US012125674B2

(12) United States Patent
Carter

(10) Patent No.: US 12,125,674 B2
(45) Date of Patent: Oct. 22, 2024

(54) SURFACE CHARGE AND POWER FEEDBACK AND CONTROL USING A SWITCH MODE BIAS SYSTEM

(71) Applicant: Advanced Energy Industries, Inc., Fort Collins, CO (US)

(72) Inventor: Daniel Carter, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 1093 days.

(21) Appl. No.: 16/871,613

(22) Filed: May 11, 2020

(65) Prior Publication Data

US 2021/0351007 A1 Nov. 11, 2021

(51) Int. Cl.
*H01J 37/32* (2006.01)
*H03K 3/64* (2006.01)
(Continued)

(52) U.S. Cl.
CPC .. *H01J 37/32137* (2013.01); *H01J 37/32715* (2013.01); *H03K 3/64* (2013.01); *H03K 3/70* (2013.01); *H03K 3/78* (2013.01); *H01J 37/32183* (2013.01); *H01J 2237/004* (2013.01); *H01J 2237/334* (2013.01)

(58) Field of Classification Search
CPC .... H03K 3/64; H03K 3/70; H03K 3/78; H01J 37/32137; H01J 37/32715; H01J 37/32183; H01J 2237/004; H01J 2237/334
See application file for complete search history.

(56) References Cited

U.S. PATENT DOCUMENTS 4,622,094 A 11/1986 Otsubo
4,693,805 A 9/1987 Quazi
(Continued)

FOREIGN PATENT DOCUMENTS

CN 1451172 10/2003
CN 1839459 9/2006
(Continued)

OTHER PUBLICATIONS

EPO, "Extended European Search Report Regarding Patent Application No. 18877737.9", Aug. 25, 2021, p. 165, Published in: EP.
(Continued)

*Primary Examiner* — Bryan R Perez
(74) *Attorney, Agent, or Firm* — Neugeboren O'Dowd PC

(57) ABSTRACT

Systems, methods and apparatus for regulating ion energies in a plasma chamber and avoiding excessive and damaging charge buildup on the substrate surface and within capacitive structures being built on the surface. An exemplary method includes placing a substrate in a plasma chamber, forming a plasma in the plasma chamber, controllably switching power to the substrate so as to apply a periodic voltage function (or a modified periodic voltage function) to the substrate, and modulating, over multiple cycles of the periodic voltage function, the periodic voltage function responsive to a defined distribution of energies of ions at the surface of the substrate so as to effectuate the defined distribution of ion energies on a time-averaged basis, and to maintain surface charge buildup below a threshold.

19 Claims, 62 Drawing Sheets

(51) Int. Cl.
*H03K 3/70* (2006.01)
*H03K 3/78* (2006.01)

(56) References Cited

U.S. PATENT DOCUMENTS

| | | | |
|---|---|---|---|
| 4,891,118 A | 1/1990 | Ooiwa et al. |
| 4,963,239 A | 10/1990 | Fujita et al. |
| 5,057,185 A | 10/1991 | Singh et al. |
| 5,156,703 A | 10/1992 | Oechsner |
| 5,160,397 A | 11/1992 | Doki et al. |
| 5,242,561 A | 9/1993 | Sato |
| 5,415,718 A | 5/1995 | Ohmi et al. |
| 5,427,669 A | 6/1995 | Drummond |
| 5,487,785 A | 1/1996 | Horiike et al. |
| 5,535,906 A | 7/1996 | Drummond |
| 5,770,972 A | 6/1998 | Collier et al. |
| 5,859,428 A | 1/1999 | Fruchtman |
| 5,983,828 A | 11/1999 | Savas |
| 6,030,667 A | 2/2000 | Nakagawa et al. |
| 6,051,114 A | 4/2000 | Yao et al. |
| 6,110,287 A | 8/2000 | Arai et al. |
| 6,129,806 A | 10/2000 | Kaji et al. |
| 6,156,667 A | 12/2000 | Jewett |
| 6,162,709 A | 12/2000 | Raoux et al. |
| 6,201,208 B1 | 3/2001 | Wendt et al. |
| 6,291,938 B1 | 9/2001 | Jewett et al. |
| 6,313,583 B1 | 11/2001 | Arita et al. |
| 6,326,584 B1 | 12/2001 | Jewett et al. |
| 6,392,210 B1 | 5/2002 | Jewett et al. |
| 6,478,924 B1 | 11/2002 | Shamouilian et al. |
| 6,507,155 B1 | 1/2003 | Barnes et al. |
| 6,544,895 B1 | 4/2003 | Donohoe |
| 6,568,346 B2 | 5/2003 | Pu et al. |
| 6,583,572 B2 | 6/2003 | Veltrop et al. |
| 6,617,794 B2 | 9/2003 | Barnes et al. |
| 6,621,674 B1 | 9/2003 | Zahringer et al. |
| 6,646,385 B2 | 11/2003 | Howald et al. |
| 6,685,798 B1 | 2/2004 | Howald et al. |
| 6,694,915 B1 | 2/2004 | Howald et al. |
| 6,707,051 B2 | 3/2004 | Shun'ko |
| 6,714,033 B1 | 3/2004 | Makhratchev et al. |
| 6,724,148 B1 | 4/2004 | Gonzalez et al. |
| 6,777,037 B2 | 8/2004 | Sumiya et al. |
| 6,794,301 B2 | 9/2004 | Savas |
| 6,819,096 B2 | 11/2004 | Gonzalez et al. |
| 6,822,396 B2 | 11/2004 | Gonzalez et al. |
| 6,863,018 B2 | 3/2005 | Koizumi et al. |
| 6,872,289 B2 | 3/2005 | Mizuno et al. |
| 6,885,153 B2 | 4/2005 | Quon |
| 6,885,453 B2 | 4/2005 | Kaufmann |
| 6,913,938 B2 | 7/2005 | Shanmugasundram et al. |
| 6,920,312 B1 | 7/2005 | Benjamin |
| 6,927,358 B2 | 8/2005 | Gonzalez et al. |
| 6,946,063 B1 | 9/2005 | Gonzalez et al. |
| 6,984,198 B2 | 1/2006 | Krishnamurthy et al. |
| 7,005,845 B1 | 2/2006 | Gonzalez et al. |
| 7,046,524 B2 | 5/2006 | Hoffman et al. |
| 7,059,267 B2 | 6/2006 | Hedberg et al. |
| 7,132,618 B2 | 11/2006 | Hoffman et al. |
| 7,201,936 B2 | 4/2007 | Schwarm et al. |
| 7,245,084 B1 | 7/2007 | Gonzalez et al. |
| 7,253,117 B2 | 8/2007 | Donohoe |
| 7,297,637 B2 | 11/2007 | Hedberg et al. |
| 7,373,899 B2 | 5/2008 | Sumiya et al. |
| 7,468,494 B2 | 12/2008 | Gonzalez et al. |
| 7,520,956 B2 | 4/2009 | Samukawa et al. |
| 7,528,386 B2 | 5/2009 | Ruzic et al. |
| 7,645,357 B2 | 1/2010 | Paterson et al. |
| 7,725,208 B2 | 5/2010 | Shanmugasundram et al. |
| 7,737,702 B2 | 6/2010 | Pipitone |
| 7,764,140 B2 | 7/2010 | Nagarkatti et al. |
| 7,777,179 B2 | 8/2010 | Chen et al. |
| 7,783,375 B2 | 8/2010 | Shanmugasundram et al. |
| 7,847,247 B2 | 12/2010 | Denpoh |
| 8,140,292 B2 | 3/2012 | Wendt |
| 8,169,595 B2 | 5/2012 | Schriever et al. |
| 8,329,054 B2 | 12/2012 | Ichino et al. |
| 8,404,598 B2 | 3/2013 | Liao et al. |
| 8,409,398 B2 | 4/2013 | Brcka |
| 8,475,673 B2 | 7/2013 | Edelberg |
| 8,641,916 B2 | 2/2014 | Yatsuda et al. |
| 8,698,107 B2 | 4/2014 | Godet et al. |
| 8,900,402 B2 | 12/2014 | Holland et al. |
| 9,105,447 B2 | 8/2015 | Brouk et al. |
| 9,114,666 B2 | 8/2015 | Valcore, Jr. et al. |
| 9,123,509 B2 | 9/2015 | Papasouliotis et al. |
| 9,177,756 B2 | 11/2015 | Holland et al. |
| 9,210,790 B2 | 12/2015 | Hoffman et al. |
| 9,283,635 B2 | 3/2016 | Peters |
| 9,305,803 B2 | 4/2016 | Morimoto et al. |
| 9,378,931 B2 | 6/2016 | Kwon et al. |
| 9,390,893 B2 | 7/2016 | Valcore, Jr. et al. |
| 9,536,749 B2 | 1/2017 | Marakhtanov et al. |
| 9,593,421 B2 | 3/2017 | Baek et al. |
| 9,595,424 B2 | 3/2017 | Marakhtanov et al. |
| 9,604,877 B2 | 3/2017 | Veerasamy et al. |
| 9,685,297 B2 | 6/2017 | Carter et al. |
| 9,754,767 B2 | 9/2017 | Kawasaki |
| 9,754,768 B2 | 9/2017 | Yamada et al. |
| 9,761,414 B2 | 9/2017 | Marakhtanov et al. |
| 9,761,419 B2 | 9/2017 | Nagami |
| 9,767,988 B2 | 9/2017 | Brouk et al. |
| 9,788,405 B2 | 10/2017 | Kawasaki et al. |
| 9,818,584 B2 | 11/2017 | Miller et al. |
| 9,872,373 B1 | 1/2018 | Shimizu et al. |
| 9,892,888 B2 | 2/2018 | Baek et al. |
| 10,607,813 B2 | 3/2020 | Fairbairn et al. |
| 10,707,055 B2 | 7/2020 | Shaw et al. |
| 10,791,617 B2 | 9/2020 | Dorf et al. |
| 10,811,228 B2 | 10/2020 | Van Zyl et al. |
| 11,189,454 B2 | 11/2021 | Carter et al. |
| 11,437,221 B2 | 9/2022 | Carter et al. |
| 2001/0014540 A1 | 8/2001 | Shan et al. |
| 2002/0038631 A1 | 4/2002 | Sumiya et al. |
| 2002/0115301 A1 | 8/2002 | Savas |
| 2002/0144786 A1 | 10/2002 | Chiang et al. |
| 2003/0033116 A1 | 2/2003 | Brcka et al. |
| 2004/0007326 A1 | 1/2004 | Roche et al. |
| 2004/0094402 A1 | 5/2004 | Gopalraja et al. |
| 2005/0090118 A1 | 4/2005 | Shannon et al. |
| 2005/0260354 A1 | 11/2005 | Singh et al. |
| 2006/0088655 A1 | 4/2006 | Collins et al. |
| 2006/0130971 A1 | 6/2006 | Chang et al. |
| 2006/0171093 A1 | 8/2006 | Ishimura et al. |
| 2006/0226786 A1 | 10/2006 | Lin et al. |
| 2007/0186856 A1 | 8/2007 | Yasui et al. |
| 2007/0193975 A1 | 8/2007 | Wilson |
| 2007/0246163 A1 | 10/2007 | Paterson et al. |
| 2008/0135400 A1 | 6/2008 | Kadlec et al. |
| 2009/0077150 A1 | 3/2009 | Wendt |
| 2009/0200494 A1 | 8/2009 | Hatem et al. |
| 2009/0255800 A1 | 10/2009 | Koshimizu |
| 2009/0298287 A1 | 12/2009 | Shannon et al. |
| 2010/0072172 A1 | 3/2010 | Ui et al. |
| 2010/0154994 A1 | 6/2010 | Fischer et al. |
| 2010/0208409 A1 | 8/2010 | Bluck et al. |
| 2010/0276273 A1 | 11/2010 | Heckman et al. |
| 2010/0296977 A1 | 11/2010 | Hancock |
| 2011/0031217 A1 | 2/2011 | Himori |
| 2011/0038187 A1 | 2/2011 | Horishita et al. |
| 2011/0065161 A1 | 3/2011 | Kwasinski et al. |
| 2011/0089023 A1 | 4/2011 | Tanaka et al. |
| 2011/0095689 A1 | 4/2011 | Gilbert |
| 2011/0220491 A1 | 9/2011 | Hilliard |
| 2011/0223750 A1 | 9/2011 | Hayashi et al. |
| 2011/0226617 A1 | 9/2011 | Hofmann et al. |
| 2011/0248634 A1 | 10/2011 | Heil et al. |
| 2011/0259851 A1 | 10/2011 | Brouk et al. |
| 2012/0052599 A1 | 3/2012 | Brouk et al. |
| 2012/0052689 A1 | 3/2012 | Tokashiki |
| 2012/0187844 A1 | 7/2012 | Brouk et al. |
| 2012/0217221 A1 | 8/2012 | Hoffman et al. |
| 2012/0318456 A1 | 12/2012 | Brouk et al. |

(56) References Cited

U.S. PATENT DOCUMENTS

| | | | |
|---|---|---|---|
| 2012/0319584 A1* | 12/2012 | Brouk | H01J 37/32174 315/111.21 |
| 2013/0122711 A1 | 5/2013 | Marakhtanov et al. | |
| 2014/0061156 A1 | 3/2014 | Brouk et al. | |
| 2014/0062303 A1 | 3/2014 | Hoffman et al. | |
| 2014/0062495 A1 | 3/2014 | Carter et al. | |
| 2014/0117861 A1 | 5/2014 | Finley et al. | |
| 2014/0148016 A1 | 5/2014 | Kanazawa et al. | |
| 2014/0173158 A1 | 6/2014 | Valcore, Jr. | |
| 2014/0265910 A1 | 9/2014 | Kobayashi et al. | |
| 2014/0302682 A1 | 10/2014 | Muto et al. | |
| 2014/0305905 A1 | 10/2014 | Yamada et al. | |
| 2015/0076112 A1 | 3/2015 | Sriraman et al. | |
| 2015/0126037 A1 | 5/2015 | Chen et al. | |
| 2015/0315698 A1 | 11/2015 | Chistyakov | |
| 2015/0325413 A1 | 11/2015 | Kim et al. | |
| 2015/0371827 A1 | 12/2015 | Godet et al. | |
| 2016/0020108 A1 | 1/2016 | Ranjan et al. | |
| 2016/0027616 A1 | 1/2016 | Ramaswamy et al. | |
| 2016/0056017 A1 | 2/2016 | Kim et al. | |
| 2016/0064247 A1 | 3/2016 | Tomura et al. | |
| 2016/0079037 A1 | 3/2016 | Hirano et al. | |
| 2016/0126068 A1 | 5/2016 | Lee et al. | |
| 2016/0126069 A1 | 5/2016 | Kwon et al. | |
| 2016/0240353 A1 | 8/2016 | Nagami | |
| 2016/0351375 A1 | 12/2016 | Valcore, Jr. et al. | |
| 2017/0018411 A1 | 1/2017 | Sriraman et al. | |
| 2017/0029941 A1 | 2/2017 | Allen et al. | |
| 2017/0053820 A1 | 2/2017 | Bosch et al. | |
| 2017/0099723 A1 | 4/2017 | Nagami et al. | |
| 2017/0154781 A1 | 6/2017 | Ranjan et al. | |
| 2017/0278665 A1 | 9/2017 | Carter et al. | |
| 2017/0358431 A1 | 12/2017 | Dorf et al. | |
| 2018/0082824 A1 | 3/2018 | Likhanskii et al. | |
| 2018/0166249 A1 | 6/2018 | Dorf et al. | |
| 2018/0226225 A1 | 8/2018 | Koh et al. | |
| 2018/0342903 A1 | 11/2018 | Luu et al. | |
| 2019/0066979 A1 | 2/2019 | Shoeb et al. | |
| 2019/0157043 A1 | 5/2019 | Shaw et al. | |
| 2019/0180982 A1 | 6/2019 | Brouk et al. | |
| 2020/0090905 A1 | 3/2020 | Brouk et al. | |
| 2021/0005428 A1 | 1/2021 | Shaw et al. | |
| 2021/0013006 A1 | 1/2021 | Nguyen et al. | |
| 2021/0074513 A1 | 3/2021 | Van Zyl et al. | |
| 2021/0134562 A1 | 5/2021 | Fairbairn et al. | |
| 2021/0202209 A1 | 7/2021 | Van Zyl et al. | |
| 2021/0241996 A1 | 8/2021 | Carter et al. | |
| 2021/0327679 A1 | 10/2021 | Carter et al. | |
| 2021/0351007 A1 | 11/2021 | Carter | |

FOREIGN PATENT DOCUMENTS

| | | |
|---|---|---|
| CN | 101685772 A | 3/2010 |
| CN | 201465987 U | 5/2010 |
| CN | 101835334 A | 9/2010 |
| CN | 102217045 A | 10/2011 |
| CN | 105097404 A | 11/2015 |
| CN | 106920729 A | 7/2017 |
| EP | 0383570 A2 | 8/1990 |
| EP | 1978542 A1 | 10/2008 |
| EP | 1129481 B1 | 2/2012 |
| GB | 2382459 A | 5/2003 |
| GB | 2400613 A | 10/2004 |
| IN | 102405512 A | 4/2012 |
| JP | 60-126832 | 7/1985 |
| JP | 62125626 A | 6/1987 |
| JP | 0214572 A | 5/1990 |
| JP | 04-193329 A | 7/1992 |
| JP | 09293600 | 11/1997 |
| JP | 2004193564 A | 7/2004 |
| JP | 2006-147269 A | 6/2006 |
| JP | 200971133 | 4/2009 |
| JP | 2009-540569 A | 11/2009 |
| JP | 2010103465 A | 5/2010 |
| JP | 2010238960 A | 10/2010 |
| JP | 2012-104382 A | 5/2012 |
| KR | 1020120019428 A | 3/2012 |
| TW | 200811905 A | 3/2008 |
| TW | 200915375 A | 4/2009 |
| TW | 201142068 A | 12/2011 |
| TW | 201614097 A | 4/2016 |
| TW | 201621974 A | 6/2016 |
| TW | 201637069 A | 10/2016 |
| WO | 0215222 A2 | 2/2002 |
| WO | 2010013476 A1 | 2/2010 |
| WO | 2010080421 A1 | 7/2010 |
| WO | 2010126893 A2 | 11/2010 |
| WO | 2012030500 A1 | 3/2012 |
| WO | 2012103101 A1 | 8/2012 |
| WO | 2013016619 | 1/2013 |
| WO | 2014035889 A1 | 3/2014 |
| WO | 2017126184 A1 | 7/2017 |

OTHER PUBLICATIONS

EPO, "Extended European Search Report Regarding Patent Application No. 18878531.5", Sep. 1, 2021, p. 126, Published in: EP.

Yukari Nakamura, "International Preliminary Report On Patentability Regarding International Application No. PCT/US2018/061653", May 28, 2020, p. 9, Published in: CH.

Athina Nickitas-Etienne, "International Preliminary Report On Patentability Regarding International Application No. PCT/US2018/061575", May 28, 2020, p. 9, Published in: CH.

Brayton, John Joseph, "Office Action Regarding U.S. Appl. No. 15/667,239", Jun. 24, 2020, p. 131, Published in: US.

CNIPA, "Notification of the 3rd Office Action Issued in Application No. 201711336133.6", Oct. 10, 2020, p. 21, Published in: CN.

Kudelka, Stephan, "Communication Pursuant to Article 94(3) EPC Issued in Application No. 10 770 205.2", Oct. 23, 2020, p. 4, Published in: EP.

Brayton, John Joseph, "Office Action Regarding U.S. Appl. No. 15/495,513", Jul. 2, 2020, p. 87, Published in: US.

Taiwan Patent Office, "Office Action Regarding Application No. 107140924", Jan. 15, 2021, p. 12, Published in: TW.

European Patent Office, "Office Action Regarding Application No. 11822326.2", Oct. 18, 2018, p. 6, Published in: EU.

SIPO, "Office Action Regarding Chinese Application No. 201711336133.6", Jan. 6, 2020, p. 7, Published in: CN.

SIPO, "Office Action Regarding Chinese Patent Application No. 201711336133.6", Mar. 4, 2019, p. 16, Published in: CN.

Fujimoto, Kayoko, "Office Action Regarding Japanese Patent Application No. 2018-081644", Apr. 16, 2019, p. 21, Published in: JP.

Joo-Seung Kim, "The Korean Intellectual Propery Office Notice of Grounds for Rejection Regarding Korean Patent Application No. 10-2015-7007771", May 31, 2018, p. 6, Published in: KR.

European Patent Office, "Office Action Regarding European Patent Application No. 10 770 205.2", Oct. 22, 2019, p. 6, Published in: EU.

Brayton, John Joseph, "United States Office Action Re U.S. Appl. No. 12/870,837", Apr. 9, 2015, p. 40, Published in: US.

Brayton, John Joseph, "United States Office Action Re U.S. Appl. No. 12/870,837", Dec. 19, 2012, p. 8, Published in: US.

Brayton, John Joseph, "United States Office Action Re U.S. Appl. No. 12/870,837", Dec. 20, 2013, p. 33, Published in: US.

SIPO, "Chinese Office Action re Application No. 201180046783.1", May 17, 2016, p. 8, Published in: CN.

SIPO, "Chinese Office Action Re Application No. 201180046783.1", Dec. 7, 2016, p. 9, Published in: CN.

SIPO, "Office Action Re Chinese Application No. 201180046783.1", Dec. 8, 2015, p. 9, Published in: CN.

European Patent Office, "European Office Action Re Application No. 11822326.2", Apr. 3, 2017, p. 4, Published in: EP.

Claessen, Michiel, "European Office Action Re Application No. 11822326.2", Feb. 27, 2018, Page (s) 5, Published in: EP.

Aguilar, Maria, "Supplementary Partial European Search Report Re Application No. EP11822326", Oct. 16, 2015, p. 5, Published in: EP.

(56) References Cited

OTHER PUBLICATIONS

Suzuki, Soichiro, "Japanese Office Action Re Application No. 2016-043215", Jan. 25, 2017, p. 7, Published in: JP.
The Korean Intellectual Property Office, "Korean Office Action re Application No. 10-2014-7004544", Feb. 3, 2016, p. 13, Published in: KR.
Brayton, John Joseph, "United States Office Action Re U.S. Appl. No. 13/193,299", May 21, 2015, p. 24, Published in: US.
Brayton, John Joseph, "United States Office Action Re U.S. Appl. No. 13/193,299", Sep. 26, 2014, p. 37, Published in: US.
Brayton, John Joseph, "United States Office Action Re U.S. Appl. No. 13/193,299", Dec. 4, 2015, p. 30, Published in: US.
Brayton, John Joseph, "United States Office Action Re U.S. Appl. No. 13/193,299", Dec. 18, 2013, p. 43, Published in: US.
SIPO, "Chinese Office Action re Application No. 201280047162.X", Apr. 26, 2016, p. 7, Published in: CN.
SIPO, "Chinese Office Action Re Application No. 201280047162.X", Oct. 24, 2016, p. 31, Published in: CN.
SIPO, "Chinese Office Action Re Application No. 201280047162.X", Sep. 6, 2015, p. 18, Published In: CN.
Brayton, John Joseph, "United States Office Action Re U.S. Appl. No. 13/193,345", Apr. 16, 2015, p. 34, Published in: US.
Brayton, John Joseph, "United States Office Action Re U.S. Appl. No. 13/193,345", Jul. 7, 2014, p. 26, Published in: US.
Brayton. John Joseph, "United States Office Action Re U.S. Appl. No. 13/193,345", Nov. 7, 2013, p. 36, Published in: US.
Brayton, John Joseph, "United States Office Action Re U.S. Appl. No. 13/596,976", Jul. 1, 2016, p. 35, Published in: US.
Brayton, John Joseph, "United States Office Action Re U.S. Appl. No. 13/596,976", Nov. 6, 2015, p. 77, Published in: US.
Brayton, John Joseph, "United States Office Action Re U.S. Appl. No. 13/596,976", Nov. 25, 2016, p. 21, Published in: US.
SIPO, "Chinese Office Action Re Application No. 201380056068.5", Oct. 17, 2016, p. 15, Published in: CN.
SIPO, "Chinese Office Action Re Application No. 201380056068.5", Jun. 12, 2017, p. 16, Published in: CN.
Brayton, John Joseph, "United States Office Action Re U.S. Appl. No. 13/596,976", Apr. 5, 2017, p. 24, Published in: US.
Fujimoto, Kayoko, "Japanese Office Action Re Application No. 2015-529905", Aug. 22, 2017, Page (s) 16, Published in: JP.
Fujimoto, Kayoko, "Japanese Office Action Re Appl. No. 2015-529905", Aug. 24, 2017, p. 16, Published in: Japan.
Kim, Joo-Seung, "Korean Office Action Re Application No. 10-2015-7007273", Jan. 30, 2018, p. 3, Published in: KR.
SIPO, "Chinese Office Action Re Application No. 201380056070.2", Aug. 15, 2016, p. 25, Published in: CN.
Brayton, John Joseph, "United States Office Action Re U.S. Appl. No. 13/597,050", Mar. 10, 2016, p. 20, Published in: US.
SIPO, "Chinese Office Action Issued for Application No. 201380056070.2", Apr. 2, 2018, p. 6, Published in: CN.
SIPO, "Chinese Office Action Re Application No. 201380056070.2", Jul. 11, 2017, p. 13, Published in: CN.
Suzuki, Soichiro, "Japanese Office Action Re Application No. 2015-529906", May 16, 2017, p. 13, Published in: JP.
Kudelka, Stephan, "European Office Action Re Appl. No. 10 770 205.2", Nov. 2, 2017, p. 30, Published in: EPO.
Awano, Masaaki, "Japanese Office Action Re Application No. 2012-508593", Sep. 6, 2013, p. 7, Published in: JP.
Atkinson, Gerard, "International Search Report and Written Opinion Re Application No. PCT/US2010/032582", Feb. 17, 2011, p. 10, Published in: AU.
Taiwan Patent Office, "Taiwan Office Action Re Application No. 099113815", Jan. 12, 2014, p. 9, Published in: TW.
Abraham, Ibrahime A., "United States Office Action Re U.S. Appl. No. 12/767,775", Apr. 25, 2013, p. 28, Published in: US.
Abraham, Ibrahime A., "United States Office Action Re U.S. Appl. No. 12/767,775", Jun. 17, 2015, p. 28, Published in: US.
Abraham, Ibrahime A., "United States Office Action Re U.S. Appl. No. 12/767,775", Jul. 1, 2014, p. 48, Published in: US.
Abraham, Ibrahime A., "United States Office Action Re U.S. Appl. No. 12/767,775", Sep. 10, 2013, p. 30, Published in: US.
McLeod, Austin, "United States Office Action Re U.S. Appl. No. 12/767,775", Oct. 17, 2012, p. 33, Published in: US.
Decision of Rejection received for Chinese Patent Application Serial No. 201710704712.5 dated Aug. 10, 2020, 8 pages.
Extended European Search Report received for European Patent Application Serial No. 18878531.5 dated Sep. 1, 2021, 126 pages.
Final Office Action received for U.S. Appl. No. 13/597,093 dated Jul. 8, 2016, 25 pages.
International Preliminary Report on Patentability received for International PCT Application Serial No. PCT/US2013/056634 dated Mar. 12, 2015, 7 pages.
International Preliminary Report on Patentability received for International PCT Application Serial No. PCT/US2013/056647 dated Mar. 12, 2015, 7 pages.
International Preliminary Report on Patentability received for International PCT Application Serial No. PCT/US2013/056657 dated Mar. 12, 2015, 8 pages.
International Preliminary Report on Patentability received for International PCT Application Serial No. PCT/US2013/056659 dated Mar. 12, 2015, 8 pages.
International Preliminary Report on Patentability received for International PCT Application Serial No. PCT/US2013/056851 dated Mar. 12, 2015, 8 pages.
International Search Report and Written Opinion received for International PCT Application Serial No. PCT/US2013/056647 dated Oct. 30, 2013, 10 pages.
International Search Report and Written Opinion received for International PCT Application Serial No. PCT/US2013/056657 dated Oct. 28, 2013, 11 pages.
International Search Report and Written Opinion received for International PCT Application Serial No. PCT/US2013/056659 dated Nov. 8, 2013, 11 pages.
International Search Report and Written Opinion received for International PCT Application Serial No. PCT/US2013/056851 dated Nov. 18, 2013, 11 pages.
International Search Report and Written Opinion received for International PCT Application Serial No. PCT/US2022/040046 dated Oct. 27, 2022, 9 pages.
Non Final Office Action received for U.S. Appl. No. 16/278,822 dated Sep. 14, 2022, 9 pages.
Non Final Office Action received for U.S. Appl. No. 16/926,876 dated Sep. 26, 2022, 7 pages.
Non Final Office Action received for U.S. Appl. No. 16/926,876 dated Sep. 29, 2022, 80 pages.
Notice of Allowance received for U.S. Appl. No. 17/584,921 dated Nov. 16, 2022, 9 pages.
Office Action received for Japanese Patent Application Serial No. 2018138425 dated Mar. 24, 2020, 7 pages.
Office Action received for Korean Patent Application Serial No. 1020157007516 dated Feb. 15, 2017, 18 pages.
Office Action received for Taiwan Patent Application Serial No. 107140922 dated Feb. 1, 2021, 9 pages.
Office Action received for Taiwan Patent Application Serial No. 110136912 dated Feb. 23, 2022, 10 pages.
Office Action received for Taiwanese Patent Applicatio Serial No. 102130565 dated Apr. 11, 2016, 2 pages.
Office Action received for Taiwanese Patent Application Serial No. 099113815 dated Jun. 18, 2014, 5 pages.
Office Action received for Taiwanese Patent Application Serial No. 101127182, dated Aug. 11, 2014, 11 pages.
Office Action received for Taiwanese Patent Application Serial No. 102130565, dated Jul. 14, 2015, 4 pages.
Office Action received for Taiwanese Patent Application Serial No. 10714924, dated Aug. 18, 2021, 5 pages.
Office Action received for Taiwanese Patent Application Serial No. 110111617 dated Jun. 30, 2022, 8 pages.
Requirement for Restriction received for U.S. Appl. No. 13/193,299 dated Aug. 8, 2013, 7 pages.
Requirement for Restriction received for U.S. Appl. No. 13/193,345 dated Jun. 6, 2013, 8 pages.

(56) References Cited

OTHER PUBLICATIONS

Requirement for Restriction received for U.S. Appl. No. 13/596,976 dated Feb. 23, 2015, 8 pages.
Requirement for Restriction received for U.S. Appl. No. 13/597,050 dated Jan. 27, 2015, 7 bages.
Requirement for Restriction received for U.S. Appl. No. 13/597,093 dated Mar. 23, 2015, 9 pages.
Requirement for Restriction received for U.S. Appl. No. 16/926,876 dated Apr. 29, 2022, 9 pages.
Silapunt, R., et al., "Ion Bombardment Energy Control for Selective Fluorocarbon Plasma Etching of Organosilicate Glass, J. Vac. Sci. Technol", vol. B 22, No. 2, 2004, pp. 826-831.
Wang, S.B., et al., "Control of Ion Energy Distribution at Substrates During Plasma Processing", J. Applied Physics, vol. 88, No. 2, Jul. 15, 2000, pp. 643-646.
Wendt "Thomson Innovation Patent Export", Mar. 10, 2009, 10 pages.
Kiubo, et al., "Charging of Dielectric Substrate Materials During Plasma Immersion Ion Implantation", Nuclear Instruments and Methods in Physics Research B, vol. 187, 2002, pp. 485-491.
EPO, "Extended Search Report Regarding European Patent Application No. 18877322", , p. 129, Published in: EP.
Harry Kim, "International Search Report and Written Opinion Regarding International Application No. PCT/US2020/027927", Sep. 17, 2021, p. 14, Published in: US.
International Preliminary Report on Patentability Chapter I received for International PCT Application Serial No. PCT/US2020/041771 dated Jan. 27, 2022, 10 pages.
Non-Final Office Action received for U.S. Appl. No. 16/278,822 dated Aug. 2, 2021, 11 pages.
Non-Final Office Action received for U.S. Appl. No. 17/150,633 dated Nov. 24, 2021, 52 pages.
Non-Final Office Action received for U.S. Appl. No. 17/171,164 dated Oct. 15, 2021, 60 pages.
Jeon, M., et al., "Hydrogenated amorphous silicon film as intrinsic passivation layer deposited at various temperatures using RF remote-PEVCD technique", "Current Applied Physics", Nov. 12, 2009, p. S237-S240, vol. 10, No. (2010), Publisher: Elsevier B.V., Published in: US.
Bruno, G., et al., "Real time ellipsometry for monitoring plasma-assisted epitaxial growth of GaN", "Applied Surface Sci.", Jul. 7, 2006, pp. 219-223, vol. 253, No. (2006), Publisher: Elsevier B.V., Published in: US.
Giangregorio, M.M., et al., "Role of plasma activation in tailoring the nanostructure of multifunctional oxides thin films", "Applied Surface Sci.", Sep. 10, 2008, pp. 5396-5400, vol. 255, No. (2009), Publisher: Elsevier B.V., Published in: US.
Vahedi, V., et al., "Verification of frequency scaling laws for capacitive radio-frequency discharges using two-dimensional simulations", "Phys. Fluids B", Jul. 1993, pp. 2719-2729, vol. 5, No. 7, Publisher: Am. Inst. of Physics, Published in: US.
Rauf, S., et al., "Nonlinear Dynamics of Radio Frequency Plasma Processing Reactors Powered by Multifrequency Sources", "IEEE Transactions on Plasma Science", Oct. 5, 1999, pp. 1329-1338, vol. 27, No. 5, Publisher: IEEE.
Raoux, S., et al., "Remote microwave plasma source for cleaning chemical vapor deposition chambers; Technology for reducing global warm . . . ", "J. Vac. Sci. Technol. B Mar./Apr. 1999", 1999, pp. 477-485, vol. 17, No. 2, Publisher: Am. Vacuum Soc'y, Published in: US.
Gangoli, S.P., et al., "Production and transport chemistry of atomic fluorine in remote plasma source and cylindrical reaction chamber", "J. Phys. D: Appl. Phys.", Aug. 16, 2007, pp. 5140-5154, vol. 40, No. (2007). Publisher: IOP Publishing Ltd., Published in: UK.
Yun, Y.B., et al., "Effects of various additive gases on chemical dry etching rate enhancement of low-k SiOCH layer in F2/Ar remote plasmas", "Thin Solid Films", Aug. 15, 2007, pp. 3549-3553, vol. 516, No. (2008), Publisher: Elsevier B.V., Published in: US.
Kuo, M.S., et al., "Influence of C4F8/Ar-based etching and H2-based remote plasma ashing processes on ultralow k materials modifications", "J. Vac. Sci. Technol. B, Mar./Apr. 2010", Mar. 19, 2010, pp. 284-294, vol. 28, No. 2, Publisher: Am. Vacuum Soc'y, Published in: US.
Heil, S.B.S., et al., "Deposition of TiN and HfO2 in a commercial 200 mm plasma atomic layer deposition reactor", "J. Vac. Sci. Technol. A, Sep./Oct. 2007", Jul. 31, 2007, pp. 1357-1366, vol. 25, No. 5, Publisher: Am. Vacuum Soc'y, Published in: US.
Kim, J.Y., et al., "Remote plasma enhanced atomic layer deposition of TiN thin films using metalorganic precursor", "J. Vac. Sci. Technol. A, Jan./Feb. 2004", Nov. 13, 2003, pp. 8-12, vol. 22, No. 1, Publisher: Am. Vacuum Soc'y, Published in: US.
Wakeham, S.J., et al., "Low temperature remote plasma sputtering of indium tin oxide for flexible display applications", "Thin Solid Films", May 12, 2009, pp. 1355-1358, vol. 519, Number (2009), Publisher: Elsevier B.V.
Ohachi, T., et al., "Measurement of nitrogen atomic flux for RF-MBE growth of GaN and AlN on Si substrates", "J. of Crystal Growth", Jan. 20, 2009, pp. 2987-2991, vol. 311, Number (2009), Publisher: Elsevier B.V.
Honda, S., et al., "Hydrogenation of polycrystalline silicon thin films", "Thin Solid Films", Oct. 5, 2005, pp. 144-148, vol. 501, No. (2006), Publisher: Elsevier B.V., Published in: US.
Brayton, John Joseph, "United States Office Action Re U.S. Appl. No. 12/870,837", Mar. 22, 2013, p. 46, Published in: US.
SIPO, "Office Action Regarding Chinese Patent Application No. 201710704712.5", Apr. 1, 2020, p. 7, Published in: CN.
SIPO, "Office Action Regarding Chinese Patent Application No. 201710704712.5", Jan. 3, 2020, p. 8, Published in: CN.
SIPO, "Office Action Regarding Chinese Patent Application No. 20171074712.5", Feb. 22, 2019, p. 6, Published in: CN.
SIPO, "Office Action Regarding Chinese Patent Application 201710704712.5", Sep. 27, 2019, p. 11, Published in: CN.
Fujimoto, Kayoko, "Notice for Reasons of Rejection Regarding Japanese Patent Application No. 2020-081092", Apr. 1, 2021, p. 6, Published in: JP.
Kudeka, Stephan, "Communication Pursuant to Article 94(3) EPC Regarding Application No. 10 770 205.2", Jun. 8, 2021, p. 6, Published in: EU.
Brayton, John Joseph, "Office Action Regarding U.S. Appl. No. 15/495,513", Apr. 14, 2021, p. 10, Published in: US.
Luque, Renan, "Office Action Regarding U.S. Appl. No. 16/896,709", May 25, 2021, p. 36, Published in: US.
Hammond, Crystal, "Office Action Regarding U.S. Appl. No. 17/031,027", Apr. 28, 2021, p. 9, Published in: US.
CNIPA, "Office Action Issued in Patent Application No. 202080057686.1", Feb. 28, 2023, p. 25, Published in: CN.
Abraham, Ibrahime A., "United States Office Action Re U.S. Appl. No. 12/767,775", Dec. 15, 2014, p. 37, Published in: US.
Brayton, John Joseph, "United States Office Action Re U.S. Appl. No. 13/193,345", Jan. 15, 2016, p. 33, Published in: US.
Mitrovic, Bayer, "International Search Report and Written Report Re Application No. PCT/US2011/047467", Feb. 12, 2011, p. 9, Published in: AU.
Guinea, William, "International Search Report and Written Opinion Re Application No. PCT/US2012/048504", Sep. 12, 2012, p. 4, Published in: AU.
Alejandro Mulero, Luz L, "Office Action Regarding U.S. Appl. No. 14/803,815", Jul. 3, 2018, p. 67, Published in: US.
Alejandro Mulero, Luz, "Office Action Regarding U.S. Appl. No. 14/803,815", Nov. 17, 2017, p. 8, Published in: US.
Daimon, Kiyoshi, "Office Action Regarding Japanese Patent Application No. 2018-138425", May 22, 2019, p. 10, Published in: JP.
Korean Patent Office, "Notice of Grounds for Rejection Regarding Korean Patent Application No. 10-2018-7029468", Feb. 7, 2019, p. 6, Published in: KR.
Choi, Sang Won, "International Search Report and Written Opinion Regarding International Application No. PCT/US2018/061653", Mar. 8, 2019, p. 12, Published in: KR.
Luque, Renan, "Office Action Regarding U.S. Appl. No. 16/194,104", Aug. 1, 2019, p. 84, Published in: US.
Luque, Renan, "Office Action Regarding U.S. Appl. No. 16/803,020", Apr. 22, 2020, p. 36, Published in: US.

(56) References Cited

OTHER PUBLICATIONS

Choi, Sang Won, "The International Search Report and the Written Opinion Re International Application No. PCT/US2018/061575", Mar. 6, 2019, p. 14, Published in: WO.
TIPO, "Office Action Regarding Taiwan Patent Application No. 107140926", May 28, 2020, p. 12, Published in: TW.
Luque, Renan, "Office Action Regarding U.S. Appl. No. 16/193,790", Sep. 4, 2019, p. 230, Published in: US.
Hammond, Crystal, "Office Action Regarding U.S. Appl. No. 16/246,996", Dec. 12, 2019, p. 84, Published in: US.
Simin Baharlou, "International Preliminary Report On Patentability for International Application No. PCT/US2018/061671", May 28, 2020, p. 14, Published in: CH.
Choi, Sang Won, "International Search Report and Written Opinion Regarding International Application No. PCT/US2018/061671", Mar. 13, 2019, p. 17, Published in: KR.
TIPO, "Office Action Regarding Taiwan Patent Application No. 107140924", Apr. 28, 2020, p. 9, Published in: TW.
Hammond, Crystal, "Office Action Regarding U.S. Appl. No. 16/194,125", Dec. 12, 2019, p. 88, Published in: US.
Hammond, Crystal, "Office Action Regarding U.S. Appl. No. 16/270,391", Dec. 12, 2019, p. 78, Published in: US.
Buzzi, F.L., et al., "Energy Distribution of Bombarding Ions in Plasma Etching of Dielectrics", "AVS 54th International Symposium", Oct. 15, 2007, Publisher: Univ. of Wisconsin—Madison, Published in: US.
Bryns, B., et al., "A Vhf driven coaxial atmospheric air plasma: electrical and optical characterization", Dec. 16, 2011. pp. 1-18, No. Rev. 2-0, Publisher: N. C. ST. U., Dep't of Nuclear Engr., Published in: US.
SIPO, "Chinese Office Action re Application No. 201180046783.1", Mar. 24, 2015, p. 18, Published in: CN.
SIPO, "Chinese Office Action re Application No. 201080003206.X", May 23, 2014, p. 6, Published in: CN.
Yafeng, Zhang, "Chinese Office Action re Application No. 201080003206.X", Jun. 10, 2015, p. 8, Published in: CN.
Yafeng, "Chinese Office Action re Application No. 201080003206.X", Sep. 4, 2013, p. 15, Published in: CN.
Yafeng, Zhang, "Chinese Office Action re Application No. 201080003206.X", Nov. 26, 2014, p. 6, Published in: CN.
Kudelka, Stephan, "Supplementary European Search Report re EP Application 10 77 0205.2, PCT/US2010/032582", Jan. 30, 2013, p. 8, Published in: NL.
Emsellem, G., "Electrodeless Plasma Thruster Design Characteristics", Jul. 11, 2005, p. 22, Publisher: 41st Joint Propulsion Conference, Tucson, Published in: US.
George, M.A., et al., "Silicon Nitride Arc Thin Films by New Plasma Enhanced Chemical Vapor Deposition Source Technology", Jul. 7, 2011, p. 5, Publisher: Article downloaded from www.generalplasma.com, Published in: US.

Masaaki Awano, "Japanese Office Action re Application No. 2012-508593", Apr. 19, 2013, p. 11, Published in: JP.
Moku, Tetsuji, "Japanese Office Action re Application No. 2013-527088", Apr. 21, 2015, p. 10, Published in: JP.
Moku, Tetsuji, "Japanese Office Action re Application No. 2014-523-057", Apr. 21, 2015, p. 11, Published in: JP.
Duk Yeul Baek, "Korean Office Action re Application No. 10-2011-7009075", Mar. 25, 2013, p. 2, Published in: KR.
The Korean Intellectual Property Office, "Korean Office Action re Application No. 10-2013-7007594", Jul. 28, 2014, p. 2, Published in: KR.
Krolak, M, "Matthew Krolak's MyElectricEngine.Com Megnetoplasmadynamic (MPD) Thruster Design", Apr. 28, 2011, p. 7, Publisher: Webpage downloaded from http://myelectricengine.com/projects/mpdthruster/mpdthruster.html, Published in: US.
Brayton, John Joseph, "US Office Action re U.S. Appl. No. 13/597,093", Nov. 5, 2015, p. 76, Published in: US.
Brayton, John Joseph, "Office Action re U.S. Appl. No. 14/606,857", Apr. 8, 2015, p. 51, Published in: US.
Sathiraju, Srinivas, "Office Action re U.S. Appl. No. 13/597,032", Apr. 9, 2015, p. 32, Published in: US.
Sathiraju, Srinivas, "Office Action re U.S. Appl. No. 13/597,032", Jun. 20, 2014, p. 42, Published in: US.
Brayton, John Joseph, "Office Action re U.S. Appl. No. 13/597,050", Jul. 17, 2015, p. 86, Published in: US.
Shamim, Ahmed, "Office Action re U.S. Appl. No. 14/011,305", Dec. 4, 2014, p. 28, Published in: US.
Lindner, Nora, "International Preliminary Report on Patentability re Application PCT/US2010/032582", Nov. 1, 2011, p. 8, Published in: CH.
Baharlou, Simin, "International Preliminary Report on Patentability re Application No. PCT/US2011/047467", Mar. 14, 2013, p. 7, Published in: CH.
Rabbani, Firoozeh, "International Search Report and Written Opinion Re Application No. PCT/US2012/022380", Mar. 13, 2012, Published in: AU.
Devlin, Martin, "International Search Report and Written Opinion Re Application No. PCT/US2012/029953", May 24, 2012, p. 11, Published in: AU.
Baharlou, Simin, "International Preliminary Report on Patentability re Application No. PCT/US2012/048504", Feb. 6, 2014, p. 11, Published in: CH.
Ramachandran, Mani, "International Search Report and Written Opinion re Application No. PCT/US2013/056634", Nov. 13, 2013, p. 10, Published in: AU.
Wittmann-Regis, Agnes, "International Preliminary Report on Patentability re Application No. PCT/US2013/056634", Mar. 12, 2015, p. 7, Published in: CH.
EPO, Extended European Search Report issued in Application No. 21803110.2, Jun. 6, 2024, pp. 11.
TIPO, Office Action issued in Application No. 109123604, Jun. 24, 2024, 26 pages, Published in Taiwan.

* cited by examiner

SURFACE CHARGE AND POWER FEEDBACK AND CONTROL USING A SWITCH MODE BIAS SYSTEM

FIELD OF THE DISCLOSURE

The present disclosure relates generally to plasma processing. In particular, but not by way of limitation, the present disclosure relates to systems, methods and apparatuses for monitoring and controlling surface charge on a wafer during plasma processing of the wafer.

DESCRIPTION OF RELATED ART

Surface charge accumulation on a wafer during semiconductor processing can affect numerous aspects of a plasma process including device damage and etching profiles, and dimensional integrity of patterned structures. For instance, charge buildup can lead to capacitive breakdown between capacitively-coupled features within a chip stack. As another example, charge buildup on surface features can deflect ions used in etching processes leading to undesirable etching or deposition profiles (i.e., non-vertical sidewalls). Existing processes use off-line empirical data accumulation and analysis to identify flags and other triggers that can be used during processing to take corrective actions. However, such methods are not real-time and are prone to errors when real-time processing conditions differ somewhat from empirically-derived models. There is therefore a need for more accurate and real-time monitoring and control of surface charge accumulation.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

In an aspect of the disclosure, a so-called eV source uses a switch mode power supply in concert with a current, voltage, or power source, to generate a modified waveform (e.g., asymmetric periodic waveform) that is provided to a substrate to effectuate charge buildup and discharge on a wafer substrate in a plasma processing chamber. The waveform can include periodic voltage steps or ramps (e.g., voltage reversals with finite slope between top and bottom of each reversal) that remove charge from the wafer surface, followed by periods of linearly decreasing voltage application to the chuck holding the wafer. While the voltage steps or ramps remove charge buildup on the wafer surface, the periods of linearly decreasing voltage result in a sustained negative voltage at the wafer surface (e.g., a slight voltage slope), which attracts ions to the surface for processing. Since the linearly decreasing voltage is controlled, a controller can also monitor or control a slope of this decreasing voltage, and this slope provides knowledge of the "ion current," $I_I$, or a current passing from the plasma, through the wafer, and into the eV source.

Knowledge of the ion current along with monitoring a time that ion current, $I_I$, is flowing provides an accurate estimate of charge buildup since surface charge accumulation, $Q_i = I_I * t$. When the surface charge accumulation, $Q_i$, exceeds a threshold, such as one known to lead to structural damage or other undesirable effects of surface charge, a positive voltage reversal (or sharp change in the direction of voltage slope) can be initiated to remove the surface charge buildup. Said another way, the asymmetric periodic voltage waveform has a duration of a linearly decreasing voltage between voltage reversals, and this duration can prevent surface charge accumulation, $Q_i$, from becoming too great. Thus, the timing of the voltage reversals can be modified or controlled to effect specific charge removal or to preclude the charge from exceeding a threshold.

At the same time, since current and voltage are known, the controller also has knowledge and control over delivered power since $P = I*V$ Some embodiments of the disclosure can be characterized as a system for plasma-based processing including a plasma processing chamber, a substrate support, and a power supply. The plasma processing chamber can be configured to contain a plasma that includes ions. The substrate support can be positioned within the plasma processing chamber and disposed to support a substrate. The power supply can be configured to provide an asymmetric periodic voltage function to an output configured to couple to a substrate support. The asymmetric periodic voltage function can have a positive voltage ramp, a first negative voltage ramp, and a second negative voltage ramp having a duration, $t_2$, between the first negative voltage ramp and a next positive voltage ramp. The power supply can also include an ion current compensation component configured to obtain a measure of ion current in the plasma processing chamber based upon monitoring of at least one of current or voltage during the duration, $t_2$, and further configured to obtain an estimate of surface charge accumulation, $Q_i$, on the substrate as a function of the ion current and the duration, $t_2$. The power supply can also include a switching controller configured to adjust the duration, $t_2$, to achieve a desired surface charge accumulation, $Q_i$, or to keep the surface charge accumulation, $Q_i$, below a threshold.

Other embodiments of the disclosure may also be characterized as an apparatus for plasma-based processing. The apparatus can include a power supply having means for obtaining a measure of ion current in a plasma processing chamber, means for obtaining an estimate of surface charge accumulation, $Q_i$, and a controller for adjusting a duration, $t_2$, of the waveform. Specifically, the power supply can be configured to provide an asymmetric periodic voltage function to an output configured to couple to a substrate support. The asymmetric periodic voltage function can have a positive voltage ramp, a first negative voltage ramp, and a second negative voltage ramp, having a duration, $t_2$, between the first negative voltage ramp and a next positive voltage ramp. The means for obtaining a measure of ion current in the plasma processing chamber can monitor at least one of current or voltage during the duration, $t_2$. The means for obtaining an estimate of surface charge accumulation, $Q_i$, on a substrate held by the substrate support can operate as a function of the ion current, $I_i$, and the duration, $t_2$. The controller can adjust the duration, $t_2$, to achieve a desired charge accumulation, $Q_i$, or can keep the surface charge accumulation, $Q_i$, below a threshold.

Some embodiments of the disclosure may be characterized as a method of biasing a substrate in a plasma processing chamber. The method can include biasing with a waveform that includes (1) periodic positive pulses, and (2) a linearly decreasing voltage between each of the positive pulses. The linearly decreasing voltage can last for a duration, $t_2$, and have a rate of decrease, dv/dt. The method can then calculate an ion current, $I_I$, from current measurements of the waveform during the duration, $t_2$, or from the rate of decrease, dv/dt. The method can then calculate surface charge accumulation, $Q_i$, that builds up during the duration, $t_2$, from the ion current, $I_I$, and compare the surface charge accumulation, $Q_i$, to a first threshold. The method can then change the duration, $t_2$, when the surface charge accumulation, $Q_i$, meets or exceeds the first threshold.

In an embodiment, a power supply can include a switch mode power supply and an ion current compensation component. The power supply can include at least two switching components and the at least two switching components can include a first switching component coupled to a DC power supply and a second switching component coupled to a ground terminal. The two switching components can be configured to alternately couple a positive DC voltage of the DC power supply and the ground terminal to an output of the power supply to effectuate a controllably narrow or monoenergetic distribution of ion energy (e.g., a single concentration of a particular ion energy) at the surface of the substrate. The at least two switching components can be in either a half bridge or full bridge configuration.

Some embodiments of the disclosure can be characterized as a system for providing voltage and can include a plasma processing chamber, a substrate support, and a power supply. The plasma processing chamber can be configured to contain a plasma that includes ions. The substrate support can be positioned within the plasma processing chamber and disposed to support a substrate. The power supply can be configured to provide an asymmetric periodic voltage function to an output configured to couple to a substrate support, the asymmetric periodic voltage function having a positive voltage ramp, a first negative voltage ramp, and a second negative voltage ramp, having a duration, $t_2$, between the first negative voltage ramp and a next positive voltage ramp. The power supply can comprise an ion current compensation component configured to obtain a measure of ion current in the plasma processing chamber based upon monitoring of at least one of current or voltage during the duration, $t_2$, and further configured to obtain an estimate of surface charge accumulation, $Q_i$, on the substrate as a function of the ion current and the duration, $t_2$. The power supply can further comprise a switching controller configured to adjust the duration, $t_2$, to achieve a desired surface charge accumulation, $Q_i$, or to keep the surface charge accumulation, $Q_i$, below a threshold.

Other embodiments of the disclosure can be characterized as an apparatus for providing voltage and can include a power supply. The power supply can be configured to provide an asymmetric periodic voltage function to an output configured to couple to a substrate support, the asymmetric periodic voltage function having a positive voltage ramp, a first negative voltage ramp, and a second negative voltage ramp, having a duration, $t_2$, between the first negative voltage ramp and a next positive voltage ramp. The power supply can comprise a means to obtain a measure of ion current in a plasma processing chamber based upon monitoring of at least one of current or voltage during the duration, $t_2$. The power supply can comprise a means to obtain an estimate of surface charge accumulation, $Q_i$, on a substrate held by the substrate support as a function of the ion current and the duration, $t_2$. The power supply can be configured to adjust the duration, $t_2$, to achieve a desired surface charge accumulation, $Q_i$, or to keep the surface charge accumulation, $Q_i$, below a threshold.

Yet other embodiments of the disclosure can be characterized as non-transitory, tangible processor readable storage medium, encoded with processor executable code to perform a method for providing a voltage. The method can include biasing a substrate in a plasma processing chamber, a waveform of the biasing comprising: (1) periodic positive pulses, and (2) a linearly decreasing voltage between each of the positive pulses, lasting for a duration, $t_2$, and having a rate of decrease, dv/dt. The method can further include calculating an ion current, $I_I$, from current measurements of the waveform during the duration, $t_2$, or from the rate of decrease, dv/dt. The method can yet further include calculating surface charge accumulation, $Q_i$, that builds up during the duration, $t_2$, from the ion current, $I_I$. The method can also include comparing the surface charge accumulation, $Q_i$, to a first threshold. The method can additionally include changing the duration, $t_2$, when the surface charge accumulation, $Q_i$, meets or exceeds the first threshold.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

DETAILED DESCRIPTION

Figure 1:
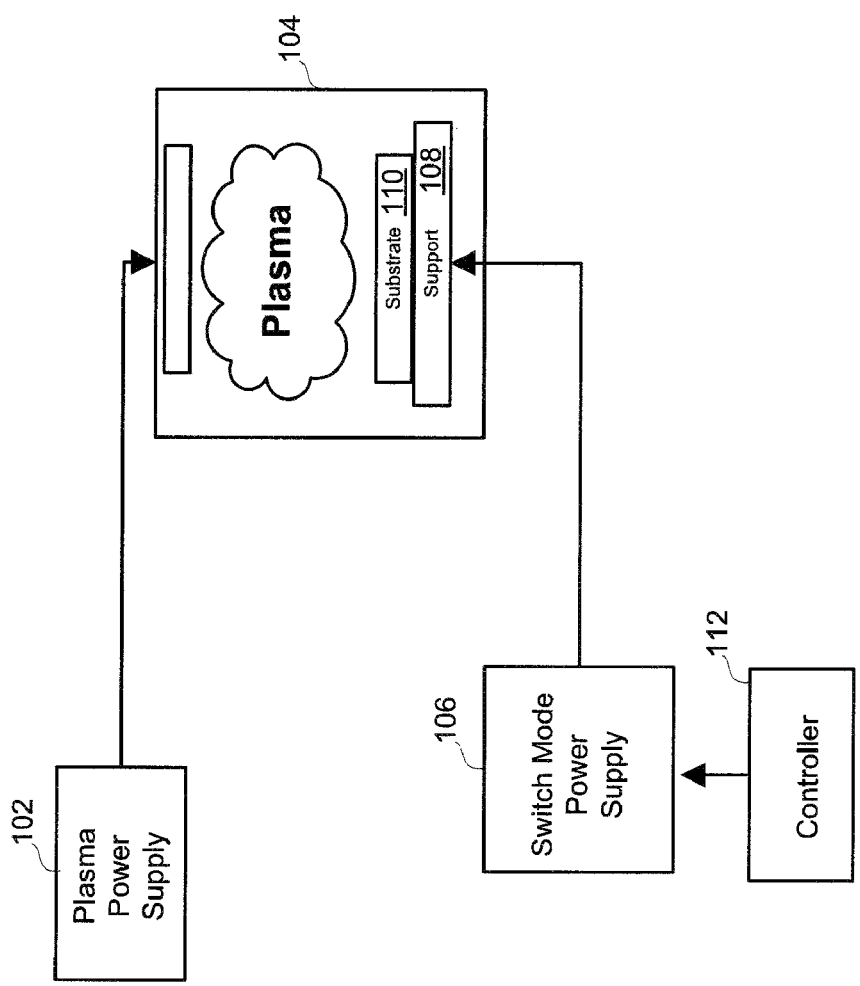
FIG. 1 illustrates a block diagram of a plasma processing system in accordance with one implementation of the present invention.

An exemplary embodiment of a plasma processing system is shown generally in FIG. 1. As depicted, a plasma power supply 102 is coupled to a plasma processing chamber 104 and a switch-mode power supply 106 is coupled to a support 108 upon which a substrate 110 rests within the chamber 104. Also shown is a controller 112 that is coupled to the switch-mode power supply 106.

In this exemplary embodiment, the plasma processing chamber 104 may be realized by chambers of substantially conventional construction (e.g., including a vacuum enclosure which is evacuated by a pump or pumps (not shown)). And, as one of ordinary skill in the art will appreciate, the plasma excitation in the chamber 104 may be by any one of a variety of sources including, for example, a helicon type plasma source, which includes magnetic coil and antenna to ignite and sustain a plasma 114 in the reactor, and a gas inlet may be provided for introduction of a gas into the chamber 104.

As depicted, the exemplary plasma chamber 104 is arranged and configured to carry out plasma-assisted etching of materials utilizing energetic ion bombardment of the substrate 110, and other plasma processing (e.g., plasma deposition and plasma assisted ion implantation). The plasma power supply 102 in this embodiment is configured to apply power (e.g., RF power) via a matching network (not shown)) at one or more frequencies (e.g., 13.56 MHz) to the chamber 104 so as to ignite and sustain the plasma 114. It should be understood that the present invention is not limited to any particular type of plasma power supply 102 or source to couple power to the chamber 104, and that a variety of frequencies and power levels may be may be capacitively or inductively coupled to the plasma 114.

As depicted, a dielectric substrate 110 to be treated (e.g., a semiconductor wafer), is supported at least in part by a support 108 that may include a portion of a conventional wafer chuck (e.g., for semiconductor wafer processing). The support 108 may be formed to have an insulating layer between the support 108 and the substrate 110 with the substrate 110 being capacitively coupled to the platforms but may float at a different voltage than the support 108.

As discussed above, if the substrate 110 and support 108 are conductors, it is possible to apply a non-varying voltage to the support 108, and as a consequence of electric conduction through the substrate 110, the voltage that is applied to the support 108 is also applied to the surface of the substrate 110.

When the substrate 110 is a dielectric, however, the application of a non-varying voltage to the support 108 is ineffective to place a voltage across the treated surface of the substrate 110. As a consequence, the exemplary switch-mode power supply 106 is configured to be controlled so as to effectuate a voltage on the surface of the substrate 110 that is capable of attracting ions in the plasma 114 to collide with the substrate 110 so as to carry out a controlled etching and/or deposition of the substrate 110, and/or other plasma-assisted processes.

Moreover, as discussed further herein, embodiments of the switch-mode power supply 106 are configured to operate so that there is an insubstantial interaction between the power applied (to the plasma 114) by the plasma power supply 102 and the power that is applied to the substrate 110 by the switch-mode power supply 106. The power applied by the switch-mode power supply 106, for example, is controllable so as to enable control of ion energy without substantially affecting the density of the plasma 114.

Furthermore, many embodiments of the exemplary switch-mode supply 106 depicted in FIG. 1 are realized by relatively inexpensive components that may be controlled by relatively simple control algorithms. And as compared to prior art approaches, many embodiments of the switch mode power supply 106 are much more efficient; thus reducing energy costs and expensive materials that are associated with removing excess thermal energy.

One known technique for applying a voltage to a dielectric substrate utilizes a high-power linear amplifier in connection with complicated control schemes to apply power to a substrate support, which induces a voltage at the surface of the substrate. This technique, however, has not been adopted by commercial entities because it has not proven to be cost effective nor sufficiently manageable. In particular, the linear amplifier that is utilized is typically large, very expensive, inefficient, and difficult to control. Furthermore, linear amplifiers intrinsically require AC coupling (e.g., a blocking capacitor) and auxiliary functions like chucking are achieved with a parallel feed circuit which harms AC spectrum purity of the system for sources with a chuck.

Another technique that has been considered is to apply high frequency power (e.g., with one or more linear amplifiers) to the substrate. This technique, however, has been found to adversely affect the plasma density because the high frequency power that is applied to the substrate affects the plasma density.

In some embodiments, the switch-mode power supply 106 depicted in FIG. 1 may be realized by buck, boost, and/or buck-boost type power technologies. In these embodiments, the switch-mode power supply 106 may be controlled to apply varying levels of pulsed power to induce a potential on the surface of the substrate 110.

Figure 2:
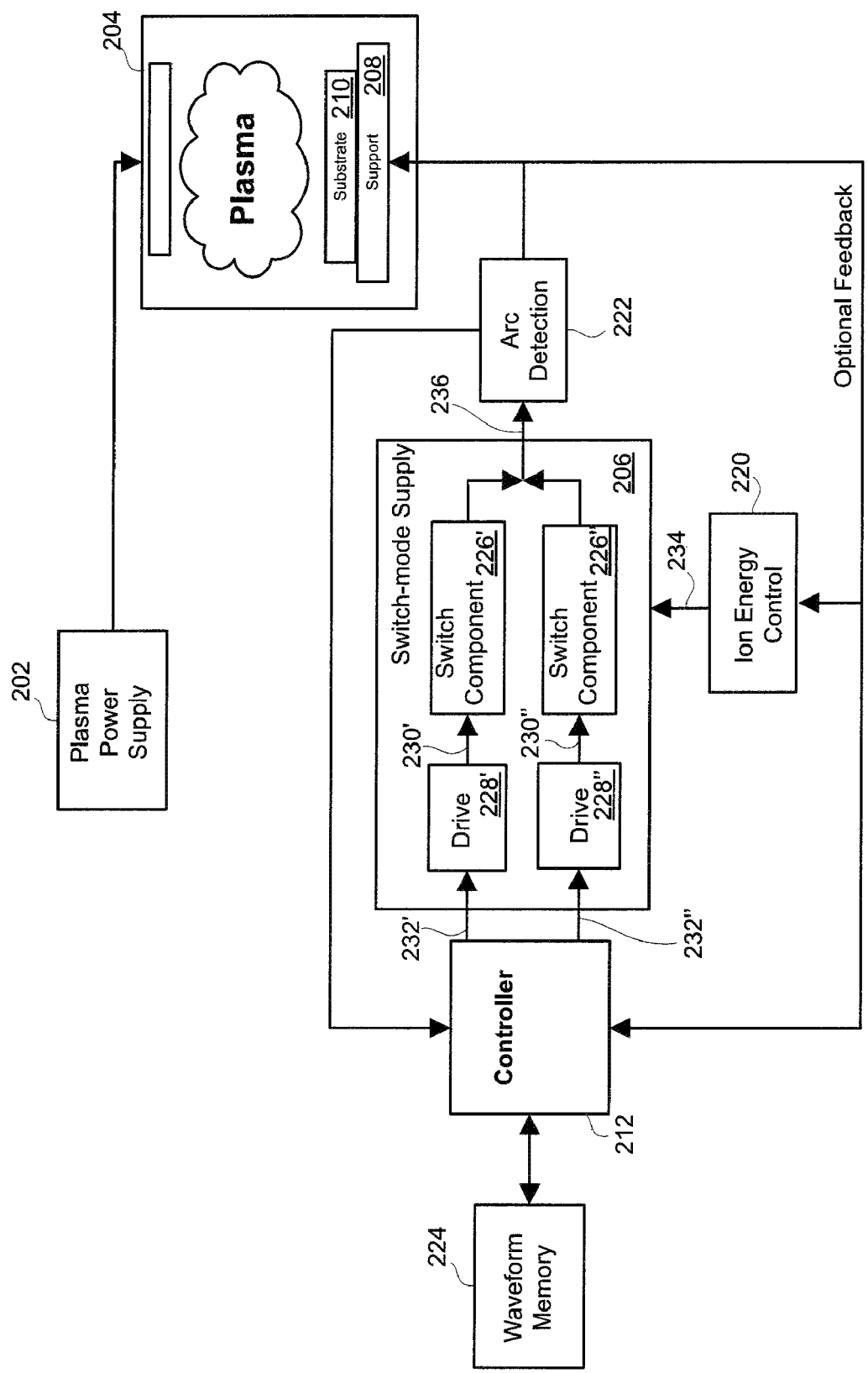
FIG. 2 is a block diagram depicting an exemplary embodiment of the switch-mode power system depicted in FIG. 1.

In other embodiments, the switch-mode power supply 106 is realized by other more sophisticated switch mode power and control technologies. Referring next to FIG. 2, for example, the switch-mode power supply described with reference to FIG. 1 is realized by a switch-mode bias supply 206 that is utilized to apply power to the substrate 110 to effectuate one or more desired energies of the ions that bombard the substrate 110. Also shown are an ion energy control component 220, an arc detection component 222, and a controller 212 that is coupled to both the switch-mode bias supply 206 and a waveform memory 224.

The illustrated arrangement of these components is logical; thus the components can be combined or further separated in an actual implementation, and the components can be connected in a variety of ways without changing the basic operation of the system. In some embodiments for example, the controller 212, which may be realized by hardware, software, firmware, or a combination thereof, may be utilized to control both the power supply 202 and switch-mode bias supply 206. In alternative embodiments, however, the power supply 202 and the switch-mode bias supply 206 are realized by completely separated functional units. By way of further example, the controller 212, waveform memory 224, ion energy control portion 220 and the switch-mode bias supply 206 may be integrated into a single component (e.g., residing in a common housing) or may be distributed among discrete components.

The switch-mode bias supply 206 in this embodiment is generally configured to apply a voltage to the support 208 in a controllable manner so as to effectuate a desired (or defined) distribution of the energies of ions bombarding the surface of the substrate. More specifically, the switch-mode bias supply 206 is configured to effectuate the desired (or defined) distribution of ion energies by applying one or more particular waveforms at particular power levels to the substrate. And more particularly, responsive to an input from the ion energy control portion 220, the switch-mode bias supply 206 applies particular power levels to effectuate particular ion energies, and applies the particular power levels using one or more voltage waveforms defined by waveform data in the waveform memory 224. As a consequence, one or more particular ion bombardment energies may be selected with the ion control portion to carry out controlled etching of the substrate (or other forms of plasma processing).

As depicted, the switch-mode power supply 206 includes switch components 226', 226" (e.g., high power field effect transistors) that are adapted to switch power to the support 208 of the substrate 210 responsive to drive signals from corresponding drive components 228', 228". And the drive signals 230', 230" that are generated by the drive components 228', 228" are controlled by the controller 212 based upon timing that is defined by the content of the waveform memory 224. For example, the controller 212 in many embodiments is adapted to interpret the content of the waveform memory and generate drive-control signals 232', 232", which are utilized by the drive components 228', 228" to control the drive signals 230', 230" to the switching components 226', 226". Although two switch components 226', 226", which may be arranged in a half-bridge configuration (or full-bridge), are depicted for exemplary purposes, it is certainly contemplated that fewer or additional switch components may be implemented in a variety of architectures (e.g., an H-bridge configuration).

In many modes of operation, the controller 212 (e.g., using the waveform data) modulates the timing of the drive-control signals 232', 232" to effectuate a desired waveform at the support 208 of the substrate 210. In addition, the switch mode bias supply 206 is adapted to supply power to the substrate 210 based upon an ion-energy control signal 234, which may be a DC signal or a time-varying waveform. Thus, the present embodiment enables control of ion distribution energies by controlling timing signals to the switching components and controlling the power (controlled by the ion-energy control component 220) that is applied by the switching components 226', 226".

In addition, the controller 212 in this embodiment is configured, responsive to an arc in the plasma chamber 204 being detected by the arc detection component 222, to carry out arc management functions. In some embodiments, when an arc is detected the controller 212 alters the drive-control signals 232', 232" so that the waveform applied at the output 236 of the switch mode bias supply 206 extinguishes arcs in the plasma 214. In other embodiments, the controller 212 extinguishes arcs by simply interrupting the application of drive-control signals 232', 232" so that the application of power at the output 236 of the switch-mode bias supply 206 is interrupted.

Figure 3:
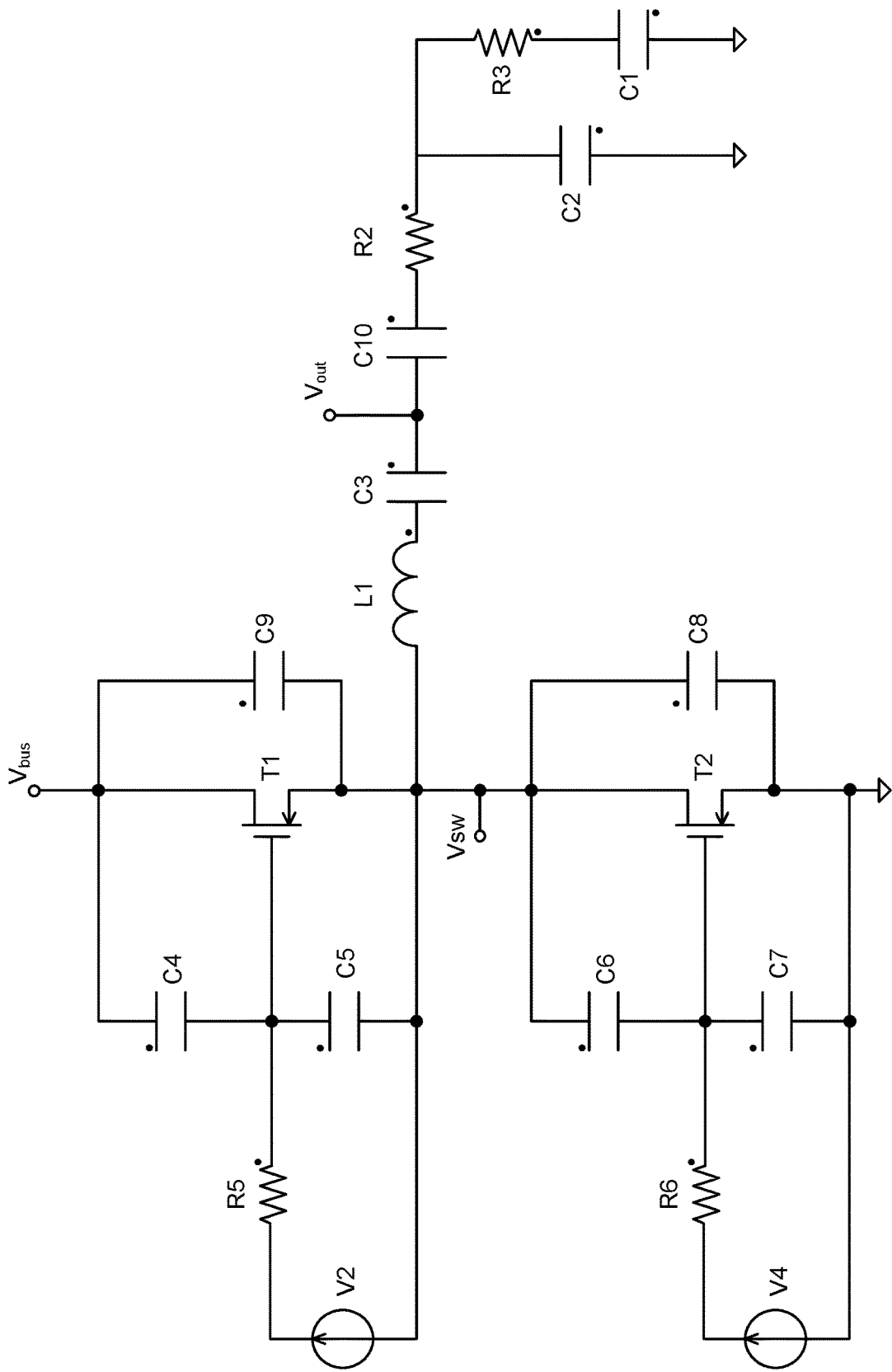
FIG. 3 is a schematic representation of components that may be utilized to realize the switch-mode bias supply described with reference to FIG. 2.

Referring next to FIG. 3, it is a schematic representation of components that may be utilized to realize the switch-mode bias supply 206 described with reference to FIG. 2. As shown, the switching components T1 and T2 in this embodiment are arranged in a half-bridge (also referred to as or totem pole) type topology (although a full-bridge configuration is also possible without departing from the spirit of this disclosure). Collectively, R2, R3, C1, and C2 represent a plasma load, C10 is an effective capacitance (also referred to herein as a series capacitance or a chuck capacitance), and C3 is an optional physical capacitor to prevent DC current from the voltage induced on the surface of the substrate or from the voltage of an electrostatic chuck (not shown) from flowing through the circuit. C10 is referred to as the effective capacitance because it includes the series capacitance (or also referred to as a chuck capacitance) of the substrate support and the electrostatic chuck (or e-chuck) as well as other capacitances inherent to the application of a bias such as the insulation and substrate. As depicted, L1 is stray inductance (e.g., the natural inductance of the conductor that feeds the power to the load). And in this embodiment, there are three inputs: Vbus, V2, and V4.

V2 and V4 represent drive signals (e.g., the drive signals 230', 230" output by the drive components 228', 228" described with reference to FIG. 2), and in this embodiment, V2 and V4 can be timed (e.g., the length of the switch pulse and/or the mutual delay) so that the closure of T1 and T2 may be modulated to control the shape of the voltage output $V_{out}$, which is applied to the substrate support. In many implementations, the transistors used to realize the switching components T1 and T2 are not ideal switches, so to arrive at a desired waveform, the transistor-specific characteristics are taken into consideration. In many modes of operation, simply changing the timing of V2 and V4 enables a desired waveform to be applied at $V_{out}$.

Figure 61:
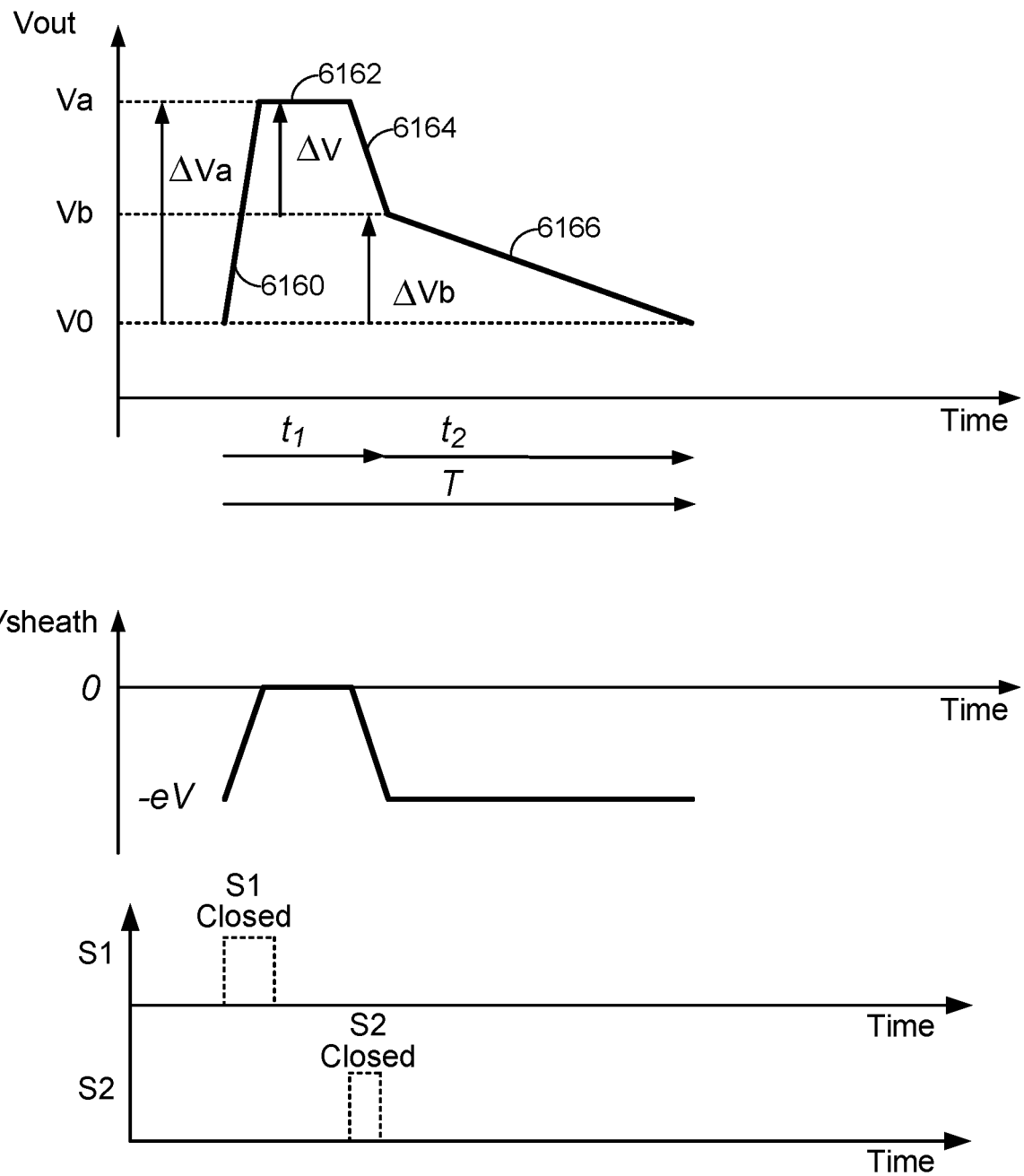
FIG. 61 includes a graph of a voltage waveform output from a bias supply; a graph of a corresponding sheath voltage; and a corresponding switch-timing diagram.
Figure 62:
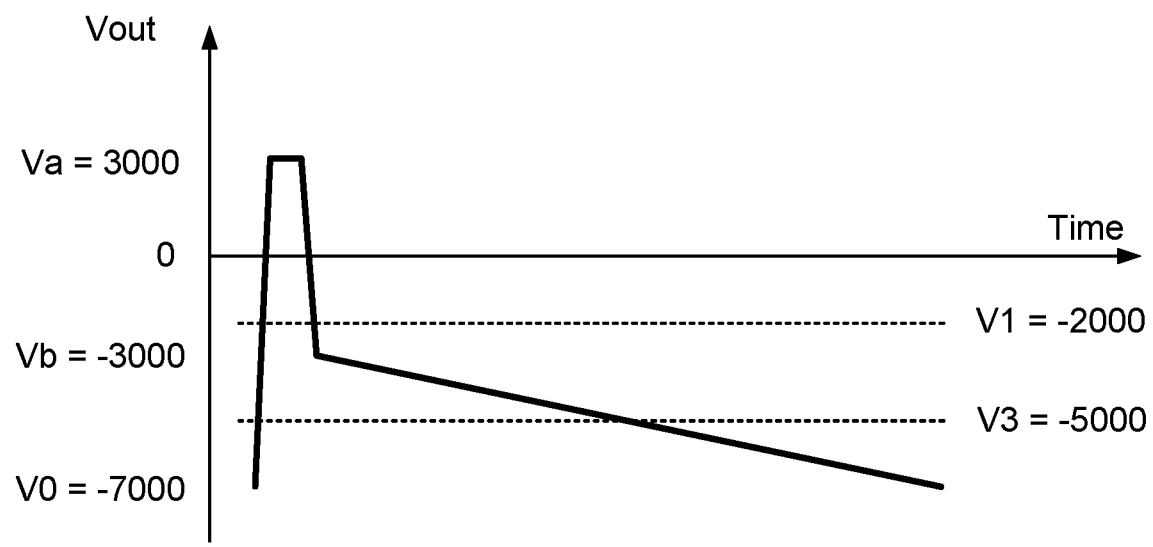
FIG. 62 is a graph depicting an exemplary bias supply waveform and exemplary voltage values.

For example, the switches T1, T2 may be operated so that the voltage at the surface of the substrate 110, 210 is generally negative with periodic voltage reversals approaching and/or slightly exceeding a positive voltage reference. The value of the voltage at the surface of the substrate 110, 210 is what defines the energy of the ions, which may be characterized in terms of an ion energy distribution function (IEDF). To effectuate desired voltage(s) at the surface of the substrate 110, 210, the waveform portions at $V_{out}$ may be generally rectangular (or having ramping sides as shown in FIGS. 61-62) and have a width that is long enough to induce a brief positive voltage at the surface of the substrate 110, 210 so as to attract enough electrons to the surface of the substrate 110, 210 in order to achieve the desired voltage(s) and corresponding ion energies.

The periodic voltage reversals that approach and/or slightly exceed the positive voltage reference may have a minimum time limited by the switching abilities of the switches T1, T2. The generally negative portions of the voltage can extend so long as the voltage does not build to a level that damages the switches. In some embodiments, the length of the negative portions of the voltage may be chosen based on the sheath transit time of the ions.

Vbus in this embodiment defines the amplitude of measured $V_{out}$, of the waveform portion which defines the voltage at the surface of the substrate, and as a consequence, the ion energy. Referring briefly again to FIG. 2, Vbus may be coupled to the ion energy control portion, which may be realized by a DC power supply that is adapted to apply a DC signal or a time-varying waveform to Vbus.

Figure 4:
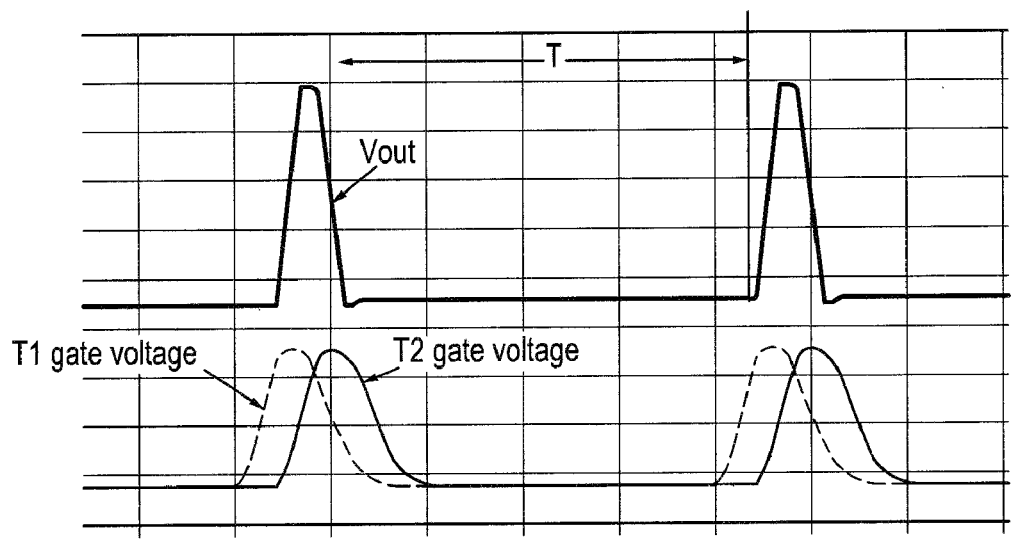
FIG. 4 is a timing diagram depicting two drive signal waveforms.

The switching pulse width, switch pulse shape, and/or mutual delay of the two signals V2, V4 may be modulated to arrive at a desired waveform at $V_{out}$ (also referred to herein as a modified periodic voltage function), and the voltage applied to Vbus may affect the characteristics of the switch pulses. In other words, the voltage Vbus may affect the switch pulse width, switch pulse shape and/or the relative phase of the signals V2, V4. Referring briefly to FIG. 4, for example, shown is a timing diagram depicting two drive signal waveforms that may be applied to T1 and T2 (as V2 and V4) so as to generate the period voltage function at $V_{out}$ as depicted in FIG. 4. To modulate the shape of the waveform portions at $V_{out}$ (e.g. to achieve the smallest time for the switch pulse at $V_{out}$, yet reach a peak value of the voltage waveform) the timing of the two gate drive signals V2, V4 may be controlled.

For example, the two gate drive signals V2, V4 may be applied to the switching components T1, T2 so the time that each of the switch pulses is applied at $V_{out}$ may be short compared to the time T between switch pulses, but long enough to induce a positive voltage at the surface of the substrate 110, 210 to attract electrons to the surface of the substrate 110, 210. Moreover, it has been found that by changing the gate voltage level between the switch pulses, it is possible to control the slope of the voltage that is applied to $V_{out}$ between the waveform portions (e.g., to achieve a sustained or substantially constant voltage at the surface of the substrate between voltage reversals). In some modes of operation, the repetition rate of the gate pulses is about 400 kHz, but this rate may certainly vary from application to application. The waveform portions can be defined as the rising portions between flat voltage regions in FIGS. 9b and 10b for instance, or the portion during $t_1$ in FIG. 14 (the waveform portion includes the first, second, and third portions 1402, 1404, and 1406 in FIG. 14), or the portion during $t_1$ in FIG. 61 (the waveform portion includes the first, second, and third portions 6160, 6162, and 6164 in FIG. 61).

Although not required, in practice, based upon modeling and refining upon actual implementation, waveforms that may be used to generate the desired (or defined) ion energy distributions may be defined, and the waveforms can be stored (e.g., in the waveform memory portion described with reference to FIG. 1 as a sequence of voltage levels). In addition, in many implementations, the waveforms can be generated directly (e.g., without feedback from $V_{out}$); thus avoiding the undesirable aspects of a feedback control system (e.g., settling time).

Figure 5:
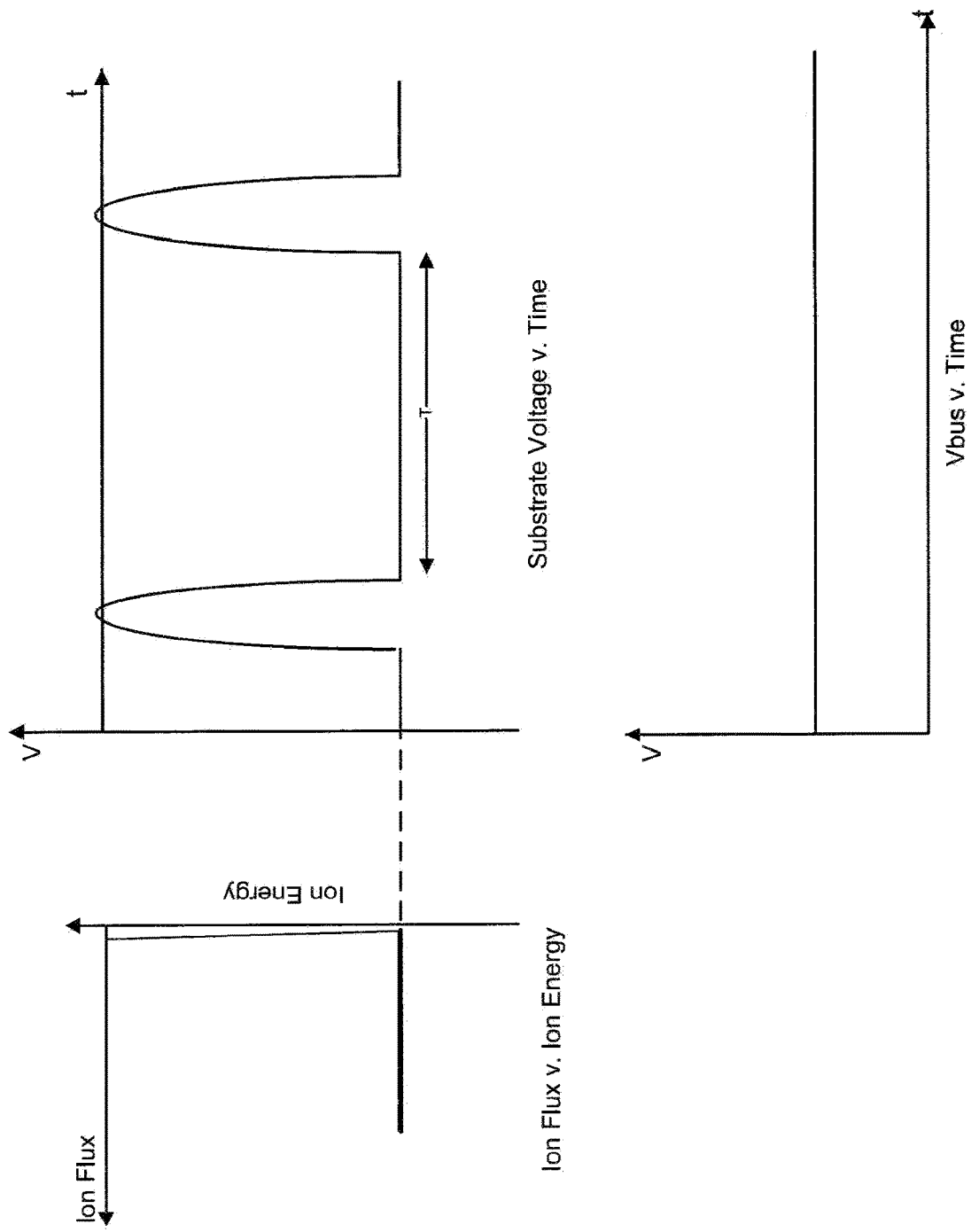
FIG. 5 is a graphical representation of a single mode of operating the switch mode bias supply, which effectuates an ion energy distribution that is concentrated at a particular ion energy.

Referring again to FIG. 3, Vbus can be modulated to control the energy of the ions, and the stored waveforms may be used to control the gate drive signals V2, V4 to achieve a desired waveform amplitude at $V_{out}$ while minimizing the switch pulse width. Again, this is done in accordance with the particular characteristics of the transistors, which may be modeled or implemented and empirically established. Referring to FIG. 5, for example, shown are graphs depicting Vbus versus time, voltage at the surface of the substrate 110, 210 versus time, and the corresponding ion energy distribution.

The graphs in FIG. 5 depict a single mode of operating the switch mode bias supply 106, 206, which effectuates an ion energy distribution that is concentrated at a particular ion energy. As depicted, to effectuate the single concentration of ion energies in this example, the voltage applied at Vbus is maintained constant while the voltages applied to V2 and V4 are controlled (e.g., using the drive signals depicted in FIG. 3) so as to generate pulses at the output of the switch-mode bias supply 106, 206, which effectuates the corresponding ion energy distribution shown in FIG. 5.

As depicted in FIG. 5, the potential at the surface of the substrate 110, 210 is generally negative to attract the ions that bombard and etch the surface of the substrate 110, 210. The periodic short pulses that are applied to the substrate 110, 210 (by applying pulses to $V_{out}$) have a magnitude defined by the potential that is applied to Vbus, and these pulses cause a brief change in the potential of the substrate 110, 210 (e.g., close to positive or slightly positive potential), which attracts electrons to the surface of the substrate to achieve the generally negative potential along the surface of the substrate 110, 210. As depicted in FIG. 5, the constant voltage applied to Vbus effectuates a single concentration of ion flux at particular ion energy; thus a particular ion bombardment energy may be selected by simply setting Vbus to a particular potential. In other modes of operation, two or more separate concentrations of ion energies may be created (e.g., see FIG. 49).

One of skill in the art will recognize that the power supply need not be limited to a switch-mode power supply, and as such the output of the power supply can also be controlled in order to effect a certain ion energy. As such, the output of the power supply, whether switch-mode or otherwise, when considered without being combined with an ion current compensation or an ion current, can also be referred to as a power supply voltage, $V_{PS}$. This power supply voltage, $V_{PS}$, is also equal to the voltage drop, $\Delta V$, in FIGS. 14 and 61.

Figure 6:
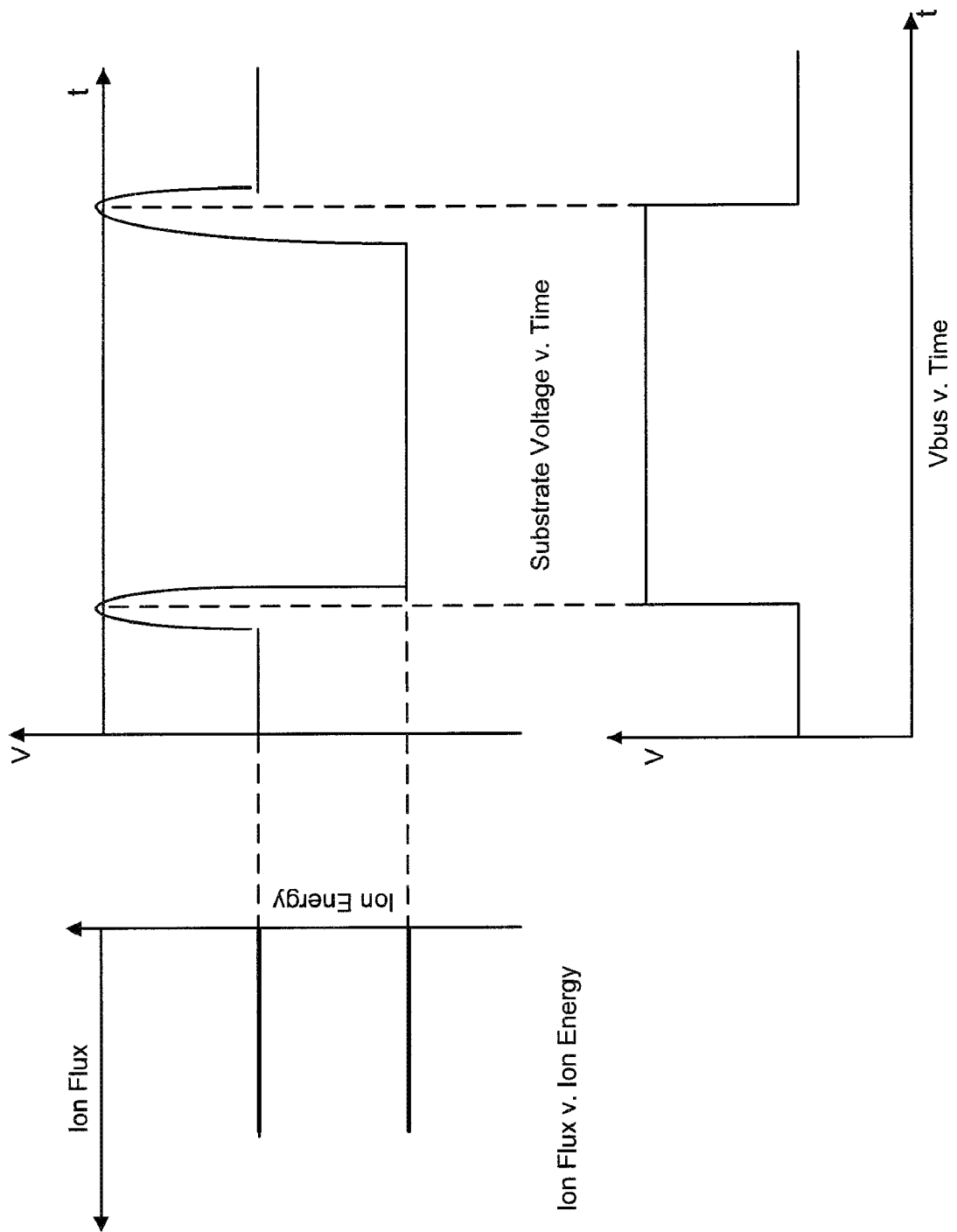
FIG. 6 are graphs depicting a bi-modal mode of operation in which two separate peaks in ion energy distribution are generated.

Referring next to FIG. 6, for example, shown are graphs depicting a bi-modal mode of operation in which two separate peaks in ion energy distribution are generated. As shown, in this mode of operation, the substrate experiences two distinct levels of voltages and periodic pulses, and as a consequence, two separate concentrations of ion energies are created. As depicted, to effectuate the two distinct ion energy concentrations, the voltage that is applied at Vbus alternates between two levels, and each level defines the energy level of the two ion energy concentrations.

Although FIG. 6 depicts the two voltages at the substrate 110, 210 as alternating after every pulse (e.g., FIG. 48), this is certainly not required. In other modes of operation for example, the voltages applied to V2 and V4 are switched (e.g., using the drive signals depicted in FIG. 3) relative to the voltage applied to $V_{out}$ so that the induced voltage at surface of the substrate alternates from a first voltage to a second voltage (and vice versa) after two or more pulses (e.g., FIG. 49).

In prior art techniques, attempts have been made to apply the combination of two waveforms (generated by waveform generators) to a linear amplifier and apply the amplified combination of the two waveforms to the substrate in order to effectuate multiple ion energies. This approach, however, is much more complex than the approach described with reference to FIG. 6, and requires an expensive linear amplifier, and waveform generators.

Figure 7A:
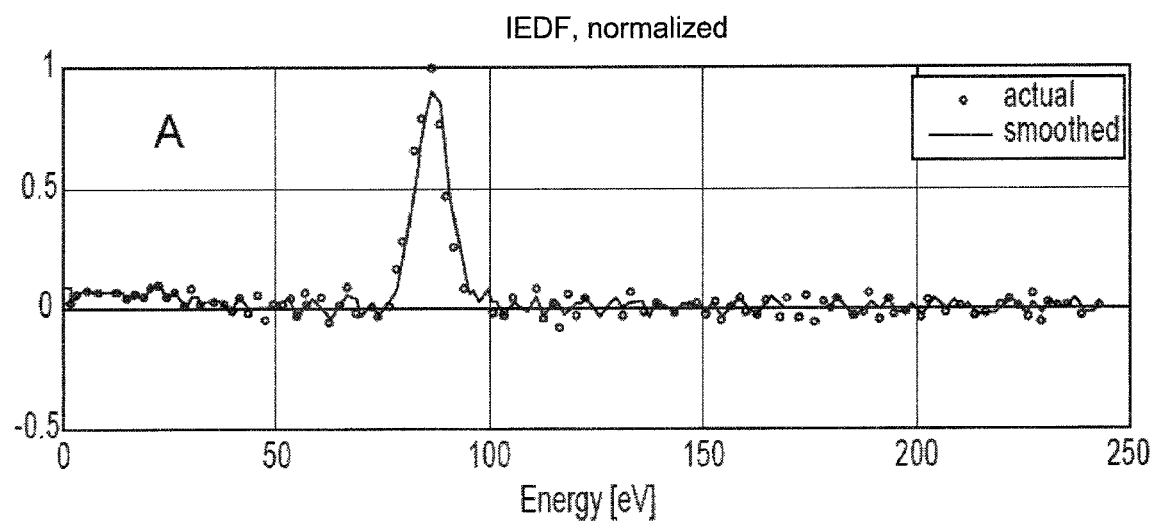
FIGS. 7A and 7B are is are graphs depicting actual, direct ion energy measurements made in a plasma.
Figure 7B:
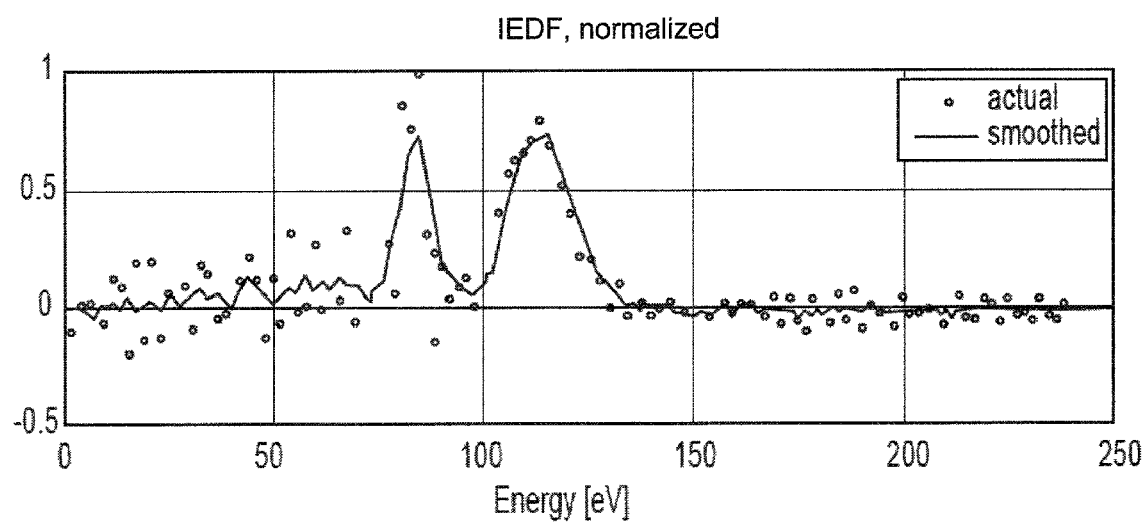

Referring next to FIGS. 7A and 7B, shown are graphs depicting actual, direct ion energy measurements made in a plasma corresponding to controllably narrow monoenergetic and dual-level regulation of the DC voltage applied to Vbus, respectively. As depicted in FIG. 7A, the ion energy distribution is concentrated around 80 eV responsive to a non-varying application of a voltage to Vbus (e.g., as depicted in FIG. 5). And in FIG. 7B, two separate concentrations of ion energies are present at around 85 eV and 115 eV responsive to a dual-level regulation of Vbus (e.g., as depicted in FIG. 6).

Figure 8:
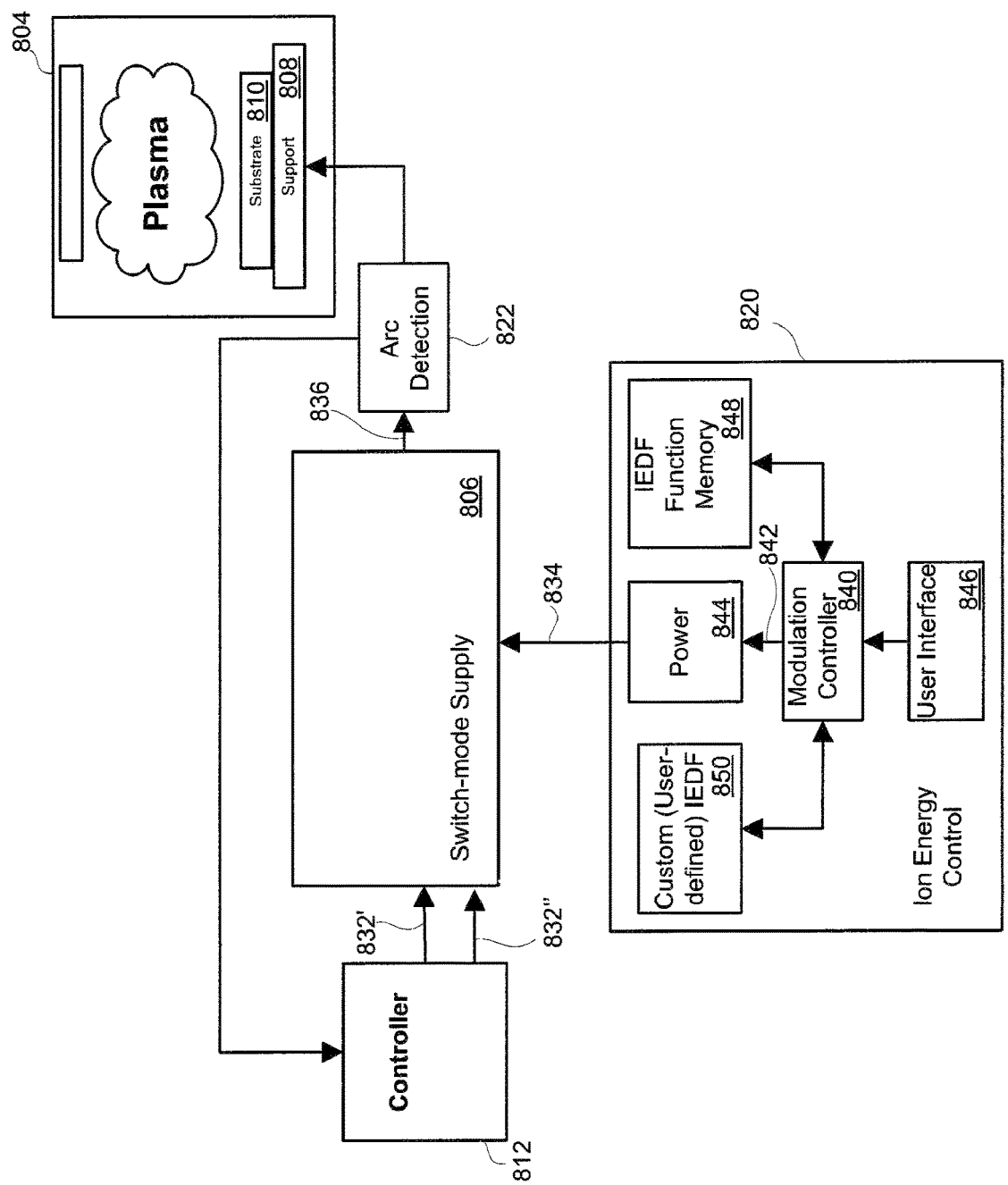
FIG. 8 is a block diagram depicting another embodiment of the present invention.

Referring next to FIG. 8, shown is a block diagram depicting another embodiment of the present invention. As depicted, a switch-mode power supply 806 is coupled to a controller 812, an ion-energy control component 820, and a substrate support 808 via an arc detection component 822. The controller 812, switch-mode supply 806, and ion energy control component 820 collectively operate to apply power to the substrate support 808 so as to effectuate, on a time-averaged basis, a desired (or defined) ion energy distribution at the surface of the substrate 810.

Figure 9A:
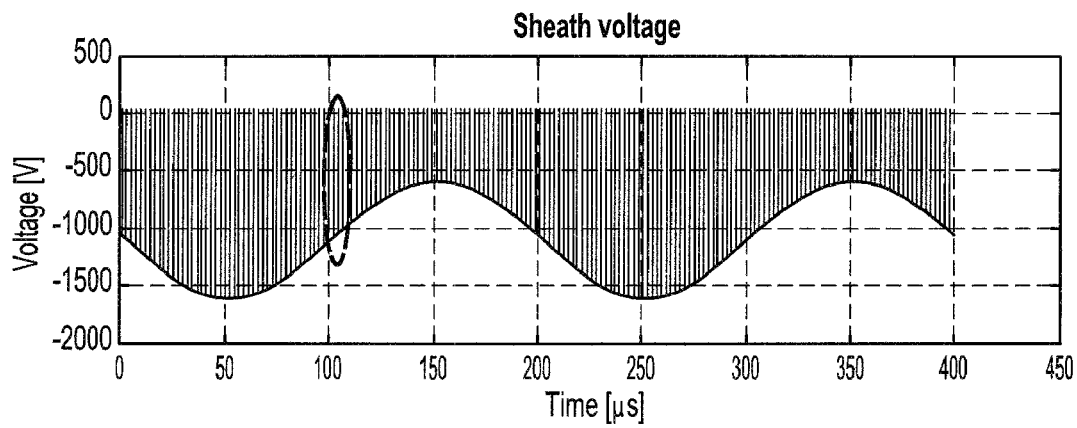
FIG. 9A is a graph depicting an exemplary periodic voltage function that is modulated by a sinusoidal modulating function.
Figure 9B:
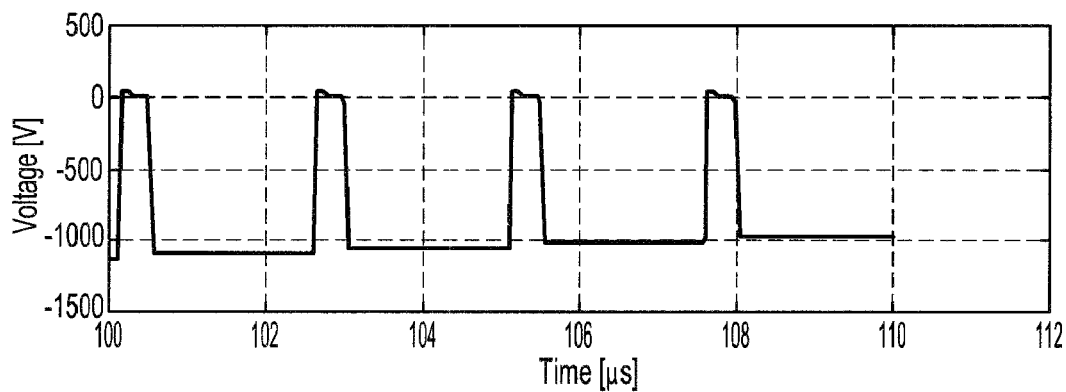
FIG. 9B is an exploded view of a portion of the periodic voltage function that is depicted in FIG. 9A.
Figure 9C:
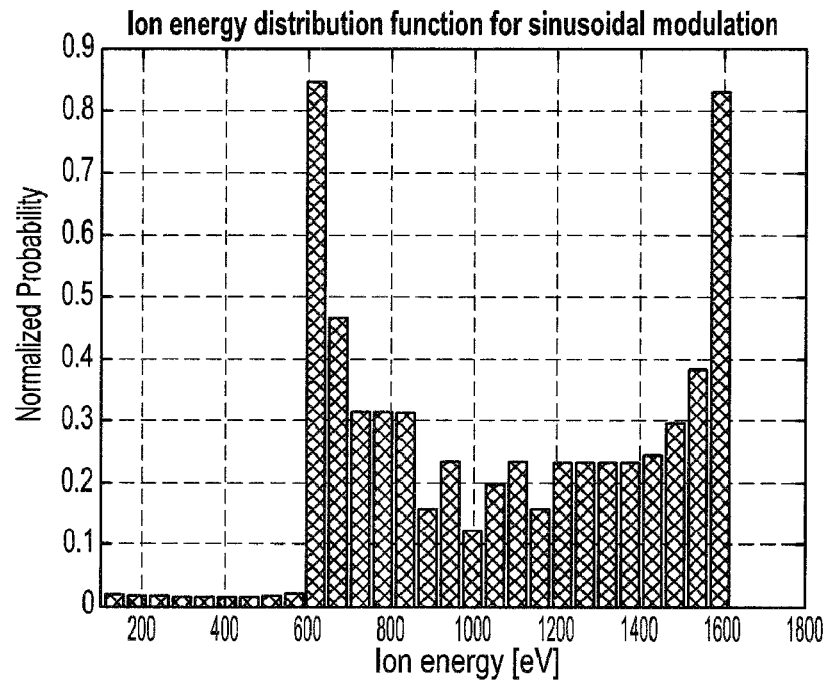
FIG. 9C depicts the resulting distribution of ion energies, on time-averaged basis, that results from the sinusoidal modulation of the periodic voltage function.
Figure 9D:
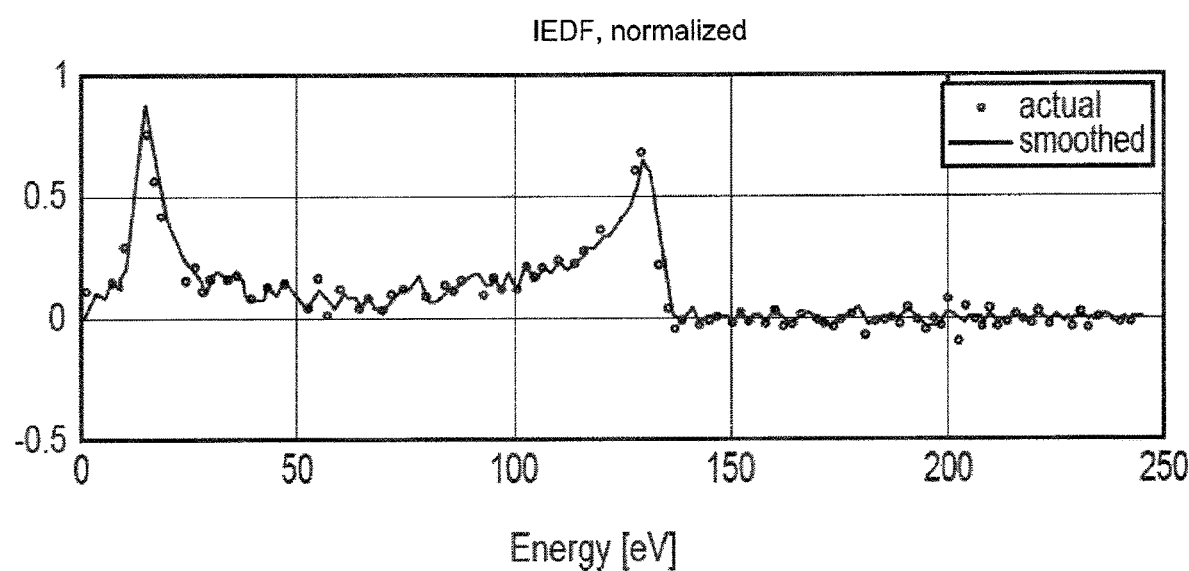
FIG. 9D depicts actual, direct, ion energy measurements made in a plasma of a resultant, time averaged, IEDF when a periodic voltage function is modulated by a sinusoidal modulating function.

Referring briefly to FIG. 9A for example, shown is a periodic voltage function with a frequency of about 400 kHz that is modulated by a sinusoidal modulating function of about 5 kHz over multiple cycles of the periodic voltage function. FIG. 9B is an exploded view of the portion of the periodic voltage function that is circled in FIG. 9A, and FIG. 9C depicts the resulting distribution of ion energies, on a time-averaged basis, that results from the sinusoidal modulation of the periodic voltage function. And FIG. 9D depicts actual, direct, ion energy measurements made in a plasma of a resultant, time-averaged, IEDF when a periodic voltage function is modulated by a sinusoidal modulating function. As discussed further herein, achieving a desired (or defined) ion energy distribution, on a time-averaged basis, may be achieved by simply changing the modulating function that is applied to the periodic voltage.

Figure 10A:
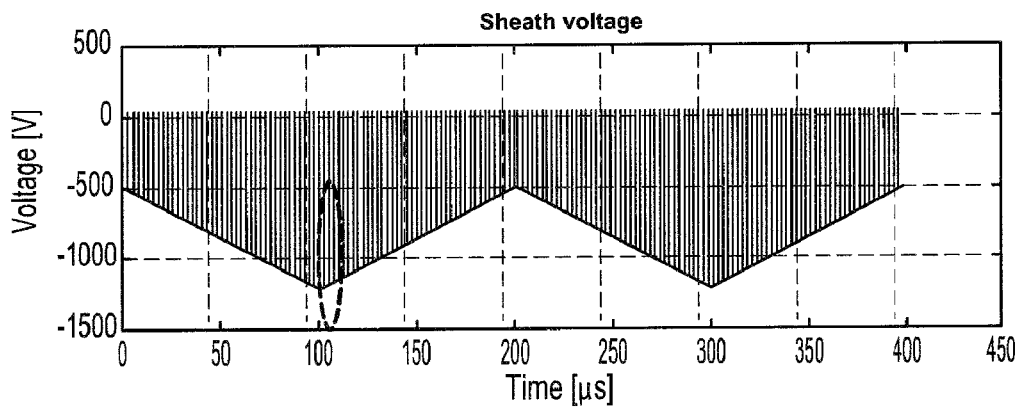
FIG. 10A depicts a periodic voltage function is modulated by a sawtooth modulating function.
Figure 10B:
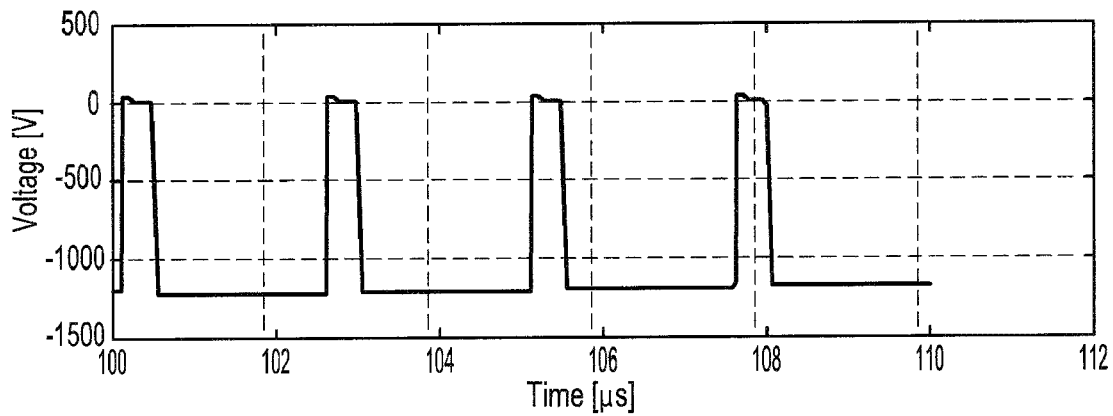
FIG. 10B is an exploded view of a portion of the periodic voltage function that is depicted in FIG. 10A.
Figure 10C:
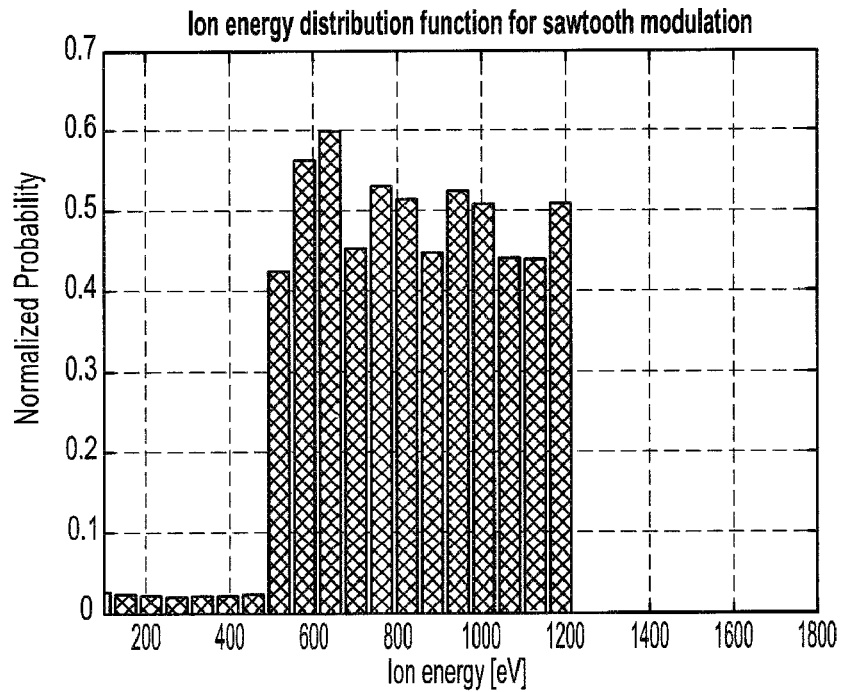
FIG. 10C is a graph depicting the resulting distribution of ion energies, on a time averaged basis, that results from the sinusoidal modulation of the periodic voltage function in FIGS. 10A and 10B.

Referring to FIGS. 10A and 10B as another example, a 400 kHz periodic voltage function is modulated by a sawtooth modulating function of approximately 5 kHz to arrive at the distribution of ion energies depicted in FIG. 10C on a time-averaged basis. As depicted, the periodic voltage function utilized in connection with FIG. 10 is the same as in FIG. 9, except that the periodic voltage function in FIG. 10 is modulated by a sawtooth function instead of a sinusoidal function.

It should be recognized that the ion energy distribution functions depicted in FIGS. 9C and 10C do not represent an instantaneous distribution of ion energies at the surface of the substrate 810, but instead represent the time average of the ion energies. With reference to FIG. 9C, for example, at a particular instant in time, the distribution of ion energies will be a subset of the depicted distribution of ion energies that exist over the course of a full cycle of the modulating function.

It should also be recognized that the modulating function need not be a fixed function nor need it be a fixed frequency. In some instances for example, it may be desirable to modulate the periodic voltage function with one or more cycles of a particular modulating function to effectuate a particular, time-averaged ion energy distribution, and then modulate the periodic voltage function with one or more cycles of another modulating function to effectuate another, time-averaged ion energy distribution. Such changes to the modulating function (which modulates the periodic voltage function) may be beneficial in many instances. For example, if a particular distribution of ion energies is needed to etch a particular geometric construct or to etch through a particular material, a first modulating function may be used, and then another modulating function may subsequently be used to effectuate a different etch geometry or to etch through another material.

Similarly, the periodic voltage function (e.g., the 400 kHz components in FIGS. 9A, 9B, 10A, and 10B and $V_{out}$ in FIG. 4) need not be rigidly fixed (e.g., the shape and frequency of the periodic voltage function may vary); in some embodiments the frequency may be established by the transit time of ions through the sheath so the acceleration of ions is affected by the voltage applied to the substrate 810 in a desirable manner.

Referring back to FIG. 8, the controller 812 provides drive-control signals 832', 832" to the switch-mode supply 806 so that the switch-mode supply 806 generates a periodic voltage function. The switch mode supply 806 may be realized by the components depicted in FIG. 3 (e.g., to create a periodic voltage function depicted in FIG. 4), but it is certainly contemplated that other switching architectures may be utilized.

In general, the ion energy control component 820 functions to apply a modulating function to the periodic voltage function (that is generated by the controller 812 in connection with the switch mode power supply 806). As shown in FIG. 8, the ion energy control component 820 includes a modulation controller 840 that is in communication with a custom IEDF portion 850, an IEDF function memory 848, a user interface 846, and a power component 844. It should be recognized that the depiction of these components is intended to convey functional components, which in reality, may be effectuated by common or disparate components.

The modulation controller 840 in this embodiment generally controls the power component 844 (and hence its output 834) based upon data that defines a modulation function, and the power component 844 generates the modulation function 834 (based upon a control signal 842 from the modulation controller 840) that is applied to the periodic voltage function that is generated by the switch-mode supply 806. The user interface 846 in this embodiment is configured to enable a user to select a predefined IEDF function that is stored in the IEDF function memory 848, or in connection with the custom IEDF component 850, define a custom IEDF In many implementations, the power component 844 includes a DC power supply (e.g., a DC switch mode power supply or a linear amplifier), which applies the modulating function (e.g. a varying DC voltage) to the switch mode power supply (e.g., to Vbus of the switch mode power supply depicted in FIG. 3). In these implementations, the modulation controller 840 controls the voltage level that is output by the power component 844 so that the power component 844 applies a voltage that conforms to the modulating function.

Figure 11:
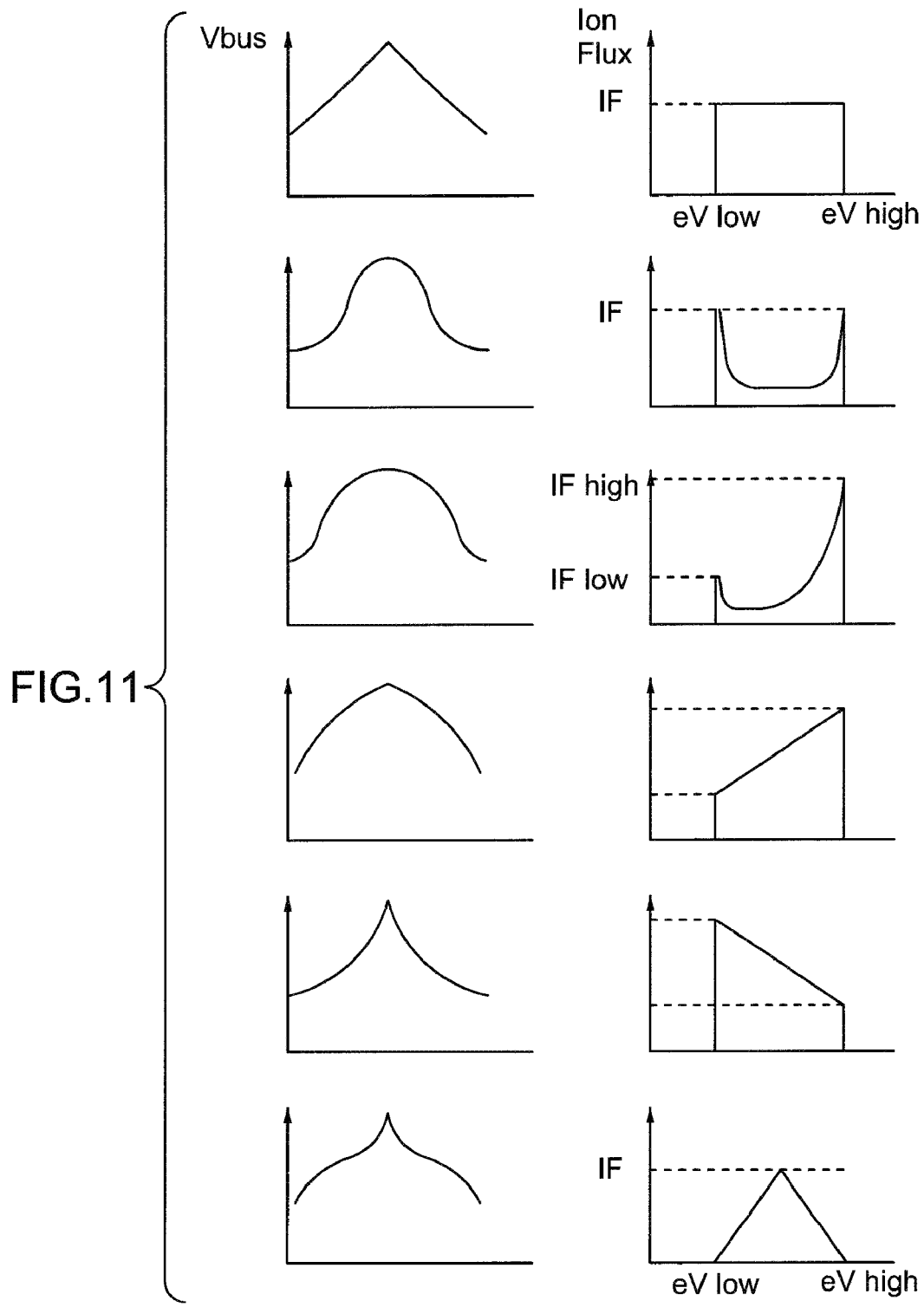
FIG. 11 are graphs showing IEDF functions in the right column and associated modulating functions in the left column.

In some implementations, the IEDF function memory 848 includes a plurality of data sets that correspond to each of a plurality of IEDF distribution functions, and the user interface 846 enables a user to select a desired (or defined) IEDF function. Referring to FIG. 11 for example, shown in the right column are exemplary IEDF functions that may be available for a user to select. And the left column depicts the associated modulating function that the modulation controller 840 in connection with the power component 844 would apply to the periodic voltage function to effectuate the corresponding IEDF function. It should be recognized that the IEDF functions depicted in FIG. 11 are only exemplary and that other IEDF functions may be available for selection.

The custom IEDF component 850 generally functions to enable a user, via the user interface 846, to define a desired (or defined) ion energy distribution function. In some implementations for example, the custom IEDF component 850 enables a user to establish values for particular parameters that define a distribution of ion energies.

For example, the custom IEDF component 850 may enable IEDF functions to be defined in terms of a relative level of flux (e.g., in terms of a percentage of flux) at a high-level (IF-high), a mid-level (IF-mid), and a low level (IF-low) in connection with a function(s) that defines the IEDF between these energy levels. In many instances, only IF-high, IF-low, and the IEDF function between these levels is sufficient to define an IEDF function. As a specific example, a user may request 1200 eV at a 20% contribution level (contribution to the overall IEDF), 700 eV at a 30% contribution level with a sinusoid IEDF between these two levels.

It is also contemplated that the custom IEDF portion 850 may enable a user to populate a table with a listing of one or more (e.g., multiple) energy levels and the corresponding percentage contribution of each energy level to the IEDF. And in yet alternative embodiments, it is contemplated that the custom IEDF component 850 in connection with the user interface 846 enables a user to graphically generate a desired (or defined) IEDF by presenting the user with a graphical tool that enables a user to draw a desired (or defined) IEDF.

In addition, it is also contemplated that the IEDF function memory 848 and the custom IEDF component 850 may interoperate to enable a user to select a predefined IEDF function and then alter the predefined IEDF function so as to produce a custom IEDF function that is derived from the predefined IEDF function.

Once an IEDF function is defined, the modulation controller 840 translates data that defines the desired (or defined) IEDF function into a control signal 842, which controls the power component 844 so that the power component 844 effectuates the modulation function that corresponds to the desired (or defined) IEDF. For example, the control signal 842 controls the power component 844 so that the power component 844 outputs a voltage that is defined by the modulating function.

Figure 12:
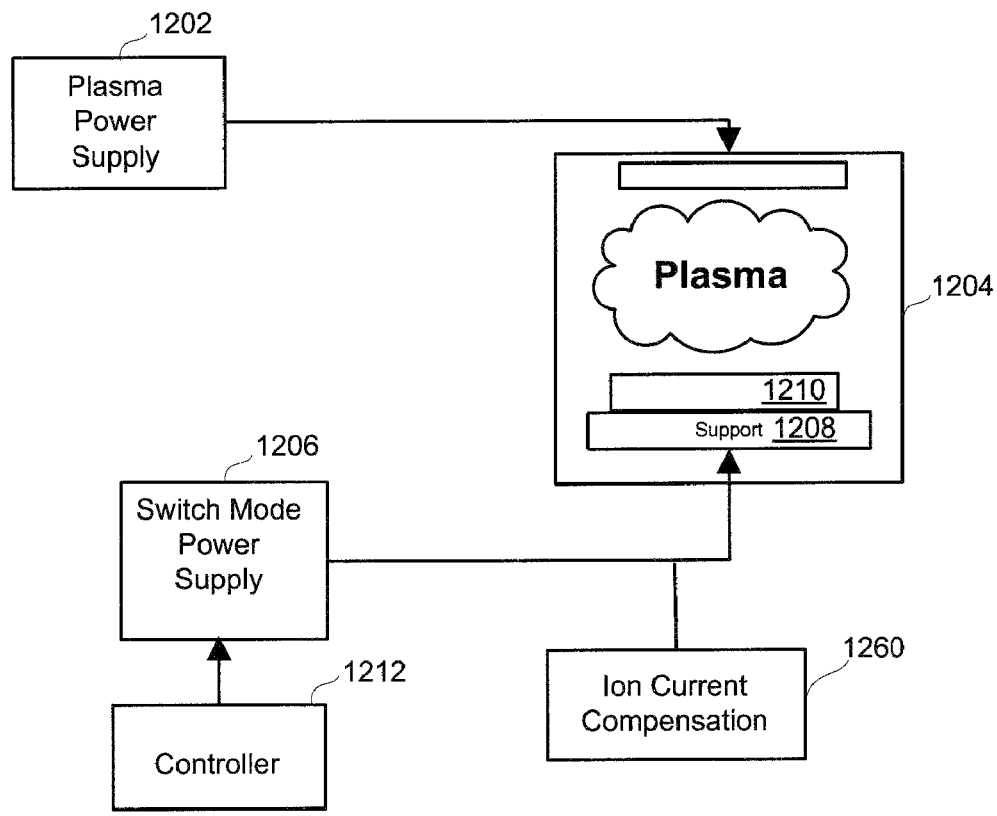
FIG. 12 is a block diagram depicting an embodiment in which an ion current compensation component compensates for ion current in a plasma chamber.
Figure 15A:
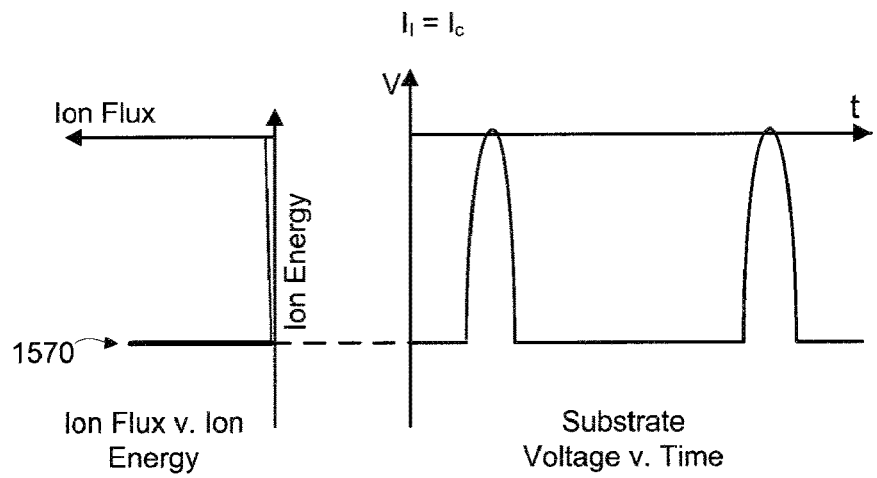
FIGS. 15A-15C are voltage waveforms as appearing at the surface of the substrate or wafer responsive to compensation current.
Figure 15B:
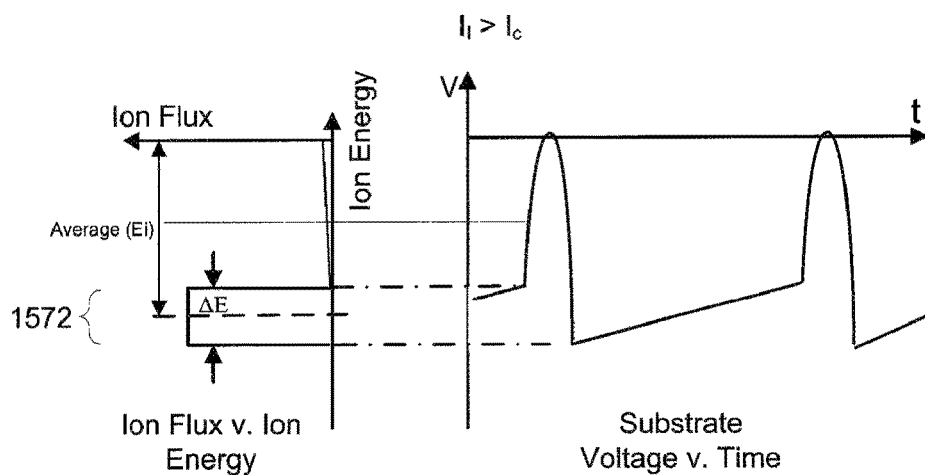
Figure 15C:
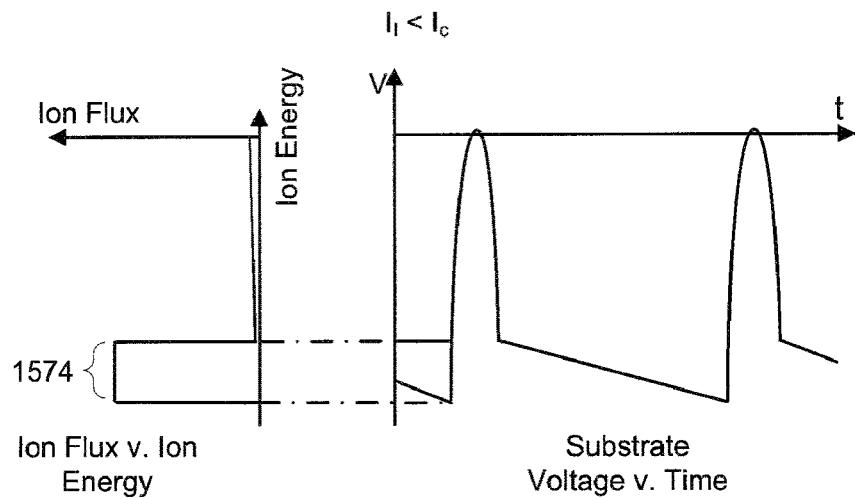

Referring next to FIG. 12, it is a block diagram depicting an embodiment in which an ion current compensation component 1260 compensates for ion current in the plasma chamber 1204. Applicants have found that, at higher energy levels, higher levels of ion current within the chamber affect the voltage at the surface of the substrate, and as a consequence, the ion energy distribution is also affected. Referring briefly to FIGS. 15A-15C for example, shown are voltage waveforms as they appear at the surface of the substrate 1210 or wafer and their relationship to IEDF.

More specifically, FIG. 15A depicts a periodic voltage function at the surface of the substrate 1210 when ion current $I_I$ is equal to compensation current Ic; FIG. 15B depicts the voltage waveform at the surface of the substrate 1210 when ion current $I_i$ is greater than the compensation current Ic; and FIG. 15C depicts the voltage waveform at the surface of the substrate when ion current is less than the compensation current Ic.

As depicted in FIG. 15A, when $I_I$=Ic a spread of ion energies 1470 is relatively narrow as compared to a uniform spread 1472 of ion energies when $I_I$>Ic as depicted in FIG. 15B or a uniform spread 1474 of ion energies when $I_I$<Ic as depicted in FIG. 15C. Thus, the ion current compensation component 1260 enables a narrow spread of ion energies when the ion current is high (e.g., by compensating for effects of ion current), and it also enables a width of the spread 1572, 1574 of uniform ion energy to be controlled (e.g., when it is desirable to have a spread of ion energies).

As depicted in FIG. 15B, without ion current compensation (when $I_I$>Ic) the voltage at the surface of the substrate, between the positive portions of the periodic voltage function, becomes less negative in a ramp-like manner, which produces a broader spread 1572 of ion energies. Similarly, when ion current compensation is utilized to increase a level of compensation current to a level that exceeds the ion current ($I_I$<Ic) as depicted in FIG. 15C, the voltage at the surface of the substrate becomes more negative in a ramp-like manner between the positive portions of the periodic voltage function, and a broader spread 1574 of uniform ion energies is produced.

Figure 13:
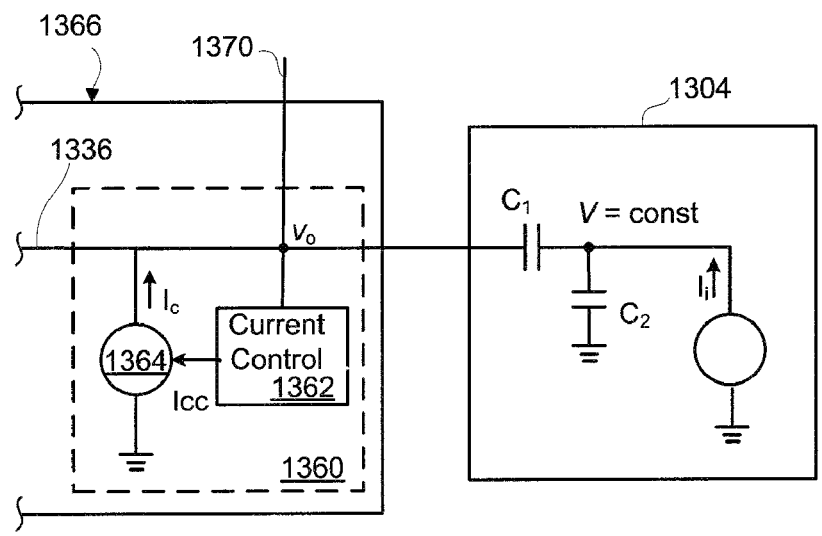
FIG. 13 is a diagram depicting an exemplary ion current compensation component.

Referring back to FIG. 12, the ion current compensation component 1260 may be realized as a separate accessory that may optionally be added to the switch mode power supply 1206 and controller 1212. In other embodiments, (e.g., as depicted in FIG. 13) the ion current compensation component 1260 may share a common housing 1366 with other components described herein (e.g., the switch-mode power supply 106, 206, 806, 1206 and ion energy control 220, 820 components). In this embodiment, the periodic voltage function provided to the plasma chamber 1204 can be referred to as a modified periodic voltage function since it comprises the periodic voltage function modified by the ion current compensation from ion current compensation component 1260. The controller 1212 can sample a voltage at different times at an electrical node where outputs of the switch mode power supply 1206 and the ion current compensation 1260 combine.

As depicted in FIG. 13, shown is an exemplary ion current compensation component 1360 that includes a current source 1364 coupled to an output 1336 of a switch mode supply and a current controller 1362 that is coupled to both the current source 1364 and the output 1336. Also depicted in FIG. 13 is a plasma chamber 1304, and within the plasma chamber are capacitive elements $C_1$, $C_2$, and ion current $I_I$. As depicted, $C_1$ represents the inherent capacitance (also referred to herein as effective capacitance) of components associated with the chamber 1304, which may include, but is not limited to, insulation, the substrate, substrate support, and an e-chuck, and $C_2$ represents sheath capacitance and stray capacitances. In this embodiment, the periodic voltage function provided to the plasma chamber 1304, and measurable at $V_{out}$, can be referred to as a modified periodic voltage function since it comprises the periodic voltage function modified by the ion current compensation, Ic.

The sheath (also herein referred to as a plasma sheath) is a layer in a plasma near the substrate surface and possibly walls of the plasma processing chamber with a high density of positive ions and thus an overall excess of positive charge. The surface with which the sheath is in contact with typically has a preponderance of negative charge. The sheath arises by virtue of the faster velocity of electrons than positive ions thus causing a greater proportion of electrons to reach the substrate surface or walls, thus leaving the sheath depleted of electrons. The sheath thickness, $\lambda_{sheath}$, is a function of plasma characteristics such as plasma density and plasma temperature.

It should be noted that because $C_1$ in this embodiment is an inherent (also referred to herein as effective) capacitance of components associated with the chamber 1304, it is not an accessible capacitance that is added to gain control of processing. For example, some prior art approaches that utilize a linear amplifier couple bias power to the substrate with a blocking capacitor, and then utilize a monitored voltage across the blocking capacitor as feedback to control their linear amplifier. Although a capacitor could couple a switch mode power supply to a substrate support in many of the embodiments disclosed herein, it is unnecessary to do so because feedback control using a blocking capacitor is not required in several embodiments of the present invention.

Figure 14:
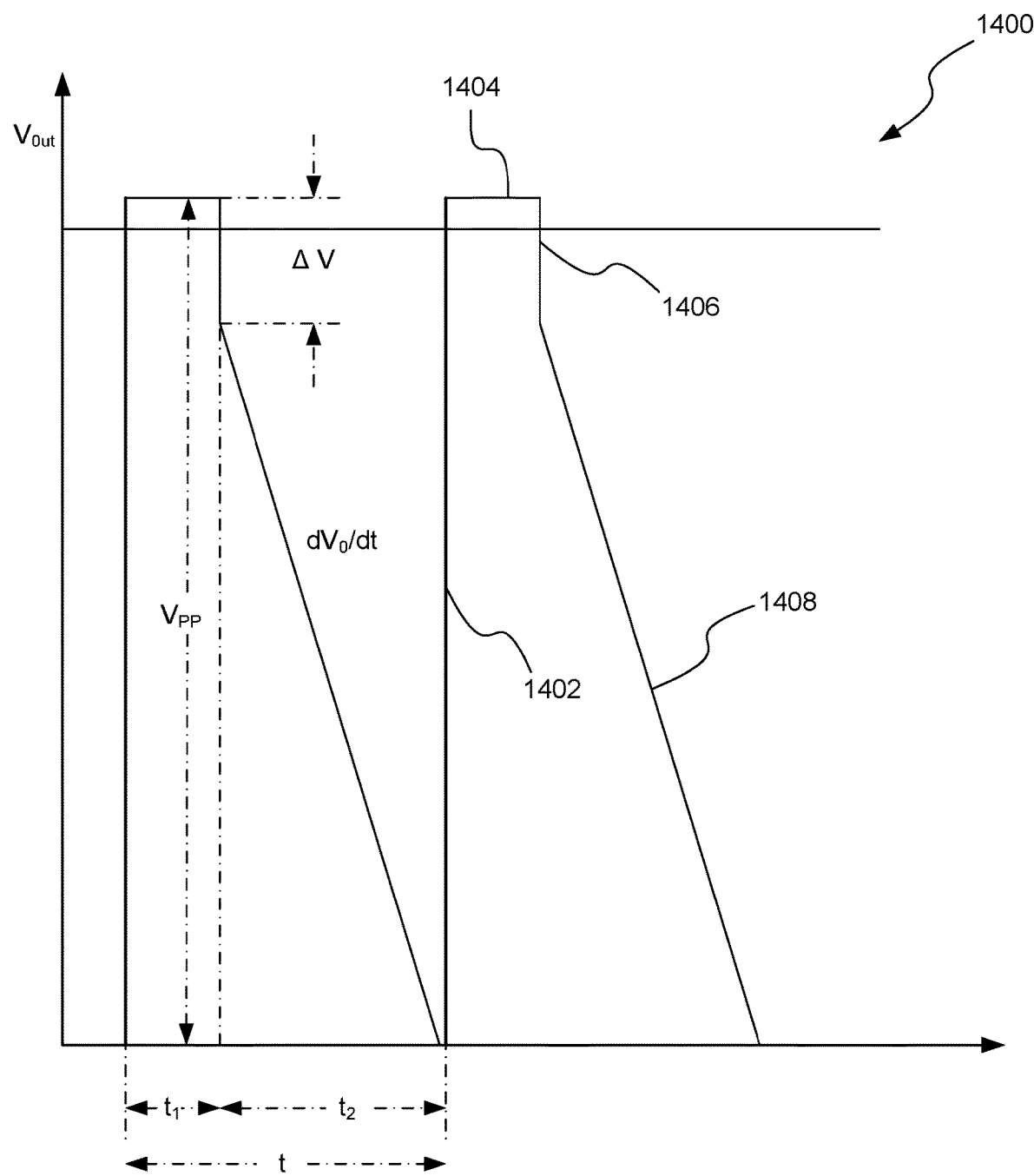
FIG. 14 is a graph depicting an exemplary voltage at node $V_{out}$ depicted in FIG. 13.

While referring to FIG. 13, simultaneous reference is made to FIG. 14, which is a graph depicting an exemplary voltage (e.g., the modified periodic voltage function) at $V_{out}$ depicted in FIG. 13. In operation, the current controller 1362 monitors the voltage at $V_{out}$, and ion current is calculated over an interval t (depicted in FIG. 14) as:

$$I_I = C_1 \frac{dV_0}{dt} \quad \text{(Equation 1)}$$

Ion current, $I_I$, and inherent capacitance (also referred to as effective capacitance), $C_1$, can either or both be time varying. Because $C_1$ is substantially constant for a given tool and is measurable, only $V_{out}$ needs to be monitored to enable ongoing control of compensation current. As discussed above, to obtain a more mono-energetic distribution of ion energy (e.g., as depicted in FIG. 15A) the current controller controls the current source 1364 so that Ic is substantially the same as $I_I$ (or in the alternative, related according to Equation 2). In this way, a narrow spread of ion energies may be maintained even when the ion current reaches a level that affects the voltage at the surface of the substrate. And in addition, if desired, the spread of the ion energy may be controlled as depicted in FIGS. 15B and 15C so that additional ion energies are realized at the surface of the substrate.

Also depicted in FIG. 13 is a feedback line 1370, which may be utilized in connection with controlling an ion energy distribution. For example, the value of $\Delta V$ (also referred to herein as a voltage step or the third portion 1406) depicted in FIG. 14, is indicative of instantaneous ion energy and may be used in many embodiments as part of a feedback control loop. In one embodiment, the voltage step, $\Delta V$, is related to ion energy according to Equation 4. In other embodiments, the peak-to-peak voltage, $V_{PP}$ can be related to the instantaneous ion energy. Alternatively, the difference between the peak-to-peak voltage, $V_{PP}$, and the product of the slope, $dV_0/dt$, of the fourth portion 1408 times time, t, can be correlated to the instantaneous ion energy (e.g., $V_{PP}-dV_0/dt \cdot t$).

Figure 16:
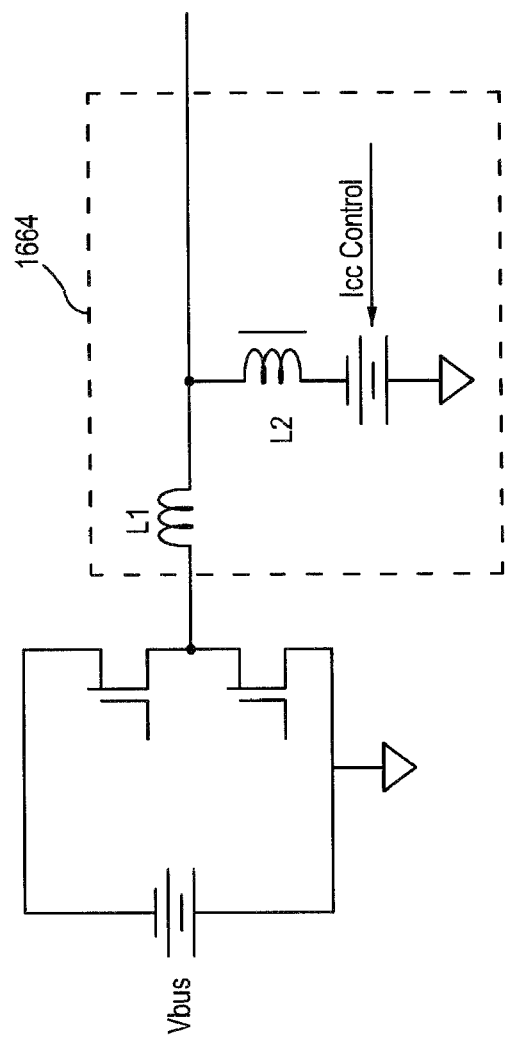
FIG. 16 is an exemplary embodiment of a current source, which may be implemented to realize the current source described with reference to FIG. 13.

Referring next to FIG. 16, shown is an exemplary embodiment of a current source 1664, which may be implemented to realize the current source 1364 described with reference to FIG. 13. In this embodiment, a controllable negative DC voltage source, in connection with a series inductor L2, function as a current source, but one of ordinary skill in the art will appreciate, in light of this specification, that a current source may be realized by other components and/or configurations.

Figure 43:
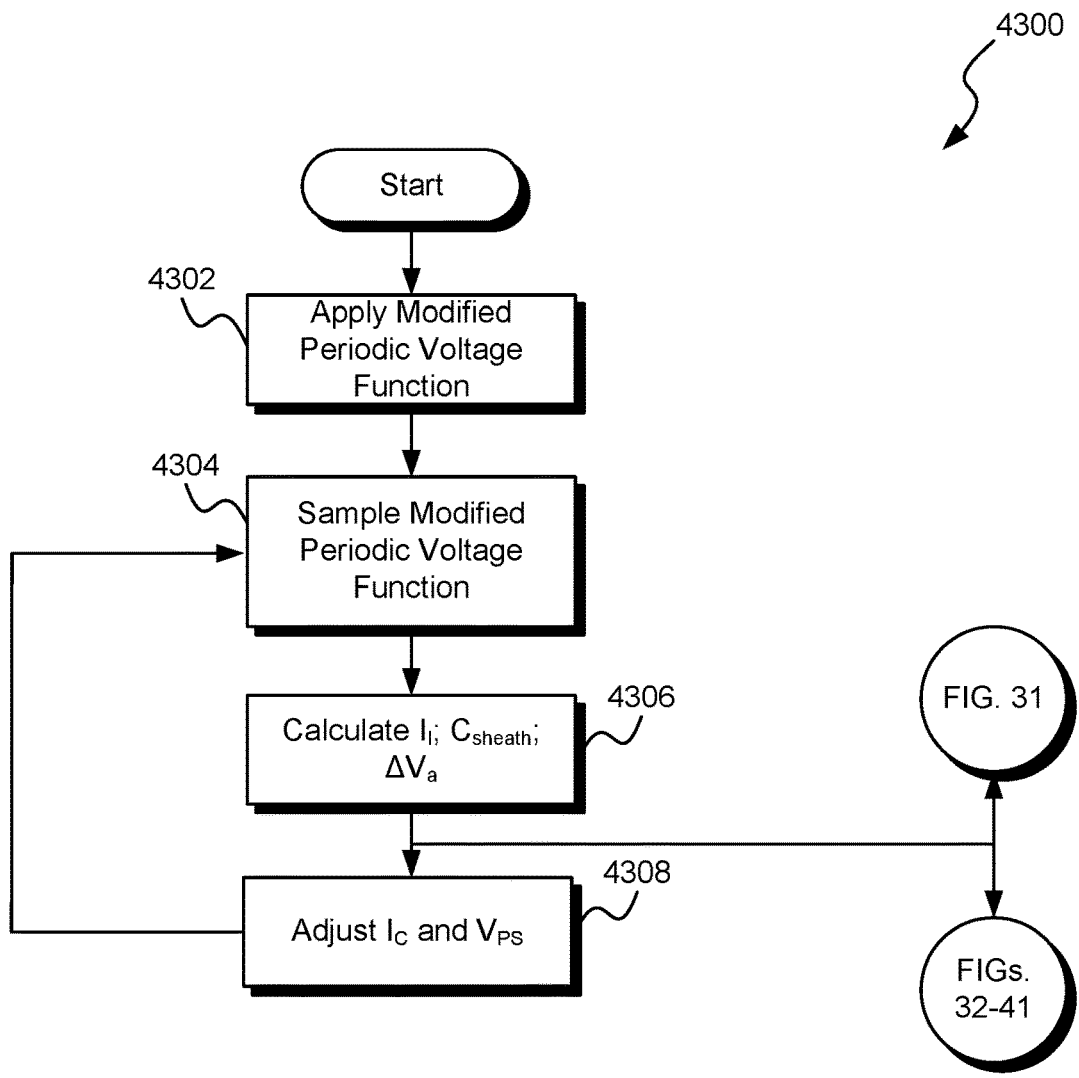
FIG. 43 illustrates one embodiment of a method of controlling an ion energy distribution of ions impacting a surface of a substrate.

FIG. 43 illustrates one embodiment of a method of controlling an ion energy distribution of ions impacting a surface of a substrate. The method 4300 starts by applying a modified periodic voltage function 4302 (see the modified periodic voltage function 4402 in FIG. 44) to a substrate support supporting a substrate within a plasma processing chamber. The modified periodic voltage function can be controlled via at least two 'knobs' such as an ion current compensation, $I_C$, (see $I_C$ 4404 in FIG. 44) and a power supply voltage, $V_{PS}$, (see power supply voltage 4406 in FIG. 44). An exemplary component for generating the power supply voltage is the switch mode power supply 106 in FIG. 1. In order to help explain the power supply voltage, $V_{PS}$, it is illustrated herein as if measured without coupling to the ion current and ion current compensation. The modified periodic voltage function is then sampled at a first and second value of an ion current compensation, $I_C$, 4304. At least two samples of a voltage of the modified periodic voltage function are taken for each value of the ion current compensation, $I_C$. The sampling 4304 is performed in order to enable calculations 4306 (or determinations) of the ion current, $I_I$, and a sheath capacitance, $C_{sheath}$, 4306. Such determination may involve finding an ion current compensation, $I_C$, that if applied to the substrate support (or as applied to the substrate support) would generate a narrow (e.g., minimum) ion energy distribution function (IEDF) width. The calculations 4306 can also optionally include determining a voltage step, $\Delta V$, (also known as a third portion of the modified periodic voltage function 1406) based on the sampling 4304 of the waveform of the modified periodic voltage function. The voltage step, $\Delta V$, can be related to the ion energy of ions reaching the substrate's surface. When finding the ion current, $I_I$, for the first time, the voltage step, $\Delta V$, can be ignored. Details of the sampling 4304 and the calculations 4306 will be provided in discussions of FIG. 30 to follow.

Figure 31:
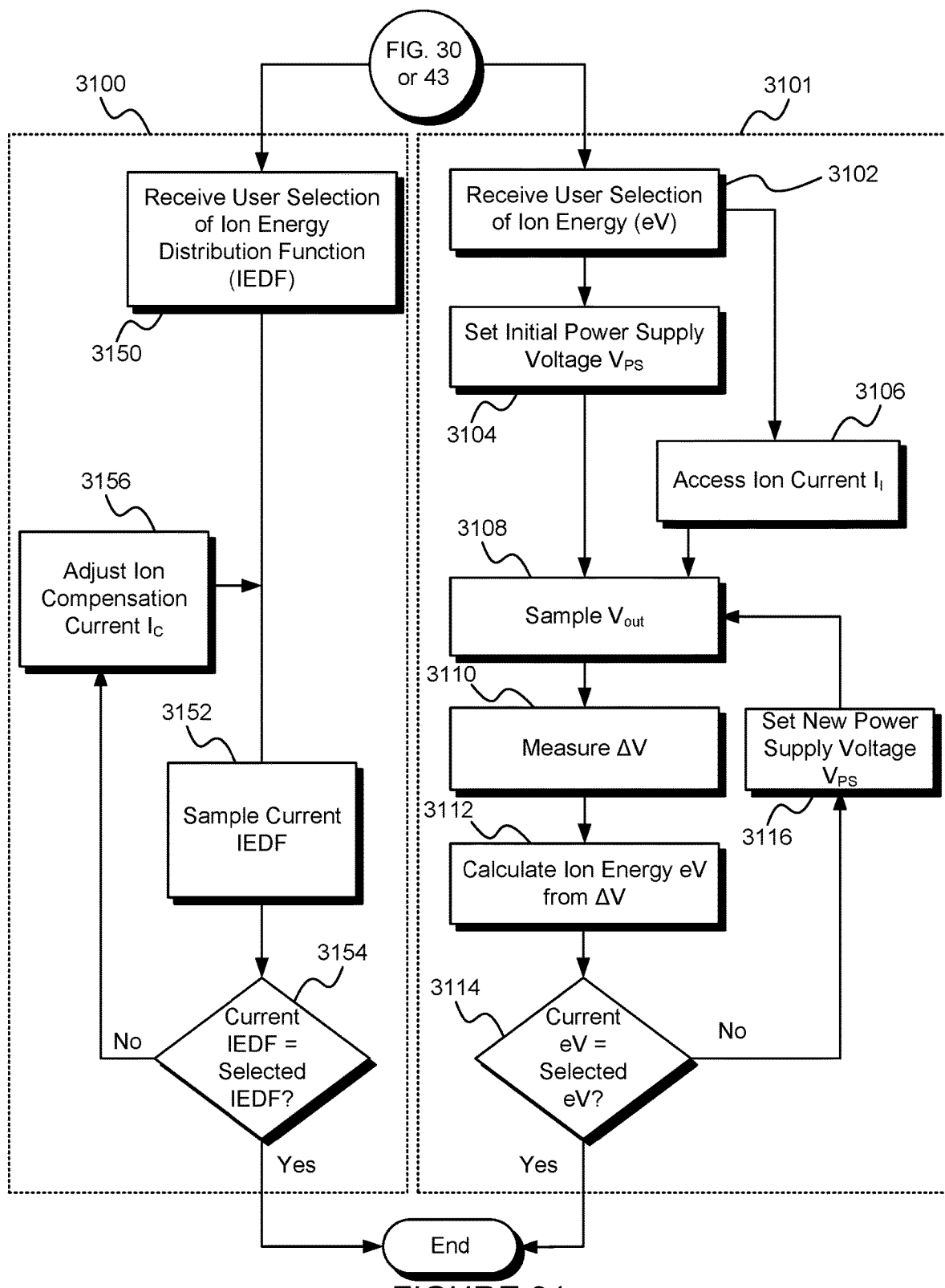
FIG. 31 illustrates methods for setting the IEDF and the ion energy.
Figure 46:
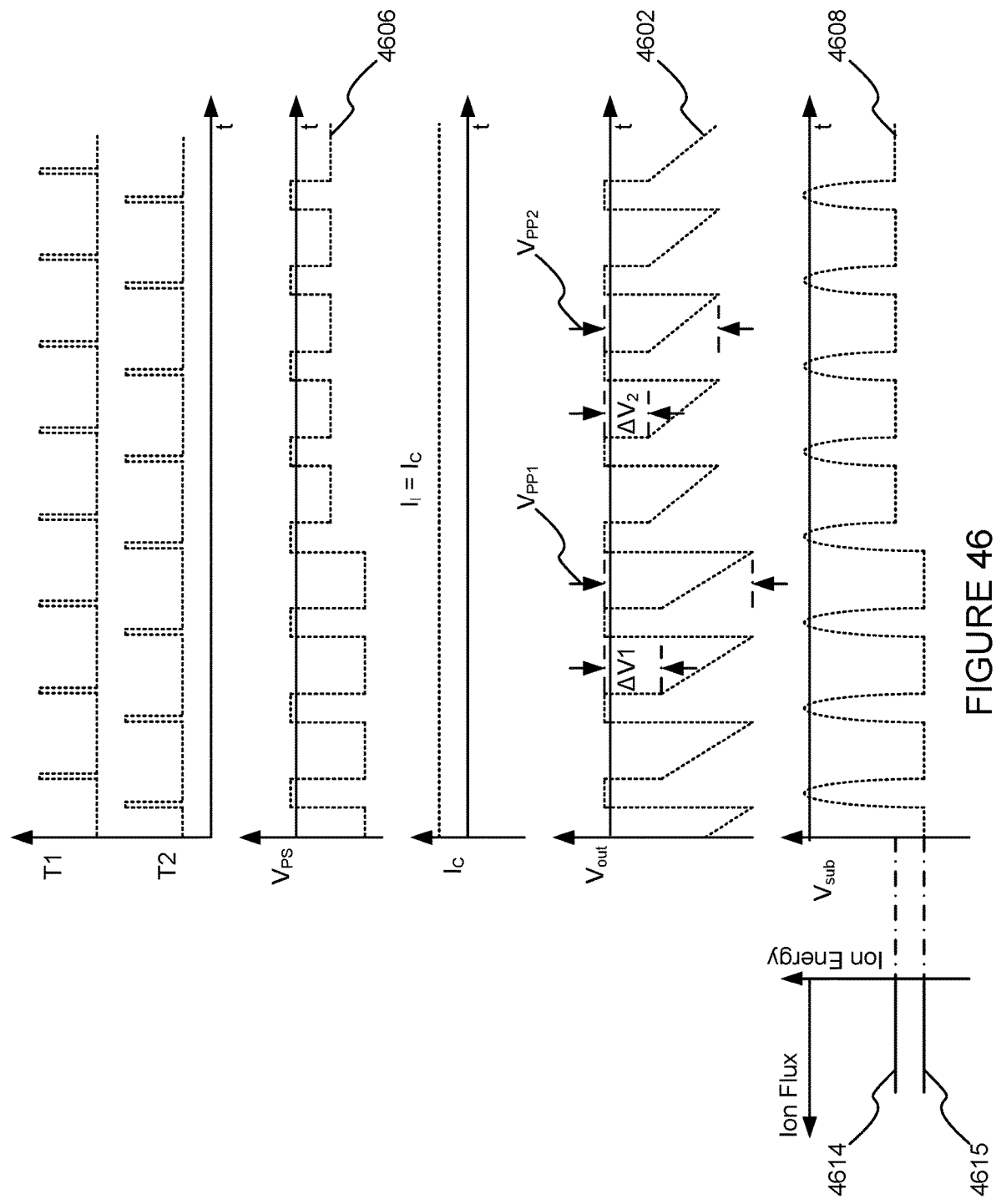
FIG. 46 illustrates selection of ion energy.
Figure 47:
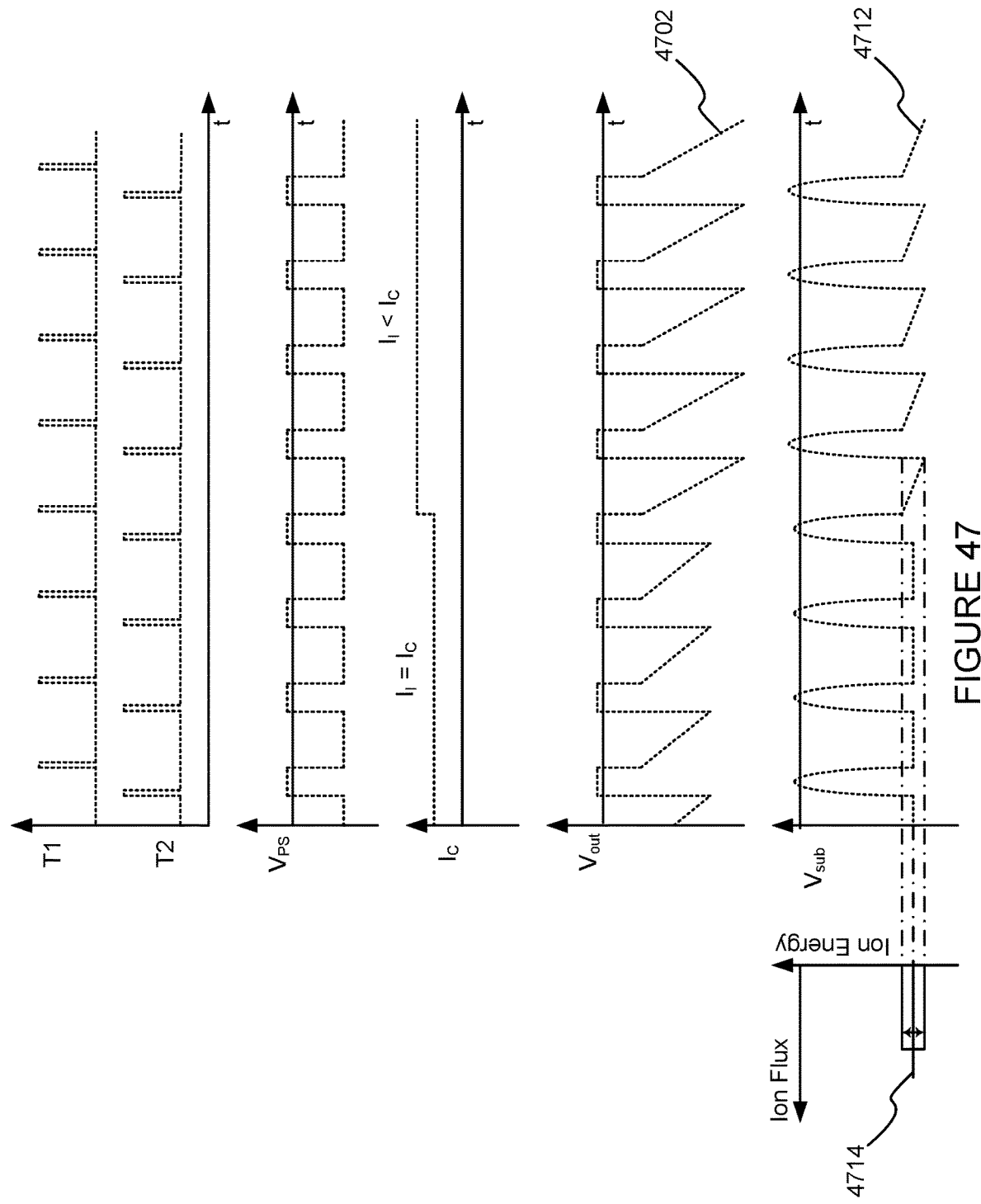
FIG. 47 illustrates selection and expansion of the ion energy distribution function width.

Once the ion current, $I_I$, and sheath capacitance, $C_{sheath}$, are known, the method 4300 may move to the method 3100 of FIG. 31 involving setting and monitoring an ion energy and a shape (e.g., width) of the IEDF. For instance, FIG. 46 illustrates how a change in the power supply voltage can effect a change in the ion energy. In particular, a magnitude of the illustrated power supply voltage is decreased resulting in a decreased magnitude of the ion energy. Additionally, FIG. 47 illustrates that given a narrow IEDF 4714, the IEDF can be widened by adjusting the ion current compensation, $I_C$. Alternatively, or in parallel, the method 4300 can perform various metrics as described with reference to FIGS. 32-41 that make use of the ion current, $I_I$, the sheath capacitance, $C_{sheath}$, and other aspects of the waveform of the modified periodic voltage function.

In addition to setting the ion energy and/or the IEDF width, the method 4300 may adjust the modified periodic voltage function 4308 in order to maintain the ion energy and the IEDF width. In particular, adjustment of the ion current compensation, $I_C$, provided by an ion current compensation component, and adjustment of the power supply voltage may be performed 4308. In some embodiments, the power supply voltage can be controlled by a bus voltage, $V_{bus}$, of the power supply (e.g., the bus voltage $V_{bus}$ of FIG. 3). The ion current compensation, $I_C$, controls the IEDF width, and the power supply voltage controls the ion energy.

After these adjustments 4308, the modified periodic voltage function can again be sampled 4304 and calculations of ion current, $I_I$, sheath capacitance, $C_{sheath}$, and the voltage step, $\Delta V$, can again be performed 4306. If the ion current, $I_I$, or the voltage step, $\Delta V$, are other than defined values (or in the alternative, desired values), then the ion current compensation, $I_C$, and/or the power supply voltage can be adjusted 4308. Looping of the sampling 4304, calculating, 4306, and adjusting 4308 may occur in order to maintain the ion energy, eV, and/or the IEDF width.

Figure 30:
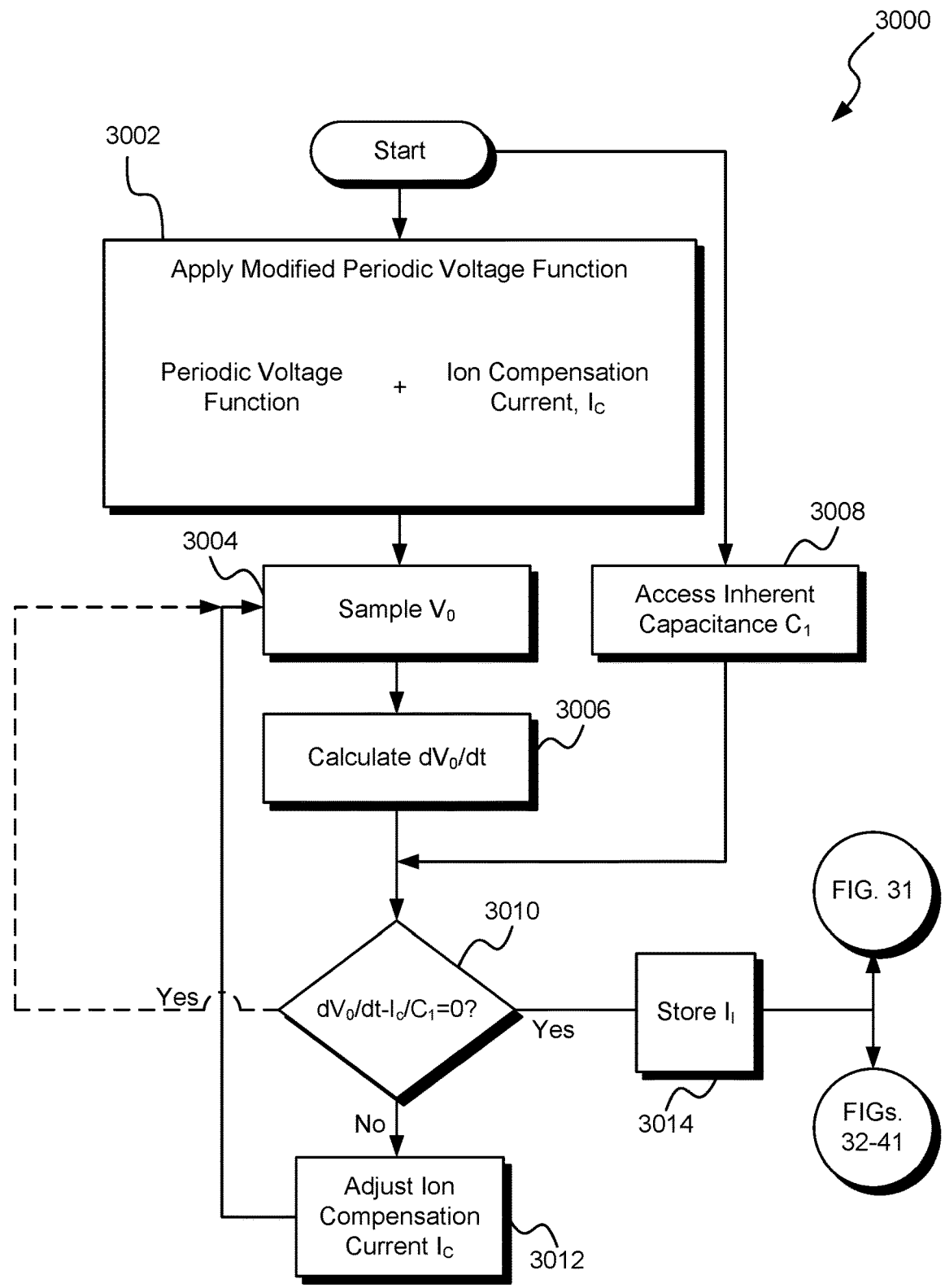
FIG. 30 illustrates one embodiment of a method of controlling an ion energy distribution of ions impacting a surface of a substrate.

FIG. 30 illustrates another embodiment of a method of controlling an ion energy distribution of ions impacting a surface of a substrate. In some embodiments, as discussed above, it may be desirable to achieve a narrow IEDF width (e.g., a minimum IEDF width or in the alternative, ~6% full-width half maximum). As such, the method 3000 can provide a modified periodic voltage function to the chamber and to the substrate support such that a constant substrate voltage (or sustained substrate voltage or substantially constant substrate voltage), and hence sheath voltage, exists at the surface of the substrate. This in turn accelerates ions across the sheath at a substantially constant voltage thus enabling ions to impact the substrate with substantially the same ion energy, which in turn provides a narrow IEDF width. For instance, in FIG. 45 it can be seen that adjusting the ion current compensation, $I_C$, can cause the substrate voltage, $V_{sub}$, between pulses to have a constant, or substantially constant (or sustained) voltage thus causing the IEDF to narrow.

Figure 45:
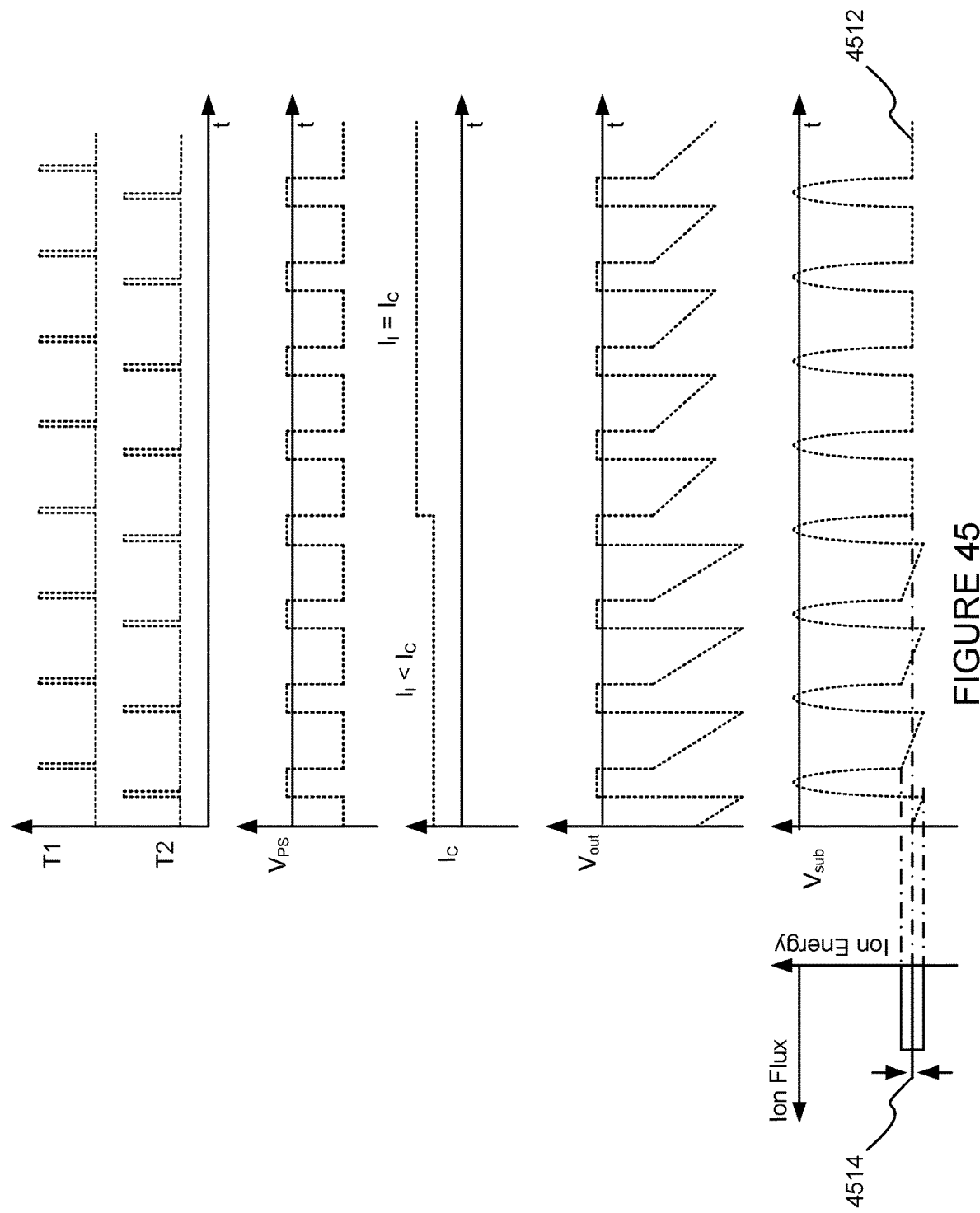
FIG. 45 illustrates the effects of making a final incremental change in ion current compensation, $I_C$, in order to match it to ion current $I_I$.

Such a modified periodic voltage function is achieved when the ion current compensation, $I_C$, equals the ion current, $I_I$, assuming no stray capacitances (see the last five cycles of the periodic voltage function ($V_0$) in FIG. 45). In the alternative, where stray capacitance, $C_{stray}$, is considered, the ion current compensation, $I_C$, is related to the ion current, $I_I$, according to Equation 2:

$$I_I = I_C \frac{C_1}{C_1 + C_{stray}} \qquad \text{(Equation 2)}$$

where, $C_1$, is an effective capacitance (e.g., the inherent capacitance described with reference to FIGS. 3 and 13). The effective capacitance, $C_1$, can vary in time or be constant. For the purposes of this disclosure, the narrow IEDF width can exist when either $I_I=I_C$ or, in the alternative, when Equation 2 is met. FIGS. 45-50 use the nomenclature, $I_I=I_C$, but it should be understood that these equalities are merely simplifications of Equation 2, and thus Equation 2 could substitute for the equalities used in FIGS. 45-50. The stray capacitance, $C_{stray}$, is a cumulative capacitance of the plasma chamber as seen by the power supply. There are eight cycles illustrated in FIG. 45.

The method 3000 can begin with an application of a modified periodic voltage function (e.g., the modified periodic voltage function depicted in FIG. 14 or the modified periodic voltage function 4402 in FIG. 44) to the substrate support 3002 (e.g., substrate support 108 in FIG. 1). A voltage of the modified periodic voltage function can be sampled 3004 at two or more times, and from this sampling, a slope $dV_0/dt$ for at least a portion of a cycle of the modified periodic voltage function can be calculated 3006 (e.g., a slope of the portion between the pulses or the fourth portion 1408). At some point before a decision 3010, a previously-determined value of an effective capacitance $C_1$ (e.g., inherent capacitance $C_1$ in FIG. 13, and an inherent capacitance C10 in FIG. 3) can be accessed 3008 (e.g., from a memory or from a user input). Based on the slope, $dV_0/dt$, the effective capacitance, $C_1$, and the ion current compensation, $I_C$, a function $f$ (Equation 3), can be evaluated for each value of the ion current compensation, $I_C$, as follows:

$$f(I_C) = \frac{dV_0}{dt} - \frac{I_C}{C_1} = 0 \qquad \text{(Equation 3)}$$

If the function $f$ is true, then the ion current compensation, $I_C$, equals the ion current, $I_I$, or in the alternative, makes Equation 2 true, and a narrow IEDF width has been achieved 3010 (e.g., see FIG. 45). If the function $f$ is not true, then the ion current compensation, $I_C$, can be adjusted 3012 further until the function $f$ is true. Another way to look at this is that the ion current compensation, $I_C$, can be adjusted until it matches the ion current, $I_I$, (or in the alternative, meets the relationship of Equation 2), at which point a narrow IEDF width will exist. Such an adjustment to the ion current compensation, $I_C$, and resulting narrowing of the IEDF, can be seen in FIG. 45. The ion current, $I_I$, and the corresponding ion current compensation, $I_C$, can be stored (e.g., in a memory) in store operation 3014. The ion current, $I_C$, can vary in time, as can the effective capacitance, $C_1$.

When Equation 3 is met, ion current, $I_I$, is known (either because $I_C=I_I$, or because Equation 2 is true). Thus, the method 3000 enables remote and non-invasive measurements of ion current, $I_I$, in real time without affecting the plasma. This leads to a number of novel metrics such as those that will be described with reference to FIGS. 32-41 (e.g., remote monitoring of plasma density and remote fault detection of the plasma source).

Figure 44:
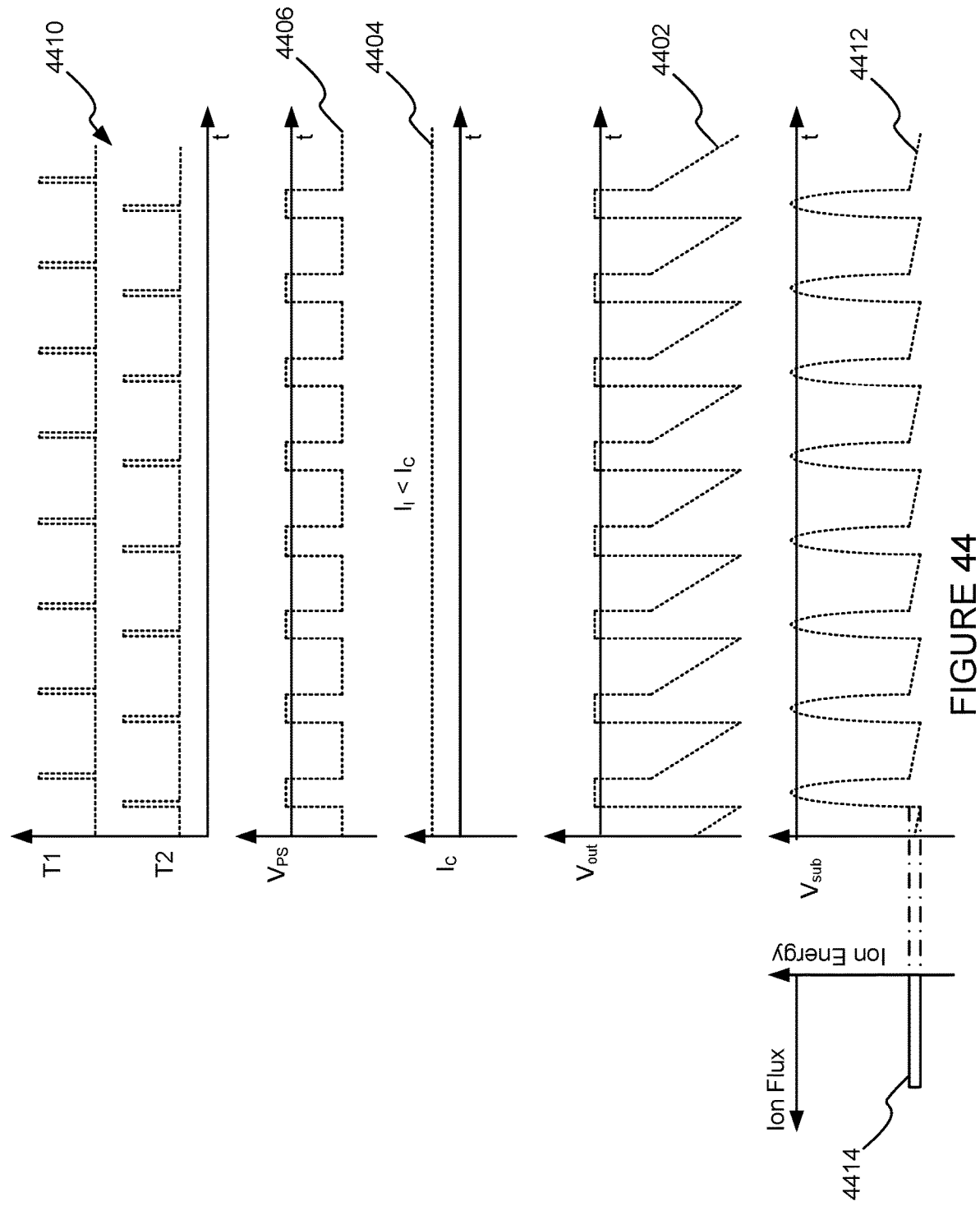
FIG. 44 illustrates various waveforms at different points in the systems herein disclosed.

While adjusting 3012 the compensation current, $I_C$, the ion energy will likely be broader than a delta function and the ion energy will resemble that of either FIG. 15B, 15C, or 44. However, once the compensation current, $I_C$, is found that meets Equation 2, the IEDF will appear as illustrated in FIG. 15A or the right portion of FIG. 45—as having a narrow IEDF width (e.g., a minimum IEDF width). This is because the voltage between pulses of the modified periodic voltage function causes a substantially constant sheath or substrate voltage, and hence ion energy, when $I_C=I_I$ (or alternatively when Equation 2 is true). In FIG. 46 the substrate voltage, 4608, includes pulses (or voltage reversals) between the constant voltage portions (or substantially constant voltage portions or sustained voltage portions). These pulses have such a short duration that their effect on ion energy and IEDF is negligible and thus the substrate voltage 4608 is referred to as being substantially constant (or sustained).

The following provides further details about each of the method steps illustrated in FIG. 30. In one embodiment, the modified periodic voltage function can have a waveform like that illustrated in FIG. 14 and can include a first portion (e.g., first portion 1402), a second portion (e.g., 1404), a third portion (e.g., third portion 1406), and a fourth portion (e.g., fourth portion 1408), where the third portion can have a voltage step, $\Delta V$, and the fourth portion can have a slope, $dV_0/dt$. The slope, $dV_0/dt$, can be positive, negative, or zero. The modified periodic voltage function 1400 can also be described as having pulses comprising the first portion 1402, the second portion 1404, and the third portion 1406, and a portion between the pulses (fourth portion 1408). In practice the transitions between portions are each more likely to have sloped voltage rises and falls as shown, for instance, in FIG. 61.

The modified periodic voltage function can be measured as $V_{out}$ in FIG. 3 and can appear as the modified periodic voltage function 4402 in FIG. 44. The modified period voltage function 4402 is produced by combining the power supply voltage 4406 (also known as the periodic voltage function) with the ion current compensation 4404. The power supply voltage 4406 is largely responsible for generating and shaping the pulses of the modified periodic voltage function 4402 and the ion current compensation 4404 is largely responsible for generating and shaping the portion between the pulses, which is often a linearly decreasing voltage having a slope. Increasing the ion current compensation, Ic, causes a decrease in a magnitude of the slope of the portion between the pulses as seen in FIG. 45. Decreasing a magnitude of the power supply voltage 4606 causes a decrease in a magnitude of the amplitude of the pulses and the peak-to-peak voltage of the modified periodic voltage function 4602 as seen in FIG. 46.

In cases where the power supply is a switch-mode power supply, the switching diagram 4410 of a first switch T1 and a second switch T2 can apply. For instance, the first switch T1 can be implemented as the switch T1 in FIG. 3 and the second switch T2 can be implemented as the second switch T2 in FIG. 3. The two switches are illustrated as closing at a start and end of each pulse provided by the switch mode power supply. When the first switch T1 is on or closed, the power supply voltage is drawn to a maximum magnitude, which is a negative value in FIG. 44 since the power supply has a negative bus voltage. The second switch T2 is turned off during this period so that the power supply voltage 4406 is isolated from ground. The first switch T1, is only momentarily on or closed, and then turned off to allow the ion current compensation component to govern the output, $V_{out}$, a second duration, $t_2$, between pulses (i.e., the linearly decreasing portion between pulses). When the second switch T2 is turned on, the power supply voltage 4406 approaches and slightly passes ground. A first duration of each pulse, $t_1$, as well as a second duration of the linearly decreasing voltage between pulses can both be tailored to different requirements. For instance, the second duration, $t_2$, can be controlled to prevent surface charge accumulation, $Q_i$, from exceeding a threshold or moving outside of a desired range.

The modified periodic voltage function can be applied to the substrate support 3002, and sampled 3004 as $V_{out}$ at a last accessible point before the modified periodic voltage function reaches the substrate support (e.g., between the switch mode power supply and the effective capacitance). The unmodified periodic voltage function (or power supply voltage 4406 in FIG. 44) can be sourced from a power supply such as the switch mode power supply 1206 in FIG. 12. The ion current compensation 4404 in FIG. 44 can be sourced from a voltage or current source such as the ion current compensation component 1260 in FIG. 12 or 1360 in FIG. 13.

A portion of or the whole modified periodic voltage function can be sampled 3004. For instance, the fourth portion (e.g., fourth portion 1408) can be sampled. The sampling 3004 can be performed between the power supply and the substrate support. For instance, in FIG. 1, the sampling 3004 can be performed between the switch mode power supply 106 and the support 108. In FIG. 3, the sampling 3004 can be performed between the inductor L1 and the inherent capacitance C10. In one embodiment, the sampling 3004 can be performed at $V_{out}$ between the capacitance C3 and the inherent capacitance C10. Since the inherent capacitance C10 and the elements representing the plasma (R2, R3, C1, and C2) are not accessible for real time measurement, the sampling 3004 is typically performed to the left of the inherent capacitance C10 in FIG. 3. Although the inherent capacitance C10 typically is not measured during processing, it is typically a known constant, and can therefore be set during manufacturing. At the same time, in some cases the inherent capacitance C10 can vary with time.

While only two samples of the modified periodic voltage function are needed in some embodiments, in others, hundreds, thousands, or tens of thousands of samples can be taken for each cycle of the modified periodic voltage function. For instance, the sampling rate can be greater than 400 kHz. These sampling rates enable more accurate and detailed monitoring of the modified periodic voltage function and its shape. In this same vein, more detailed monitoring of the periodic voltage function allows more accurate comparisons of the waveform: between cycles, between different process conditions, between different processes, between different chambers, between different sources, etc. For instance, at these sampling rates, the first, second, third, and fourth portions 1402, 1404, 1406, 1408 of the periodic voltage function illustrated in FIG. 14 can be distinguished, which may not be possible at traditional sampling rates. In some embodiments, the higher sampling rates enable resolving of the voltage step, $\Delta V$, and the slope, $dV_0/dt$, which are not possible in the art. In some embodiments, a portion of the modified periodic voltage function can be sampled while other portions are not sampled.

The calculation 3006 of the slope, $dV_0/dt$, can be based on a plurality of $V_{out}$ measurements taken during the time $t_2$ (e.g., the fourth portion 1408). For instance, a linear fit can be performed to fit a line to the $V_{out}$ values where the slope of the line gives the slope, $dV_o/dt$. In another instance, the $V_{out}$ values at the beginning and end of time t (e.g., the fourth portion 1408) in FIG. 14 can be ascertained and a line can be fit between these two points with the slope of the line given as $dV_o/dt$. These are just two of numerous ways that the slope, $dV_o/dt$, of the portion between the voltage reversals can be calculated.

The decision 3010 can be part of an iterative loop used to tune the IEDF to a narrow width (e.g., a minimum width, or in the alternative, 6% full-width half maximum). Equation 3 only holds true where the ion current compensation, Ic, is equal to the ion current, $I_I$ (or in the alternative, is related to $I_I$ according to Equation 2), which only occurs where there is a constant substrate voltage and thus a constant and substantially singular ion energy (a narrow IEDF width). A constant substrate voltage 4608 ($V_{sub}$) can be seen in FIG. 46. Thus, either ion current, $I_I$, or alternatively ion current compensation, Ic, can be used in Equation 3.

Alternatively, two values along the fourth portion 1408 (also referred to as the portion between the voltage reversals) can be sampled for a first cycle and a second cycle and a first and second slope can be determined for each cycle, respectively. From these two slopes, an ion current compensation, Ic, can be determined which is expected to make Equation 3 true for a third, but not-yet-measured, slope. Thus, an ion current, $I_I$, can be estimated that is predicted to correspond to a narrow IEDF width. These are just two of the many ways that a narrow IEDF width can be determined, and a corresponding ion current compensation, Ic, and/or a corresponding ion current, $I_I$, can be found.

The adjustment to the ion current compensation, Ic, 3012 can involve either an increase or a decrease in the ion current compensation, Ic, and there is no limitation on the step size for each adjustment. In some embodiments, a sign of the function ƒ in Equation 3 can be used to determine whether to increase or decrease the ion current compensation. If the sign is negative, then the ion current compensation, Ic, can be decreased, while a positive sign can indicate the need to increase the ion current compensation, Ic.

Once an ion current compensation, Ic, has been identified that equals the ion current, $I_I$ (or in the alternative, is related thereto according to Equation 2), the method 3000 can advance to further set point operations (see FIG. 31) or remote chamber and source monitoring operations (see FIGS. 32-41). The further set point operations can include setting the ion energy (see also FIG. 46) and the distribution of ion energy or IEDF width (see also FIG. 47). The source and chamber monitoring can include monitoring plasma density, source supply anomalies, plasma arcing, and others.

Furthermore, the method 3000 can optionally loop back to the sampling 3004 in order to continuously (or in the alternative, periodically) update the ion current compensation, Ic. For instance, the sampling 3004, calculation 3006, the decision 3010, and the adjusting 3012 can periodically be performed given a current ion current compensation, Ic, in order to ensure that Equation 3 continues to be met. At the same time, if the ion current compensation, Ic, that meets Equation 3 is updated, then the ion current, $I_I$, can also be updated and the updated value can be stored 3014.

While the method 3000 can find and set the ion current compensation, Ic, so as to equal the ion current, $I_I$, or in the alternative, to meet Equation 2, a value for the ion current compensation, Ic, needed to achieve a narrow IEDF width can be determined without (or in the alternative, before) setting the ion current, $I_C$, to that value. For instance, by applying a first ion current compensation, $Ic_1$, for a first cycle and measuring a first slope, $dV_{O1}/dt$, of the voltage between the voltage reversals, and by applying a second ion current compensation, $Ic_2$, for a second cycle and measuring a second slope, $dV_{O2}/dt$, of the voltage between the voltage reversals, a third slope, $dV_{O3}/dt$, associated with a third ion current compensation, $Ic_3$, can be determined at which Equation 3 is expected to be true. The third ion current compensation, $Ic_3$, can be one that if applied would result in a narrow IEDF width. Hence, the ion current compensation, Ic, that meets Equation 3 and thus corresponds to ion current, $I_I$, can be determined with only a single adjustment of the ion current compensation. The method 3000 can then move on to the methods described in FIG. 31 and/or FIGS. 32-41 without ever setting the ion current, $I_C$, to a value needed to achieve the narrow IEDF width. Such an embodiment may be carried out in order to increase tuning speeds.

FIG. 31 illustrates methods for setting the IEDF width and the ion energy. The method originates from the method 3000 illustrated in FIG. 30, and can take either of the left path 3100 (also referred to as an IEDF branch) or the right path 3101 (also referred to as an ion energy branch), which entail setting of the IEDF width and the ion energy, respectively. Ion energy, eV, is proportional to a voltage step, ΔV, or the third portion 1406 of the modified periodic voltage function 1400 of FIG. 14. The relationship between ion energy, eV, and the voltage step, ΔV, can be written as Equation 4:

$$eV = \Delta V \frac{C_1}{C_2 + C_1} \quad \text{(Equation 4)}$$

where $C_1$ is the effective capacitance (e.g., chuck capacitance; inherent capacitance, C10, in FIG. 3; or inherent capacitance, C1, in FIG. 13), and $C_2$ is a sheath capacitance (e.g., the sheath capacitance C4 in FIG. 3 or the sheath capacitance C2 in FIG. 13). The sheath capacitance, $C_2$, may include stray capacitances and depends on the ion current, $I_I$. The voltage step, ΔV, can be measured as a change in voltage between the second portion 1404 and the fourth portion 1408 of the modified periodic voltage function 1400. By controlling and monitoring the voltage step, ΔV, (which is a function of a power supply voltage or a bus voltage such as bus voltage, $V_{bus}$ in FIG. 3), ion energy, eV, can be controlled and known.

At the same time, the IEDF width can be approximated according to Equation 5:

$$IEDF \text{ width} = V_{PP} - \Delta V - \frac{It}{C} \quad \text{(Equation 5)}$$

where I is $I_I$ where C is $C_{series}$, or I is $I_C$ where C is $C_{effective}$. The second duration, $t_2$, is the time between pulses, $V_{PP}$, is the peak-to-peak voltage, and ΔV is the voltage step.

Additionally, sheath capacitance, $C_2$, can be used in a variety of calculations and monitoring operations. For instance, the Debye sheath distance, $\lambda_{sheath}$, can be estimated as follows:

$$\lambda_{sheath} = \frac{\epsilon A}{C_2} \quad \text{(Equation 6)}$$

where ϵ is vacuum permittivity and A is an area of the substrate (or in an alternative, a surface area of the substrate support). In some high voltage applications, Equation 6 is written as equation 7:

$$\lambda_{sheath} = \sqrt{\frac{T_e \cdot \epsilon_0}{n_e q}} \cdot \left(\frac{V}{2} T_e\right)^{.75} \quad \text{(Equation 7)}$$

Additionally, an e-field in the sheath can be estimated as a function of the sheath capacitance, $C_2$, the sheath distance, $\lambda_{sheath}$, and the ion energy, eV. Sheath capacitance, $C_2$, along with the ion current, $I_I$, can also be used to determine plasma density, $n_e$, from Equation 8 where saturation current, $I_{sat}$, is linearly related to the compensation current, $I_C$, for singly ionized plasma.

$$I_{sat} = \sum n_i q_i \sqrt{\frac{kT_e}{m_i}} A \approx n_e q \sqrt{\frac{kT_e}{<m>}} A \quad \text{(Equation 8)}$$

An effective mass of ions at the substrate surface can be calculated using the sheath capacitance, $C_2$ and the saturation current, $I_{sat}$. Plasma density, $n_e$, electric field in the sheath, ion energy, eV, effective mass of ions, and a DC potential of the substrate, $V_{DC}$, are fundamental plasma parameters that are typically only monitored via indirect means in the art. This disclosure enables direct measurements of these parameters thus enabling more accurate monitoring of plasma characteristics in real time.

As seen in Equation 4, the sheath capacitance, $C_2$, can also be used to monitor and control the ion energy, eV, as illustrated in the ion energy branch 3101 of FIG. 31. The ion energy branch 3101 starts by receiving a user selection of ion energy 3102. The ion energy branch 3101 can then set an initial power supply voltage for the switch-mode power supply that supplies the periodic voltage function 3104. At some point before a sample periodic voltage operation 3108, the ion current can also be accessed 3106 (e.g., accessed from a memory). The periodic voltage can be sampled 3108 and a measurement of the third portion of the modified periodic voltage function can be measured 3110. Ion energy, $I_I$, can be calculated from the voltage step, $\Delta V$, (also referred to as the third portion (e.g., third portion 1406)) of the modified periodic voltage function 3112. The ion energy branch 3101 can then determine whether the ion energy equals the defined ion energy 3114, and if so, the ion energy is at the desired set point and the ion energy branch 3101 can come to an end. If the ion energy is not equal to the defined ion energy, then the ion energy branch 3101 can adjust the power supply voltage 3116, and again sample the periodic voltage 3108. The ion energy branch 3101 can then loop through the sampling 3108, measuring 3110, calculating 3112, decision 3114, and the setting 3116 until the ion energy equals the defined ion energy.

The method for monitoring and controlling the IEDF width is illustrated in the IEDF branch 3100 of FIG. 31. The IEDF branch 3100 includes receiving a user selection of an IEDF width 3150 and sampling a current IEDF width 3152. A decision 3154 then determines whether the defined IEDF width equals the current IEDF width, and if the decision 3152 is met, then the IEDF width is as desired (or defined), and the IEDF branch 3100 can come to an end. However, if the current IEDF width does not equal the defined IEDF width, then the ion current compensation, Ic, can be adjusted 3156. This determination 3154 and the adjustment 3156 can continue in a looping manner until the current IEDF width equals the defined IEDF width.

In some embodiments, the IEDF branch 3100 can also be implemented to secure a desired IEDF shape. Various IEDF shapes can be generated and each can be associated with a different ion energy and IEDF width. For instance, a first IEDF shape may be a delta function while a second IEDF shape may be a square function. Other IEDF shapes may be cupped. Examples of various IEDF shapes can be seen in FIG. 11.

With knowledge of the ion current, $I_I$, and the voltage step, $\Delta V$, Equation 4 can be solved for ion energy, eV. The voltage step, $\Delta V$, can be controlled by changing the power supply voltage which in turn causes the voltage step, $\Delta V$, to change. A larger power supply voltage causes an increase in the voltage step, $\Delta V$, and a decrease in the power supply voltage causes a decrease in the voltage step, $\Delta V$. In other words, increasing the power supply voltage results in a larger ion energy, eV.

Furthermore, since the above systems and methods operate on a continuously varying feedback loop, the desired (or defined) ion energy and IEDF width can be maintained despite changes in the plasma due to variations or intentional adjustments to the plasma source or chamber conditions.

Although FIGS. 30-41 have been described in terms of a single ion energy, one of skill in the art will recognize that these methods of generating and monitoring a desired (or defined) IEDF width (or IEDF shape) and ion energy can be further utilized to produce and monitor two or more ion energies, each having its own IEDF width (or IEDF shape). For instance, by providing a first power supply voltage, $V_{PS}$, in a first, third, and fifth cycles, and a second power supply voltage in a second, fourth, and sixth cycles, two distinct and narrow ion energies can be achieved for ions reaching the surface of the substrate (e.g., FIG. 42A). Using three different power supply voltages results in three different ion energies (e.g., FIG. 42B). By varying a time during which each of multiple power supply voltages is applied, or the number of cycles during which each power supply voltage level is applied, the ion flux of different ion energies can be controlled (e.g., FIG. 42C).

The above discussion has shown how combining a periodic voltage function provided by a power supply with an ion current compensation provided by an ion current compensation component, can be used to control an ion energy and IEDF width and/or IEDF shape of ions reaching a surface of a substrate during plasma processing.

Some of the heretofore mentioned controls are enabled by using some combination of the following: (1) a fixed waveform (consecutive cycles of the waveform are the same); (2) a waveform having at least two portions that are proportional to an ion energy and an IEDF (e.g., the third and fourth portions 1406 and 1408 illustrated in FIG. 14); and (3) a high sampling rate (e.g., 125 MHz) that enables accurate monitoring of the distinct features of the waveform. For instance, where the prior art, such as linear amplifiers, sends a waveform to the substrate that is similar to the modified periodic voltage function, undesired variations between cycles make it difficult to use those prior art waveforms to characterize the ion energy or IEDF width (or IEDF shape).

Where linear amplifiers have been used to bias a substrate support, the need to sample at a high rate has not been seen since the waveform is not consistent from cycle to cycle and thus resolving features of the waveform (e.g., a slope of a portion between pulses) typically would not provide useful information. Such useful information does arise when a fixed waveform is used, as seen in this and related disclosures.

The herein disclosed fixed waveform and the high sampling rate further lead to more accurate statistical observations being possible. Because of this increased accuracy, operating and processing characteristics of the plasma source and the plasma in the chamber can be monitored via monitoring various characteristics of the modified periodic voltage function. For instance, measurements of the modified periodic voltage function enable remote monitoring of sheath capacitance and ion current, and can be monitored without knowledge of the chamber process or other chamber details. A number of examples follow to illustrate just some of the multitude of ways that the heretofore mentioned systems and methods can be used for non-invasive monitoring and fault detection of the source and chamber.

As an example of monitoring, and with reference to FIG. 14, the DC offset of the waveform 1400 can represent a health of the plasma source (hereinafter referred to as the "source"). In another, a slope of a top portion 1404 (the second portion) of a pulse of the modified periodic voltage function can be correlated to damping effects within the source. The standard deviation of the slope of the top portion 1404 from horizontal (illustrated as having a slope equal to 0) is another way to monitor source health based on an aspect of the waveform 1400. Another aspect involves measuring a standard deviation of sampled $V_{out}$ points along the fourth portion 1408 of the modified periodic voltage function and correlating the standard deviation to chamber ringing. For instance, where this standard deviation is monitored among consecutive pulses, and the standard deviation increases over time, this may indicate that there is ringing in the chamber, for instance in the e-chuck. Ringing can be a sign of poor electrical connections to, or in, the chamber or of additional unwanted inductance or capacitance.

Figure 32:
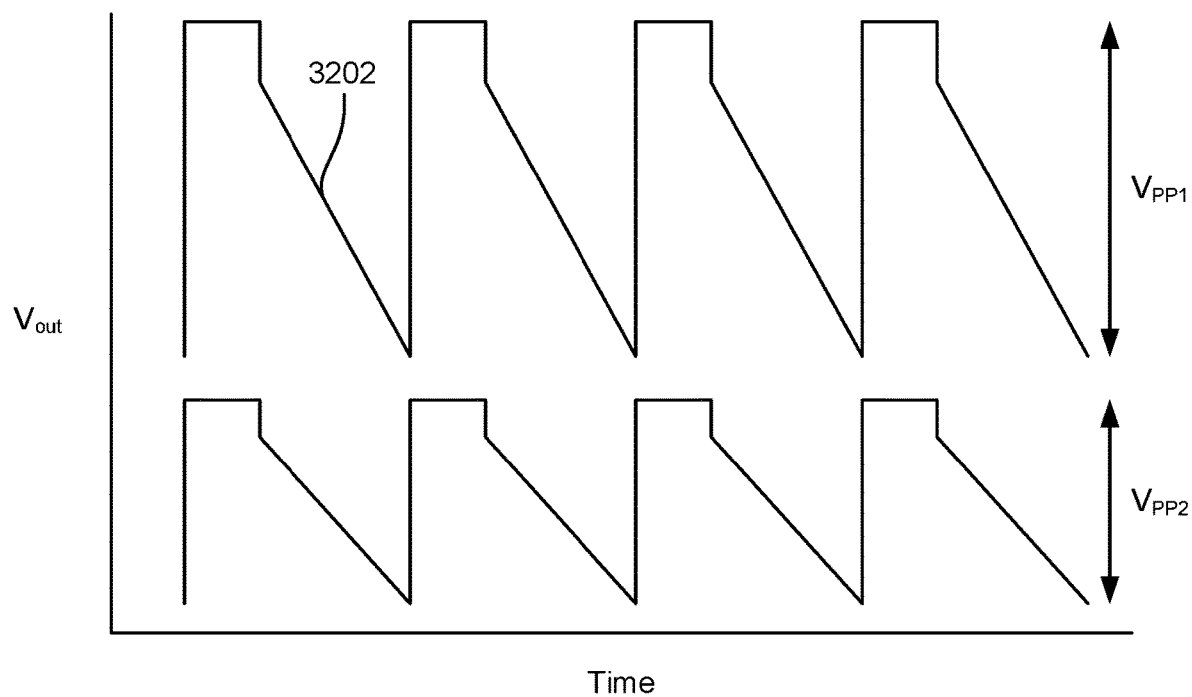
FIG. 32 illustrates two modified periodic voltage function waveforms delivered to the substrate support according to one embodiment of this disclosure.

FIG. 32 illustrates two modified periodic voltage functions delivered to the substrate support according to one embodiment of this disclosure. When compared, the two modified periodic voltage functions can be used for chamber matching or in situ anomaly or fault detection. For instance, one of the two modified periodic voltage functions can be a reference waveform and the second can be taken from a plasma processing chamber during calibration. Differences between the two modified periodic voltage functions (e.g., differences in peak-to-peak voltage, $V_{PP}$) can be used to calibrate the plasma processing chamber. Alternatively, the second modified periodic voltage function can be compared to the reference waveform during processing and any difference (e.g., shifts) in waveform characteristics can be indicative of a fault (e.g., a difference in the slope of a fourth portion 3202 of the modified periodic voltage functions).

Figure 33:
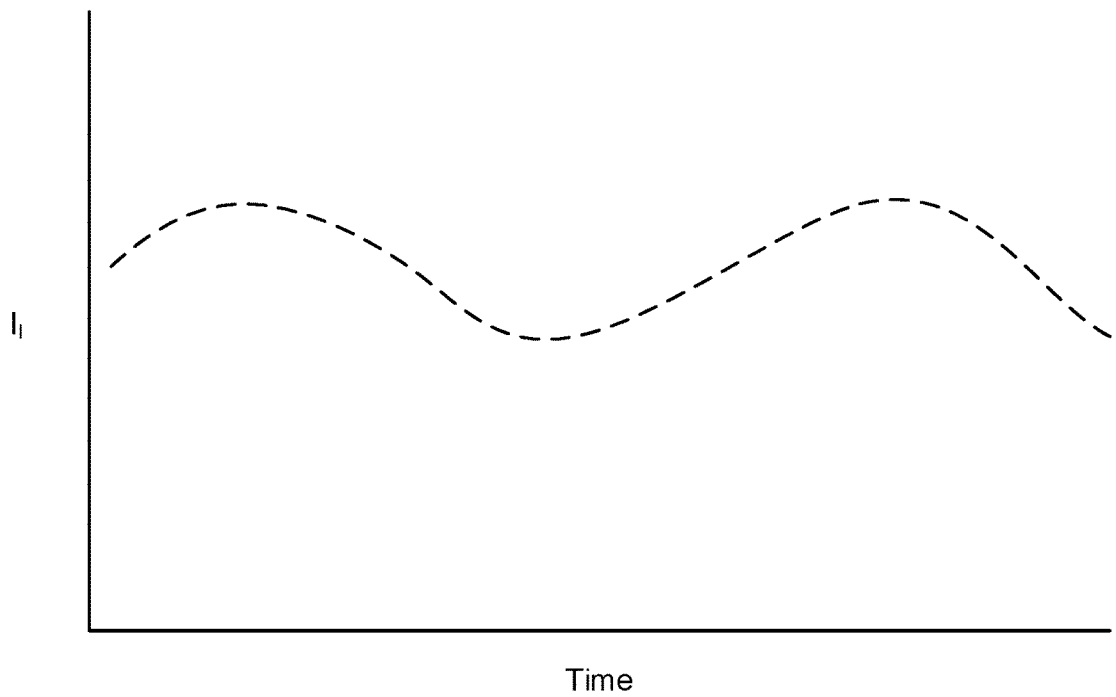
FIG. 33 illustrates an ion current waveform that can indicate plasma source instability or changes in the plasma density.

FIG. 33 illustrates an ion current waveform that can indicate plasma source instability and changes in the plasma density. Fluctuations in ion current, $I_I$, such as that illustrated in FIG. 33, can be analyzed to identify faults and anomalies in the system. For instance, the periodic fluctuations in FIG. 33 may indicate a low-frequency instability in the plasma source (e.g., plasma power supply 102). Such fluctuations in ion current, $I_I$, can also indicate cyclical changes in plasma density. This indicator and the possible faults or anomalies that it may indicate are just one of many ways that remote monitoring of the ion current, $I_I$, can be used to particular advantage.

Figure 34:
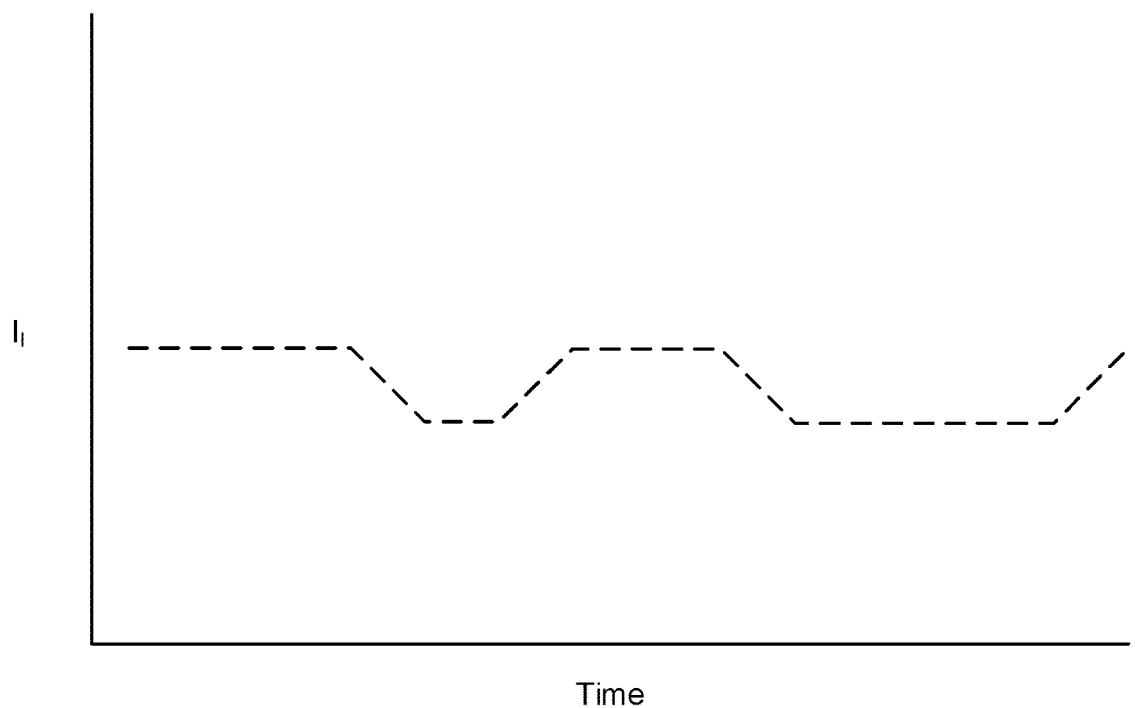
FIG. 34 illustrates an ion current, $I_I$, of a modified periodic voltage function waveform having a non-cyclical shape.

FIG. 34 illustrates an ion current, $I_I$, of a modified periodic voltage function having a non-cyclical shape. This embodiment of an ion current, $I_L$ can indicate non-cyclical fluctuations such as plasma instability and changes in plasma density. Such a fluctuation may also indicate various plasma instabilities such as arcing, formation of parasitic plasma, or drift in plasma density.

Figure 35:
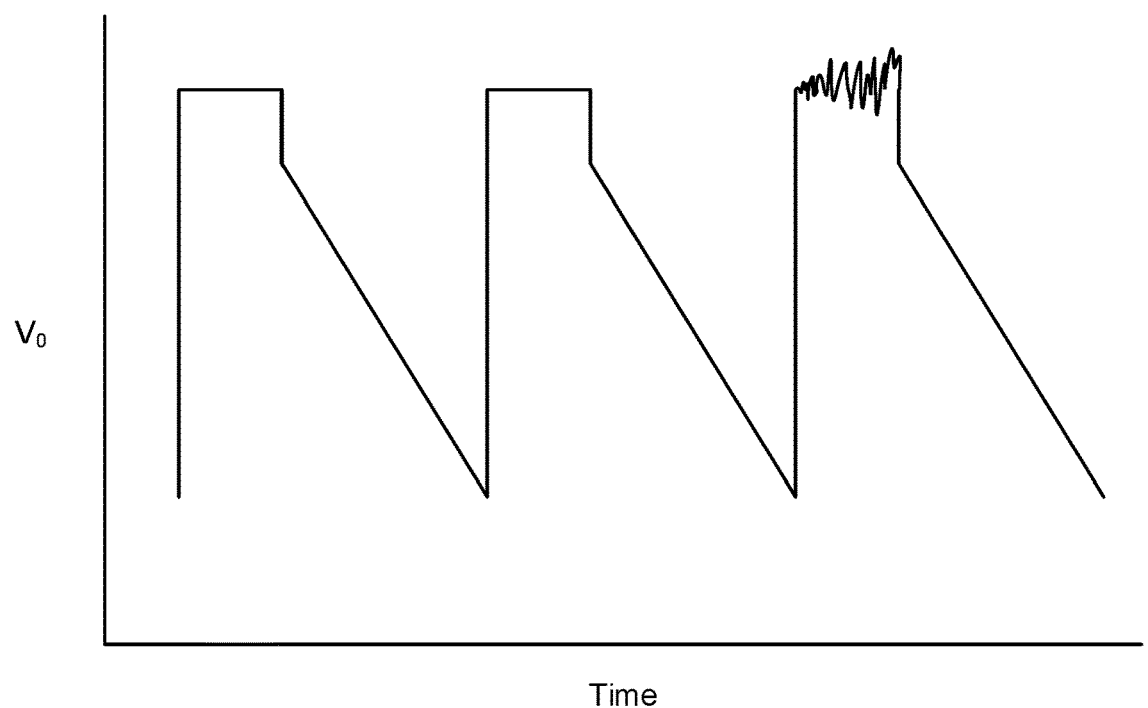
FIG. 35 illustrates a modified periodic voltage function waveform that can indicate faults within the bias supply.

FIG. 35 illustrates a modified periodic voltage function that can indicate faults within the bias supply. A top portion (also referred to herein as a second portion) of the third illustrated cycle shows anomalous behavior that may be indicative of ringing in the bias supply (e.g., power supply 1206 in FIG. 12). This ringing may be an indication of a fault within the bias supply. Further analysis of the ringing may identify characteristics that help to identify the fault within the power system.

Figure 36:
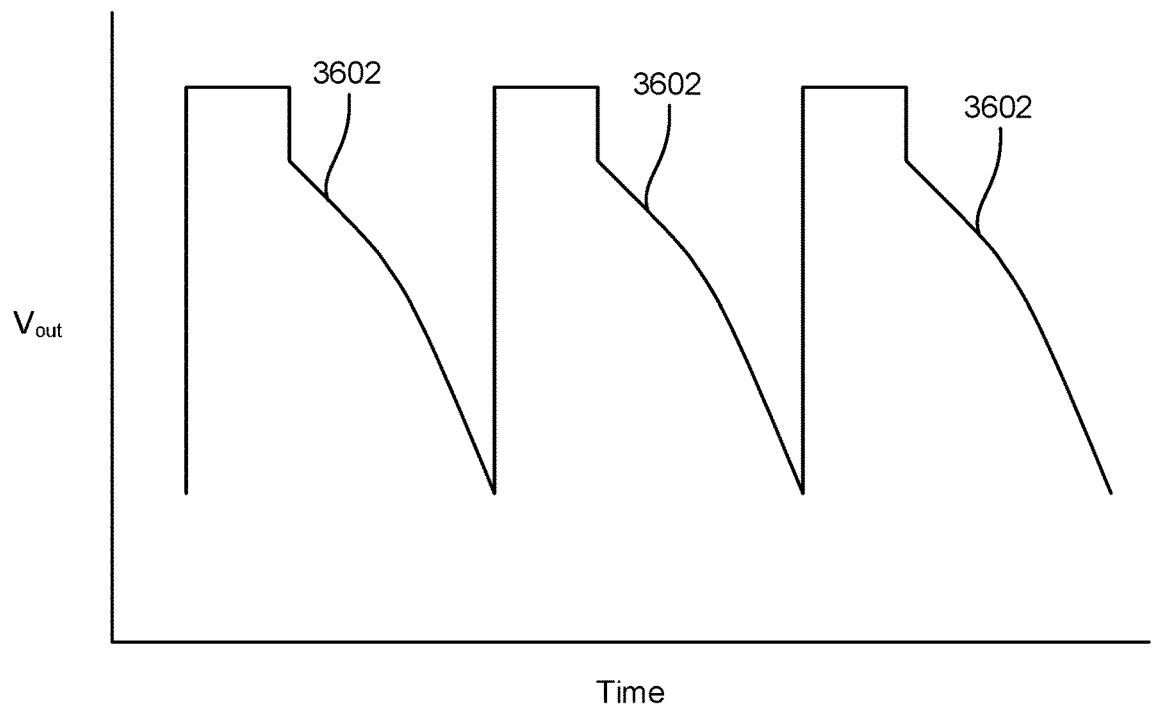
FIG. 36 illustrates a modified periodic voltage function waveform that can be indicative of a dynamic change in the system capacitance.

FIG. 36 illustrates a modified periodic voltage function that can be indicative of a dynamic (or nonlinear) change in a capacitance of the system. For instance, a stray capacitance that nonlinearly depends on voltage could result in such a modified periodic voltage function. In another example, plasma breakdown or a fault in the chuck could also result in such a modified periodic voltage function. In each of the three illustrated cycles a nonlinearity in the fourth portion 3602 of each cycle can be indicative of a dynamic change in the system capacitance. For instance, the nonlinearities can indicate a change in the sheath capacitance since other components of system capacitance are largely fixed.

Figure 37:
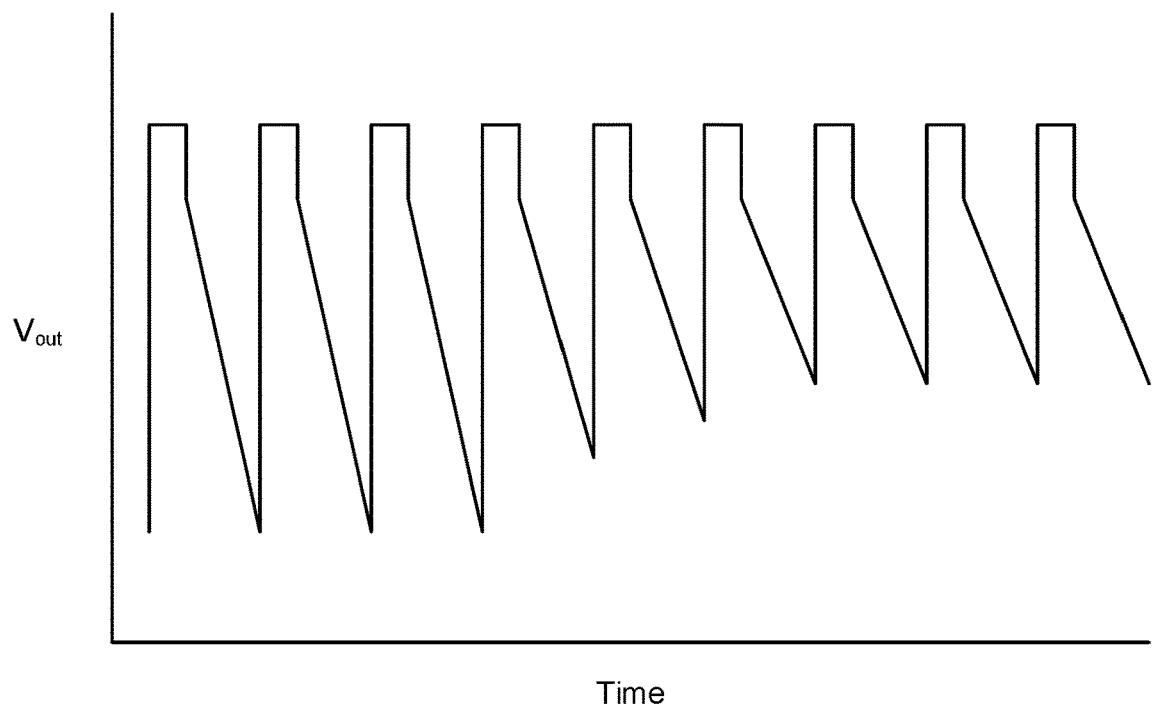
FIG. 37 illustrates a modified periodic voltage function waveform that may be indicative of changes in plasma density.

FIG. 37 illustrates a modified periodic voltage function that may be indicative of changes in plasma density. The illustrated modified periodic voltage function shows monotonic shifts in the slope $dV_0/dt$, which can indicate a change in plasma density. These monotonic shifts can provide a direct indication of an anticipated event, such as a process etch end point. In other embodiments, these monotonic shifts can indicate a fault in the process where no anticipated event exists.

Figure 38:
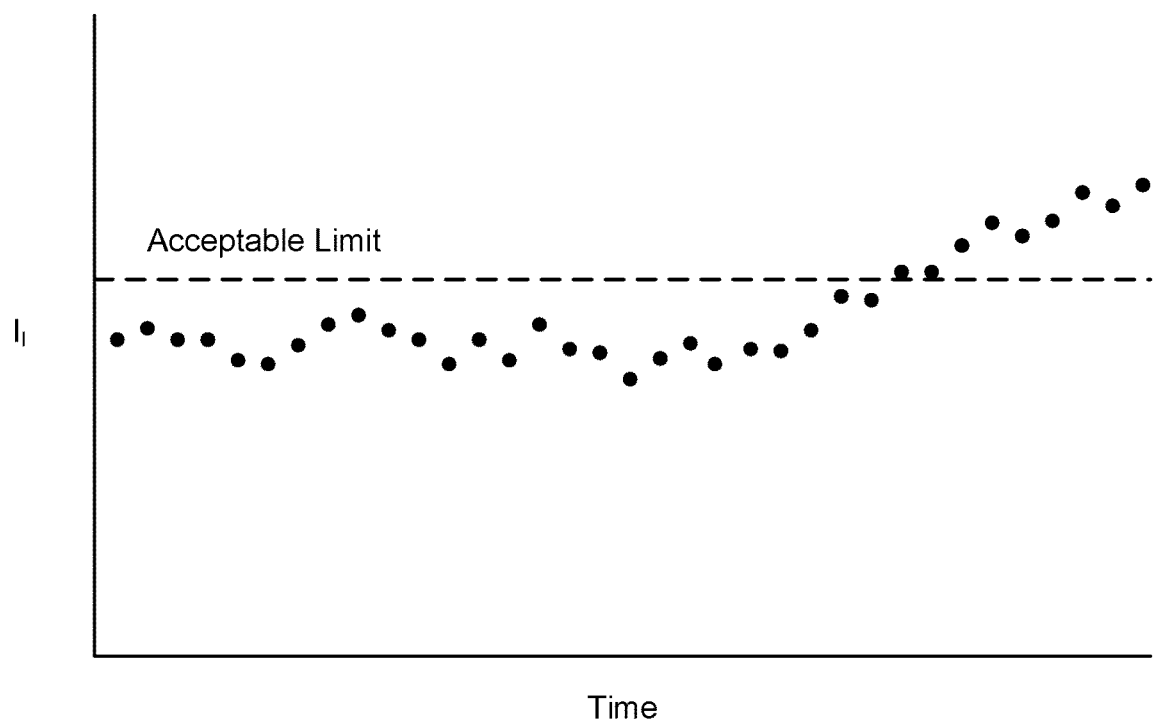
FIG. 38 illustrates a sampling of ion current for different process runs, where drift in the ion current can indicate system drift.

FIG. 38 illustrates a sampling of ion current for different process runs, where drift in the ion current can indicate system drift. Each data point can represent an ion current for a given run, where the acceptable limit is a user-defined or automated limit which defines an acceptable ion current. Drift in the ion current, which gradually pushes the ion current above the acceptable limit can indicate that substrate damage is possible. This type of monitoring can also be combined with any number of other traditional monitors, such as optical omission, thickness measurement, etc. These traditional types of monitors in addition to monitoring ion current drift can enhance existing monitoring and statistical control.

Figure 39:
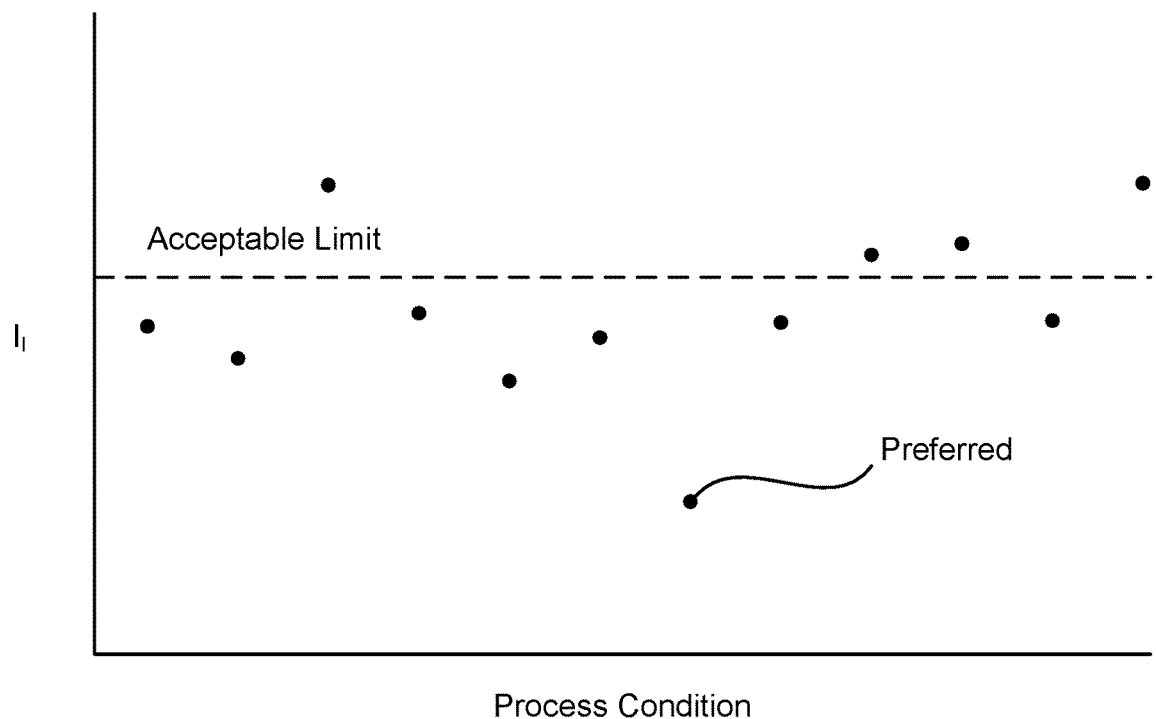
FIG. 39 illustrates a sampling of ion current for different process parameters.

FIG. 39 illustrates a sampling of ion current for different process parameters. In this illustration ion current can be used as a figure of merit to differentiate different processes and different process characteristics. Such data can be used in the development of plasma recipes and processes. For instance, eleven process conditions could be tested resulting in the eleven illustrated ion current data points, and the process resulting in a preferred ion current can be selected as an ideal process, or in the alternative as a preferred process. For instance, the lowest ion current may be selected as the ideal process, and thereafter the ion current associated with the preferred process can be used as a metric to judge whether a process is being carried out with the preferred process condition(s). This figure of merit can be used in addition to or as an alternative to similar traditional merit characteristics such as rate, selectivity, and profile angle, to name a few non-limiting examples.

Figure 40:
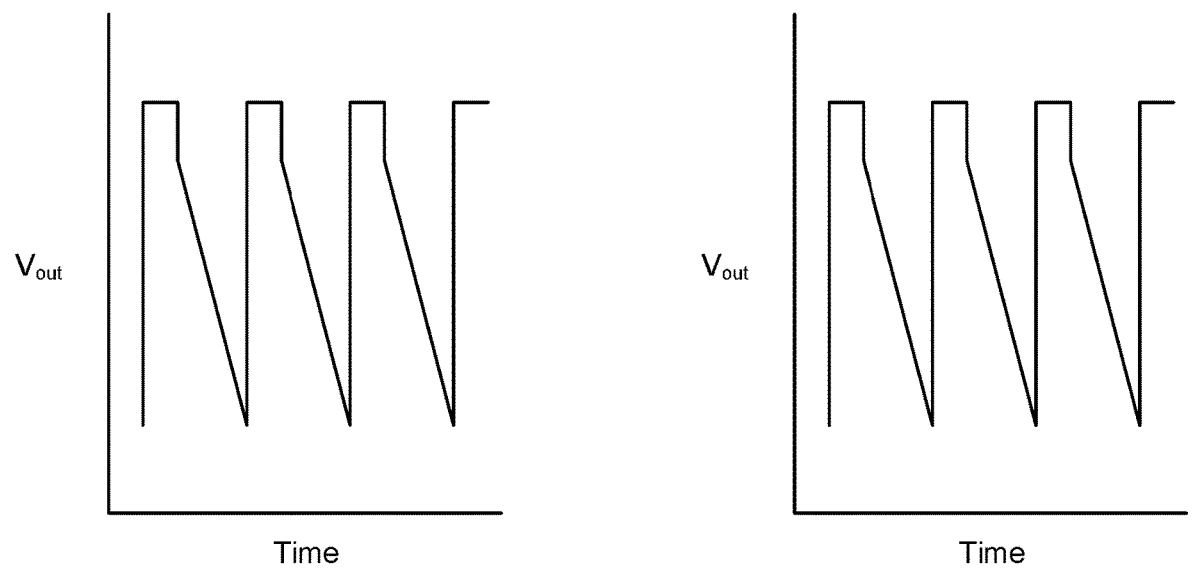
FIG. 40 illustrates two bias waveforms monitored without a plasma in the chamber.

FIG. 40 illustrates two modified periodic voltage functions monitored without a plasma in the chamber. These two modified periodic voltage functions can be compared and used to characterize the plasma chamber. In an embodiment the first modified periodic voltage function can be a reference waveform while the second modified periodic voltage function can be a currently-monitored waveform. These waveforms can be taken without a plasma in the processing chamber, for instance after a chamber clean or preventative maintenance, and therefore the second waveform can be used to provide validation of an electrical state of the chamber prior to release of the chamber into (or back into) production.

Figure 41:
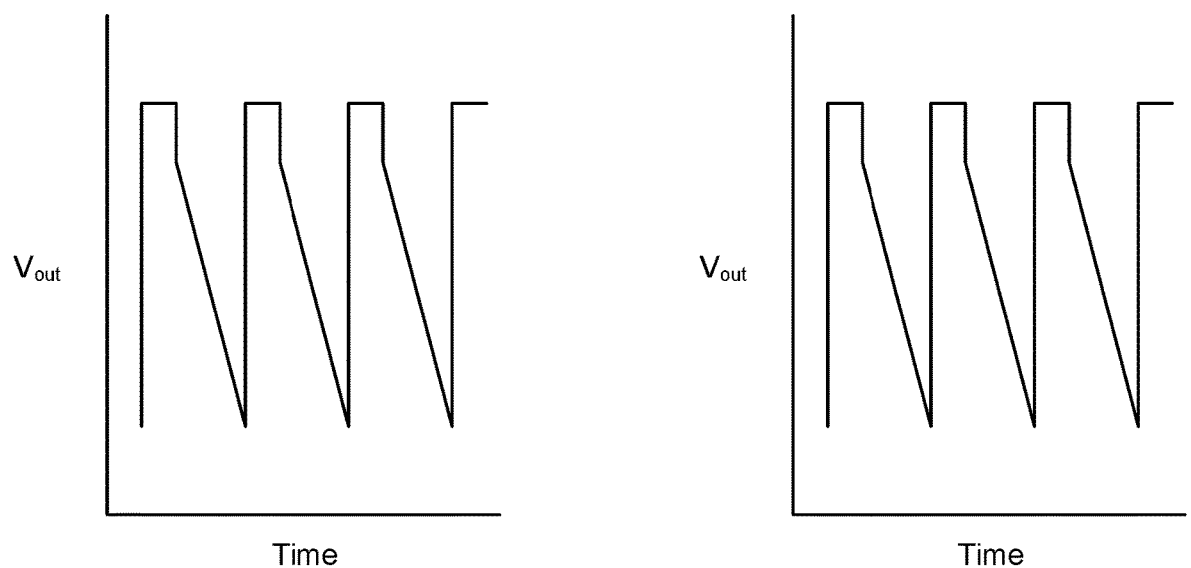
FIG. 41 illustrates two bias waveforms that can be used to validate a plasma process.
Figure 42A:
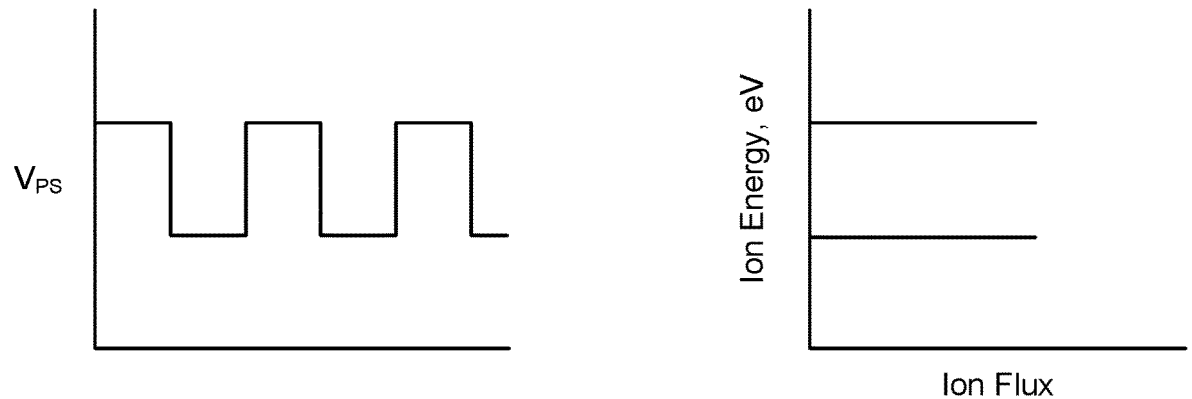
FIG. 42A illustrates a first power supply voltage and ion energy plot showing the relationship between the power supply voltage and ion energy.
Figure 42B:
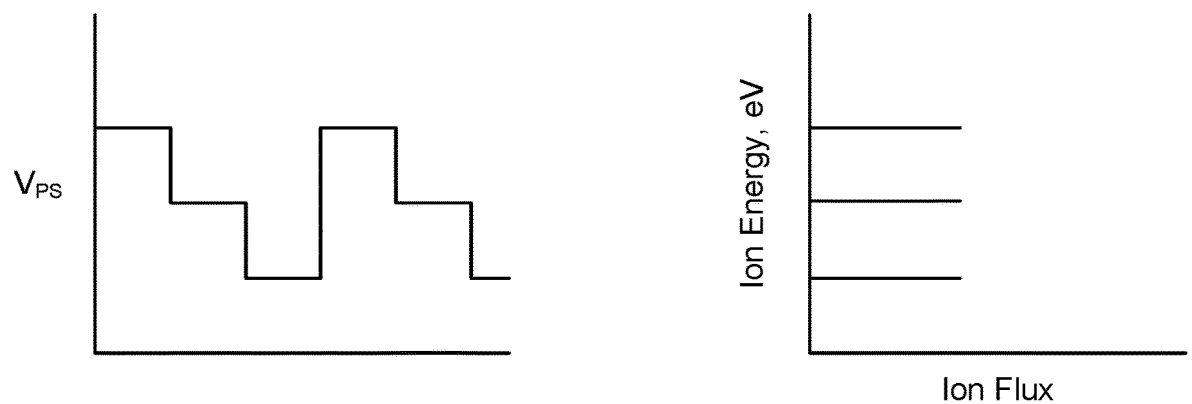
FIG. 42B illustrates a second power supply voltage and ion energy plot showing the relationship between the power supply voltage and ion energy.
Figure 42C:
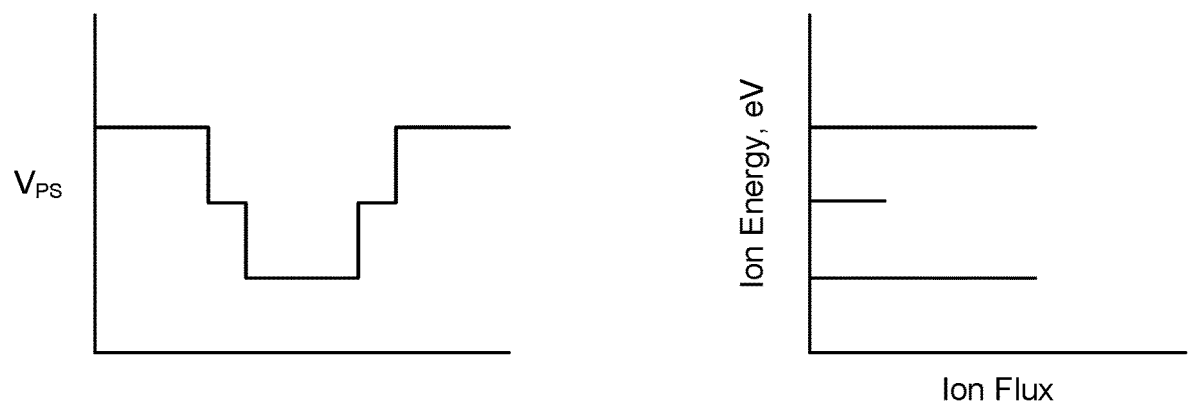
FIG. 42C illustrates a third power supply voltage and ion energy plot showing the relationship between the power supply voltage and ion energy.

FIG. 41 illustrates two modified periodic voltage functions that can be used to validate a plasma process. The first modified periodic voltage function can be a reference waveform while the second modified periodic voltage function can be a currently monitored waveform. The currently monitored waveform can be compared to the reference waveform and any differences can indicate parasitic and/or non-capacitive impedance issues that are otherwise not detectable using traditional monitoring methods. For instance, the ringing seen on the waveform of FIG. 35 may be detected and could represent ringing in the power supply.

Any of the metrics illustrated in FIGS. 32-41 can be monitored while the method 3000 loops in order to update the ion current compensation, Ic, ion current, $I_I$, and/or the sheath capacitance, $C_{sheath}$. For instance, after each ion current, $I_I$, sample is taken in FIG. 38, the method 3000 can loop back to the sampling 3004 in order to determine an updated ion current, $I_I$. In another example, as a result of a monitoring operation, a correction to the ion current, $I_I$, ion energy, eV, or the IEDF width may be desired. A corresponding correction can be made and the method 3000 can loop back to the sampling 3004 to find a new ion current compensation, Ic, that meets Equation 3.

One of skill in the art will recognize that the methods illustrated in FIGS. 30, 31, and 43 do not require any particular or described order of operation, nor are they limited to any order illustrated by or implied in the figures. For instance, metrics (FIGS. 32-41) can be monitored before, during, or after setting and monitoring the IEDF width and/or the ion energy, eV.

FIG. 44 illustrates various waveforms at different points in the systems herein disclosed. Given the illustrated switching pattern 4410 for switching components of a switch mode power supply, a power supply voltage, $V_{PS}$, 4406 (also referred to herein as a periodic voltage function), ion current compensation, Ic, 4404, modified periodic voltage function 4402, and substrate voltage, $V_{sub}$, 4412, the IEDF has the illustrated width 4414 (which may not be drawn to scale) or IEDF shape 4414. This width is wider than what this disclosure has referred to as a "narrow width." As seen, when the ion current compensation, Ic, 4404 is greater than the ion current, $I_I$, the substrate voltage, $V_{sub}$, 4412 is not constant. The IEDF width 4414 is proportional to a voltage difference of the sloped portion between voltage reversals of the substrate voltage, $V_{sub}$, 4412.

Given this non-narrow IEDF width 4414, the methods herein disclosed call for the ion current compensation, Ic, to be adjusted until $I_C=I_I$ (or in the alternative are related according to Equation 2). FIG. 45 illustrates the effects of making a final incremental change in ion current compensation, Ic, in order to match it to ion current $I_I$. When $I_C=I_I$ the substrate voltage, $V_{sub}$, 4512 becomes substantially constant, and the IEDF width 4514 goes from non-narrow to narrow.

Once the narrow IEDF has been achieved, one can adjust the ion energy to a desired or defined value as illustrated in FIG. 46. Here, a magnitude of the power supply voltage (or in the alternative a bus voltage, $V_{bus}$, of a switch-mode power supply) is decreased (e.g., a maximum negative amplitude of the power supply voltage 4606 between voltage reversals is reduced). As a result, $\Delta V_1$ decreases to $\Delta V_2$ as does the peak-to-peak voltage, from $V_{PP1}$ to $V_{PP2}$. A magnitude of the substantially constant (or sustained) substrate voltage, $V_{sub}$, 4608 consequently decreases, thus decreasing a magnitude of the ion energy from 4615 to 4614 while maintaining the narrow IEDF width.

Whether the ion energy is adjusted or not, the IEDF width can be widened after the narrow IEDF width is achieved as shown in FIG. 47. Here, given $I_I \neq I_C$ (or in the alternative, Equation 2 giving the relation between $I_I$ and $I_C$), $I_C$ can be adjusted thus changing a slope of the portion between pulses of the modified periodic voltage function 4702. As a result of ion current compensation, Ic, and ion current, $I_I$, being not equal, the substrate voltage moves from substantially constant to non-constant. A further result is that the IEDF width 4714 expands from the narrow IEDF 4714 to a non-narrow IEDF 4702. The more that $I_C$ is adjusted away from $I_I$, the greater the IEDF 4714 width.

Figure 48:
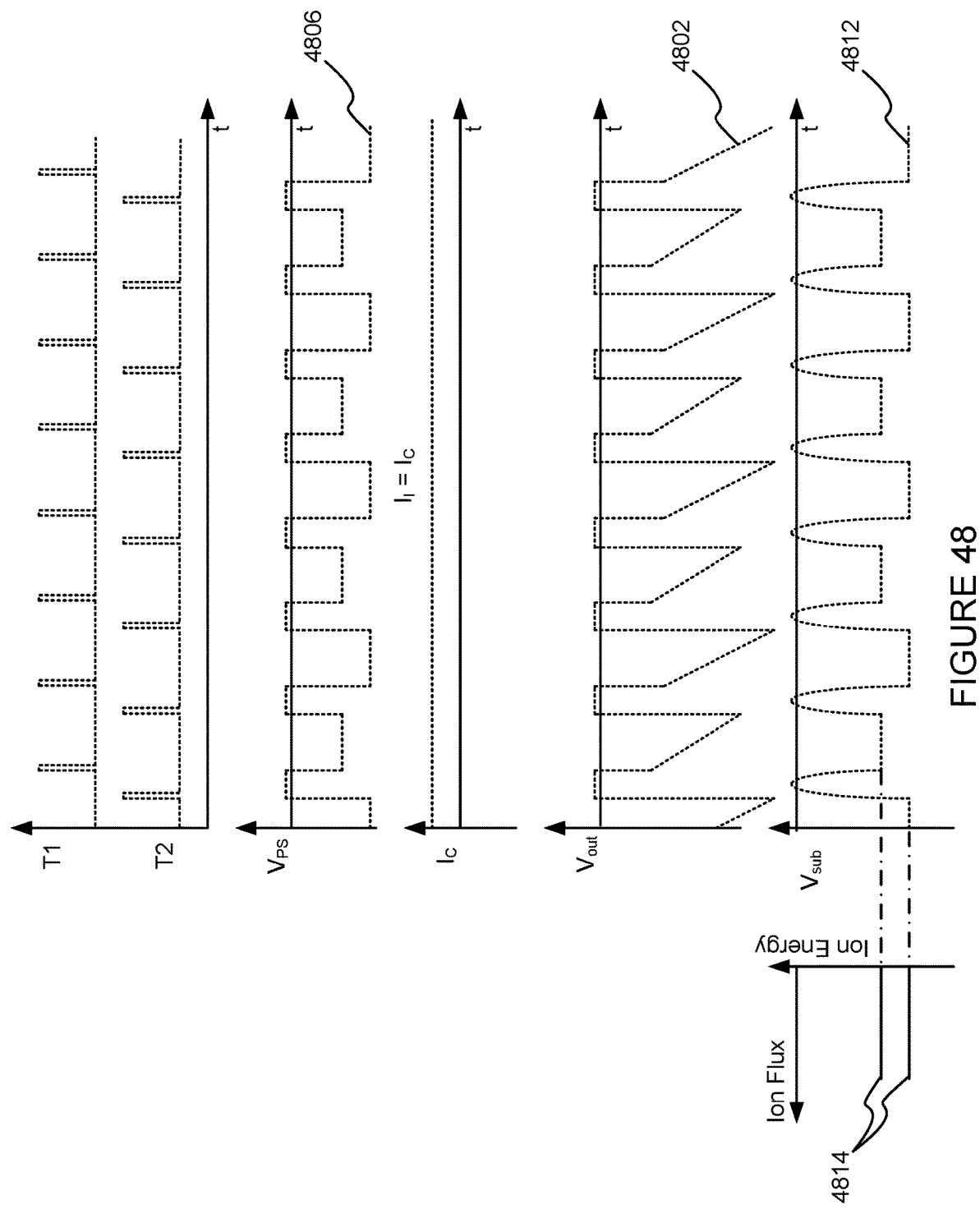
FIG. 48 illustrates one pattern of the power supply voltage, $V_{PS}$, that can be used to achieve more than one ion energy level where each ion energy level has a narrow IEDF width.

FIG. 48 illustrates one pattern of the power supply voltage that can be used to achieve more than one ion energy level where each ion energy level has a narrow IEDF 4814 width. A magnitude of the power supply voltage 4806 alternates each cycle. This results in an alternating $\Delta V$ and peak-to-peak voltage for each cycle of the modified periodic voltage function 4802. The substrate voltage 4812 in turn has two substantially constant voltages (or sustained voltages) that alternate between pulses of the substrate voltage. This results in two different ion energies each having a narrow IEDF 4814 width.

Figure 49:
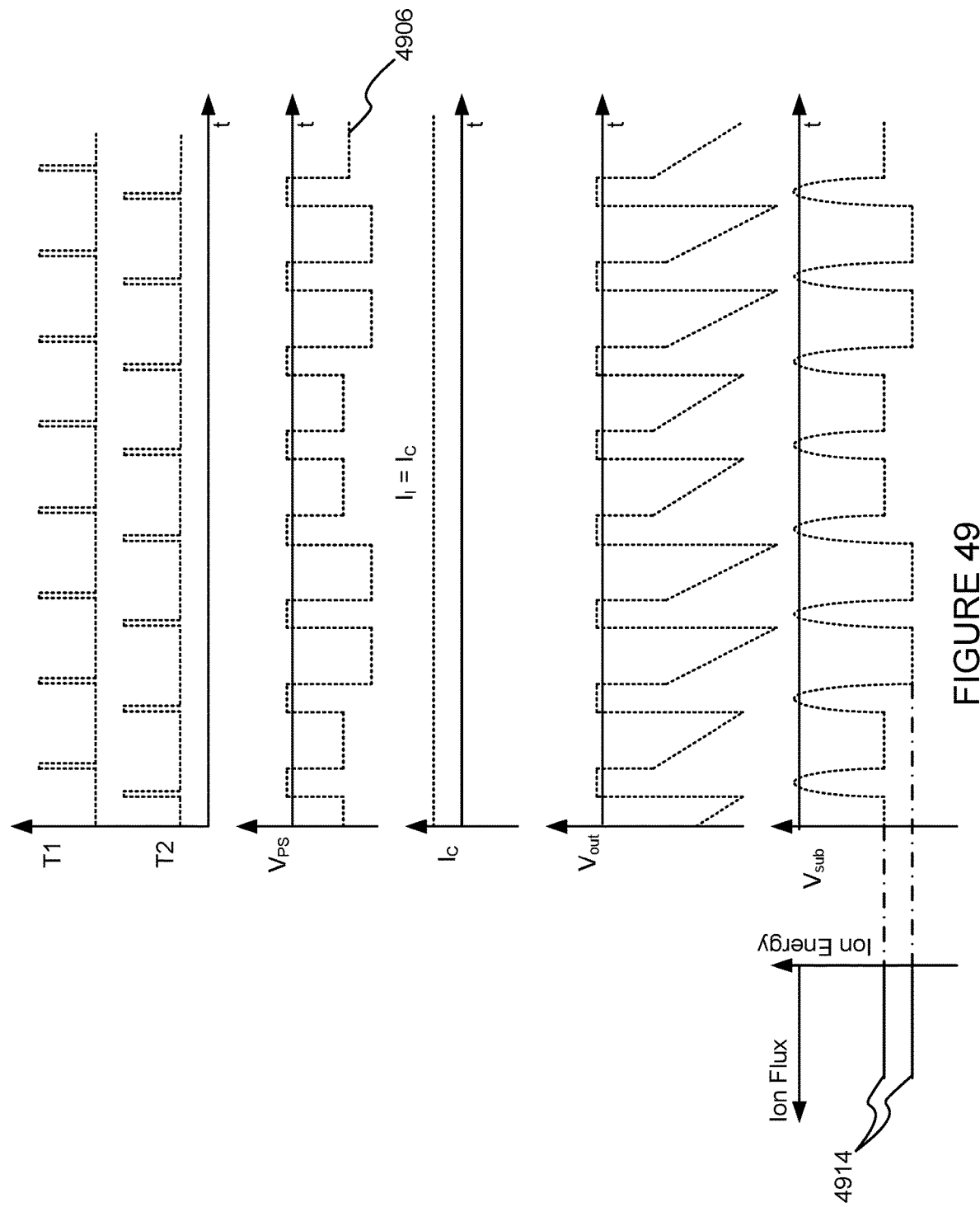
FIG. 49 illustrates another pattern of the power supply voltage, $V_{PS}$, that can be used to achieve more than one ion energy level where each ion energy level has a narrow IEDF width.

FIG. 49 illustrates another pattern of the power supply voltage that can be used to achieve more than one ion energy level where each ion energy level has a narrow IEDF 4914 width. Here, the power supply voltage 4906 alternates between two different magnitudes but does so for two cycles at a time before alternating. As seen, the average ion energies are the same as if $V_{PS}$ 4906 were alternated every cycle. This shows just one example of how various other patterns of the $V_{PS}$ 4906 can be used to achieve the same ion energies.

Figure 50:
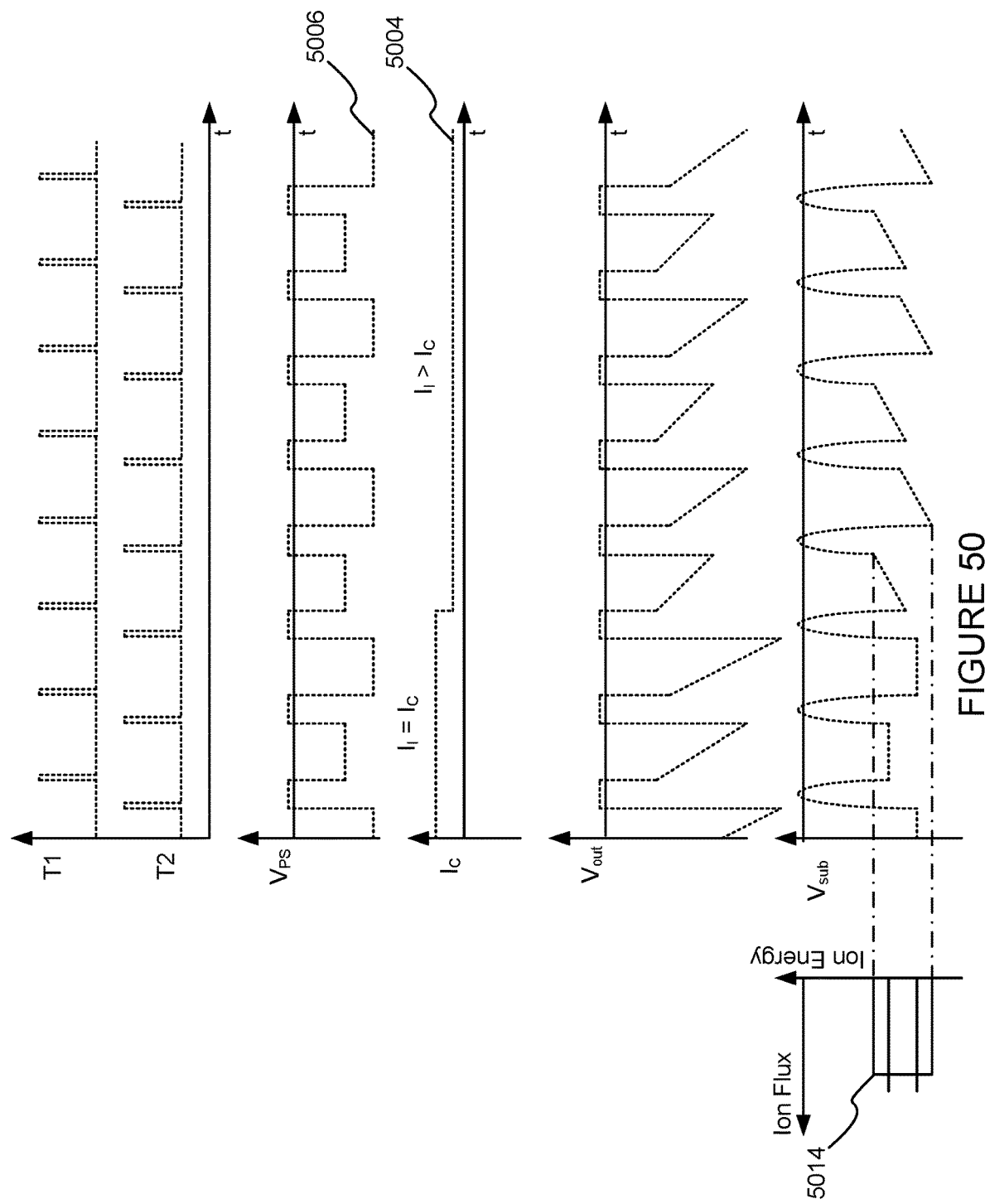
FIG. 50 illustrates one combination of power supply voltages, $V_{PS}$, and ion current compensation, $I_C$, that can be used to create a defined IEDF.
Figure 51:
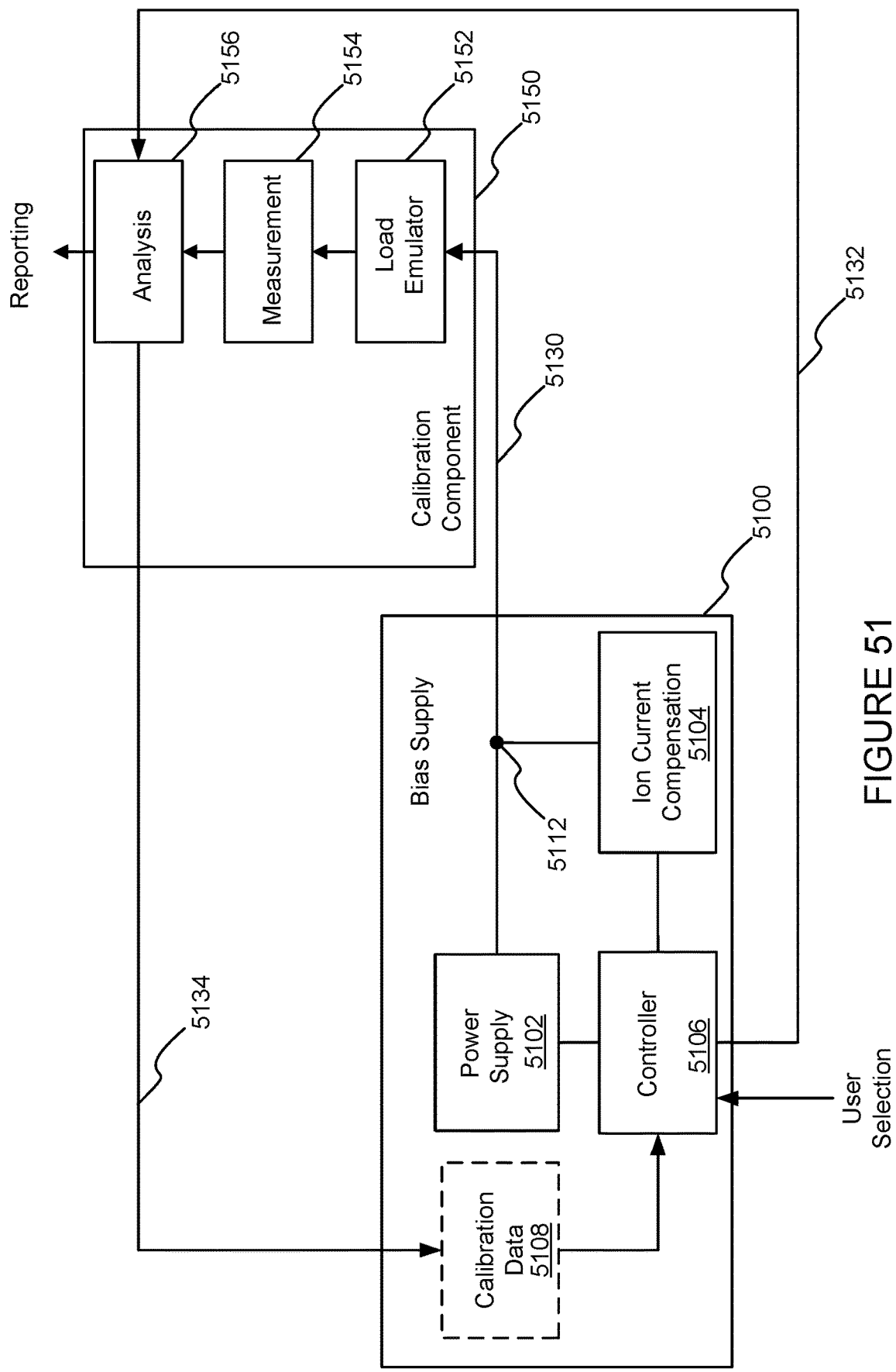
FIG. 51 is a block diagram depicting an embodiment of an ion current compensation component calibrated by a calibration component.
Figure 52:
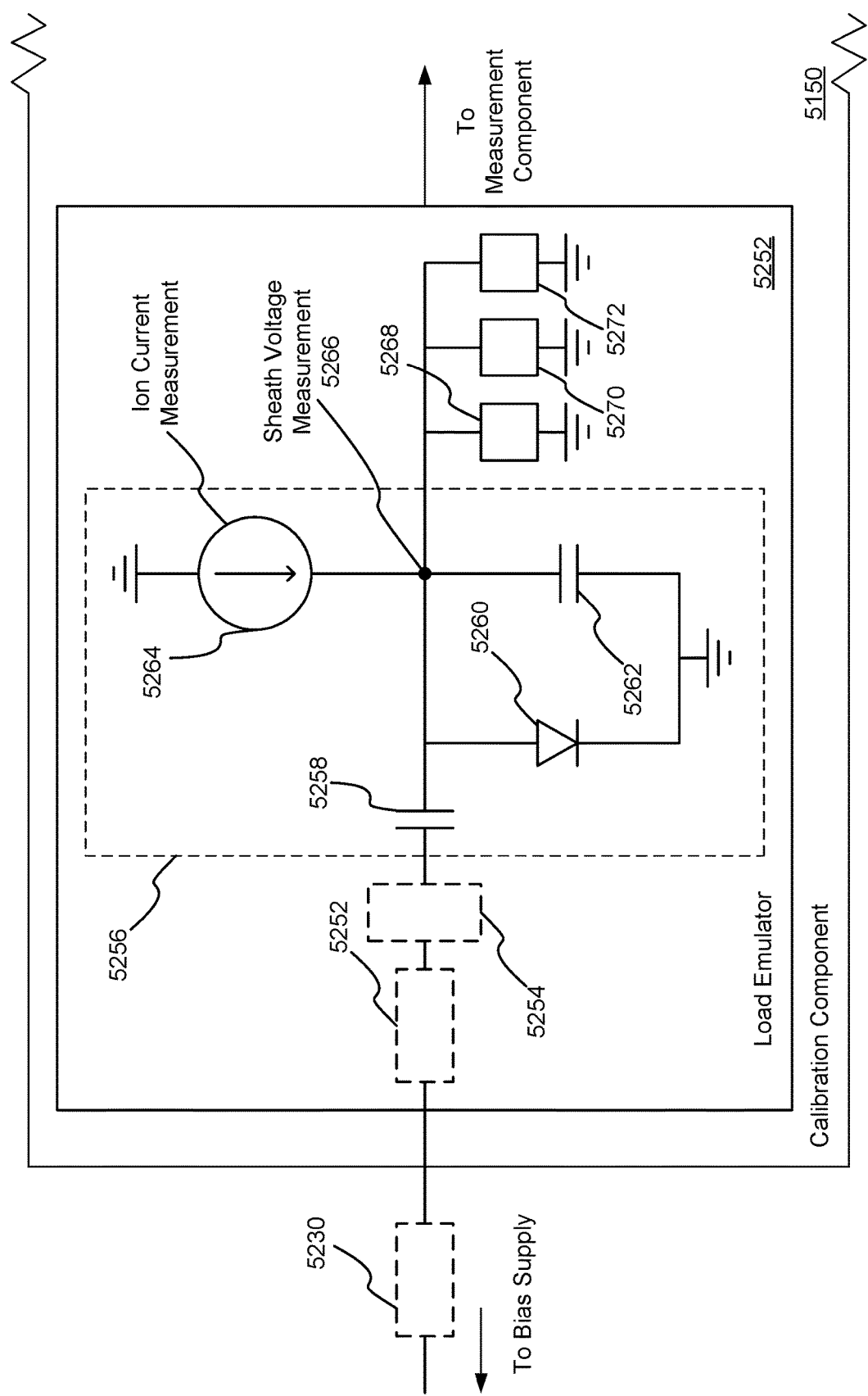
FIG. 52 illustrates a detailed embodiment of a calibration component such as the one shown in FIG. 51.

FIG. 50 illustrates one combination of power supply voltages, $V_{PS}$, 5006 and ion current compensation, Ic, 5004 that can be used to create a defined IEDF 5014. Here, alternating power supply voltages 5006 result in two different ion energies. Additionally, by adjusting the ion current compensation 5004 away from the ion current, $I_I$, the IEDF 5014 width for each ion energy can be expanded. If the ion energies are close enough, as they are in the illustrated embodiment, then the IEDF 5014 for both ion energies will overlap resulting in one large IEDF 5014. Other variations are also possible, but this example is meant to show how combinations of adjustments to the $V_{PS}$ 5006 and the Ic 5004 can be used to achieve defined ion energies and defined IEDFs 5014.

Throughout this disclosure, the term monoenergetic ion energy distribution has been used, but it will be understood by those of skill in the art that in practice there may be some small finite width to the ion energy distribution despite the use of a constant or substantially constant substrate surface voltage. Therefore, the terms controllably narrow or monoenergetic distribution of ion energy are used to refer to the narrowest ion energy distributions possible via the systems and methods disclosed herein.

Figure 17A:
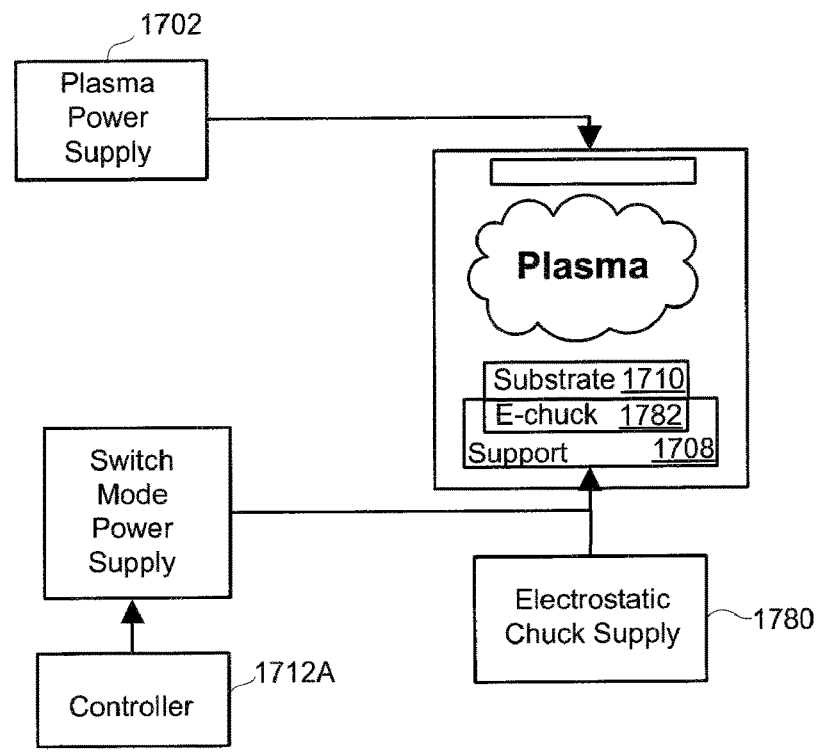
FIGS. 17A and 17B are block diagrams depicting other embodiments of the present invention.
Figure 17B:
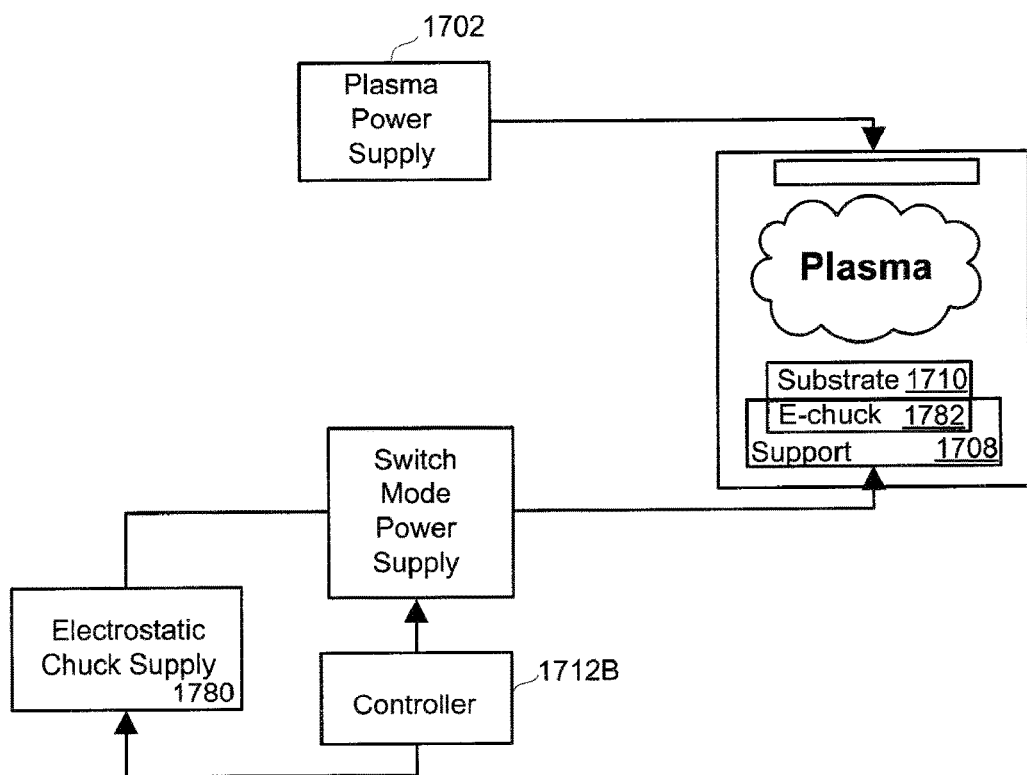

Referring next to FIGS. 17A and 17B, shown are block diagrams depicting other embodiments of the present invention. As shown, the substrate support 1708 in these embodiments includes an electrostatic chuck 1782, and an electrostatic chuck supply 1780 is utilized to apply power to the electrostatic chuck 1782. In some variations, as depicted in FIG. 17A, the electrostatic chuck supply 1780 is positioned to apply power directly to the substrate support 1708, and in other variations, the electrostatic chuck supply 1780 is positioned to apply power in connection with the switch mode power supply. It should be noted that serial chucking can be carried by either a separate supply or by use of the controller to effect a net DC chucking function. In this DC-coupled (e.g., no blocking capacitor), series chucking function, the undesired interference with other RF sources can be minimized.

Figure 18:
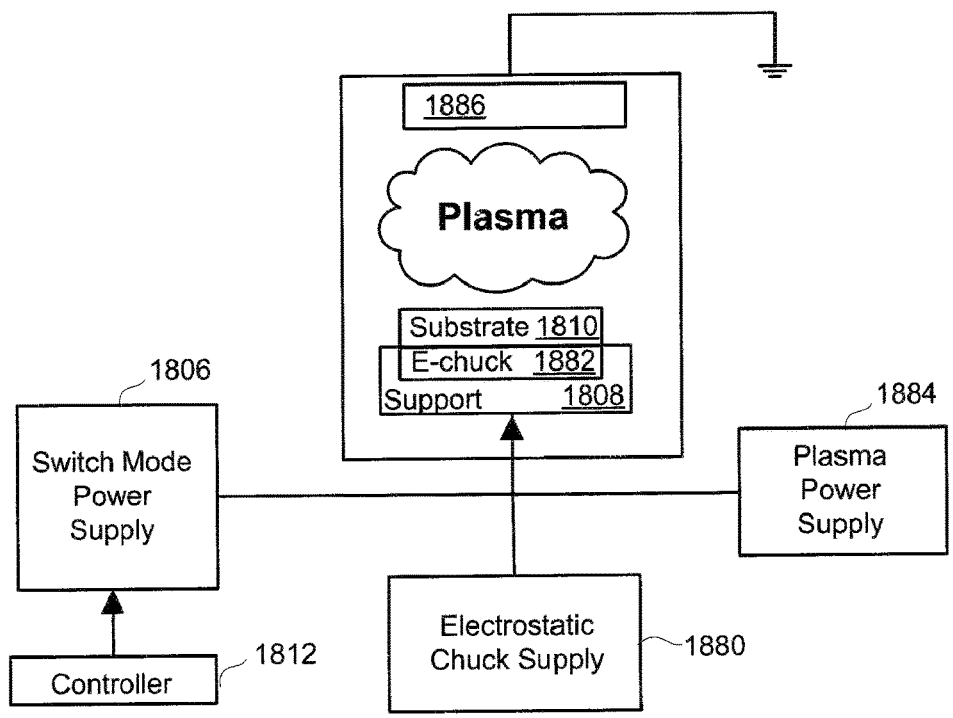
FIG. 18 is a block diagram depicting yet another embodiment of the present invention.

Shown in FIG. 18 is a block diagram depicting yet another embodiment of the present invention in which a plasma power supply 1884 that generally functions to generate plasma density is also configured to drive the substrate support 1808 alongside the switch mode power supply 1806 and electrostatic chuck supply 1880. In this implementation, each of the plasma power supply 1884, the electrostatic chuck supply 1880, and the switch mode power supply 1806 may reside in separate assemblies, or two or more of the supplies 1806, 1880, 1884 may be architected to reside in the same physical assembly. Beneficially, the embodiment depicted in FIG. 18 enables a top electrode 1886 (e.g., shower head) to be electrically grounded so as to obtain electrical symmetry and reduced level of damage due to fewer arcing events.

Figure 19:
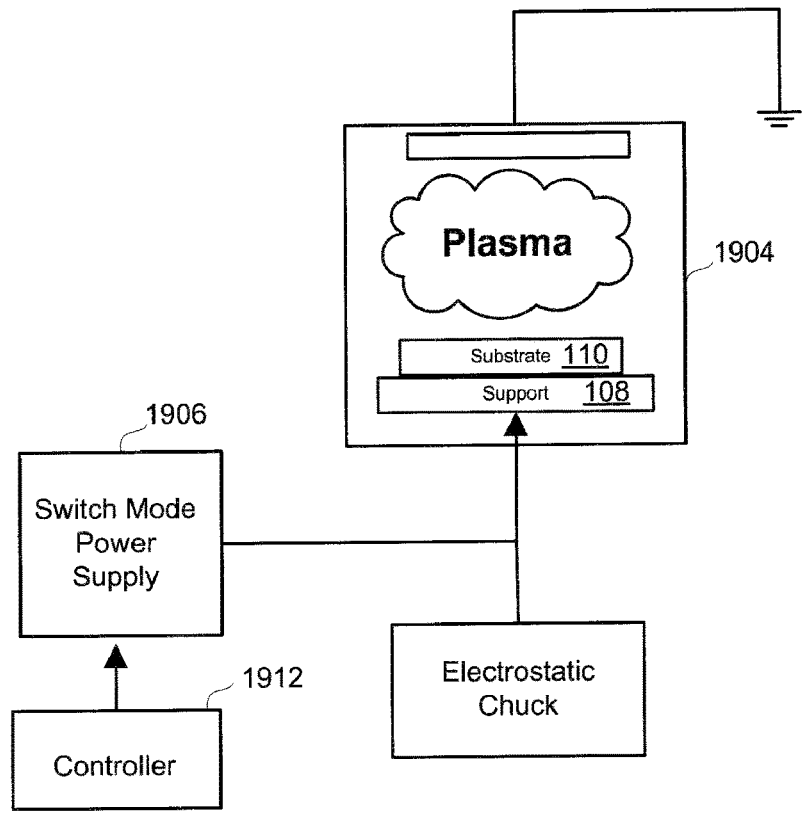
FIG. 19 is a block diagram depicting still another embodiment of the present invention.

Referring to FIG. 19, shown is a block diagram depicting still another embodiment of the present invention. As depicted, the switch mode power supply 1906 in this embodiment is configured to apply power to the substrate support and the chamber 1904 so as to both bias the substrate and ignite (and sustain) the plasma without the need for an additional plasma power supply (e.g., without the plasma power supply 102, 202, 1202, 1702, 1884). For example, the switch-mode power supply 1806 may be operated at a duty cycle that is sufficient to ignite and sustain the plasma while providing a bias to the substrate support.

Figure 20:
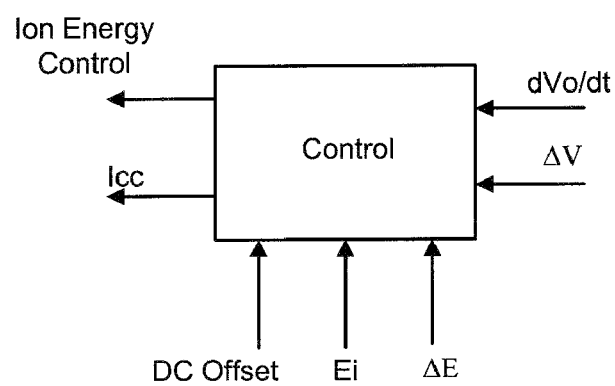
FIG. 20 is a block diagram input parameters and control outputs that may be utilized in connection with the embodiments described with reference to FIGS. 1-19.

Referring next to FIG. 20, it is a block diagram depicting input parameters and control outputs of a control portion that may be utilized in connection with the embodiments described with reference to FIGS. 1-19. The depiction of the control portion is intended to provide a simplified depiction of exemplary control inputs and outputs that may be utilized in connection with the embodiments discussed herein—it is not intended to a be hardware diagram. In actual implementation, the depicted control portion may be distributed among several discrete components that may be realized by hardware, software, firmware, or a combination thereof.

With reference to the embodiments previously discussed herein, the controller depicted in FIG. 20 may provide the functionality of one or more of the controller 112 described with reference to FIG. 1; the controller 212 and ion energy control 220 components described with reference to FIG. 2; the controller 812 and ion energy control portion 820 described with reference to FIG. 8; the ion current compensation component 1260 described with reference to FIG. 12; the current controller 1362 described with reference to FIG. 13; the Icc control depicted in FIG. 16, controllers 1712A, 1712B depicted in FIGS. 17A and 17B, respectively; and controllers 1812, 1912 depicted in FIGS. 18 and 19, respectively.

As shown, the parameters that may be utilized as inputs to the control portion include dVo/dt and ΔV, which are described in more detail with reference to FIGS. 13 and 14. As discussed, dVo/dt may be utilized to in connection with an ion-energy-distribution-spread input ΔE to provide a control signal Icc, which controls a width of the ion energy distribution spread as described with reference to FIGS. 12, 13, 14, 15A-C, and FIG. 16. In addition, an ion energy control input (Ei) in connection with optional feedback ΔV may be utilized to generate an ion energy control signal (e.g., that affects Vbus depicted in FIG. 3) to effectuate a desired (or defined) ion energy distribution as described in more detail with reference to FIGS. 1-11. And another parameter that may be utilized in connection with many e-chucking embodiments is a DC offset input, which provides electrostatic force to hold the wafer to the chuck for efficient thermal control.

Figure 21:
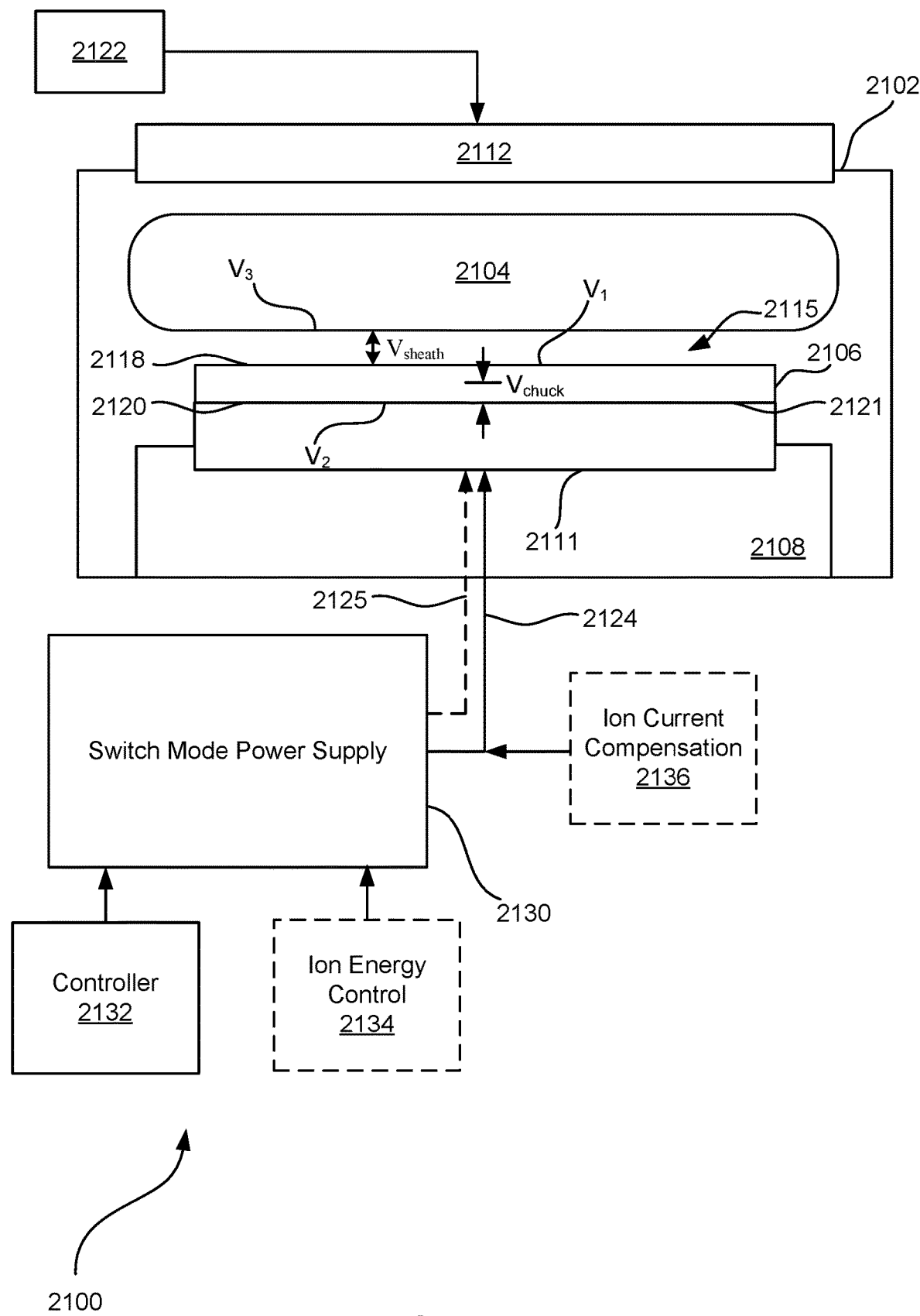
FIG. 21 is a block diagram depicting yet another embodiment of the present invention.

FIG. 21 illustrates a plasma processing system 2100 according to an embodiment of this disclosure. The system 2100 includes a plasma processing chamber 2102 enclosing a plasma 2104 for etching a top surface 2118 of a substrate 2106 (and other plasma processes). The plasma is generated by a plasma source 2112 (e.g., in-situ or remote or projected) powered by a plasma power supply 2122. A plasma sheath voltage $V_{sheath}$ measured between the plasma 2104 and the top surface 2118 of the substrate 2106 accelerates ions from the plasma 2104 across a plasma sheath 2115, causing the accelerated ions to impact a top surface 2118 of a substrate 2106 and etch the substrate 2106 (or portions of the substrate 2106 not protected by photoresist). The plasma 2104 is at a plasma potential $V_3$ relative to ground (e.g., the plasma processing chamber 2102 walls). The substrate 2106 has a bottom surface 2120 that is electrostatically held to a support 2108 via an electrostatic chuck 2111 and a chucking potential $V_{chuck}$ between a top surface 2121 of the electrostatic chuck 2111 and the substrate 2106. The substrate 2106 is dielectric and therefore can have a first potential $V_1$ at the top surface 2118 and a second potential $V_2$ at the bottom surface 2120. The top surface of the electrostatic chuck 2121 is in contact with the bottom surface 2120 of the substrate, and thus these two surfaces 2120, 2121 are at the same potential, $V_2$. The first potential $V_1$, the chucking potential $V_{chuck}$, and the second potential $V_2$, are controlled via an AC waveform with a DC bias or offset generated by a switch mode power supply 2130 and provided to the electrostatic chuck 2111 via a first conductor 2124. Optionally, the AC waveform is provided via the first conductor 2124, and the DC waveform is provided via an optional second conductor 2125. The AC and DC output of the switch mode power supply 2130 can be controlled via a controller 2132, which is also configured to control various aspects of the switch mode power supply 2130.

Ion energy and ion energy distribution are a function of the first potential $V_1$. The switch mode power supply 2130 provides an AC waveform tailored to effect a desired first potential $V_1$ known to generate a desired (or defined) ion energy and ion energy distribution. The AC waveform can be RF and have a non-sinusoidal waveform such as that illustrated in FIGS. 9B, 10B, 14, 32, 37, 40, 41, and and 44-50. The first potential $V_1$ can be proportional to the change in voltage ΔV illustrated in FIG. 14. The first potential $V_1$ is also equal to the plasma voltage $V_3$ minus the plasma sheath voltage $V_{sheath}$. But since the plasma voltage $V_3$ is often small (e.g., less than 20 V) compared to the plasma sheath voltage $V_{sheath}$ (e.g., 50 V-2000 V), the first potential $V_1$ and the plasma sheath voltage $V_{sheath}$ are approximately equal and for purposes of implementation can be treated as being equal. Thus, since the plasma sheath voltage $V_{sheath}$ dictates ion energies, the first potential $V_1$ is proportional to ion energy distribution. By maintaining a constant first potential $V_1$ (or substantially constant voltage portions or sustained voltage portions), the plasma sheath voltage $V_{sheath}$ is constant (or substantially constant or sustained), and thus substantially all ions are accelerated via the same energy, and hence a narrow ion energy distribution is achieved. The plasma voltage $V_3$ results from energy imparted to the plasma 2104 via the plasma source 2112.

The first potential $V_1$ at the top surface 2118 of the substrate 2106 is formed via a combination of capacitive charging from the electrostatic chuck 2111 and charge buildup from electrons and ions passing through the sheath 2115. The AC waveform from the switch mode power supply 2130 is tailored to offset the effects of ion and electron transfer through the sheath 2115 and the resulting charge buildup at the top surface 2118 of the substrate 2106 such that the first potential $V_1$ remains substantially constant (or sustained).

The chucking force that holds the substrate 2106 to the electrostatic chuck 2111 is a function of the chucking potential $V_{chuck}$. The switch mode power supply 2130 provides a DC bias, or DC offset, to the AC waveform, so that the second potential $V_2$ is at a different potential than the first potential $V_1$. This potential difference causes the chucking voltage $V_{chuck}$. The chucking voltage $V_{chuck}$ can be measured from the top surface 2221 of the electrostatic chuck 2111 to a reference layer inside the substrate 2106, where the reference layer includes any elevation inside the substrate except a bottom surface 2120 of the substrate 2106 (the exact location within the substrate 2106 of the reference layer can vary). Thus, chucking is controlled by and is proportional to the second potential $V_2$.

In an embodiment, the second potential $V_2$ is equal to the DC offset of the switch mode power supply 2130 modified by the AC waveform (in other words an AC waveform with a DC offset where the DC offset is greater than a peak-to-peak voltage of the AC waveform). The DC offset may be substantially larger than the AC waveform, such that the DC component of the switch mode power supply 2130 output dominates the second potential $V_2$ and the AC component can be neglected or ignored.

The potential within the substrate 2106 varies between the first and second potentials $V_1$, $V_2$. The chucking potential $V_{chuck}$ can be positive or negative (e.g., $V_1 > V_2$ or $V_1 < V_2$) since the coulombic attractive force between the substrate 2106 and the electrostatic chuck 2111 exists regardless of the chucking potential $V_{chuck}$ polarity.

The switch mode power supply 2130 in conjunction with the controller 2132 can monitor various voltages deterministically and without sensors. In particular, the ion energy (e.g., mean energy and ion energy distribution) is deterministically monitored based on parameters of the AC waveform (e.g., slope and step). For instance, the plasma voltage $V_3$, ion energy, and ion energy distribution are proportional to parameters of the AC waveform produced by the switch mode power supply 2130. In particular the $\Delta V$ of the falling edge of the AC waveform (see for example FIG. 14), is proportional to the first potential $V_1$, and thus to the ion energy. By keeping the first potential $V_1$ constant (or substantially constant voltage portions or sustained voltage portions), the ion energy distribution can be kept narrow.

In the case where the first potential $V_1$ cannot be directly measured and the correlation between the switch mode power supply output and the first voltage $V_1$ may vary based on the capacitance of the substrate 2106 and processing parameters, a constant of proportionality between $\Delta V$ and the first potential $V_1$ can be empirically determined after a short processing time has elapsed. For instance, where the falling edge $\Delta V$ of the AC waveform is 50 V, and the constant of proportionality is empirically found to be 2 for the given substrate and process, the first potential $V_1$ can be expected to be 100 V. A proportionality between the voltage step, $\Delta V$, and the first potential $V_1$ (and thus also ion energy, eV) is described by Equation 4. Thus, the first potential $V_1$, along with ion energy, and ion energy distribution can be determined based on knowledge of the AC waveform of the switch mode power supply without any sensors inside the plasma processing chamber 2102. Additionally, the switch mode power supply 2130 in conjunction with the controller 2132 can monitor when and if chucking is taking place (e.g., whether the substrate 2106 is being held to the electrostatic chuck 2111 via the chucking potential $V_{chuck}$).

Dechucking is performed by eliminating or decreasing the chucking potential $V_{chuck}$. This can be done by setting the second potential $V_2$ equal to the first potential $V_1$. In other words, the DC offset and the AC waveform can be adjusted in order to cause the chucking voltage $V_{chuck}$ to approach 0 V. Compared to conventional dechucking methods, the system 2100 achieves faster dechucking and thus greater throughput since both the DC offset and the AC waveform can be adjusted to achieve dechucking. Also, when the DC and AC power supplies are in the switch mode power supply 2130, their circuitry is more unified, closer together, can be controlled via a single controller 2132 (as compared to typical parallel arrangements of DC and AC power supplies), and change output faster. The speed of dechucking enabled by the embodiments herein disclosed also enables dechucking after the plasma 2104 is extinguished, or at least after power from the plasma source 2112 has been turned off.

The plasma source 2112 can take a variety of forms. For instance, in an embodiment, the plasma source 2112 includes an electrode inside the plasma processing chamber 2102 that establishes an RF field within the chamber 2102 that both ignites and sustains the plasma 2104. In another embodiment, the plasma source 2112 includes a remote projected plasma source that remotely generates an ionizing electromagnetic field, projects or extends the ionizing electromagnetic field into the processing chamber 2102, and both ignites and sustains the plasma 2104 within the plasma processing chamber using the ionizing electromagnetic field. Yet, the remote projected plasma source also includes a field transfer portion (e.g., a conductive tube) that the ionizing electromagnetic field passes through en route to the plasma processing chamber 2102, during which time the ionizing electromagnetic field is attenuated such that the field strength within the plasma processing chamber 2102 is only a tenth or a hundred or a thousandth or an even smaller portion of the field strength when the field is first generated in the remote projected plasma source. The plasma source 2112 is not drawn to scale.

The switch mode power supply 2130 can float and thus can be biased at any DC offset by a DC power source (not illustrated) connected in series between ground and the switch mode power supply 2130. The switch mode power supply 2130 can provide an AC waveform with a DC offset either via AC and DC power sources internal to the switch mode power supply 2130 (see for example FIGS. 22, 23, 26), or via an AC power source internal to the switch mode power supply 2130 and a DC power supply external to the switch mode power supply 2130 (see for example FIGS. 24, 27). In an embodiment, the switch mode power supply 2130 can be grounded and be series coupled to a floating DC power source coupled in series between the switch mode power supply 2130 and the electrostatic chuck 2111.

The controller 2132 can control an AC and DC output of the switch mode power supply when the switch mode power supply 2130 includes both an AC and DC power source. When the switch mode power supply 2130 is connected in series with a DC power source, the controller 2132 may only control the AC output of the switch mode power supply 2130. In an alternative embodiment, the controller 2130 can control both a DC power supply coupled to the switch mode power supply 2130, and the switch mode power supply 2130. One skilled in the art will recognize that while a single controller 2132 is illustrated, other controllers can also be implemented to control the AC waveform and DC offset provided to the electrostatic chuck 2111.

The electrostatic chuck 2111 can be a dielectric (e.g., ceramic) and thus substantially block passage of DC voltages, or it can be a semiconductor material such as a doped ceramic. In either case, the electrostatic chuck 2111 can have a second voltage $V_2$ on a top surface 2121 of the electrostatic chuck 2111 that capacitively couples voltage to a top surface 2118 of the substrate 2106 (usually a dielectric) to form the first voltage $V_1$.

The plasma 2104 shape and size are not necessarily drawn to scale. For instance, an edge of the plasma 2104 can be defined by a certain plasma density in which case the illustrated plasma 2104 is not drawn with any particular plasma density in mind. Similarly, at least some plasma density fills the entire plasma processing chamber 2102 despite the illustrated plasma 2104 shape. The illustrated plasma 2104 shape is intended primarily to show the sheath 2115, which does have a substantially smaller plasma density than the plasma 2104.

Figure 22:
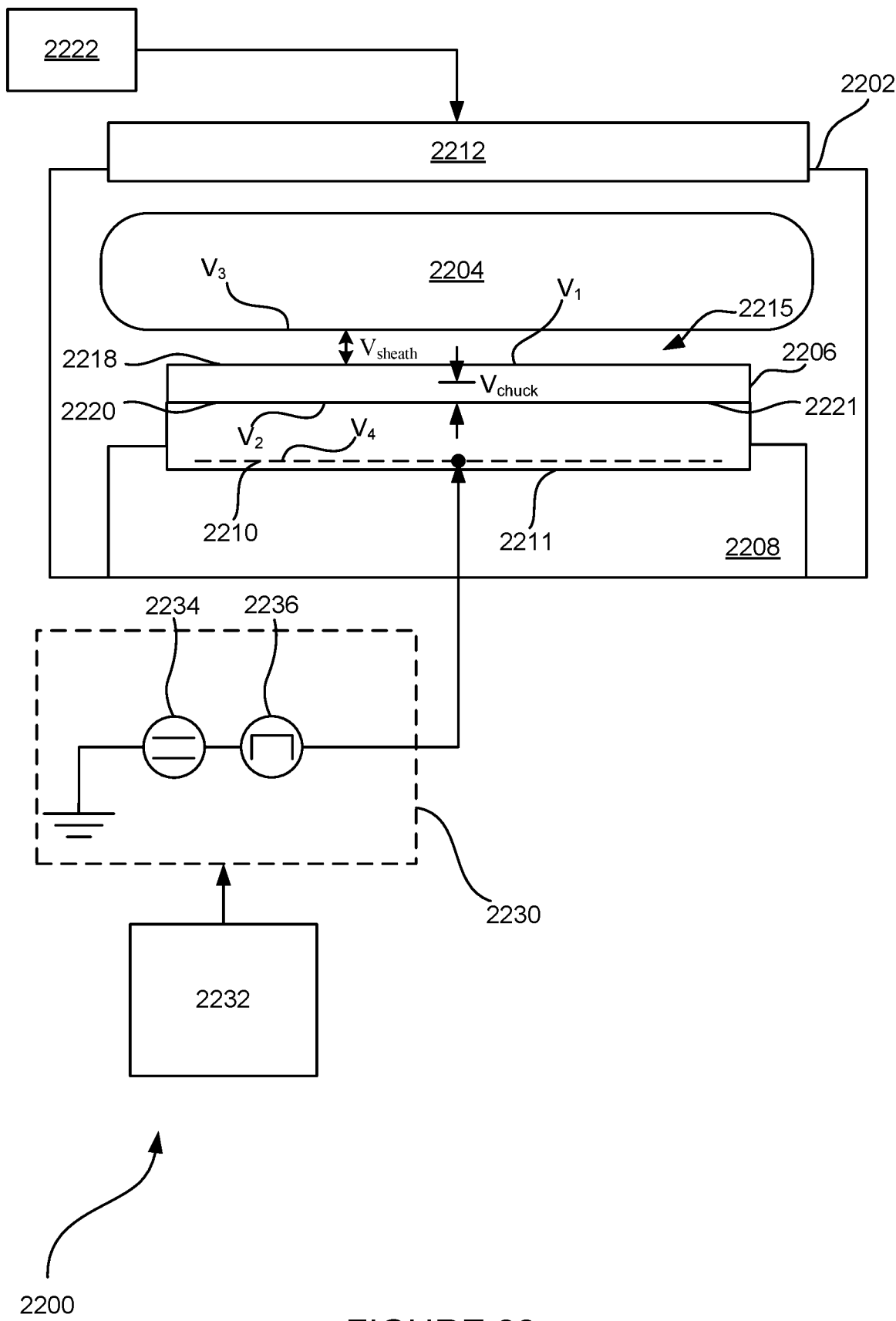
FIG. 22 is a block diagram depicting yet another embodiment of the present invention.

FIG. 22 illustrates another embodiment of a plasma processing system 2200. In the illustrated embodiment, the switch mode power supply 2230 includes a DC power source 2234 and an AC power source 2236 connected in series. Controller 2232 is configured to control an AC waveform with a DC offset output of the switch mode power supply 2230 by controlling both the AC power source 2236 waveform and the DC power source 2234 bias or offset. This embodiment also includes an electrostatic chuck 2211 having a grid or mesh electrode 2210 embedded in the chuck 2211. The switch mode power supply 2230 provides both an AC and DC bias to the grid electrode 2210. The DC bias along with the AC component, which is substantially smaller than the DC bias and can thus be neglected, establishes a third potential $V_4$ on the grid electrode 2210. When the third potential $V_4$ is different than a potential at a reference layer anywhere within the substrate 2206 (excluding the bottom surface 2220 of the substrate 2206), a chucking potential $V_{chuck}$ and a coulombic chucking force are established which hold the substrate 2206 to the electrostatic chuck 2211. The reference layer is an imaginary plane parallel to the grid electrode 2210. The AC waveform capacitively couples from the grid electrode 2210 through a portion of the electrostatic chuck 2211, and through the substrate 2206 to control the first potential $V_1$ on a top surface 2218 of the substrate 2206. Since a plasma potential $V_3$ is negligible relative to a plasma sheath voltage $V_{sheath}$, the first potential $V_1$ and the plasma sheath voltage $V_{sheath}$ are approximately equal, and for practical purposes are considered equal. Therefore, the first potential $V_1$ equals the potential used to accelerate ions through the sheath 2215.

In an embodiment, the electrostatic chuck 2211 can be doped so as to be conductive enough that any potential difference through the body of the chuck 2211 is negligible, and thus the grid or mesh electrode 2210 can be at substantially the same voltage as the second potential $V_2$.

The grid electrode 2210 can be any conductive planar device embedded in the electrostatic chuck 2211, parallel to the substrate 2206, and configured to be biased by the switch mode power supply 2230 and to establish a chucking potential $V_{chuck}$. Although the grid electrode 2210 is illustrated as being embedded in a lower portion of the electrostatic chuck 2211, the grid electrode 2210 can be located closer or further from the substrate 2206. The grid electrode 2210 also does not have to have a grid pattern. In an embodiment, the grid electrode 2210 can be a solid electrode or have a non-solid structure with a non-grid shape (e.g., a checkerboard pattern). In an embodiment, the electrostatic chuck 2211 is a ceramic or other dielectric and thus the third potential $V_4$ on the grid electrode 2210 is not equal to the first potential $V_1$ on a top surface 2221 of the electrostatic chuck 2211. In another embodiment, the electrostatic chuck 2211 is a doped ceramic that is slightly conductive and thus the third potential $V_4$ on the grid electrode 2210 can be equal to the second potential $V_2$ on the top surface 2221 of the electrostatic chuck 2211.

The switch mode power supply 2230 generates an AC output that can be non-sinusoidal. The switch mode power supply 2230 is able to operate the DC and AC sources 2234, 2236 in series because the DC power source 2234 is AC-conductive and the AC power source 2236 is DC-conductive. Exemplary AC power sources that are not DC-conductive are certain linear amplifiers which can be damaged when provided with DC voltage or current. The use of AC-conductive and DC-conductive power sources reduces the number of components used in the switch mode power supply 2230. For instance, if the DC power source 2234 is AC-blocking, then an AC-bypass or DC-blocking component (e.g., a capacitor) may have to be arranged in parallel with the DC power source 2234. If the AC power source 2236 is DC-blocking, then a DC-bypass or AC-blocking component (e.g., an inductor) may have to be arranged in parallel with the AC power source 2236.

In this embodiment, the AC power source 2238 is generally configured to apply a voltage bias to the electrostatic chuck 2211 in a controllable manner so as to effectuate a desired (or defined) ion energy distribution for the ions bombarding the top surface 2218 of the substrate 2206. More specifically, the AC power source 2236 is configured to effectuate the desired (or defined) ion energy distribution by applying one or more particular waveforms at particular power levels to the grid electrode 2210. And more particularly, the AC power source 2236 applies particular power levels to effectuate particular ion energies, and applies the particular power levels using one or more voltage waveforms defined by waveform data stored in a waveform memory (not illustrated). As a consequence, one or more particular ion bombardment energies may be selected to carry out controlled etching of the substrate 2206 (or other plasma-assisted processes). In one embodiment, the AC power source 2236 can make use of a switched mode configuration (see for example FIGS. 25-27). The switch mode power supply 2230, and particularly the AC power source 2236, can produce an AC waveform as described in various embodiments of this disclosure.

One skilled in the art will recognize that the grid electrode 2210 may not be necessary and that other embodiments can be implemented without the grid electrode 2210. One skilled in the art will also recognize that the grid electrode 2210 is just one example of numerous devices that can be used to establish chucking potential Vchuck.

Figure 23:
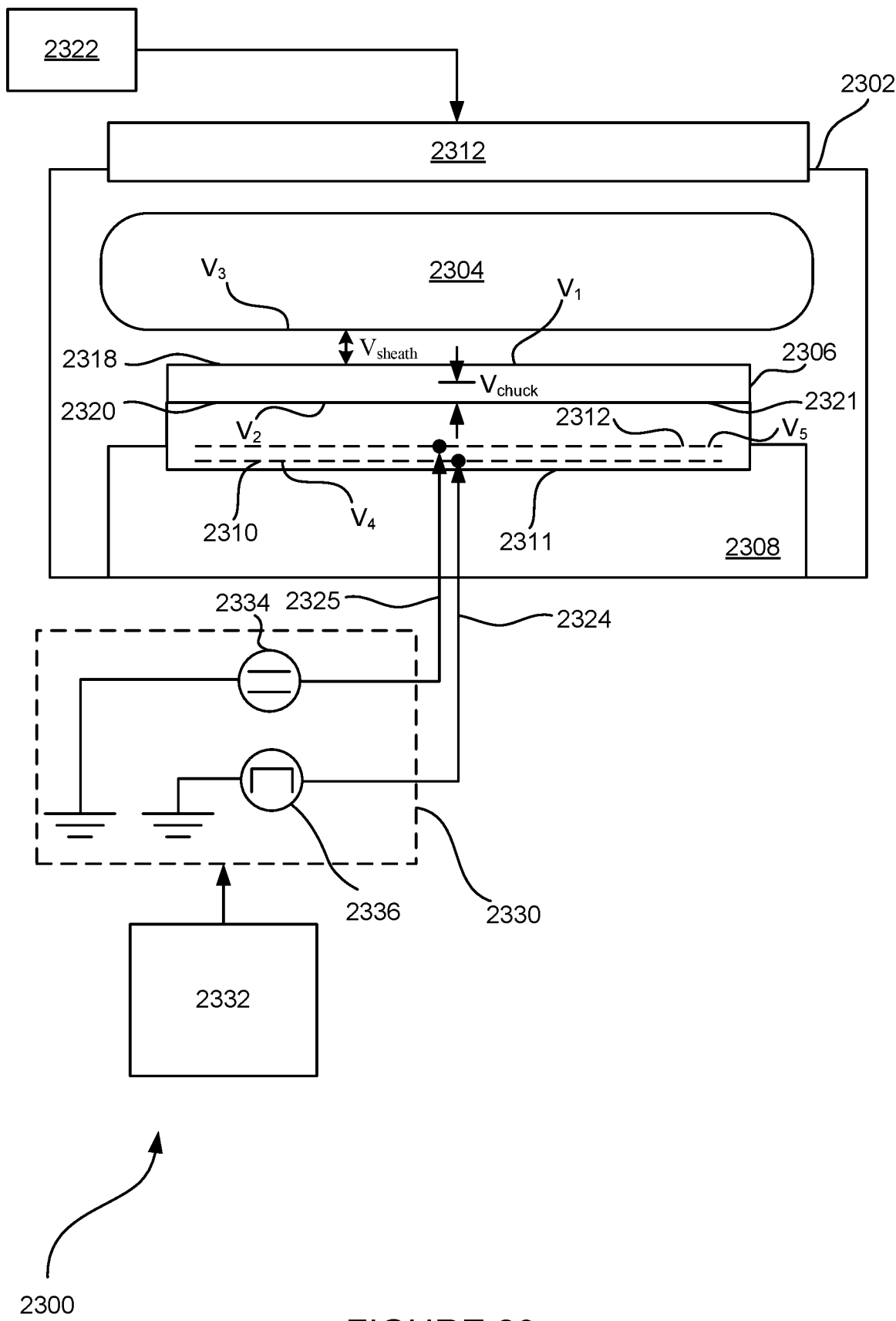
FIG. 23 is a block diagram depicting yet another embodiment of the present invention.

FIG. 23 illustrates another embodiment, of a plasma processing system 2300. The illustrated embodiment includes a switch mode power supply 2330 for providing an AC waveform and a DC bias to an electrostatic chuck 2311. The switch mode power supply 2330 includes a DC power source 2334 and an AC power source 2336, both of which can be grounded. The AC power source 2336 generates an AC waveform that is provided to a first grid or mesh electrode 2310 embedded in the electrostatic chuck 2311 via a first conductor 2324. The AC power source 2336 establishes a potential V4 on the first grid or mesh electrode 2310. The DC power source 2334 generates a DC bias that is provided to a second grid or mesh electrode 2312 embedded in the electrostatic chuck 2311 via a second conductor 2325. The DC power source 2334 establishes a potential V5 on the second grid or mesh electrode 2312. The potentials V4 and V5 can be independently controlled via the AC and DC power sources 2336, 2334, respectively. However, the first and second grid or mesh electrodes 2310, 2312 can also be capacitively coupled and/or there can be DC coupling between the grid or mesh electrodes 2310, 2312 via a portion of the electrostatic chuck 2311. If either AC or DC coupling exists, then the potentials V4 and V5 may be coupled. One skilled in the art will recognize that the first and second grid electrodes 2310, 2312 can be arranged in various locations throughout the electrostatic chuck 2311 including arranging the first grid electrode 2310 closer to the substrate 2306 than the second grid electrode 2312.

Figure 24:
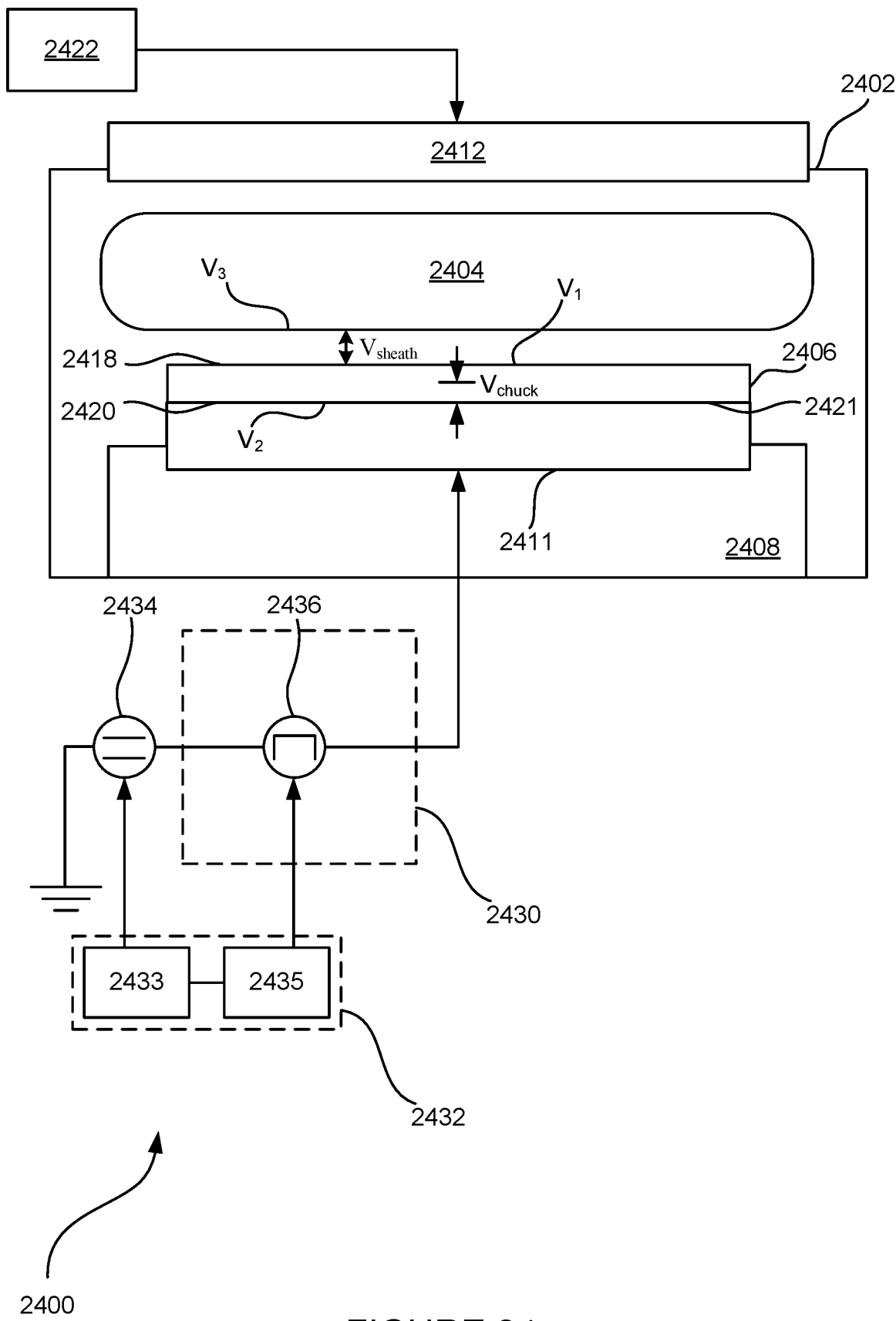
FIG. 24 is a block diagram depicting yet another embodiment of the present invention.

FIG. 24 illustrates another embodiment of a plasma processing system 2400. In this embodiment, a switch mode power supply 2430 provides an AC waveform to an electrostatic chuck 2411, where the switch mode power supply 2430 output is offset by a DC bias provided by a DC power supply 2434. The AC waveform of the switch mode power supply 2430 has a waveform selected by controller 2435 to bombard a substrate 2406 with ions from a plasma 2404 having a narrow ion energy distribution. The AC waveform can be non-sinusoidal (e.g., square wave or pulsed) and can be generated via an AC power source 2436 of the switch mode power supply 2430. Chucking is controlled via the DC offset from the DC power supply 2434, which is controlled by controller 2433. The DC power supply 2434 can be coupled in series between ground and the switch mode power supply 2430. The switch mode power supply 2430 is floating such that its DC bias can be set by the DC power supply 2434.

One skilled in the art will recognize that while the illustrated embodiment shows two independent controllers 2433, 2435, these could be combined into a single functional unit, device, or system such as optional controller 2432. Additionally, controllers 2433 and 2435 can be coupled so as to communicate with each other and share processing resources.

Figure 25:
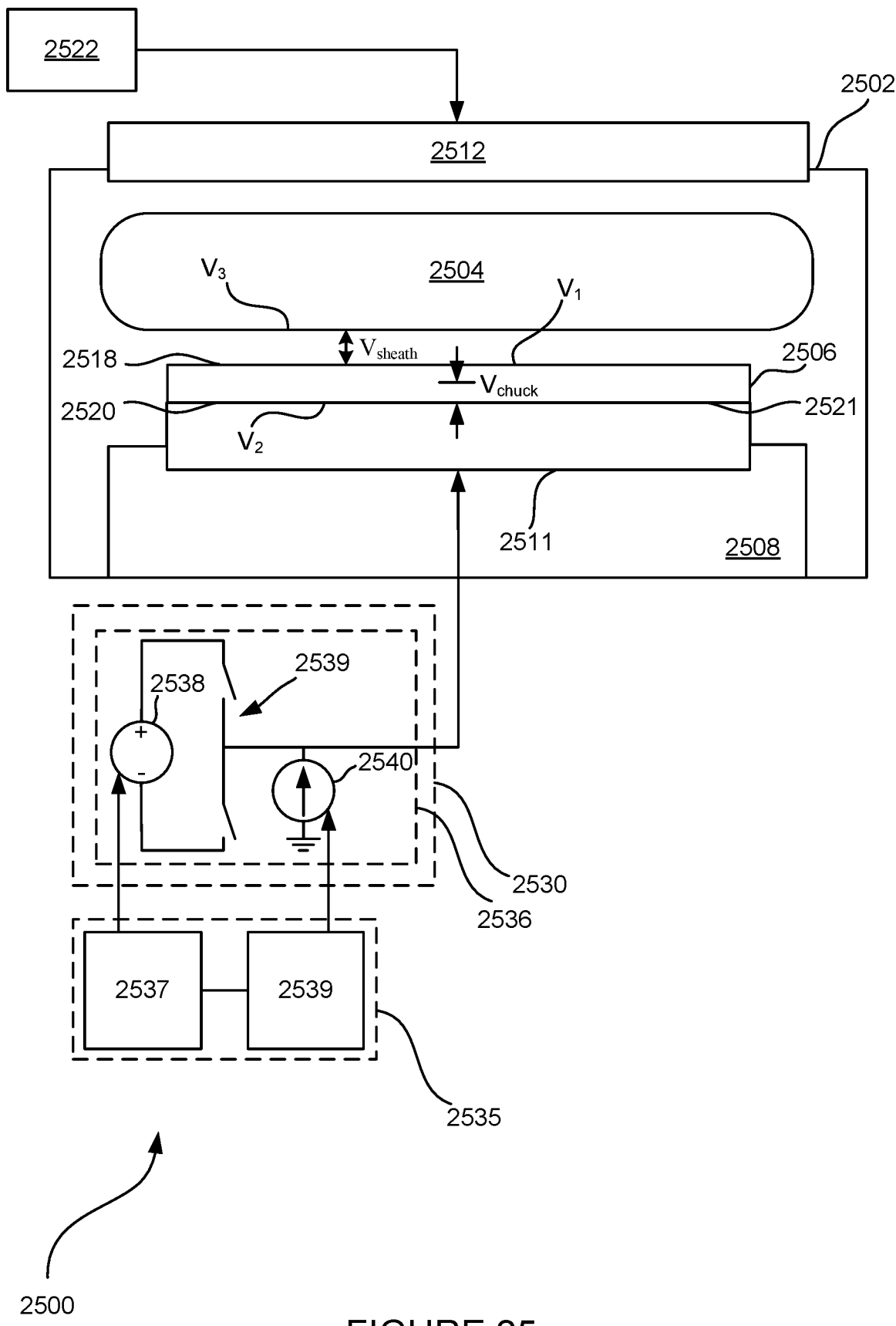
FIG. 25 is a block diagram depicting yet another embodiment of the present invention.

FIG. 25 illustrates a further embodiment of a plasma processing system 2500. The illustrated embodiment includes a switch mode power supply 2530 that produces an AC waveform that can have a DC offset provided by a DC power supply (not illustrated). The switch mode power supply can be controlled via optional controller 2535, which encompasses a voltage and current controller 2537, 2539. The switch mode power supply 2530 can include a controllable voltage source 2538 having a voltage output controlled by the voltage controller 2537, and a controllable current source 2540 having a current output controlled by the current controller 2539. The controllable voltage and current sources 2538, 2540 can be in a parallel arrangement. The controllable current source 2540 is configured to compensate for an ion current between a plasma 2504 and a substrate 2506.

The voltage and current controllers 2537, 2539 can be coupled and in communication with each other. The voltage controller 2537 can also control a switched output 2539 of the controllable voltage source 2538. The switched output 2539 can include two switches in parallel as illustrated, or can include any circuitry that converts an output of the controllable voltage source 2538 into a desired AC waveform (e.g., non-sinusoidal). Via the two switches, a controlled voltage or AC waveform from the controllable voltage source 2538 can be combined with a controlled current output of the controllable current source 2540 to generate an AC waveform output of the switch mode power supply 2530.

The controllable voltage source 2538 is illustrated as having a given polarity, but one skilled in the art will recognize that the opposite polarity is an equivalent to that illustrated. Optionally, the controllable voltage and current sources 2538, 2540 along with the switched output 2539 can be part of an AC power source 2536 and the AC power source 2536 can be arranged in series with a DC power source (not illustrated) that is inside or outside of the switch mode power supply 2530.

Figure 26:
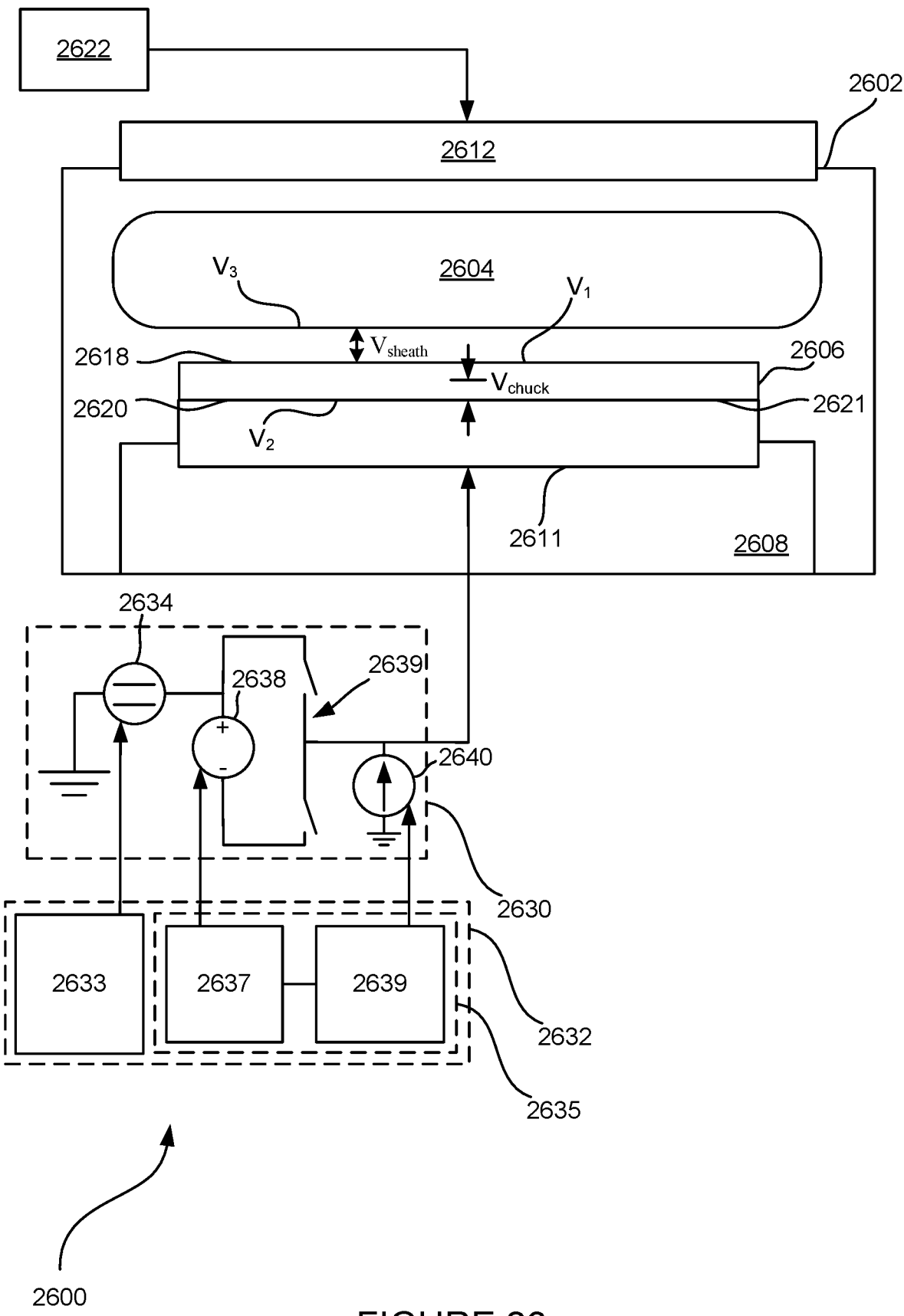
FIG. 26 is a block diagram depicting yet another embodiment of the present invention.

FIG. 26 illustrates yet another embodiment of a plasma processing system 2600. In the illustrated embodiment, a switch mode power supply 2630 provides an AC waveform having a DC offset to an electrostatic chuck 2611. The AC component of the waveform is generated via a parallel combination of a controllable voltage source 2638 and a controllable current source 2640 connected to each other through a switched output 2639. The DC offset is generated by a DC power source 2634 coupled in series between ground and the controllable voltage source 2638. In an embodiment, the DC power source 2634 can be floating rather than grounded. Similarly, the switch mode power supply 2630 can be floating or grounded.

The system 2600 can include one or more controllers for controlling an output of the switch mode power supply 2630. A first controller 2632 can control the output of the switch mode power supply 2630, for instance via a second controller 2633 and a third controller 2635. The second controller 2633 can control a DC offset of the switch mode power supply 2630 as generated by the DC power source 2634. The third controller 2635 can control the AC waveform of the switch mode power supply 2630 by controlling the controllable voltage source 2638 and the controllable current source 2640. In an embodiment, a voltage controller 2637 controls the voltage output of the controllable voltage source 2638 and a current controller 2639 controls a current of the controllable current source 2640. The voltage and current controllers 2637, 2639 can be in communication with each other and can be a part of the third controller 2635.

One skilled in the art will recognize that the embodiments above, describing various configurations of controllers relative to the power sources 2634, 2638, 2640, are not limiting, and that various other configurations can also be implemented without departing from this disclosure. For instance, the third controller 2635 or the voltage controller 2637 can control a switched output 2639 between the controllable voltage source 2638 and the controllable current source 2640. As another example, the second and third controllers 2633, 2635 can be in communication with each other (even though not illustrated as such). It should also be understood that the polarities of the controllable voltage and current sources 2638, 2640 are illustrative only and not meant to be limiting.

The switched output 2639 can operate by alternately switching two parallel switches in order to shape an AC waveform. The switched output 2639 can include any variety of switches including, but not limited to, MOSFET and BJT. In one variation, the DC power source 2634 can be arranged between the controllable current source 2640 and the electrostatic chuck 2611 (in other words, the DC power source 2634 can float), and the switch mode power supply 2630 can be grounded.

Figure 27:
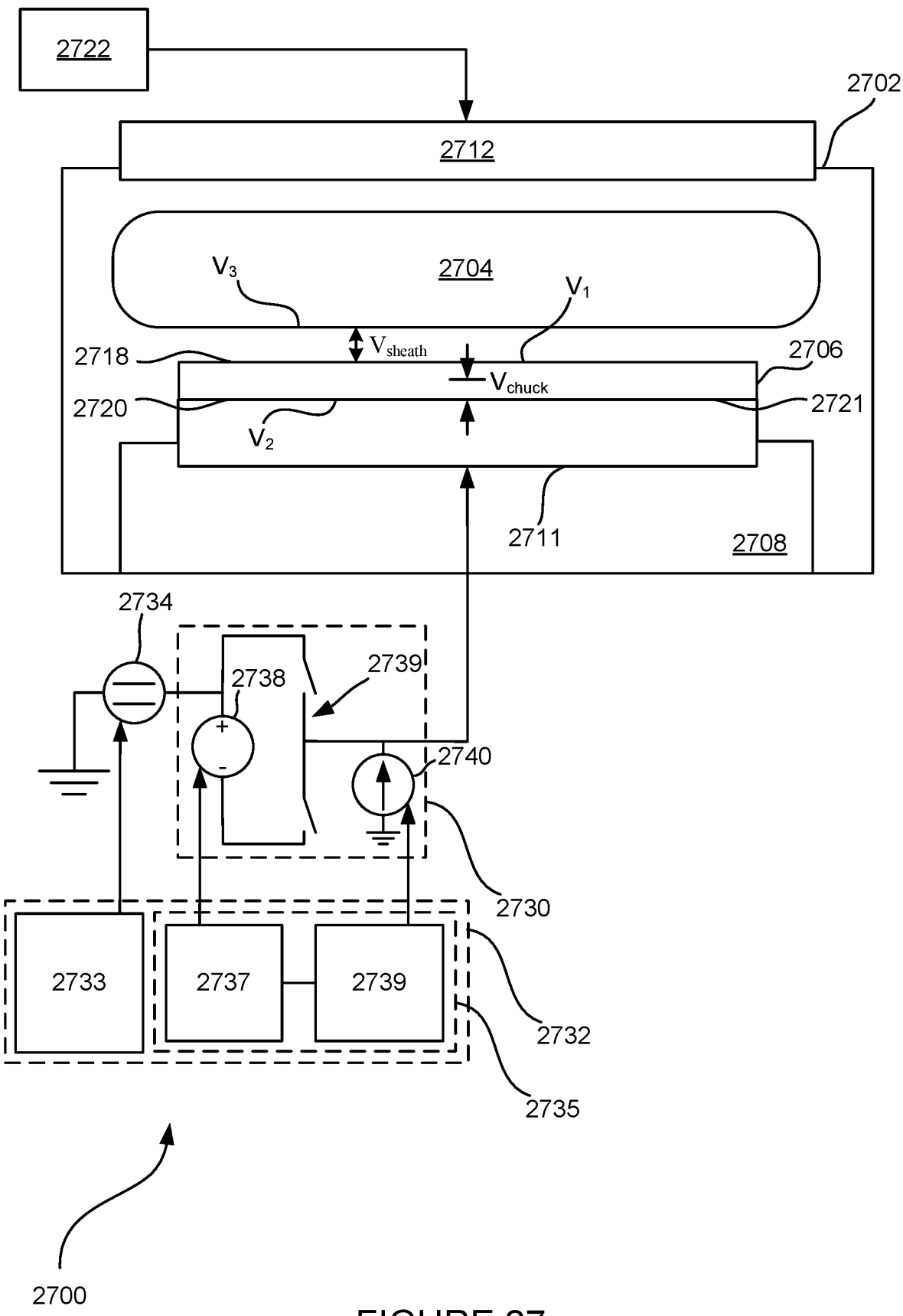
FIG. 27 is a block diagram depicting yet another embodiment of the present invention.

FIG. 27 illustrates another embodiment of a plasma processing system 2700. In this variation, the switch mode power supply 2734 again is grounded, but instead of being incorporated into the switch mode power supply 2730, here the DC power source 2734 is a separate component and provides a DC offset to the entire switch mode power supply 2730 rather than just components within the switch mode power supply 2730.

Figure 28:
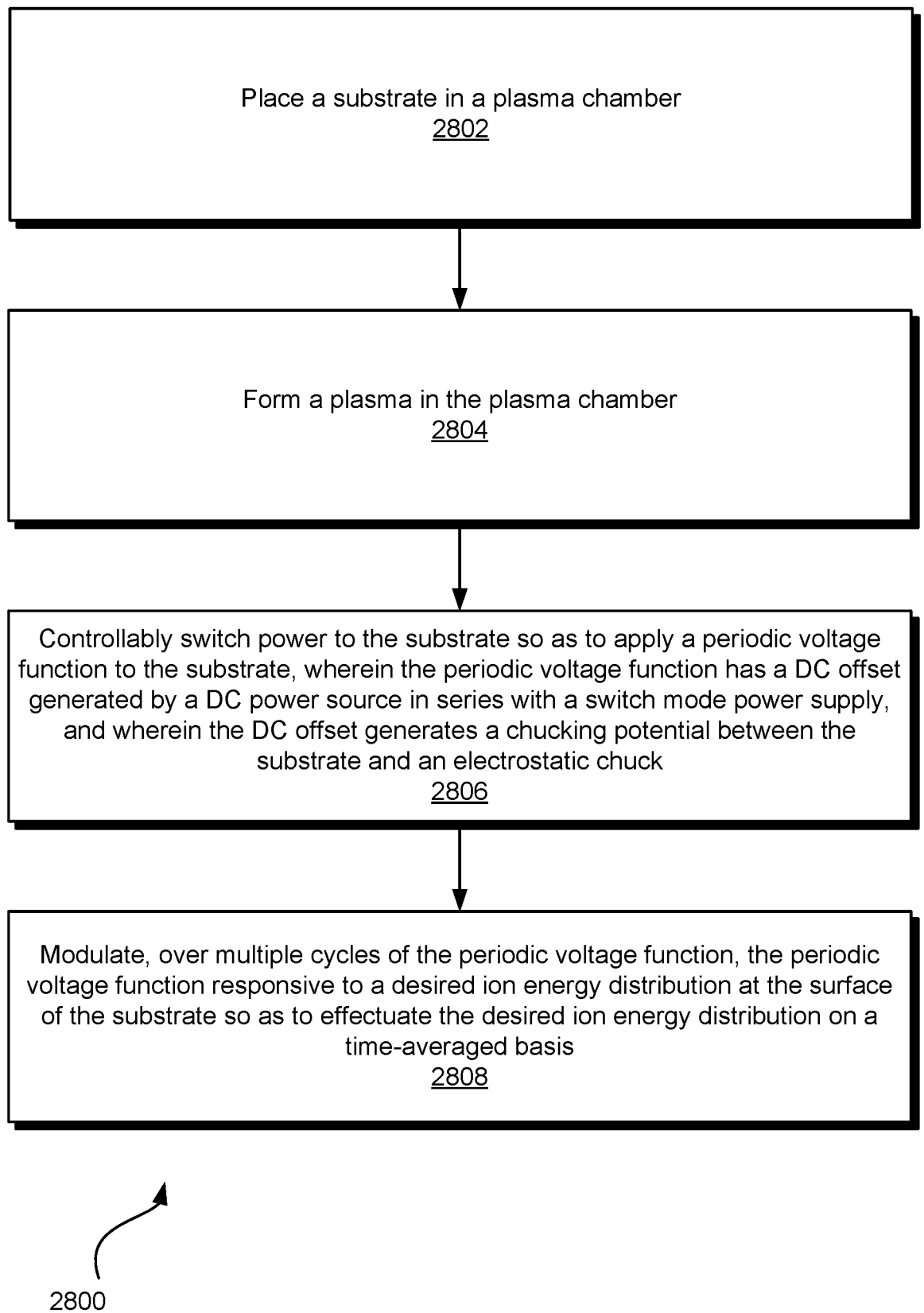
FIG. 28 illustrates a method according to an embodiment of this disclosure.

FIG. 28 illustrates a method 2800 according to an embodiment of this disclosure. The method 2800 includes a place a substrate in a plasma chamber operation 2802. The method 2800 further includes a form a plasma in the plasma chamber operation 2804. Such a plasma can be formed in situ or via a remote projected source. The method 2800 also includes a switch power operation 2806. The switch power operation 2806 involves controllably switching power to the substrate so as to apply a period voltage function to the substrate. The periodic voltage function can be considered a pulsed waveform (e.g., square wave) or an AC waveform and includes a DC offset generated by a DC power source in series with a switch mode power supply. In an embodiment, the DC power source can be incorporated into the switch mode power supply and thus be in series with an AC power source of the switch mode power supply. The DC offset generates a potential difference between a top surface of an electrostatic chuck and a reference layer within the substrate and this potential difference is referred to as the chucking potential. The chucking potential between the electrostatic chuck and the substrate holds the substrate to the electrostatic chuck thus preventing the substrate from moving during processing. The method 2800 further includes a modulate operation 2808 in which the periodic voltage function is modulated over multiple cycles. The modulation is responsive to a desired (or defined) ion energy distribution at the surface of the substrate so as to effectuate the desired (or defined) ion energy distribution on a time-averaged basis.

Figure 29:
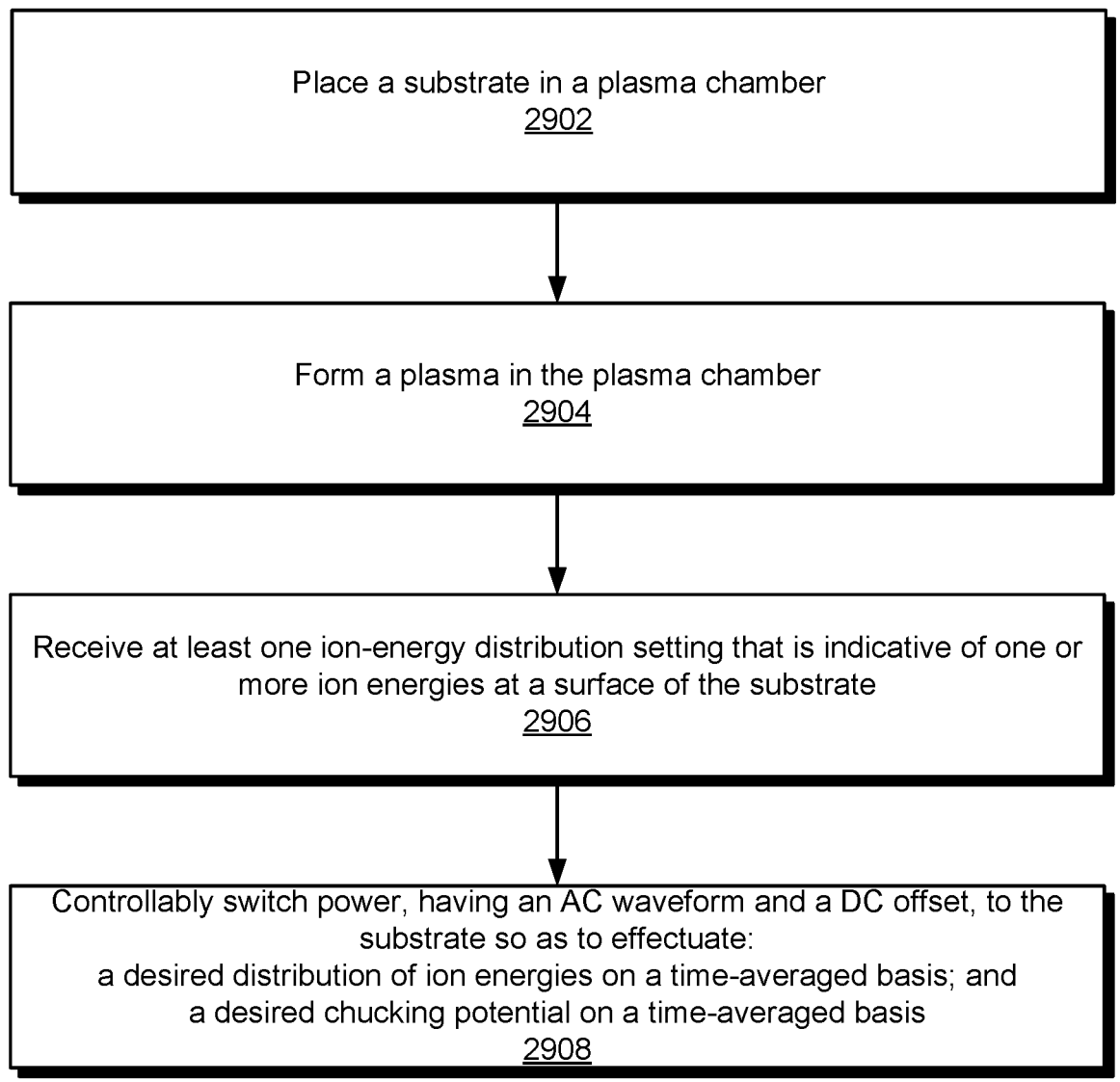
FIG. 29 illustrates another method according to an embodiment of this disclosure.

FIG. 29 illustrates another method 2900 according to an embodiment of this disclosure. The method 2900 includes a place a substrate in a plasma chamber operation 2902. The method 2900 further includes a form a plasma in the plasma chamber operation 2904. Such a plasma can be formed in situ or via a remote projected source. The method 2900 also includes a receive at least one ion-energy distribution setting operation 2906. The setting received in the receive operation 2906 can be indicative of one or more ion energies at a surface of the substrate. The method 2900 further includes a switch power operation 2908 in which power to the substrate is controllably switched so as to effectuate the following: (1) a desired (or defined) distribution of ion energies on a time-averaged basis; and (2) a desired chucking potential on a time-averaged basis. The power can have an AC waveform and a DC offset.

Controlling Surface Charge Accumulation

During plasma processing, isolated elements may accumulate excess charge resulting in possible damage to sensitive devices connected with these elements. In other cases, accumulating charge on insulative features may cause deflection of arriving ions resulting in distortion of structures being etch or deposited. These are just two issues that arise from excess charge build up. Traditional plasma processing systems lack the ability to directly measure and control surface charge during plasma processing.

Referring again to FIG. 14, an asymmetric periodic voltage function is provided to a substrate support to bias the substrate and generate the potential that attracts ions from the plasma. The waveform sees a positive voltage rise, or ramp, at the start of the period, t, which, when applied to the substrate support in the presence of a plasma, draws electrons to the substrate surface resulting in an accumulation of negative charge. The power supply biasing the substrate can then provide little if any voltage or current for a first duration, $t_1$, until a start of the second duration, $t_2$. A first voltage drop, or ramp, produces a surface potential that causes positive ions to begin flowing from the plasma to the substrate surface. A second voltage ramp (with slope dv/dt), is then maintained during the second duration, $t_2$, regulating a voltage drop across the plasma sheath (having a capacitance, $C_{sheath}$) in the presence of arriving, positively charged ions. At the end of the second duration, $t_2$, the positive voltage rise, or ramp, is again repeated, stopping the flow of ions, replenishing the negative surface change, and starting the next cycle. As described above, when properly regulated, the current measured during the second duration, $t_2$, can be combined with knowledge of the series capacitance, $C_{chuck}$, to allow ion current flowing during the second voltage ramp to be determined according to:

$$\frac{dv}{dt} = \frac{I_I}{C_{chuck}} \quad \text{(Equation 9)}$$

In other words, ion current can be found as:

$$I_I = \frac{dv}{dt} C_{chuck} \quad \text{(Equation 10)}$$

Knowledge of the ion current, combined with knowledge of the second duration, $t_2$, allows important information to be resolved, such as, total surface charge accumulation, $Q_i$, from the accumulation of ion current delivered to the substrate surface during the second duration, $t_2$. Total surface charge accumulation, $Q_i$, can be found as:

$$Q_i = I_I t_2 \quad \text{(Equation 11)}$$

To avoid excessive surface charge buildup, total surface charge accumulation, $Q_i$, can be monitored, and the second duration, $t_2$, or the time in which ion current is flowing to the substrate, can be altered or reduced, until the surface charge, $Q_i$, meets a desired level or returns below a threshold deemed safe. The second duration, $t_2$, can be controlled by at least one or both of repetition rate and duty factor.

Figure 58:
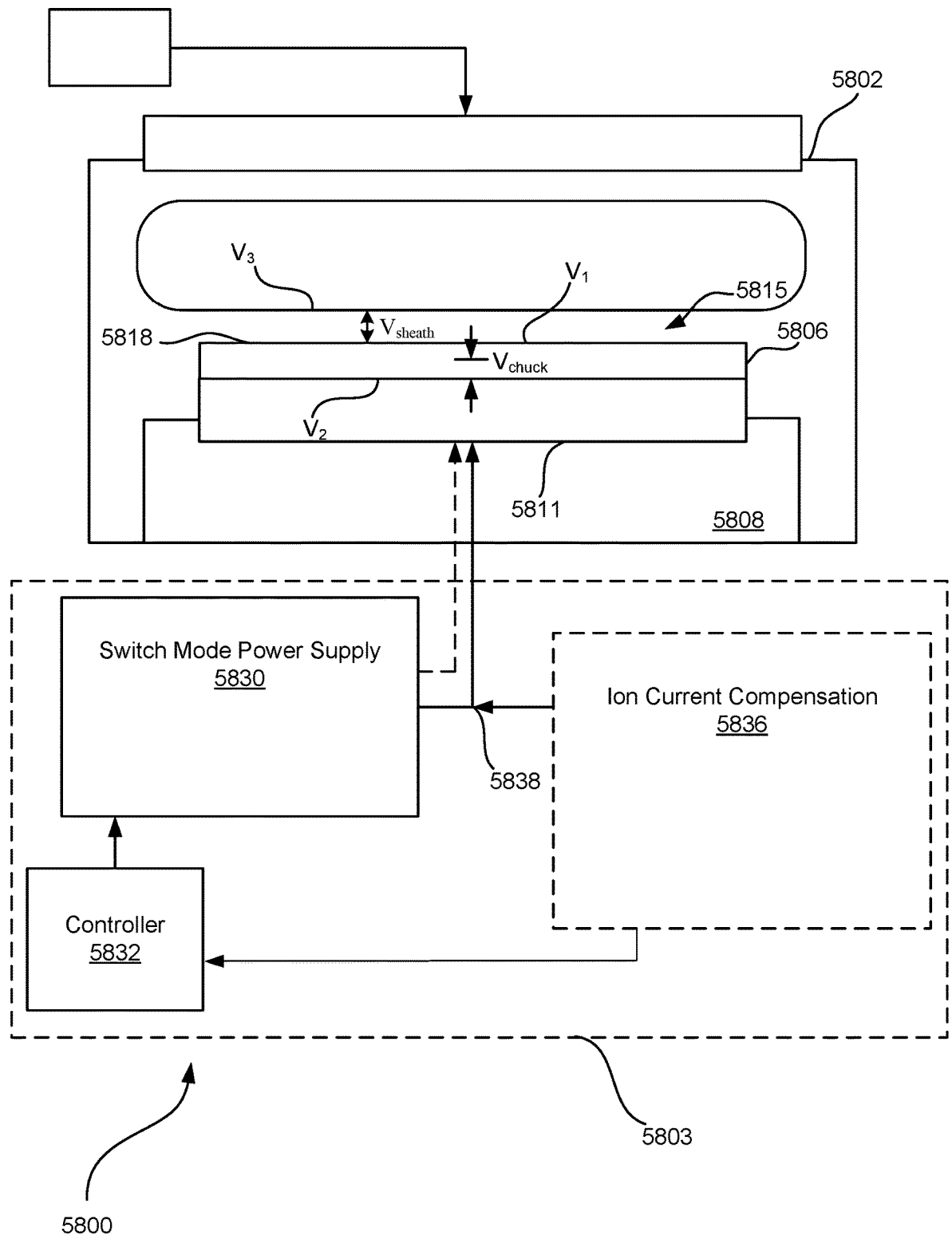
FIG. 58 illustrates a block diagram depicting one embodiment of a plasma-based processing system with an optional ion current compensation.

FIG. 58 illustrates one embodiment of a system for plasma-based processing where a power supply 5803 both controls an ion energy distribution at the substrate surface, but also prevent excessive surface charge accumulation. The system 5800 is similar to that described in FIG. 21, and thus only certain components will be described. The power supply 5803 can include a switch mode power supply 5830 controlled via a controller 5832 (e.g., a switching controller). The switch mode power supply 5830 provides an AC waveform to an output 5838 tailored to effect a desired first potential $V_1$ known to generate a desired (or defined) ion energy and ion energy distribution. The output 5838 can be configured for coupling to a substrate support 5808 of the processing chamber 5802. The AC waveform from the switch mode power supply 5830 can be tailored to offset the effects of ion and electron transfer through the sheath 5815 and the resulting charge buildup at the top surface 5818 of the substrate 5806 such that the first potential $V_1$ remains substantially constant (or sustained). The output 5838 can combine contributions from the switch mode power supply 5830 and the ion current compensation component 5836 to form an asymmetric periodic voltage waveform, such as those shown in FIGS. 61-62.

The switch mode power supply 5830 in conjunction with the controller 5832 can monitor various voltages deterministically and without sensors. In particular, the ion energy (e.g., mean energy and ion energy distribution) is deterministically monitored based on parameters of the AC waveform (e.g., slope dv/dt and step $\Delta V$ in FIG. 14 or slope of 6166 and step $\Delta V = V_a - V_b$ in FIG. 61). For instance, the plasma voltage $V_3$, ion energy, and ion energy distribution are proportional to parameters of the AC waveform produced by the switch mode power supply 5830. In particular the $\Delta V$ of the falling edge, or voltage drop, or first negative voltage ramp (6164 in FIG. 61), of the AC waveform, is proportional to the first potential $V_1$, and thus to the ion energy. By keeping the first potential $V_1$ constant (or substantially constant or sustained), the ion energy distribution can be kept narrow or monoenergetic.

In the case where the first potential $V_1$ cannot be directly measured and the correlation between the switch mode power supply output and the first voltage $V_1$ may vary based on the capacitance of the substrate 5806 and processing parameters, a constant of proportionality between $\Delta V$ and the first potential $V_1$ can be empirically determined after a short processing time has elapsed. For instance, where the falling edge $\Delta V$ of the AC waveform is 50 V, and the constant of proportionality is empirically found to be 2 for the given substrate and process, the first potential $V_1$ can be expected to be 100 V. A proportionality between the step voltage, $\Delta V$, and the first potential $V_1$ (and thus also ion energy, eV) is described by Equation 4. Thus, the first potential $V_1$, along with ion energy, and ion energy distribution can be determined based on knowledge of the AC waveform of the switch mode power supply without any sensors inside the plasma processing chamber 5802.

It should be noted that FIG. 61 shows a similar voltage waveform to that seen in FIG. 14, but with somewhat different nomenclature, a different reference voltage, and sloped voltage ramps rather than the seemingly vertical voltage steps seen in FIG. 14 (though some voltage rise and voltage drop over a finite period of time is implied in FIG. 14 by virtue of inherent inductive and capacitive loads in most circuits). For instance, $V_{PP}$ in FIG. 14 corresponds to $\Delta Va$ in FIG. 61. The $\Delta Vb$ in FIG. 61 corresponds to $V_{PP}-\Delta V$ in FIG. 14.

The switch mode power supply 5830 can float and thus can be biased at any DC offset by a DC power source (not illustrated) connected in series between ground and the switch mode power supply 5830. The switch mode power supply 5830 can provide an AC waveform with a DC offset either via AC and DC power sources internal to the switch mode power supply 5830 (see for example FIGS. 22, 23, 26), or via an AC power source internal to the switch mode power supply 5830 and a DC power supply external to the switch mode power supply 5830 (see for example FIGS. 24, 27). In an embodiment, the switch mode power supply 5830 can be grounded and be series coupled to a floating DC power source coupled in series between the switch mode power supply 5830 and the electrostatic chuck 5811.

The controller 5832 can control an AC and DC output of the switch mode power supply when the switch mode power supply 5830 includes both an AC and DC power source. When the switch mode power supply 5830 is connected in series with a DC power source, the controller 5832 may only control the AC output of the switch mode power supply 5830. In an alternative embodiment, the controller 5832 can control both a DC power supply coupled to the switch mode power supply 5830, and the switch mode power supply 5830. One skilled in the art will recognize that while a single controller 5832 is illustrated, other controllers can also be implemented to control the AC waveform and DC offset provided to the electrostatic chuck 5811.

The controller 5832 may especially be able to control a period and/or duty cycle of an asymmetric periodic voltage function generated by the switch mode power supply 5830. This control may especially allow control of the second duration, $t_2$, and hence an accumulation of charge, $Q_i$, on the substrate surface. In some cases, both period and duty cycle can be simultaneously modified to effectuate a desired surface charge accumulation, $Q_i$.

The power supply 5803 can also include an ion current compensation component 5836 (either a current or voltage source or a power supply) electrically coupled to the output 5838. The ion current compensation component 5836 tends to offset the influence of ion current, or the tendency of ion current to negate the bias voltage on the surface of the substrate. The ion current compensation component 5836 biases the substrate 5806, via the output 5838, at least during the second duration, $t_2$, thereby providing the second negative voltage ramp (e.g., the dv/dt region in FIG. 14).

The ion current compensation component can be configured to obtain a measure of ion current in the plasma processing chamber based upon monitoring current, voltage, or both between the output and the substrate at least during the duration $t_2$. As noted earlier, monitoring voltage can allow the slope, dv/dt, during the duration, $t_2$, to be known. Increasing an output of ion current compensation component 5836 causes an increase in the magnitude of the negative slope dv/dt, while decreasing this output decreases the magnitude of the negative slope dv/dt. As discussed earlier, the ion current compensation component 5836 not only controls its output and thus the slope dv/dt, but also allows measurement of the ion current, $I_I$.

With a measurement of ion current, $I_I$, the ion current compensation component 5836 can also estimate surface charge accumulation, $Q_i$, on the substrate 5806, for instance, using either Equation 10 or 11.

The surface charge accumulation, $Q_i$, can be compared to a threshold or a target range, and if the surface charge accumulation, $Q_i$, is equal to or above this threshold or outside of the target range, then the controller 5832 can adjust the second duration, $t_2$, via one of the various ways mentioned above, until the surface charge accumulation, $Q_i$, fall bellow the threshold or is back within the target range.

In an embodiment, a controller 5805 in the ion current compensation component 5836 can perform the above-noted comparison and then pass instructions to the controller 5832 to adjust the second duration, $t_2$. Alternatively, the controller 5805 in the ion current compensation component 5836 can perform the above-noted comparison and inform the controller 5832 of the result of the comparison, and the controller 5832 can decide to adjust the second duration, $t_2$, in response to this data. In another alternative, the ion current compensation component 5836 can estimate the surface charge accumulation, $Q_i$, pass this data to the controller 5832, the controller 5832 can perform the comparison, and then decide whether and how to adjust the second duration, $t_2$. These methods are reflected in FIGS. 65-67. Although the controller 5832 is shown as being part of the power supply 5803, in other embodiments, the controller 5832 can be external to the power supply 5803.

Figure 59:
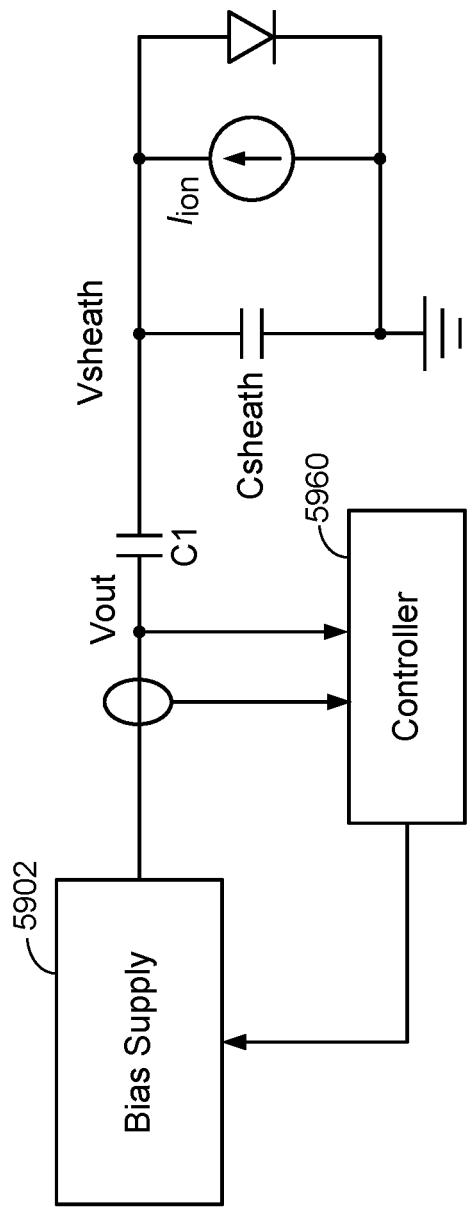
FIG. 59 is a diagram depicting aspects of an exemplary control system.

Referring to FIG. 59, shown are aspects of an exemplary control system that may be used in connection with embodiments herein. Also shown are representations of a sheath capacitance (Csheath) and a capacitance C1 that represents the inherent capacitance of components associated with the plasma processing chambers discussed throughout this disclosure 100, which may include insulation, the substrate, substrate support, and an e-chuck.

As shown, current and/or voltage may be measured by the controller 5960 to indirectly monitor one or more characteristics of an environment of a plasma processing chamber. An exemplary characteristic of the environment of a plasma processing chamber may be sheath capacitance (C sheath), which may be calculated with Equation 2 using a measured output voltage, $V_{out}$. Another exemplary characteristic of the environment of a plasma processing chamber may be total surface charge accumulation, $Q_i$, which may be calculated with Equation 11. Power supply 5803 is one example of the bias supply 5902.

The plasma can be monitored in advance of processing the substrate to obtain data (e.g., about sheath capacitance and/or other characteristics of the environment of the plasma processing chamber) that is stored, and then the data is utilized to adjust the bias waveform(s) (e.g., in a feed-forward manner). The monitoring may also be performed during plasma processing, and adjustment of plasma parameters (e.g., by adjusting voltage and/or duty cycle of the bias supply 5902) may be made using real-time feedback using, for example, voltage and/or current measurements as shown in FIG. 59.

Figure 60:
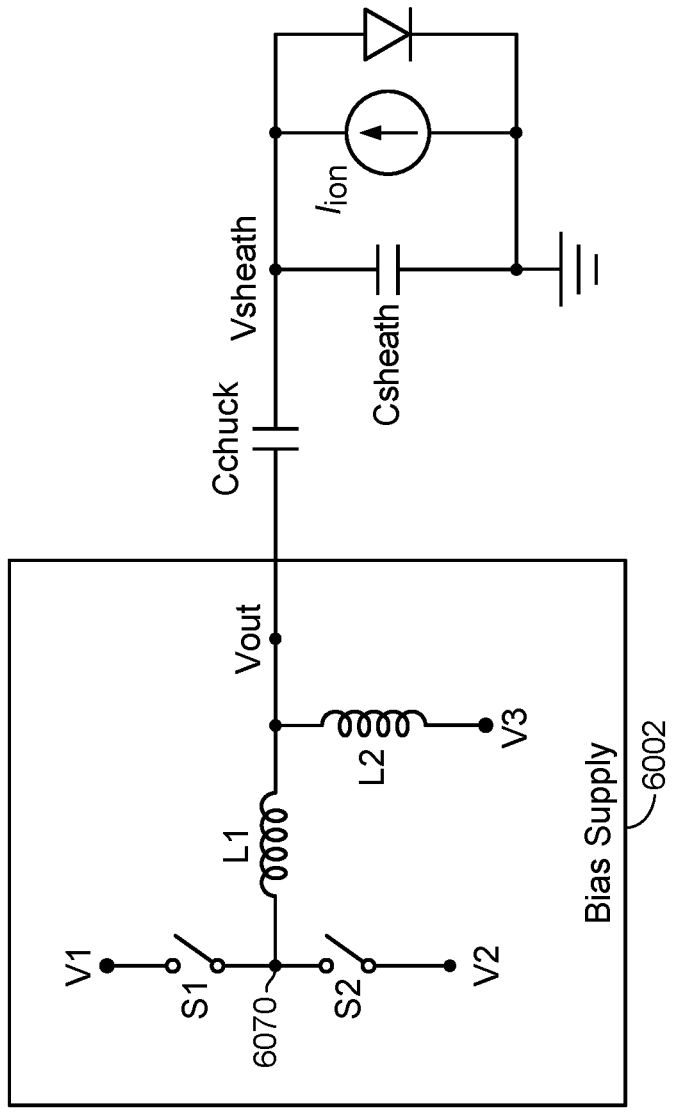
FIG. 60 is a diagram depicting aspects of an exemplary bias supply.

Referring next to FIG. 60, shown is a general representation of an exemplary bias supply 6002 that may be used to realize the bias supplies of this disclosure including 5803. As shown, the bias supply 6002 utilizes three voltages V1, V2, and V3. Because the output, $V_{out}$, is capacitively coupled through Cchuck, it is generally not necessary to control the DC level of $V_{out}$ and the three voltages can be reduced to two by choosing one of V1, V2 or V3 to be ground (0V). A separate chucking supply may be used so it is not necessary to control the DC level of $V_{out}$. If a separate chucking supply is not used, all three voltages can be controlled to control the DC level of $V_{out}$. Although not shown for clarity, the two switches S1, and S2 may be controlled by a switch controller via electrical or optical connection to enable the switch controller to open and close the switches, S1, S2, as disclosed below and as discussed earlier. The depicted switches S1, S2 may be realized by single pole, single throw switches, and as a non-limiting example, the switches S1, S2 may be realized by silicon carbide metal-oxide semiconductor field-effect transistors (SiC MOSFETs).

In this implementation, the voltages V1, V2, and V3 may be DC-sourced voltages. As shown, the first switch, S1, is disposed to switchably connect the first voltage, V1, to the output, $V_{out}$, through an inductive element and the second switch, S2, is disposed to switchably couple the second voltage, V2, to the output, $V_{out}$, through an inductive element. In this implementation the two switches connect to a common node, 6070, and a common inductive element, L1, is disposed between the common node 6070 and an output node, $V_{out}$. Other arrangements of the inductive elements are possible. For example, there may be two separate inductive elements with one inductive element connecting S1 to $V_{out}$ and another connecting S2 to $V_{out}$. In another example one inductive element may connect S1 to S2 and another inductive element may connect either S1 or S2 to $V_{out}$.

While referring to FIG. 60, simultaneous reference is made to FIG. 61, which depicts: 1) a cycle of the asymmetric periodic voltage waveform (also referred to as a modified periodic voltage function earlier in this disclosure) of the bias supply 5202 that is output at $V_{out}$; 2) a corresponding sheath voltage; and 3) corresponding switch positions of switches S1 and S2. As shown, the periodic voltage waveform that is output by the bias supply 6002 is asymmetric, so that a first half-cycle of the voltage waveform does not have a corresponding symmetrical component during a last half-cycle of the voltage waveform. In operation, the first switch, S1, is closed momentarily to increase, along a first portion 6160 of the voltage waveform (between voltage V0 and Va) a level of the voltage at the output node, $V_{out}$, to a first voltage level, Va. The level Va is maintained along a second portion 6162 of the waveform. The second switch, S2, is then closed momentarily to decrease, along a third portion 6164 of the waveform, the level of the voltage waveform at the output node, $V_{out}$, to a second voltage level, Vb. Note that S1 and S2 are open except for short periods of time. As shown, the negative voltage swing along the third portion 6164 affects the sheath voltage (Vsheath); thus, a magnitude of Va-Vb may be controlled to affect the sheath voltage and may be adjusted between different cycles of the voltage waveform to affect multiple ion energy peaks within the ion energy distribution function. A duration, $t_2$, between opening of the second switch S2 and closing of the first switch S1 can be adjusted to control a total surface charge accumulation, $Q_t$.

Figure 53:
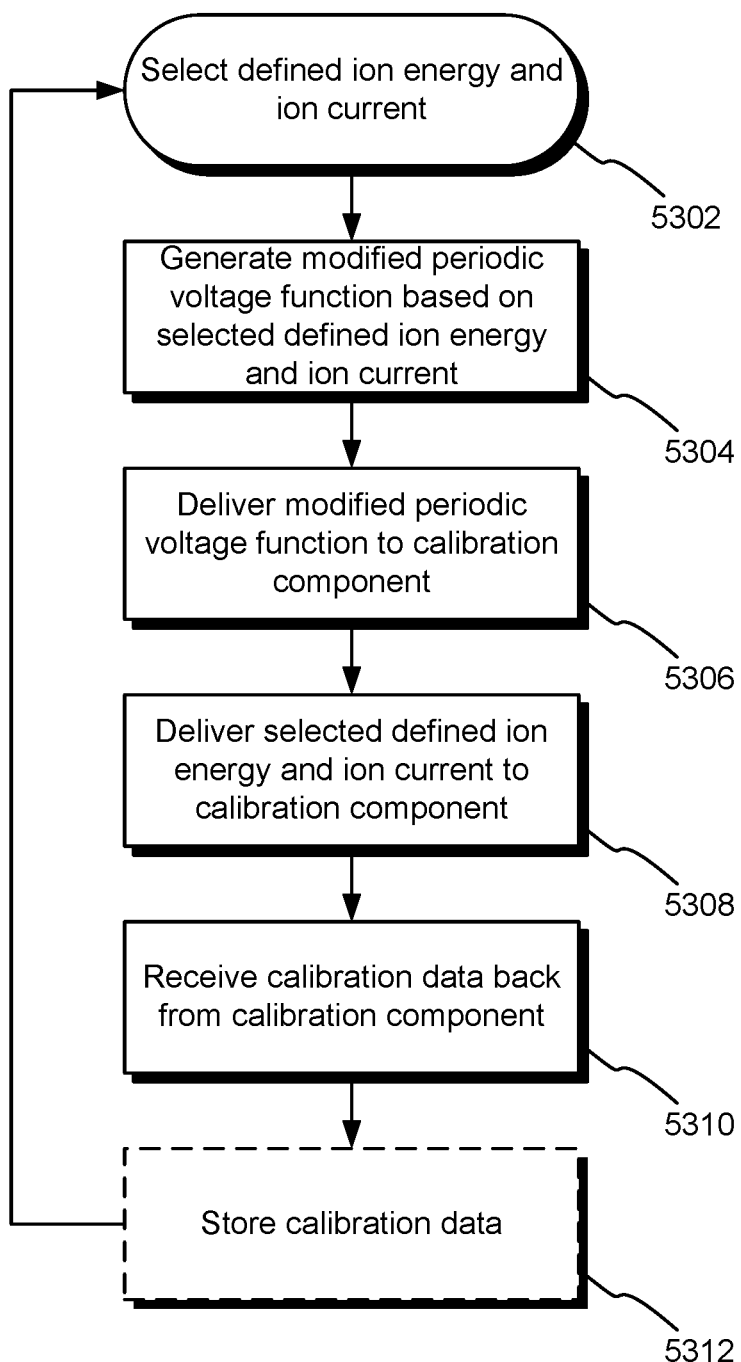
FIG. 53 illustrates a method of calibrating an ion current compensation component.
Figure 54:
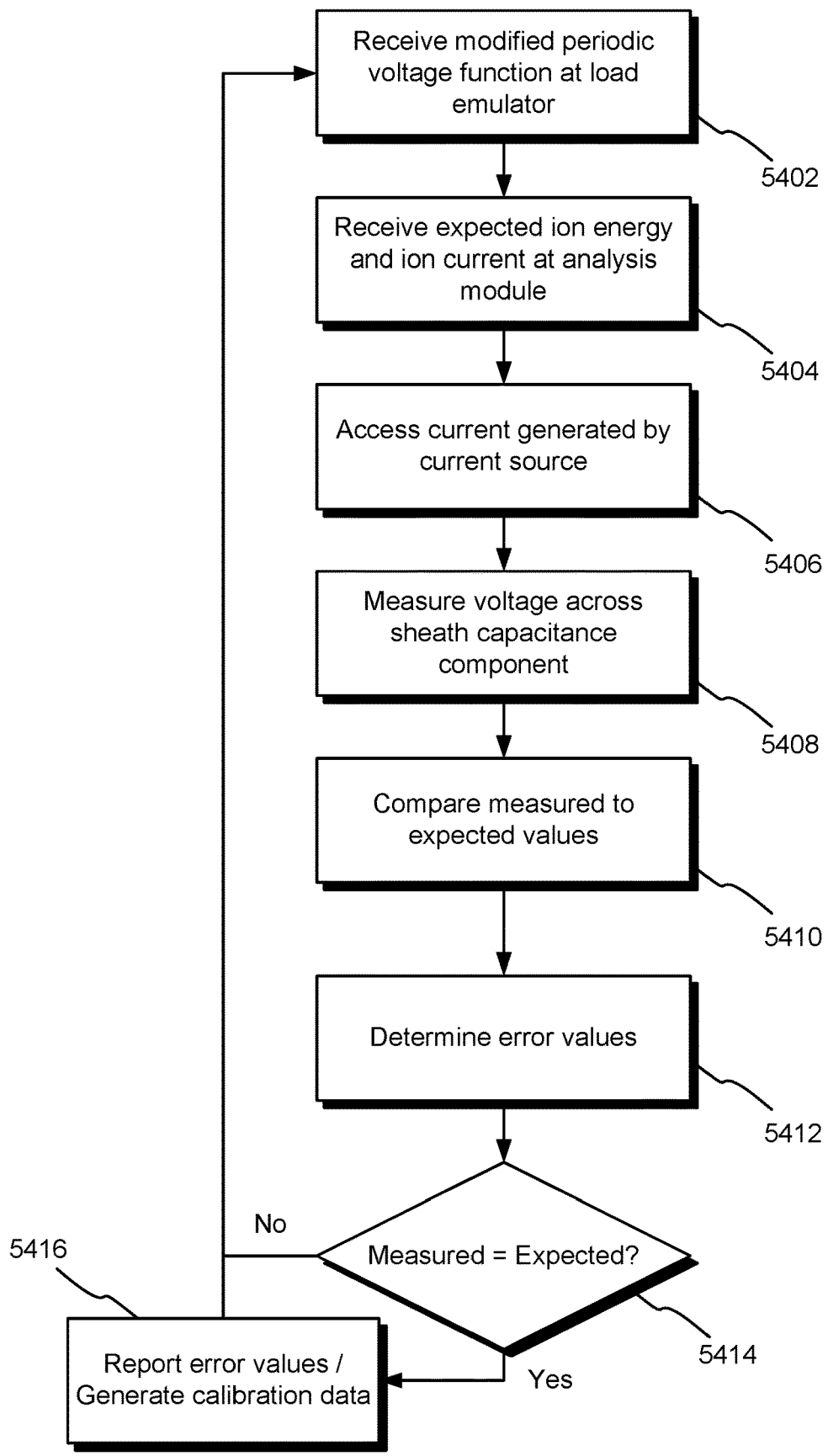
FIG. 54 illustrates another method of calibrating an ion current compensation component.
Figure 55:
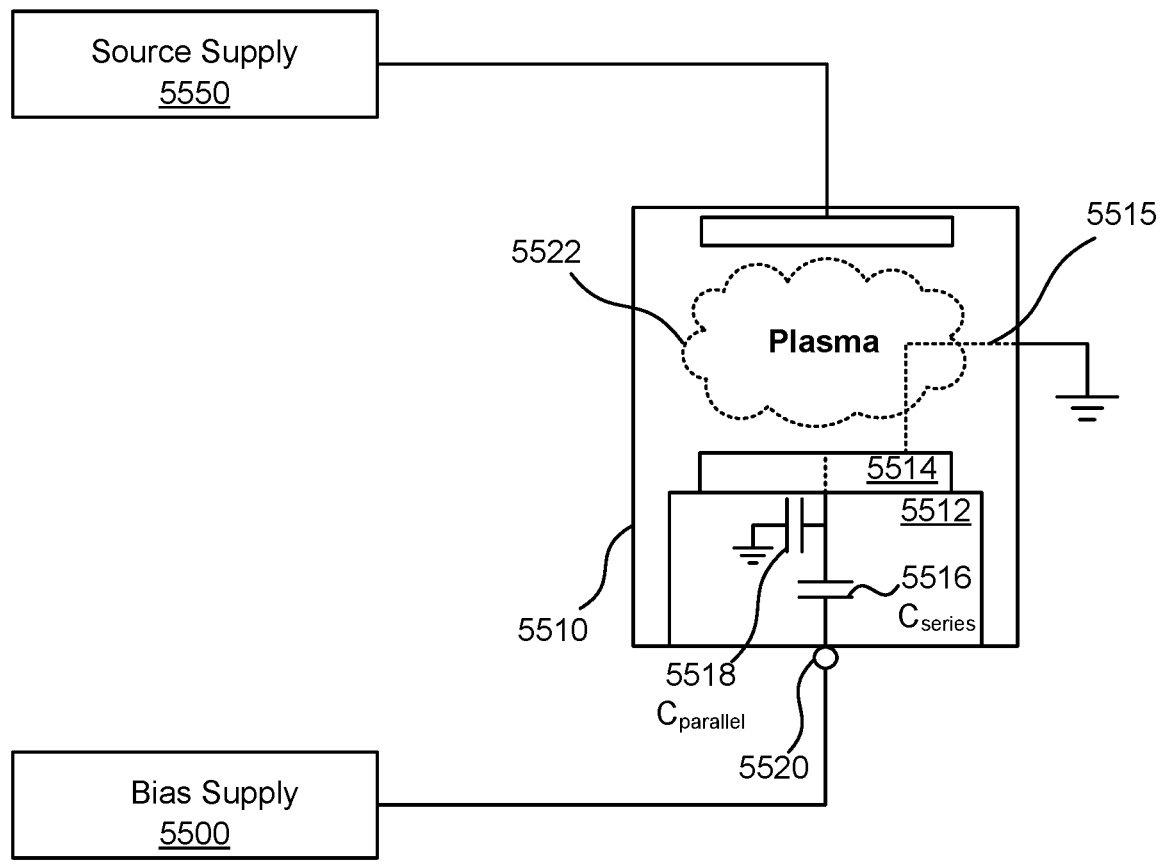
FIG. 55 is a block diagram depicting an embodiment of components for determining an effective capacitance of an electrostatic chuck.
Figure 56:
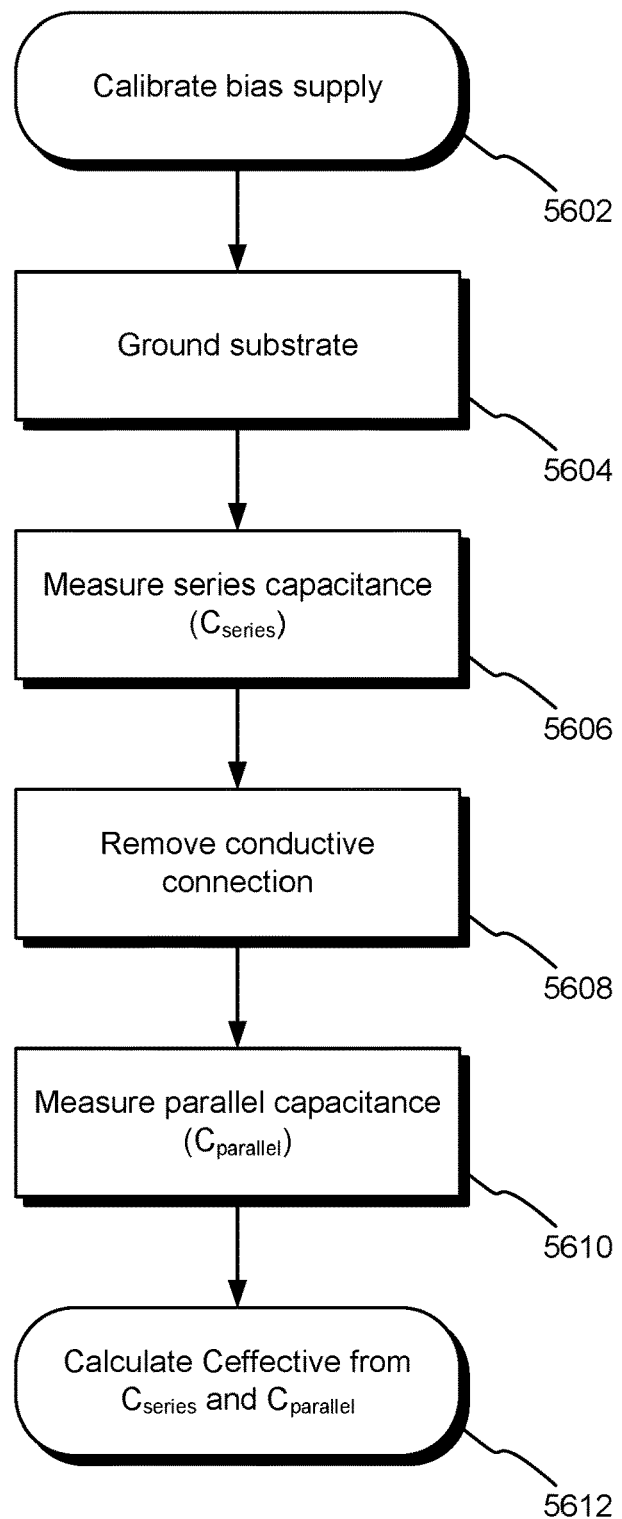
FIG. 56 illustrates a method of using a calibrated bias supply to determine an effective capacitance of an electrostatic chuck.
Figure 57:
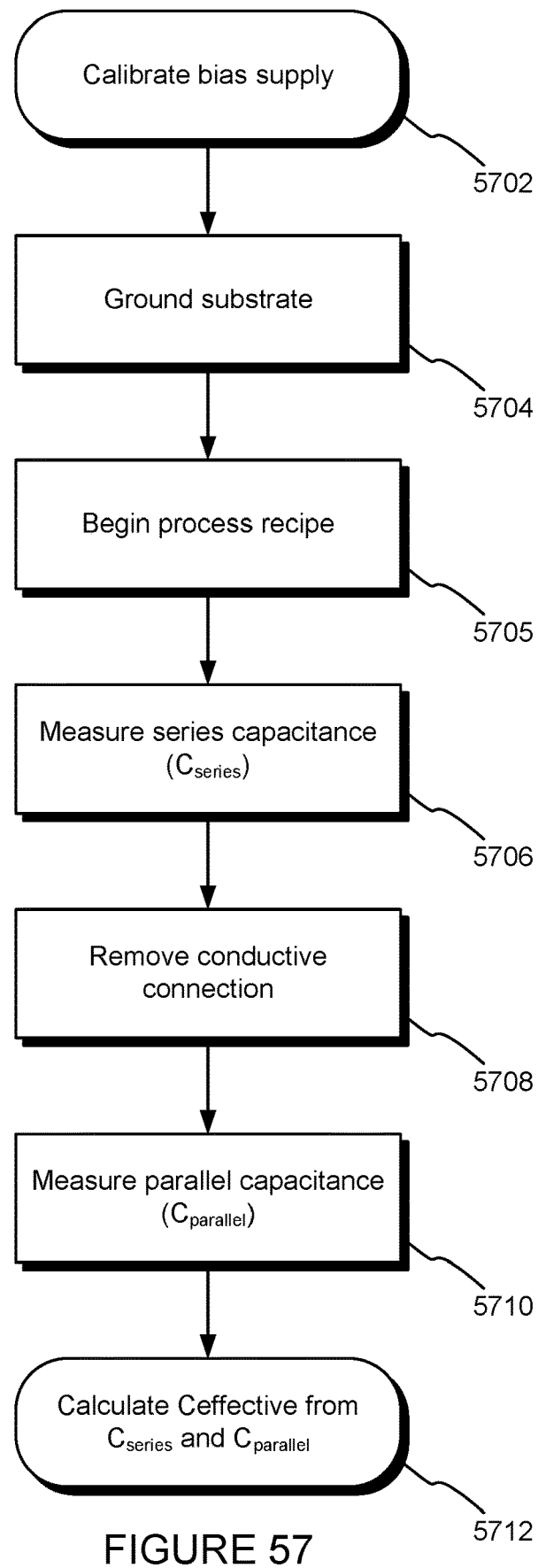
FIG. 57 illustrates another method of using a calibrated bias supply to determine an effective capacitance of an electrostatic chuck.

In this embodiment, after the second switch S2 opens and while the first and second switches S1, S2 are open, the third voltage, V3, is applied to the output node, $V_{out}$, through a second inductive element L2 to further decrease a level of the voltage at the output node along a fourth portion 6166 of the voltage waveform (e.g., the dv/dt region of FIG. 14). Alternatively, the third voltage, V3, can be applied throughout operation of the switches regardless of their open or closed state. In other words, application of the third voltage, V3, can have a duration exceeding the second duration, $t_2$. As shown in FIG. 53, the negative voltage ramp along the fourth portion 6166 may be established to maintain the sheath voltage by compensating for ions that impact the substrate. V3 can be applied only during the fourth portion 6166 or throughout an entire cycle of the periodic voltage waveform.

Thus, S1 momentarily connects and then disconnects the first voltage, V1, to the output, $V_{out}$, through the first inductive element L1, and after a period of time, S2 connects and then disconnects the second voltage (e.g., ground) to the output, Vout, through the first inductive element L1. The third voltage, V3, is coupled to the output, Vout, through a second inductive element L2. In this implementation, the first voltage, V1, may be higher than the third voltage V3, and the momentary connection and disconnection of the first voltage, V1, to the output $V_{out}$ causes the voltage of the output, $V_{out}$, to increase along the first portion 6160 of the voltage waveform to a first voltage level, Va, and the first voltage level, Va, is sustained along the second portion of the waveform 6162. The first voltage level Va may be above the first voltage, V1, and the second voltage, V2, (e.g., ground) may be less than the first voltage level, Va. The momentary connecting and then disconnecting of the second voltage, V2, causes the voltage of the output to decrease at the third portion 6164 to the second voltage level Vb that is below the second voltage, V2 (e.g., ground). Between opening of the first switch S1 and closing of the second switch S2, the bias supply may or may not attempt to control voltage or current supplied to the substrate. However, in other embodiments, the bias supply may not provide any voltage, current, or power to the substrate support during this period between activity of the switches. In other words, the second part of the waveform 6162 may or may not be controlled by the bias supply.

As an example, as shown in FIG. 62, V1 may be −2000 VDC; V2 may be ground; V3 may be −5000 VDC; V0 may be −7000 VDC; Vb may be −3000 VDC; and Va may be 3000 VDC. But these voltages are merely exemplary to provide context to relative magnitude and polarities of the voltages described with reference to FIGS. 60 and 61.

Figure 63A:
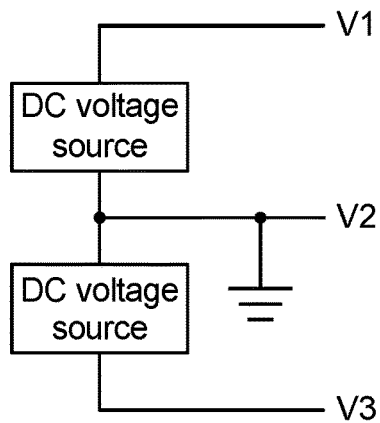
FIG. 63A depicts an implementation using two voltage sources to provide voltages to the bias supply depicted in FIG. 52.
Figure 63B:
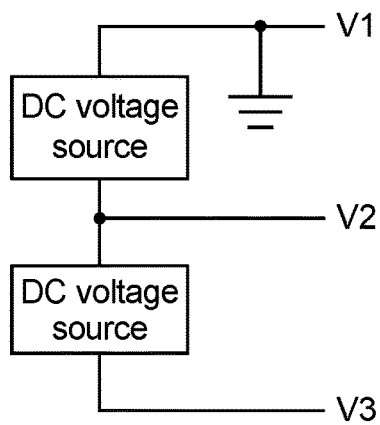
FIG. 63B depicts another implementation using two voltage sources to provide voltages to the bias supply depicted in FIG. 52.
Figure 63C:
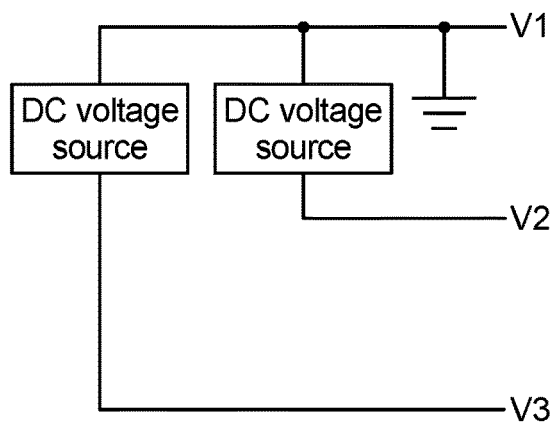
FIG. 63C depicts yet another implementation using two voltage sources to provide voltages to the bias supply depicted in FIG. 52.

Referring next to FIGS. 63A-63C shown are possible arrangements of two DC voltage sources to provide the voltages V1, V2, and V3 depicted in FIGS. 61 and 62. In FIG. 63A, V2 is grounded and forms a common node between the two DC voltage sources. In FIG. 63B, V1 is grounded and V2 forms a common node between the DC voltage sources. And in FIG. 63C, V1 is grounded and forms a common node between each of the two DC voltage sources.

Figure 64A:
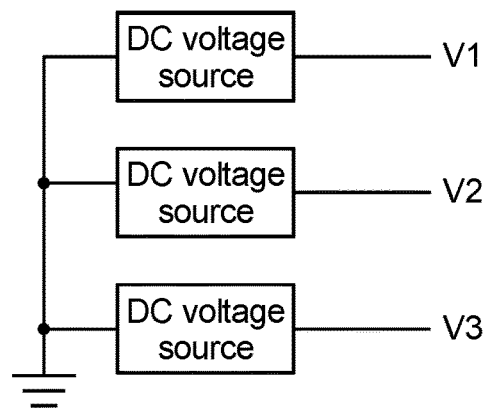
FIG. 64A depicts an implementation using three voltage sources to provide voltages to the bias supply depicted in FIG. 52.
Figure 64B:
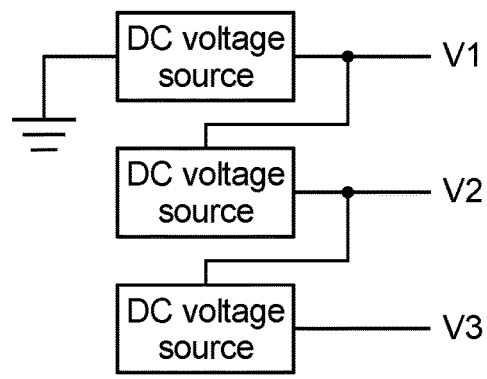
FIG. 64B depicts another implementation using three voltage sources to provide voltages to the bias supply depicted in FIG. 52.
Figure 64C:
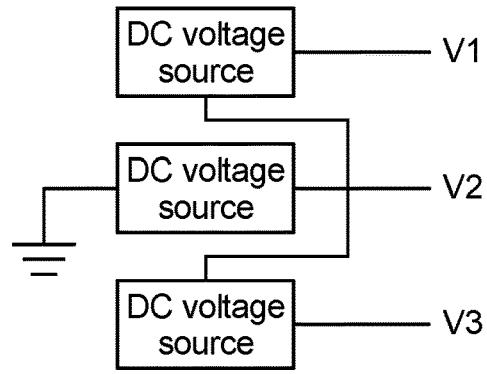
FIG. 64C depicts yet another implementation using three voltage sources to provide voltages to the bias supply depicted in FIG. 52.

In some embodiments, as shown in FIGS. 64A, 64B, and 64C, three DC voltage sources may be utilized to apply the three voltages V1, V2, and V3. As shown in FIG. 64A, each of the three DC voltage sources may be coupled to ground, and each of the three DC voltage sources provides a corresponding one of V1, V2, V3. In FIG. 64B one of the DC voltages sources is grounded and the three DC voltage sources are arranged in series. In FIG. 64C, one of DC voltages sources is disposed between ground and V2, and each of the DC voltage sources is coupled to V2.

Figure 65:
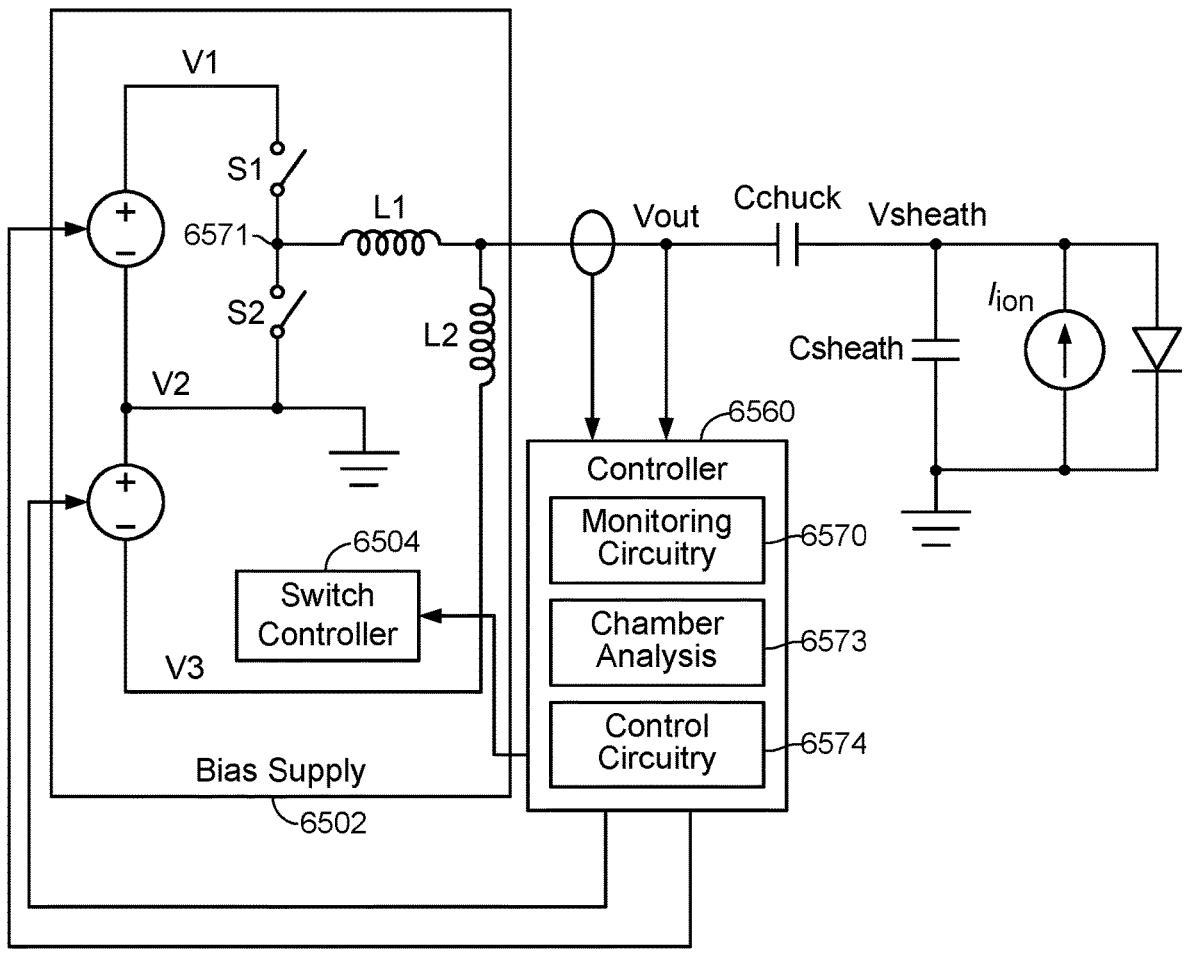
FIG. 65 is a diagram depicting aspects of an exemplary bias supply in connection with a control system

Referring next to FIG. 65, shown is an exemplary bias supply 6502 that may be used to realize the bias supplies of this disclosure, including 5803. As shown, the bias supply 6502 includes a switch controller 6504 and two voltage sources to provide a first voltage V1, a second voltage V2, and a third voltage V3. Although not shown for clarity, the two switches S1, and S2 are coupled to the switch controller 6504 (e.g., via electrical or optical connection) to enable the switch controller 6504 to open and close the switches, S1, S2, as disclosed below. The depicted switches S1, S2 may be realized by single pole, single throw, normally open switches that are controllable by electrical or optical signal. As a non-limiting example, the switches S1, S2 may be realized by silicon carbide metal-oxide semiconductor field-effect transistors (SiC MOSFETs).

Also shown is an exemplary controller 6560 that may be realized within a housing of each bias supply or may be realized as a part of a centralized tool controller. As shown, the controller 6560 is coupled to receive information (e.g., voltage and/or current information) indicative of the power applied by the bias supply 6502 at the output, $V_{out}$, of the bias supply. As shown, the controller 6560 is also coupled to the switch controller 6504 and the two DC voltage sources to enable the controller 6560 to control the bias supply 6502 (e.g., to control the plasma sheaths proximate to the bias electrodes; to control a second duration, $t_2$, and hence surface charge accumulation, $Q_i$).

In addition, the controller 6560 includes monitoring circuitry 6570 to measure at least one characteristic of the power that is applied by the bias supply 6502, and a chamber analysis component 6573 configured to calculate a characteristic of an environment within a plasma processing chamber based upon the measured characteristic of the power obtained from the monitoring circuitry 6570. Also shown in the controller 6560 is control circuitry 6574 to adjust the power applied by the bias supply 6502 to control the plasma sheaths proximate to the bias electrodes. In FIG. 65, the controller 6560 and switch controller 6504 are depicted as separate constructs, but it should be recognized that the controller 6560 and switch controller 6504 may be integrated and/or share common underlying components. For example, the controller 6560 and switch controller 6504 may be collocated on the same printed circuit board or system-on-chip (SoC). As another example, the controller 6560 and switch controller may be realized by a system that includes an architecture similar to, or the same as, the computing device depicted in FIG. 70.

The monitoring circuitry 6570 may include one or more sensors such as a directional coupler, V-I sensor, phase and gain sensor, voltage sensor, and a current sensor. As one of ordinary skill in the art will appreciate, the measured characteristic of power may include, voltage, current, phase, and power. In addition, the monitoring circuitry 6570 may include analog-to-digital conversion components to convert analog signals from the sensor(s) to digital representations of the measured characteristic of the power. In other implementations, the sensor(s) are separate from the controller 6560, and the monitoring circuitry 6570 includes analog-to-digital conversion components to convert analog signals from the sensor(s) to digital representations of the measured characteristic of the power. In yet other implementations, the sensor(s) include sensing elements and analog-to-digital conversion components, and the monitoring circuitry 6570 may receive the digital representation of the characteristic of the power. The monitoring of one or more characteristics of the environment of the plasma processing chamber may include measuring (with the monitoring circuitry 6570) at least one characteristic of the power that is applied by the at least one bias supply.

The chamber analysis component 6573 is generally configured to determine a characteristic of an environment within the plasma processing chamber based upon the measured characteristic of the power obtained from the monitoring circuitry 6570. Although power may be measured (by the monitoring circuitry 6570) at a location that is exterior to the plasma processing chamber, the measured power characteristic may be used to calculate the characteristic of an environment within the plasma processing chamber. For example, using Equation 1, ion current in a region proximate to a bias zone may be calculated using measurements of voltage at $V_{out}$ in connection with C1. As another example, using Equation 2, sheath capacitance in a region proximate to a bias zone may be calculated. As yet another example, Equation 11 can be used to determine surface charge accumulation, $Q_i$.

The control circuitry 6574 generally operates to adjust the power applied by the bias supply to adjust an aspect of the environment within the plasma processing chamber. For example, the plasma sheath proximate to a zone (established by the bias supply 6502) may be adjusted, and/or ion current may also be adjusted. As shown, the controller 6560 may be coupled to the DC voltage sources and the switch controller 6504; thus, with reference to FIG. 61, the controller 6560 may be used to adjust the voltage, Va, the voltage Vb, the first duration $t_1$, the second duration $t_2$, the time T, and the slope of the fourth portion 6166. As discussed with reference to FIG. 61, the voltage of the plasma sheath in proximity to a bias zone associated with the bias supply 6502 may be adjusted. The surface charge accumulation, $Q_i$, during the second duration, $t_2$, can also be controlled by controller 6560.

Referring again to FIG. 65, in this implementation (which incorporates the embodiment depicted in FIG. 63A), the second voltage, V2, is provided at a node that is coupled to two DC voltage sources and coupled to ground, but in other implementations (e.g., described above with reference to FIGS. 63B and 63C) the second voltage, V2, need not be ground. As shown, the first switch, S1, is disposed to switchably connect the first voltage, V1, to the common node 6571 (that is common to S1 and S2), and the second switch, S2, is disposed to switchably couple the second voltage, V2, to the common node 6571. In addition, the first inductive element, L1, is disposed between the common node and an output node, $V_{out}$.

In operation, the switch controller 6504 is configured close the first switch, S1, to increase, along a first portion 6160 of the voltage waveform (between a voltage $V_0$, and Va) a level of the voltage at the output node, $V_{out}$, to a first voltage level, Va, that is maintained along the second portion 6162 of the waveform, and then the first switch, S1, is opened. The switch controller 6504 then closes the second switch, S2, to decrease, along a third portion 6164 of the waveform, the level of the voltage waveform at the output node, $V_{out}$, to a second voltage level, Vb, and then the switch controller 6504 opens the second switch, S2, so that S1 and S2 are open. As shown, the negative voltage swing along the third portion 6164 affects the sheath voltage (Vsheath); thus, a magnitude of Vb may be controlled to affect the sheath voltage in close proximity to the electrode plane coupled to $V_{out}$. Those of skill in the art will appreciate that Vb is controllable by controlling V1, but Vb is not equal to V1 by virtue of the effect of the inductor, L1, in this implementation.

Controlling a second duration, $t_2$, between opening of the second switch S2 and closing of the first switch S1, can control surface charge accumulation, $Q_i$.

In this embodiment, the second voltage source functions as an ion compensation component to apply, at least while the first and second switches S1, S2 are open, the third voltage, V3, to the output node, $V_{out}$, through a second inductive element L2 to further decrease a level of the voltage waveform at the output node along a fourth portion 6166 of the periodic asymmetric voltage waveform. As shown in FIG. 61, the negative voltage ramp along the fourth portion 6166 may be established to maintain, and optionally modify, the sheath voltage by compensating for ions that impact the substrate. For instance, the negative ramp voltage along the fourth portion 6166 can be adjusted to affect a width of an ion energy peak within the ion energy distribution function, and a duration, $t_2$, of the negative ramp voltage can be used to control charge accumulation, $Q_i$, on the substrate.

Thus, S1 momentarily connects and then disconnects the first voltage, V1, to the output, $V_{out}$, through the first inductive element L1, and after a period of time, S2 connects and then disconnects the second voltage (e.g., ground) to the output, $V_{out}$, through the first inductive element L1. The third voltage, V3, is coupled to the output, $V_{out}$, through a second inductive element L2. In this implementation, the first voltage, V1, may be higher than the third voltage V3, and the momentary connection and disconnection of the first voltage, V1, to the output $V_{out}$ causes the voltage of the output, $V_{out}$, to increase along the first portion 6160 of the voltage waveform to a first voltage level, Va, and the first voltage level, Va, is sustained along the second portion of the waveform 5362. The first voltage level Va may be above the first voltage, V1, and the second voltage, V2, (e.g., ground) may be less than the first voltage level, Va. The momentary connecting and then disconnecting of the second voltage, V2, causes the voltage of the output to decrease at the third portion 6164 to the second voltage level Vb that is below the second voltage, V2 (e.g., ground).

In an embodiment, one or more bias supplies may be used to measure ion density, sheath capacitance, or other chamber parameters with a reference substrate or no substrate in the chamber. One or more processing runs could be carried out, and then the measurements can be repeated. In this way, changes to the chamber can be monitored.

If a silicon top lid is used, then one or more bias supplies 5803, 5960, 6002, and 6502 can be used to monitor regional ion density and/or other chamber parameters. A silicon top lid (also referred to as a silicon vacuum seal) is typically consumable but may not be consumed in uniform manner. Using multiple bias supplies 5803, 5960, 6002, 6502 to measure regional plasma characteristics may provide a means to infer non-uniform changes in the silicon vacuum seal. This feedback over time can be used to adjust an RF source(s) and/or bias supplies 5803, 5960, 6002, and 6502 to account for time varying non-uniformities in the silicon vacuum seal. Additionally, this feedback can be used to determine when the silicon vacuum seal may be due for replacement. In another embodiment, one or more bias supplies 5803, 5960, 6002, and 6502 can be coupled to an electrode adjacent to this silicon vacuum seal (e.g., at a top of the chamber). Since a bias supply 5803, 5960, 6002, and 6502 can be used to modify or even eliminate the plasma sheath, this top-mounted bias supply 5803, 5960, 6002, and 6502 could be used to minimize or even eliminate a plasma sheath between the silicon vacuum seal and the plasma. In this way, erosion or consumption of the silicon vacuum seal can be reduced as compared to current processes.

Along these lines, each bias supply 5803, 5960, 6002, and 6502 and corresponding electrode could be arranged at various locations of the processing chamber in order to locally control plasma sheaths and thereby reduce or eliminate ion bombardment for certain regions or components of the chamber. Ion density and sheath capacitance, and local variations thereof, may be used to monitor chamber cleanliness. For instance, changes in local ion density over time may indicate that a local chamber surface has accumulated one or more films. In another embodiment, multiple electrostatic chuck voltages distributed in space could be used to influence regional ion density.

Although this disclosure has focused on adjusting a second duration, $t_2$, to effect a desired surface charge accumulation, $Q_i$, in other embodiments, adjustments to the power supply sustaining the plasma can have similar effects. In particular, since plasma density is correlated to ion current, $I_I$, and surface charge accumulation is a function of ion current, $I_I$, adjusting an amount of power coupled into the plasma, and hence plasma density, can be used to control or maintain surface charge accumulation, $Q_i$. For instance, a feedback to the subsystem controlling plasma density, often called the plasma source, can be used to control surface charge accumulation, $Q_i$. Thus, both plasma power as well as a duration of the second negative voltage ramp from the bias supply can be used independently to control surface charge accumulation, $Q_i$. At the same time, both the plasma source and bias supply could be used in combination to control surface charge accumulation, $Q_i$, (e.g., decreasing plasma power while also reducing the second duration, $t_2$.).

Figure 68:
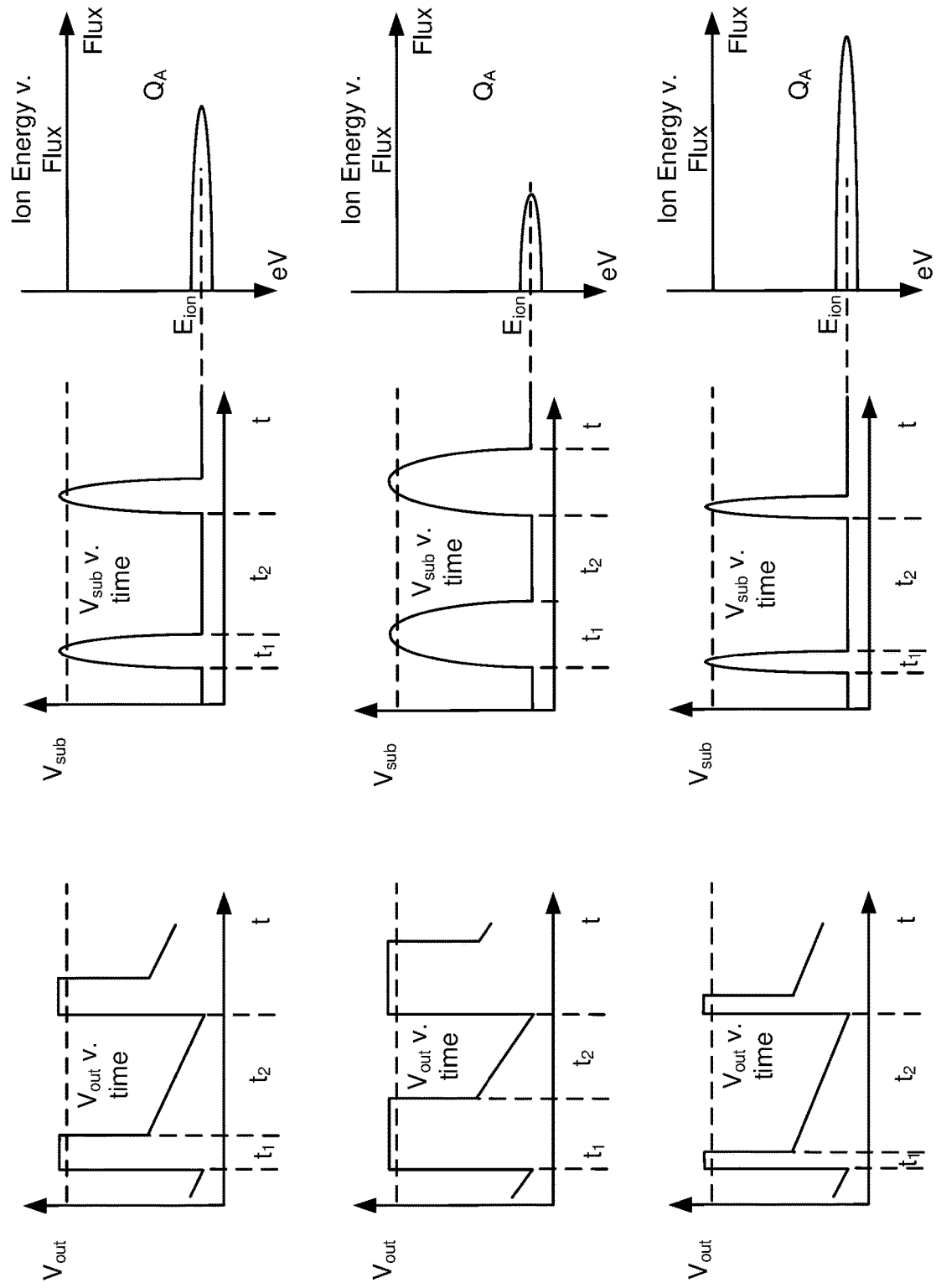
FIG. 68 illustrates timing charts for a power supply of a plasma processing system where a duration, $t_2$, can be adjusted to control surface charge accumulation, $Q_i$.

FIG. 68 illustrates plots of output voltage from the power supply (e.g., 5803), substrate voltage, and ion flux, for different second durations, $t_2$. Changing the second duration, $t_2$, has no impact on the position of the IEDF ($E_{ion}$) on the energy scale but affects magnitude of the charge delivered ($Q_i$) during each cycle and thus establishes a method for controlling surface charge accumulation, $Q_i$, without impacting nominal ion energy $E_{ion}$. The top row shows plots for a medium-valued second duration, $t_2$, the middle row shows plots for a shorter-valued second duration, $t_2$, and the bottom row shows plots for a longer-valued second duration, $t_2$. One can see that changes to the second duration, $t_2$, do not influence the amplitude of the substrate voltage, but it does influence how long the substrate voltage is at a constant negative voltage (or substantially constant negative voltage or sustained negative voltage), and thus influences ion flux to the substrate. Hence, reducing the second duration, $t_2$, too much can lead to reduced production. Lengthening the second duration, $t_2$, can increase the total amount of time during which the plasma is doing work on the substrate, but can also lead to excessive charge accumulation. So, a balance between the duration of ion bombardment and surface charge accumulation, $Q_i$, often needs to be found.

Figure 66:
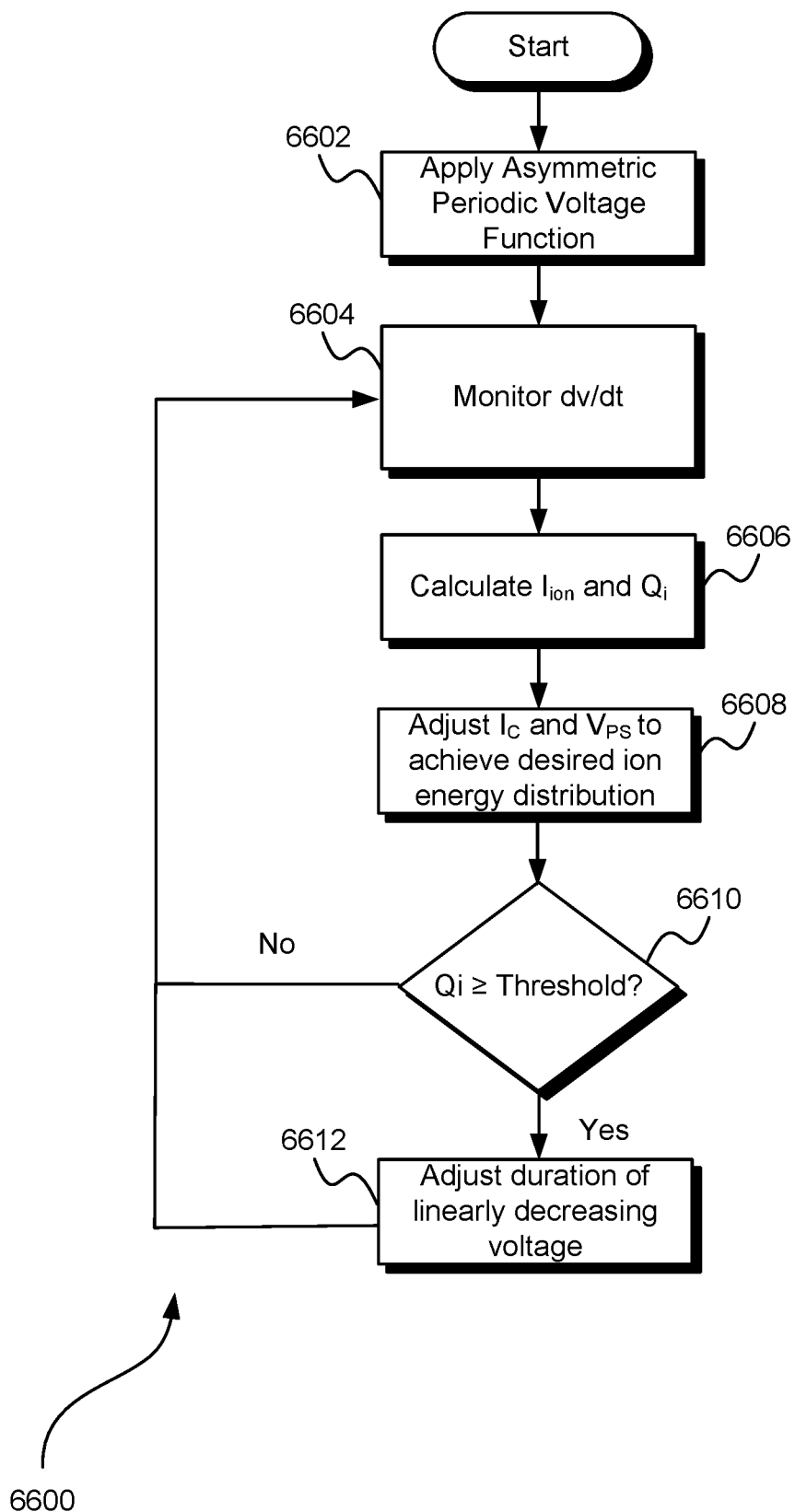
FIG. 66 illustrates a method for operating a plasma processing system where surface charge accumulation on a substrate surface can be controlled.

FIG. 66 illustrates a method of biasing a substrate to control (e.g., limit) accumulated surface charge. The method 6600 can include applying an asymmetric periodic voltage function to an output (Block 6602). A power supply can be configured to provide this voltage function. The output can be configured to couple to a substrate support. The asymmetric periodic voltage function can include a positive voltage ramp (e.g., 6160 in FIG. 61), a first negative voltage ramp (e.g., 6164) having a duration, $t_1$, and a second negative positive ramp (e.g., 6166) having a second duration, $t_2$. This second negative voltage ramp can also be referred to as a linearly decreasing voltage. The method 6600 can include monitoring a slope, dv/dt, for the duration, $t_2$ (Block 6604). This can be used to measure ion current in the plasma processing chamber. In an embodiment, an ion current compensation component, such as 5836, can perform the monitoring of Block 6604. The method 6600 can then calculate an ion current, $I_I$, using Equation 10 (Block 6606), and then calculate surface charge accumulation, $Q_i$, using the ion current, $I_I$, and Equation 11. This calculation can be performed by an ion current compensation component, such as 5836, or by a controller such as 5832. In parallel or before calculation of a surface charge accumulation, $Q_i$, the method 6600 can adjust an output of an ion compensation component (e.g., current or voltage) and a switch mode power supply, such as 5830, can adjust an output voltage drop, ΔV (e.g., 6164), to achieve a desired ion energy distribution (e.g., a controllably narrow or monoenergetic ion energy distribution) (Block 6608). Once the surface charge accumulation, $Q_i$, is known, or at least estimated, this can be compared to a threshold or a range (Decision 6610). If the surface charge accumulation, $Q_i$, is below this threshold or within the range, then the method 6600 can return to the monitoring step (Block 6604) and continue monitoring for excessive, or out-of-range, surface charge accumulation, $Q_i$. This decision can be made by an ion current compensation component, such as 5836, or by a controller such as 5832. If the Decision 6610 is YES, then the method 6600 can adjust a duration, $t_2$, of the linearly decreasing voltage (Block 6612) and return to monitoring dv/dt (Block 6604) until the Decision 6610 finds that the surface charge accumulation, $Q_i$, is back within bounds or below the threshold. A controller, such as 5832, can control the second duration, $t_2$, of the linearly decreasing voltage via signals to switches within a switch mode power supply in one instance.

Figure 67:
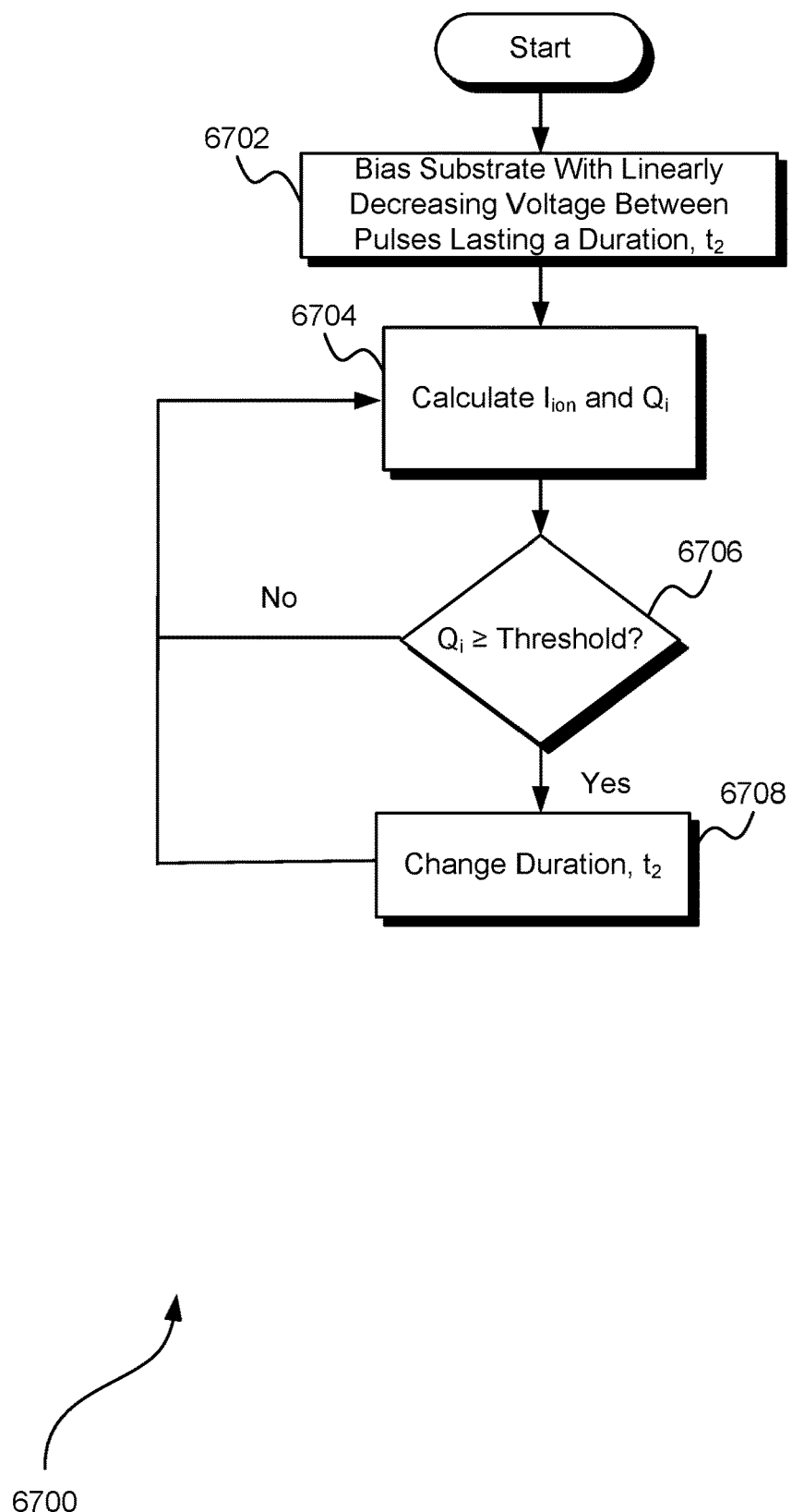
FIG. 67 illustrates another method for operating a plasma processing system where surface charge accumulation on a substrate surface can be controlled.

FIG. 67 illustrates another method of biasing a substrate to control accumulated surface charge. The method 6700 can include biasing a substrate in a plasma processing chamber with a linearly decreasing voltage between pulses of an asymmetric periodic voltage function (Block 6702), such as that seen in FIGS. 61 and 62. A power supply can be configured to provide this voltage function. The output can be configured to couple to a substrate support. The linearly decreasing voltage can last a duration, $t_2$, which is a controllable value. The method can then calculate ion current, $I_I$, using Equation 10 (Block 6704), and then calculate surface charge accumulation, $Q_i$, using the ion current, $I_I$, and Equation 11 (Block 6704). This calculation can be performed by an ion current compensation component, such as 5836, or by a controller such as 5832. Surface charge accumulation, $Q_i$, during the duration, $t_2$, can then be compared to a threshold or range (Decision 6706). If the surface charge accumulation, $Q_i$, is below this threshold or within the range (Decision 6706), then the method 6600 can return to the calculating of ion current, $I_I$, and surface charge accumulation, $Q_i$ (Block 6704) and continue monitoring for excessive, or out-of-range, surface charge accumulation, $Q_i$. This decision can be made by an ion current compensation component, such as 5836, or by a controller such as 5832. If the Decision 6706 is YES, then the method 6700 can adjust a duration, $t_2$, of the linearly decreasing voltage (Block 6708) and return to the calculating of ion current, $I_I$, and surface charge accumulation, $Q_i$ (Block 6704) and continue monitoring for excessive, or out-of-range, surface charge accumulation, $Q_i$. A controller, such as 5832, can control the duration, $t_2$, of the linearly decreasing voltage via signals to switches within a switch mode power supply in one instance.

In some embodiments, the components and functions of the ion current compensation component 5836 can be implemented within the switch mode power supply 5830.

Integration Method to Determine the Slope of the Modified Periodic Voltage Function In another embodiment, surface charge accumulation, $Q_i$, can be estimated without knowing the slope, dv/dt, of the linearly decreasing voltage during the second duration, $t_2$. Instead, the area under the voltage curve during the second duration, $t_2$, can be used to determine the surface charge accumulation, $Q_i$. One way to determine this area is via integration of ion current, $I_I$, during the second duration, $t_2$, as shown below in Equation 12:

$$Q_i = \frac{1}{C_{chuck}} \int I_I \, dt \qquad \text{(Equation 12)}$$

Ion current, $I_I$, may be determined as previously noted, for instance, by adjusting the ion compensation current, $I_C$, until Equation 3 is true, and ion current, $I_I$, is then known from ion compensation current, $I_C$ (e.g., $I_C = I_I$).

While this disclosure has described surface charge accumulation, $Q_i$, it should be noted that, Qi, could refer to charge delivered since there may be some sources of charge leakage. Similarly, Equations 11 and 12 could refer to charge delivered, rather than charge accumulation.

Figure 69:
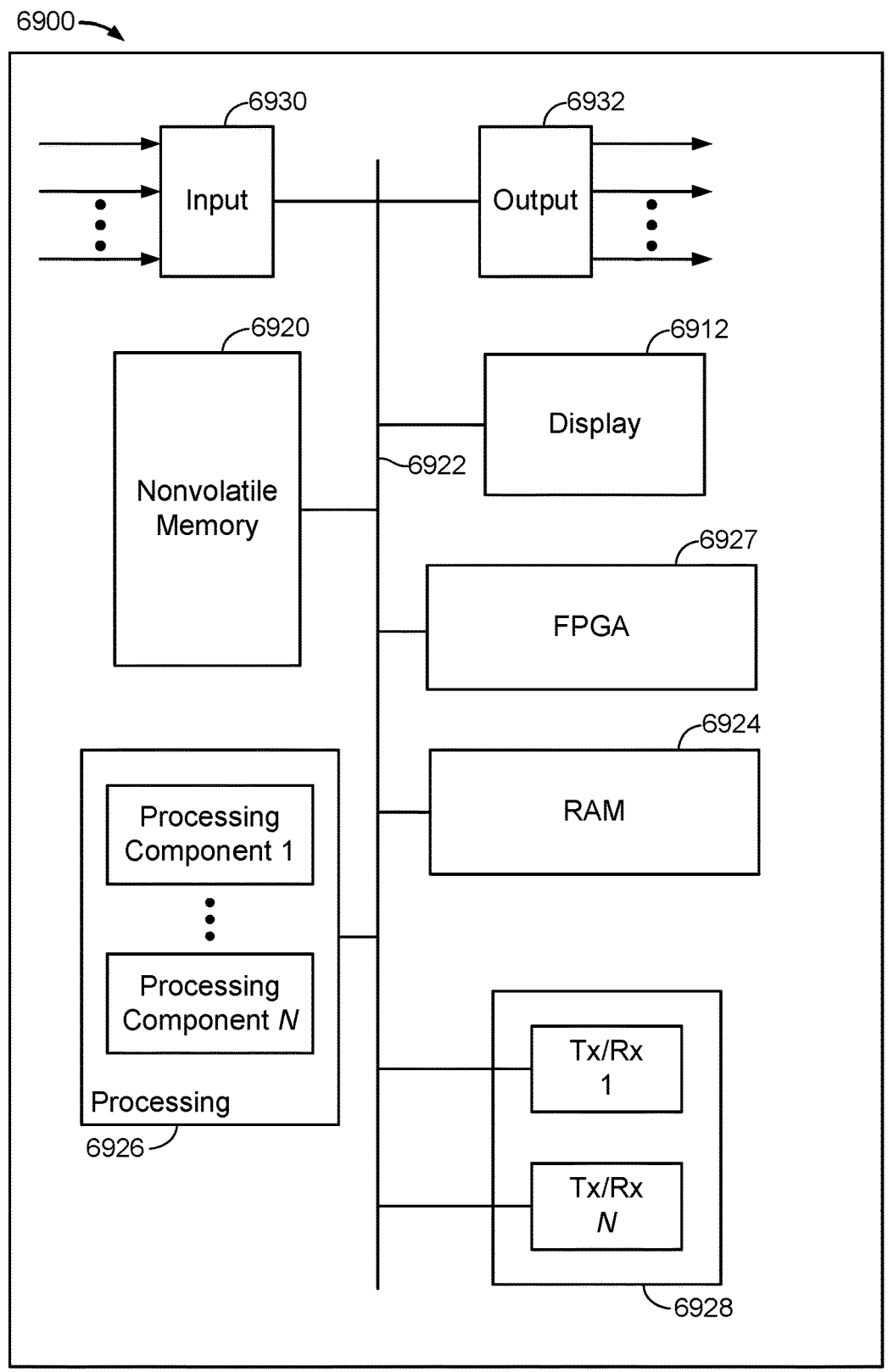
FIG. 69 shows a block diagram depicting physical components that may be utilized to realize a device for operating or manufacturing the remote plasma sources herein disclosed according to an exemplary embodiment.

The methods described in connection with the embodiments disclosed herein may be embodied directly in hardware, in processor-executable code encoded in a non-transitory tangible processor readable storage medium, or in a combination of the two. Referring to FIG. 69 for example, shown is a block diagram depicting physical components that may be utilized to realize control aspects of the plasma power supply 102, 202, 1202, 1702, 2122, 2222, 2322, 2422, 2522, 2622, 2722 and the bias supplies 106, 206, 806, 1206, 1366, 1806 and 1884, 1906, 2130, 2230, 2330, 2430, 2530, 2630, 2730, 5102, 5202, 5500, 5803, 5902, 6002, and 6502 according to an exemplary embodiment. As shown, in this embodiment a display portion 6912 and nonvolatile memory 6920 are coupled to a bus 6922 that is also coupled to random access memory ("RAM") 6924, a processing portion (which includes N processing components) 6926, a field programmable gate array (FPGA) 6927, and a transceiver component 6928 that includes N transceivers. Although the components depicted in FIG. 69 represent physical components, FIG. 69 is not intended to be a detailed hardware diagram; thus, many of the components depicted in FIG. 69 may be realized by common constructs or distributed among additional physical components. Moreover, it is contemplated that other existing and yet-to-be developed physical components and architectures may be utilized to implement the functional components described with reference to FIG. 69.

This display portion 6912 generally operates to provide a user interface for a user, and in several implementations, the display is realized by a touchscreen display. In general, the nonvolatile memory 6920 is non-transitory memory that functions to store (e.g., persistently store) data and processor-executable code (including executable code that is associated with effectuating the methods described herein). In some embodiments for example, the nonvolatile memory 6920 includes bootloader code, operating system code, file system code, and non-transitory processor-executable code to facilitate the execution of a method of biasing the substrate to achieve one or more IEDF energy peaks optionally having different amplitudes as described with reference to relative to FIGS. 6, 9-11, 42B, 42C, 46, and 48-50. One or more of the monitoring circuitry 5770, chamber analysis component 5772 and control circuitry 5772 may be realized, at least in part, by the non-transitory processor-executable code.

In many implementations, the nonvolatile memory 6920 is realized by flash memory (e.g., NAND or ONENAND memory), but it is contemplated that other memory types may be utilized as well. Although it may be possible to execute the code from the nonvolatile memory 6920, the executable code in the nonvolatile memory is typically loaded into RAM 6924 and executed by one or more of the N processing components in the processing portion 6926.

The N processing components in connection with RAM 6924 generally operate to execute the instructions stored in nonvolatile memory 6920 to enable execution of the algorithms and functions disclosed herein. It should be recognized that several algorithms are disclosed herein, but some of these algorithms are not represented in flowcharts. Processor-executable code to effectuate methods of biasing different localized regions of the substrate or chamber as shown in and described relative to FIGS. 6, 9-11, 42B, 42C, 46, and 48-50 may be persistently stored in nonvolatile memory 6920 and executed by the N processing components in connection with RAM 6924. As one of ordinarily skill in the art will appreciate, the processing portion 6926 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, non-transitory FPGA-configuration-instructions may be persistently stored in non-volatile memory 6920 and accessed (e.g., during boot up) to configure a field programmable gate array (FPGA) to implement the algorithms disclosed herein and to effectuate one or more of the functions of the controller 5760 or other aspects of the RF sources 102, 202, 1202, 1702, 2122, 2222, 2322, 2422, 2522, 2622, 2722 and bias supplies 106, 206, 806, 1206, 1366, 1806 and 1884, 1906, 2130, 2230, 2330, 2430, 2530, 2630, 2730, 5102, 5202, 5500, 5803, 5902, 6002, and 6502.

The input component 6930 operates to receive signals (e.g., current, voltage, and phase information at an output of the bias supply) that are indicative of one or more aspects of the modified periodic voltage function being supplied to the substrate support. The signals received at the input component may include, for example, $V_{out}$ or a rate of change of $V_{out}$ (e.g., $dv_0/dt$). The output component generally operates to provide one or more analog or digital signals to effectuate an operational aspect of controlling the bias supply as disclosed herein and/or signal(s) to effect a desired IEDF. For example, the output portion 6932 may provide control signals for controlling a controllable current source 2540, 2640, 2740, a current source 1664, or an ion current compensation component 1260, 1360, 2136 and/or switching of switches within the bias supply 106, 206, 806, 1206, 1366, 1806 and 1884, 1906, 2130, 2230, 2330, 2430, 2530, 2630, 2730, 5102, 5202, 5702.

The depicted transceiver component 6928 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

In conclusion, the present disclosure provides, among other things, a method and apparatus for selectively generating desired (or defined) ion energies using a switch-mode power supply. As used herein, the recitation of "at least one of A, B or C" is intended to mean "either A, B, C or any combination of A, B and C." The previous description of the disclosed embodiments is provided to enable any person skilled in the art to make or use the present disclosure. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention.

What is claimed is:

1. A system for providing a voltage comprising:
 a power supply configured to provide an asymmetric periodic voltage function to an output configured to couple to a substrate support, the asymmetric periodic voltage function having a positive voltage ramp, a first negative voltage ramp, and a second negative voltage ramp, having a duration, t2, between the first negative voltage ramp and a next positive voltage ramp;
 the power supply comprising an ion current compensation component configured to obtain an estimate of surface charge accumulation, $Q_i$, on a substrate, wherein the surface charge accumulation, Qi, during the duration, t2 is estimated as:

$$Q_i = \frac{1}{C_{chuck}} \int I_I \, dt$$

where $C_{chuck}$ comprises a series capacitance and $I_1$ is ion current; and
 the power supply comprising a switching controller configured to adjust the duration, $t_2$, to achieve a desired surface charge accumulation, $Q_i$, or to keep the surface charge accumulation, $Q_i$, below a threshold.

2. The system of claim 1, wherein the ion current compensation component effects a controllable width of ion energy at the surface of the substrate.

3. The system of claim 2, wherein the ion current compensation component effects a controllably narrow or mono-energetic distribution of ion energy at the surface of the substrate.

4. The system of claim 3, wherein ion current compensation component is further configured to maintain a fixed magnitude voltage or current at the output during the duration, t2, to effectuate the controllably narrow or monoenergetic distribution of ion energy at the surface of the substrate.

5. The system of claim 3, wherein the power supply includes at least two switching components and the at least two switching components include a first switching component coupled to a DC power supply and a second switching component coupled to a ground terminal, the two switching components configured to alternately couple a positive DC voltage of the DC power supply and the ground terminal to the output to effectuate the controllably narrow or monoenergetic distribution of ion energy at the surface of the substrate.

6. The system of claim 5, wherein the switching controller is configured to provide a first and second separate drive-control signals, respectively, to the first and second of the at least two switching components by a corresponding one of a first and separate second drive-control-signal lines, and to control a timing of the drive-control signals to alternately switch the positive DC voltage and a ground potential to the output to generate the asymmetric periodic voltage function, which when applied to a dielectric or semiconductor substrate on the substrate support, produces a sustained negative voltage at the surface of the substrate during the duration, t2, the sustained negative voltage effectuates the controllably narrow or monoenergetic distribution of ion energy.

7. The system of claim 6, further comprising, a waveform memory, the waveform memory programmed to include timing information for the drive-control signals comprising a timing of the duration, $t_2$.

8. The system of claim 1, wherein the estimate of the surface charge accumulation is derived as an integral of the ion current over the duration, $t_2$.

9. The system of claim 1, wherein the estimate of the surface charge accumulation is derived as a multiple of a rate of change, dv/dt, of the voltage times a series capacitance, Cchuck.

10. An apparatus for providing a voltage comprising:
a power supply configured to provide an asymmetric periodic voltage function to an output configured to couple to a substrate support, the asymmetric periodic voltage function having a positive voltage ramp, a first negative voltage ramp, and a second negative voltage ramp, having a duration, $t_2$, between the first negative voltage ramp and a next positive voltage ramp;
the power supply including:
monitoring circuitry to estimate a surface charge accumulation, $Q_i$, during the duration, $t_2$ as:

$Q_i = 1/C_{chuck} \int I_1 dt$ where $C_{chuck}$ comprises a series capacitance and $I_1$ is ion current;
control circuitry to achieve a desired surface charge accumulation, $Q_i$, or to keep the surface charge accumulation, $Q_i$, below a threshold.

11. The apparatus of claim 10, wherein the power supply effects a controllable width of ion energy at the surface of the substrate.

12. The apparatus of claim 11, wherein power supply effects a controllably narrow or monoenergetic distribution of ion energy at the surface of the substrate.

13. The apparatus of claim 12, wherein power supply is further configured to maintain a fixed magnitude voltage or current at the output during the duration, $t_2$, to effectuate the controllably narrow or monoenergetic distribution of ion energy at the surface of the substrate.

14. The apparatus of claim 12, wherein the power supply includes at least two switching components and the at least two switching components include a first switching component coupled to a DC power supply and a second switching component coupled to a ground terminal, the two switching components configured to alternately couple a positive DC voltage of the DC power supply and the ground terminal to the output to effectuate the controllably narrow or monoenergetic distribution of ion energy at the surface of the substrate.

15. The apparatus of claim 14, wherein the controller is configured to provide a first and second separate drive-control signals, respectively, to the first and second of the at least two switching components by a corresponding one of a first and separate second drive-control-signal lines, and to control a timing of the first and second separate drive-control signals to alternately switch the positive DC voltage and a ground potential to the output to generate the asymmetric periodic voltage function, which when applied to a dielectric or semiconductor substrate on the substrate support, produces a sustained negative voltage at the surface of the substrate during the duration, t2, the sustained negative voltage effectuates the controllably narrow or monoenergetic distribution of ion energy.

16. The apparatus of claim 15, further comprising, a waveform memory, the waveform memory programmed to include timing information for the first and second separate drive-control signals comprising a timing of the duration, t2.

17. The apparatus of claim 10, further comprising:
a plasma processing chamber.

18. A system for providing a voltage, the system comprising:
a power supply configured to bias a substrate in a plasma processing chamber, a waveform of the biasing comprising: (1) periodic positive pulses, and (2) a linearly decreasing voltage between each of the positive pulses, lasting for a duration, t2, and having a rate of decrease, dv/dt; and
a controller configured to:
calculate ion current, $I_1$, from the rate of decrease, dv/dt, and a series capacitance, $C_{chuck}$, between the substrate and a power supply providing the biasing;
calculate a surface charge accumulation, $Q_i$, during the duration, $t_2$ as:

$Q_i = 1/C_{chuck} \int I_1 dt;$ and
change the duration, $t_2$, when the surface charge accumulation, $Q_i$, meets or exceeds a first threshold.

19. The system of claim 18, wherein the controller is configured to keep a duration, $t_1$, of each of the pulses constant during the changing of the duration, $t_2$, thereby maintaining a constant ion energy delivered to the substrate.

* * * * *